(12) United States Patent
Smith

(10) Patent No.: US 11,158,982 B2
(45) Date of Patent: Oct. 26, 2021

(54) ACTIVE COVER PLATES

(71) Applicant: SNAPRAYS, LLC, Vineyard, UT (US)

(72) Inventor: Jeremy C. Smith, Orem, UT (US)

(73) Assignee: SnapRays LLC, Vineyard, UT (US)

(*) Notice: Subject to any disclaimer, the term of this patent is extended or adjusted under 35 U.S.C. 154(b) by 290 days.

(21) Appl. No.: 16/166,965

(22) Filed: Oct. 22, 2018

(65) Prior Publication Data

US 2019/0122832 A1   Apr. 25, 2019
US 2021/0057173 A9   Feb. 25, 2021

Related U.S. Application Data

(63) Continuation-in-part of application No. 15/920,047, filed on Mar. 13, 2018, now Pat. No. 10,404,045, and
(Continued)

(51) Int. Cl.
*H01R 13/66* (2006.01)
*G05F 3/02* (2006.01)
(Continued)

(52) U.S. Cl.
CPC .......... *H01R 13/6675* (2013.01); *G05F 3/02* (2013.01); *H01H 9/0066* (2013.01); *H01H 9/0271* (2013.01); *H01H 9/182* (2013.01); *H01R 9/16* (2013.01); *H01R 12/7076* (2013.01); *H01R 12/7088* (2013.01); *H01R 43/00* (2013.01);
(Continued)

(58) Field of Classification Search
CPC ......... H02M 5/00; H01H 9/02; H01R 25/006; H01R 25/16; H01R 25/162; H01R 13/506; H01R 13/6666; H01R 13/6691; H01R 13/713; H01R 13/73; H02G 3/00; H02G 3/14; H02G 3/38; H02G 3/081;
(Continued)

(56) References Cited

U.S. PATENT DOCUMENTS 1,938,309 A   12/1933  Williams
2,015,698 A   10/1935  Tiffany
(Continued)

FOREIGN PATENT DOCUMENTS

CA   2732657      2/2011
CN   201311835    9/2009
(Continued)

OTHER PUBLICATIONS

Office Action dated Jan. 26, 2018 for U.S. Reexam 90/014,022.
(Continued)

*Primary Examiner* — William H. Mayo, III
*Assistant Examiner* — Krystal Robinson

(57) ABSTRACT

A variety of active cover plate configurations with prongs configured to contact side screw terminals of electrical receptacles are described. In one illustrative embodiment, an active cover plate includes a multi-gang face plate configured to be installed over a multi-gang light switch installation, the multi-gang faceplate including at least two apertures sized to accept a manually manipulatable element of switches in the multi-gang light switch installation. Prongs extend rearward from the multi-gang faceplate around at least one of the apertures.

17 Claims, 96 Drawing Sheets

Related U.S. Application Data a continuation-in-part of application No. 15/870,832, filed on Jan. 12, 2018, now Pat. No. 10,109,945, and a continuation-in-part of application No. 29/629,812, filed on Dec. 15, 2017, now Pat. No. Des. 887,819, and a continuation-in-part of application No. 15/708,082, filed on Sep. 18, 2017, now Pat. No. 10,644,461, which is a continuation-in-part of application No. 29/608,292, filed on Jun. 20, 2017, now Pat. No. Des. 847,608, and a continuation-in-part of application No. 29/608,296, filed on Jun. 20, 2017, now Pat. No. Des. 877,599, and a continuation-in-part of application No. 29/208,295, filed on Jun. 20, 2017, now Pat. No. Des. 842,076, and a continuation-in-part of application No. 29/608,300, filed on Jun. 20, 2017, now Pat. No. Des. 849,512, and a continuation-in-part of application No. 29/608,301, filed on Jun. 20, 2017, now Pat. No. Des. 849,513, and a continuation-in-part of application No. 29/608,297, filed on Jun. 20, 2017, now Pat. No. Des. 849,510, and a continuation-in-part of application No. 29/608,294, filed on Jun. 20, 2017, now Pat. No. Des. 842,075, and a continuation-in-part of application No. 15/496,872, filed on Apr. 25, 2017, now Pat. No. 10,291,007, and a continuation-in-part of application No. 15/486,280, filed on Apr. 12, 2017, now Pat. No. 9,917,430, and a continuation-in-part of application No. 15/486,273, filed on Apr. 12, 2017, now Pat. No. 9,871,324, and a continuation-in-part of application No. 15/486,277, filed on Apr. 12, 2017, now Pat. No. 9,899,814, and a continuation-in-part of application No. 15/484,318, filed on Apr. 11, 2017, now Pat. No. 10,153,999, and a continuation-in-part of application No. 15/481,280, filed on Apr. 6, 2017, now Pat. No. 9,882,318, and a continuation-in-part of application No. 15/481,318, filed on Apr. 6, 2017, now Pat. No. 9,882,361, and a continuation-in-part of application No. 29/599,679, filed on Apr. 5, 2017, now Pat. No. Des. 845,108, and a continuation-in-part of application No. 29/598,255, filed on Mar. 23, 2017, now Pat. No. Des. 819,426, and a continuation-in-part of application No. 29/594,005, filed on Feb. 14, 2017, now abandoned, and a continuation-in-part of application No. 29/594,002, filed on Feb. 14, 2017, now Pat. No. Des. 832,223, and a continuation-in-part of application No. 29/594,007, filed on Feb. 14, 2017, now Pat. No. Des. 832,224, and a continuation-in-part of application No. 29/594,003, filed on Feb. 14, 2017, now Pat. No. Des. 913,963, and a continuation-in-part of application No. 15/428,099, filed on Feb. 8, 2017, now Pat. No. 9,832,841, and a continuation-in-part of application No. 15/409,508, filed on Jan. 18, 2017, now Pat. No. 9,807,829, said application No. 15/481,280 is a continuation-in-part of application No. 15/406,404, filed on Jan. 13, 2017, now Pat. No. 9,742,111, said application No. 15/708,082 is a continuation-in-part of application No. 15/145,749, filed on May 3, 2016, now Pat. No. 9,787,025, and a continuation-in-part of application No. 29/551,208, filed on Jan. 11, 2016, now Pat. No. Des. 809,899, and a continuation-in-part of application No. 14/678,746, filed on Apr. 3, 2015, now Pat. No. 9,768,562, said application No. 29/594,002 is a continuation-in-part of application No. 29/522,404, filed on Mar. 30, 2015, now Pat. No. Des. 781,241, said application No. 15/708,082 is a continuation-in-part of application No. 29/522,406, filed on Mar. 30, 2015, now Pat. No. Des. 810,697, said application No. 15/145,749 is a continuation-in-part of application No. 14/549,143, filed on Nov. 20, 2014, now Pat. No. 9,362,728, said application No. 15/708,082 is a continuation-in-part of application No. 14/066,637, filed on Oct. 29, 2013, now Pat. No. 9,035,181, said application No. 14/678,746 is a continuation of application No. 14/066,637, filed on Oct. 29, 2013, now Pat. No. 9,035,181, said application No. 14/549,143 is a continuation-in-part of application No. 14/066,621, filed on Oct. 29, 2013, now Pat. No. 9,035,180, said application No. 14/066,637 is a continuation-in-part of application No. 13/461,915, filed on May 2, 2012, now Pat. No. 8,912,442.

(60) Provisional application No. 62/579,033, filed on Oct. 30, 2017, provisional application No. 62/536,452, filed on Jul. 24, 2017, provisional application No. 62/522,691, filed on Jun. 21, 2017, provisional application No. 62/460,094, filed on Feb. 17, 2017, provisional application No. 62/279,831, filed on Jan. 18, 2016, provisional application No. 62/081,539, filed on Nov. 18, 2014, provisional application No. 62/027,784, filed on Jul. 23, 2014, provisional application No. 61/906,651, filed on Nov. 20, 2013, provisional application No. 61/836,972, filed on Jun. 19, 2013, provisional application No. 61/778,386, filed on Mar. 12, 2013, provisional application No. 61/720,131, filed on Oct. 30, 2012, provisional application No. 61/574,344, filed on Aug. 1, 2011.

(51) Int. Cl.
| | |
|---|---|
| *H02G 3/14* | (2006.01) |
| *H05K 5/03* | (2006.01) |
| *H01H 9/00* | (2006.01) |
| *H01H 9/02* | (2006.01) |
| *H01H 9/18* | (2006.01) |
| *H01R 9/16* | (2006.01) |
| *H01R 12/70* | (2011.01) |
| *H01R 43/00* | (2006.01) |
| *H05K 1/11* | (2006.01) |
| *H01R 24/78* | (2011.01) |
| *H01R 13/187* | (2006.01) |
| *H01R 13/447* | (2006.01) |
| *H01R 13/24* | (2006.01) |
| *H01R 13/717* | (2006.01) |
| *H01R 13/11* | (2006.01) |

(52) U.S. Cl.
CPC ............... *H02G 3/14* (2013.01); *H05K 1/119* (2013.01); *H05K 5/03* (2013.01); *H01R 13/111* (2013.01); *H01R 13/187* (2013.01); *H01R 13/2421* (2013.01); *H01R 13/2478* (2013.01); *H01R 13/447* (2013.01); *H01R 13/7175* (2013.01); *H01R 24/78* (2013.01); *H05K 2201/09027* (2013.01); *H05K 2201/1028* (2013.01); *H05K 2201/10106* (2013.01)

(58) Field of Classification Search
CPC .......... H02G 3/121; H02G 3/18; H02G 3/086; H02G 3/10; H02G 3/123
USPC ....................................................... 174/66
See application file for complete search history.

(56) References Cited

U.S. PATENT DOCUMENTS

| | | |
|---|---|---|
| 2,045,199 A | 6/1936 | Petersen |
| 2,193,740 A | 9/1938 | Reed |
| 2,134,695 A | 11/1938 | Bigman |
| 2,227,549 A | 1/1941 | McNeill |
| 2,385,620 A | 9/1945 | Fleckenstein |
| 2,428,167 A | 9/1947 | Linton |
| 2,515,820 A * | 7/1950 | Clark ............ H01H 9/185 40/542 |
| 2,575,820 A * | 11/1951 | Linton ............ H01H 9/161 362/95 |
| 2,580,056 A | 12/1951 | Wheeler, Jr. |
| 2,749,381 A | 6/1956 | Farish |
| 2,880,285 A | 3/1959 | Robison et al. |
| 2,908,743 A | 10/1959 | Premoshis |
| 2,934,590 A * | 4/1960 | Thompson ........ H02B 1/048 174/53 |
| 3,120,414 A | 2/1964 | Farish, Jr. |
| 3,168,612 A | 2/1965 | Sorenson |
| 3,307,030 A | 2/1967 | Francisco |
| D212,760 S | 11/1968 | Bordner |
| 3,522,595 A | 8/1970 | White |
| 3,588,489 A | 6/1971 | Gaines |
| 3,680,237 A | 8/1972 | Finnerty, Sr. |
| 3,739,226 A | 6/1973 | Setter et al. |
| D230,274 S | 2/1974 | Polus |
| 3,800,113 A * | 3/1974 | Sheahan ........ H02B 1/048 200/295 |
| 3,859,454 A | 1/1975 | Mann |
| 3,879,101 A | 4/1975 | McKissic |
| 3,950,053 A * | 4/1976 | Brighenti ............ H01H 9/02 439/131 |
| 3,953,933 A * | 5/1976 | Goldstein ............ H02G 3/12 40/642.02 |
| 4,000,405 A | 12/1976 | Horwinski |
| 4,038,582 A | 7/1977 | Horwinski |
| 4,117,258 A | 9/1978 | Shanker |
| 4,163,882 A * | 8/1979 | Baslow ............ H02B 1/044 174/57 |
| 4,211,905 A * | 7/1980 | Quigley ............ H02B 1/048 200/16 C |
| 4,255,780 A | 3/1981 | Sakellaris |
| 4,282,591 A | 8/1981 | Andreuccetti |
| 4,340,795 A * | 7/1982 | Arthur ............ H02B 1/048 200/295 |
| 4,514,789 A | 4/1985 | Jester |
| 4,534,486 A | 8/1985 | Eidson |
| 4,546,419 A | 10/1985 | Johnson |
| 4,611,264 A | 9/1986 | Bradley |
| 4,616,285 A | 10/1986 | Sackett |
| 4,617,613 A | 10/1986 | Rice |
| 4,755,913 A | 7/1988 | Sleveland |
| 4,774,641 A | 9/1988 | Rice |
| 4,886,469 A | 12/1989 | Jseng |
| 5,016,398 A | 5/1991 | Fukunaga |
| D330,267 S | 10/1992 | Hendrix |
| 5,153,816 A | 10/1992 | Griffin |
| 5,178,350 A * | 1/1993 | Vink ............ H02G 3/18 220/3.4 |
| 5,186,682 A | 2/1993 | Iida |
| 5,189,259 A * | 2/1993 | Carson ............ H01H 9/02 174/57 |
| 5,248,919 A | 9/1993 | Hanna |
| 5,290,175 A | 3/1994 | Robinson |
| 5,384,428 A | 1/1995 | Luu |
| 5,406,439 A | 4/1995 | Crane et al. |
| 5,415,564 A * | 5/1995 | Winter ............ H01R 24/76 439/535 |
| 5,473,517 A | 12/1995 | Blackman |
| D366,339 S | 1/1996 | Waller |
| 5,481,442 A | 1/1996 | Dickie et al. |
| 5,485,356 A * | 1/1996 | Nguyen ............ H01R 13/717 174/66 |
| 5,584,725 A | 12/1996 | Tseng |
| 5,622,424 A | 4/1997 | Brady |
| 5,660,459 A | 8/1997 | Appelberg |
| 5,670,776 A | 9/1997 | Rothbaum |
| 5,683,166 A * | 11/1997 | Lutzker ............ H05B 33/06 250/466.1 |
| D395,314 S | 6/1998 | Oikawa |
| D399,825 S | 10/1998 | Heung et al. |
| 5,816,682 A | 10/1998 | Marischen |
| D401,566 S | 11/1998 | Gesmondi |
| 5,833,350 A | 11/1998 | Moreland |
| D407,072 S | 3/1999 | Gaule |
| 5,914,826 A | 6/1999 | Smallwood |
| 6,000,807 A | 12/1999 | Moreland |
| 6,010,228 A | 1/2000 | Blackman |
| 6,023,021 A | 2/2000 | Matthews et al. |
| D427,086 S | 6/2000 | Gaule |
| 6,087,588 A | 7/2000 | Soules |
| 6,089,893 A | 7/2000 | Yu et al. |
| D429,829 S | 8/2000 | Doran |
| D443,500 S | 6/2001 | Luu |
| 6,281,438 B1 * | 8/2001 | Desilets ............ H01R 13/652 174/53 |
| 6,341,981 B1 | 1/2002 | Gorman |
| D456,239 S | 4/2002 | Luu |
| 6,386,725 B1 * | 5/2002 | Amburgey ............ F21S 8/035 200/310 |
| 6,390,647 B1 | 5/2002 | Shaefer |
| 6,395,981 B1 | 5/2002 | Ford et al. |
| 6,423,900 B1 * | 7/2002 | Soules ............ H01H 9/185 174/66 |
| D464,865 S | 10/2002 | Luu |
| 6,457,843 B1 | 10/2002 | Kester |
| D473,528 S | 4/2003 | Wengrower |
| 6,547,411 B1 | 4/2003 | Dornbusch |
| 6,608,253 B1 | 8/2003 | Rintz |
| 6,765,149 B1 | 7/2004 | Ku |
| 6,774,328 B2 | 8/2004 | Adams et al. |
| 6,805,469 B1 | 10/2004 | Barton |
| 6,808,283 B2 | 10/2004 | Tsao |
| D500,743 S | 1/2005 | Saviki, Jr. et al. |
| 6,867,370 B2 | 3/2005 | Compagnone |
| 6,883,927 B2 | 4/2005 | Cunningham et al. |
| 6,891,284 B2 | 5/2005 | Tilley |
| 6,901,779 B2 * | 6/2005 | Magee ............ A45C 11/325 109/23 |
| 6,974,910 B2 | 12/2005 | Rohmer |
| 7,011,422 B2 | 3/2006 | Robertson et al. |
| 7,019,212 B1 | 3/2006 | Esmailzadeh |
| 7,036,948 B1 | 5/2006 | Wyatt |
| 7,064,498 B2 | 6/2006 | Dowling et al. |
| D542,627 S | 5/2007 | Rohmer et al. |
| 7,247,793 B2 | 7/2007 | Hinkson |
| 7,270,436 B2 | 9/2007 | Jasper |
| 7,273,983 B1 | 9/2007 | Rintz |
| 7,318,653 B2 | 1/2008 | Chien |
| D561,558 S | 2/2008 | Jackson |
| D561,559 S | 2/2008 | Krumpe |
| D567,633 S | 4/2008 | Anderson |
| 7,360,912 B1 | 4/2008 | Savicki, Jr. |
| D573,005 S | 7/2008 | Huang |
| D576,566 S | 9/2008 | Wu et al. |
| D577,985 S | 10/2008 | Kidman |
| 7,506,990 B2 | 3/2009 | Glazner |
| 7,547,131 B2 | 6/2009 | Faunce et al. |
| 7,576,285 B1 | 8/2009 | Saviki, Jr. |
| D603,984 S | 11/2009 | Richter |
| D606,029 S | 12/2009 | Chou |
| 7,745,750 B2 | 6/2010 | Hewson et al. |
| 7,821,160 B1 | 10/2010 | Roosli et al. |
| 7,850,322 B2 | 12/2010 | Glazner et al. |
| 7,918,667 B1 | 4/2011 | Shim |
| 7,946,871 B1 | 5/2011 | Yu et al. |
| 8,003,886 B1 | 8/2011 | Rintz |
| D650,112 S | 12/2011 | Bryant |
| 8,148,637 B2 | 4/2012 | Davidson |
| 8,242,364 B1 * | 8/2012 | Shotey ............ H02G 3/14 174/66 |
| D666,471 S | 9/2012 | Peckham |
| 8,299,359 B2 * | 10/2012 | Alderson ............ H02G 3/14 174/66 |

(56) References Cited

U.S. PATENT DOCUMENTS

| | | | |
|---|---|---|---|
| 8,304,652 B2 | 11/2012 | McBain | |
| 8,393,747 B2 | 3/2013 | Kevelos et al. | |
| 8,511,866 B1 | 8/2013 | Mendez | |
| 8,564,279 B2 | 10/2013 | Johnson et al. | |
| 8,592,703 B2* | 11/2013 | Johnson | H01H 23/02 |
| | | | 200/339 |
| 8,668,347 B2 | 3/2014 | Ebeling | |
| 8,697,991 B2 | 4/2014 | Davidson | |
| 8,797,723 B2 | 8/2014 | Hilton et al. | |
| 8,847,071 B2* | 9/2014 | Castaldo | H04L 25/4902 |
| | | | 174/50 |
| D719,699 S | 12/2014 | Bryant | |
| 8,912,442 B2 | 12/2014 | Smith | |
| D721,043 S | 1/2015 | Tonnesen | |
| 9,035,180 B2* | 5/2015 | Smith | H02G 3/081 |
| 9,035,181 B2 | 5/2015 | Smith et al. | |
| 9,362,728 B2 | 6/2016 | Smith et al. | |
| 9,464,795 B2 | 10/2016 | Ebeling | |
| 9,482,426 B2 | 11/2016 | Diotte | |
| 9,653,860 B2* | 5/2017 | Hestrin | H01R 25/006 |
| 9,742,111 B2 | 8/2017 | Smith et al. | |
| 9,755,374 B2 | 9/2017 | St. Laurent et al. | |
| 9,768,562 B2 | 9/2017 | Smith et al. | |
| 9,774,154 B2 | 9/2017 | St. Laurent et al. | |
| 9,787,025 B2 | 10/2017 | Smith et al. | |
| 9,807,829 B2 | 10/2017 | Jensen | |
| 9,832,841 B2 | 11/2017 | Knight et al. | |
| 9,857,841 B2* | 1/2018 | DeSilva | H02G 3/121 |
| 9,871,324 B2 | 1/2018 | Smith et al. | |
| 9,882,318 B2 | 1/2018 | Smith et al. | |
| 9,882,361 B2 | 1/2018 | Smith et al. | |
| 9,899,814 B2 | 2/2018 | Smith et al. | |
| 9,917,430 B2 | 3/2018 | Smith et al. | |
| 10,109,945 B2 | 10/2018 | Smith et al. | |
| 10,381,788 B2* | 8/2019 | Smith | H05K 5/03 |
| 10,886,674 B2* | 1/2021 | Diotte | H01R 13/717 |
| 2001/0046130 A1 | 11/2001 | Cunningham et al. | |
| 2002/0127908 A1* | 9/2002 | Kidman | H02G 3/14 |
| | | | 439/538 |
| 2002/0131262 A1 | 9/2002 | Amburgey | |
| 2003/0013503 A1 | 1/2003 | Menard et al. | |
| 2003/0124022 A1* | 7/2003 | Georges | A61L 9/03 |
| | | | 422/5 |
| 2004/0247300 A1 | 12/2004 | He et al. | |
| 2005/0264383 A1 | 12/2005 | Zhang | |
| 2006/0065510 A1 | 3/2006 | Kiko et al. | |
| 2006/0072302 A1* | 4/2006 | Chien | F21V 23/06 |
| | | | 362/84 |
| 2006/0077684 A1 | 4/2006 | Yuen | |
| 2006/0161270 A1 | 7/2006 | Luskin et al. | |
| 2006/0170380 A1 | 8/2006 | Evans | |
| 2006/0262462 A1 | 11/2006 | Barton | |
| 2007/0120978 A1 | 5/2007 | Jones | |
| 2008/0073117 A1 | 3/2008 | Misener | |
| 2008/0266121 A1 | 10/2008 | Ellul | |
| 2009/0153438 A1 | 6/2009 | Miller et al. | |
| 2009/0225480 A1 | 9/2009 | Baxter | |
| 2009/0284385 A1 | 11/2009 | Tang et al. | |
| 2009/0322159 A1 | 12/2009 | Dubose et al. | |
| 2010/0033950 A1 | 2/2010 | Farrell | |
| 2011/0056720 A1 | 3/2011 | Davidson | |
| 2011/0210833 A1 | 9/2011 | McNeely et al. | |
| 2011/0228552 A1 | 9/2011 | Kevelos et al. | |
| 2011/0261511 A1* | 10/2011 | Alderson | H02G 3/14 |
| | | | 361/679.01 |
| 2012/0008307 A1 | 1/2012 | Delany | |
| 2012/0068612 A1 | 3/2012 | Ebeling | |
| 2012/0156937 A1 | 6/2012 | Almouli | |
| 2012/0182172 A1 | 7/2012 | Sorensen | |
| 2012/0215470 A1 | 8/2012 | Maguire | |
| 2012/0316808 A1 | 12/2012 | Frader-Thompson et al. | |
| 2013/0063848 A1 | 3/2013 | Thorpe et al. | |
| 2013/0076242 A1 | 3/2013 | Moreland | |
| 2013/0221868 A1 | 8/2013 | Diotte et al. | |
| 2014/0060878 A1* | 3/2014 | Trojanowski | H02G 3/081 |
| | | | 174/66 |
| 2015/0200061 A1* | 7/2015 | de Peralta | H02G 3/14 |
| | | | 200/297 |
| 2015/0371534 A1 | 12/2015 | Dimberg et al. | |
| 2017/0018890 A1 | 1/2017 | St. Laurent et al. | |
| 2017/0018897 A1 | 1/2017 | St. Laurent et al. | |
| 2017/0214188 A1 | 7/2017 | Smith | |
| 2018/0048099 A1 | 2/2018 | Diotte | |

FOREIGN PATENT DOCUMENTS

| | | |
|---|---|---|
| DE | 202006006354 | 10/2007 |
| EP | 2211210 | 3/2007 |
| KR | 1019930025223 | 6/1995 |
| KR | 1019950015932 | 6/1995 |
| KR | 20090121424 | 11/2009 |
| KR | 1020080047328 | 11/2009 |
| KR | 100955064 | 4/2010 |
| KR | 1020090098056 | 4/2010 |
| WO | 2007122141 | 11/2007 |
| WO | 2012006812 | 1/2012 |
| WO | 2012033746 | 3/2012 |
| WO | 2013019394 | 2/2013 |
| WO | 2014070863 | 5/2014 |

OTHER PUBLICATIONS

Office Action dated Feb. 23, 2018 for U.S. Appl. No. 90/014,021.
Office Action dated Sep. 20, 2018 for U.S. Appl. No. 15/920,047.
Permaglo Night Light, www.costco.ca, accessed Mar. 21, 2017, 4 pgs.
Permaglo Safety Lighting Products, www.pemaglo.com, accessed Mar. 21, 2017, 1 pg.
Request for Ex Parte Reexamination for U.S. Pat. No. 9,035,180, May 19, 2015.
TekSyCo Technical Systems Company—Plug into the Future, at least as early as Jul. 16, 2009.
Request for Ex Parte Reexamination for U.S. Pat. No. 8,912,442 ,May 19, 2015.
Initial Expert Report of Michael Thuma.
Ontel answer and Affirmative Defenses to Plaintiff's Second Amended Complaint, U.S. District Court filing ,Jun. 5, 2017.
Ontel Defendants LPR 2.2(b) Initial Disclosures, U.S. District Court filing ,Jul. 14, 2017.
Ontel Defendants LPR 2.4 Preliminary Non-Infringement and Invalidity Contentions, ,Aug. 8, 2017.
Ontel Defendants Memorandum in Opposition to Plaintiff's Motion for Leave to File a Second Amended Complaint, U.S. District Court filing ,Apr. 11, 2017.
Plate Pals Wallplate Thermometers, http://www.platepats.com/home.html. Last visited Apr. 12, 2017. ,2006.
Respondent Alltrade Tools LLC's Notice of Prior Art.
Respondent Alltrade Tools LLC's Second Supplemental Invalidity Contentions.
Respondent Alltrade Tools LLC's Supplemental Invalidity Contentions.
Respondent Enstant Technology Co., Ltd.'s Response to Compainant Snaprays, LLC's Invalidity Contentions Interrogatories.
Respondent Ontel Products Corporation's Notice of Prior Art.
Respondents Enstant Technology Co., Ltd. and Vistek Technology Co., Lts.'s Notice of Prior Art.
UL Warns of Light with Unauthorized UL Mark, The Associated Press New Alert, visited Oct. 2018 ,Jul. 2009.
International Search Report for PCT/US2011/050524, pp. 1-3, dated Mar. 28, 2012.
Written Opinion of the International Searching Aurhtority for PCT/US2011/050524, pp. 1-3, dated Mar. 7, 2013.
International Preliminary Report on Patentability for PCT/US2011/050524, pp. 1-4, dated Mar. 13, 2013.

(56) References Cited

OTHER PUBLICATIONS

U.S. Appl. No. 61/380,561 made publicly accessible with U.S. Patent Application Publication No. 2013/0221868 on Aug. 29, 2013, pp. 1-19.

* cited by examiner

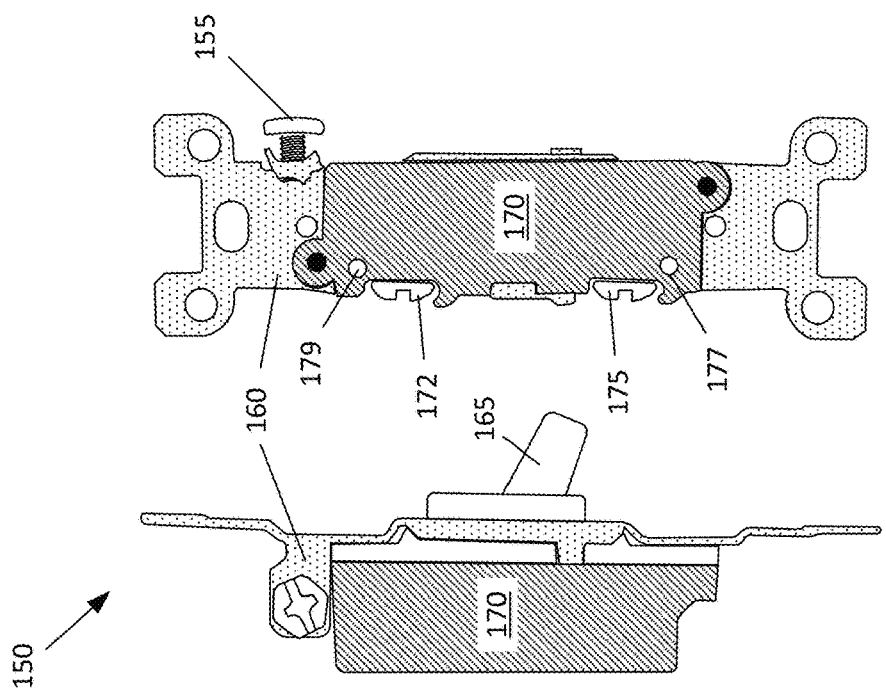
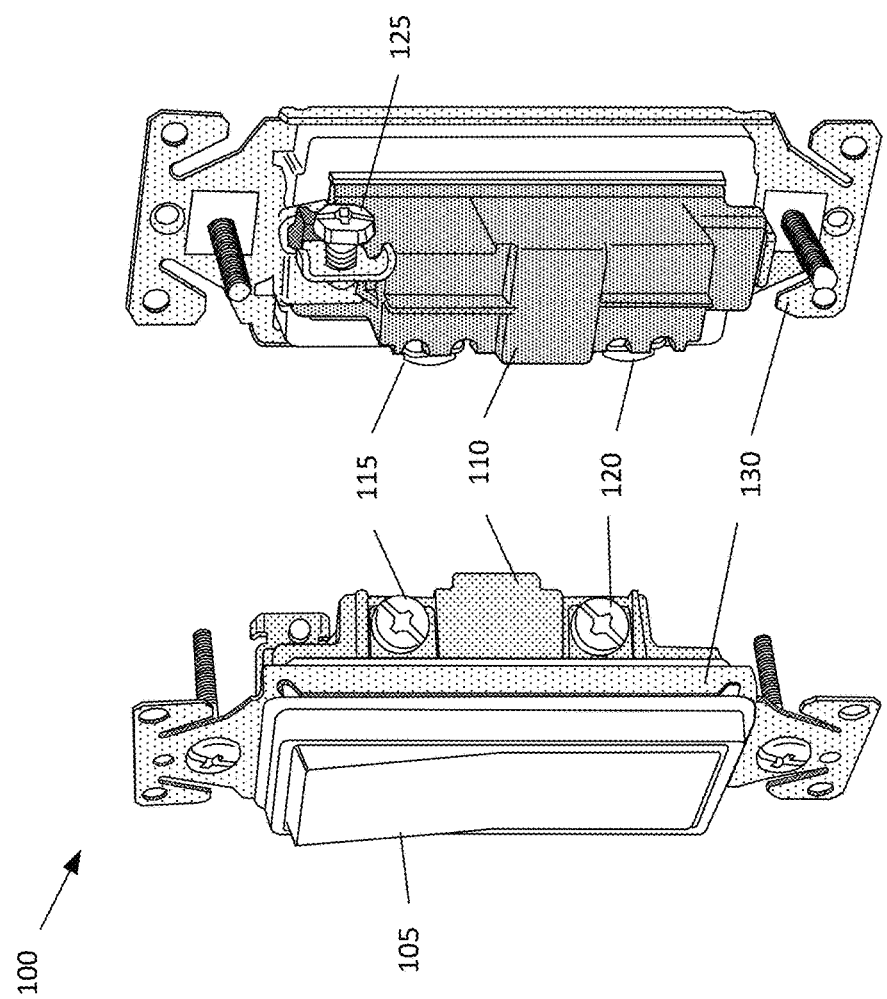

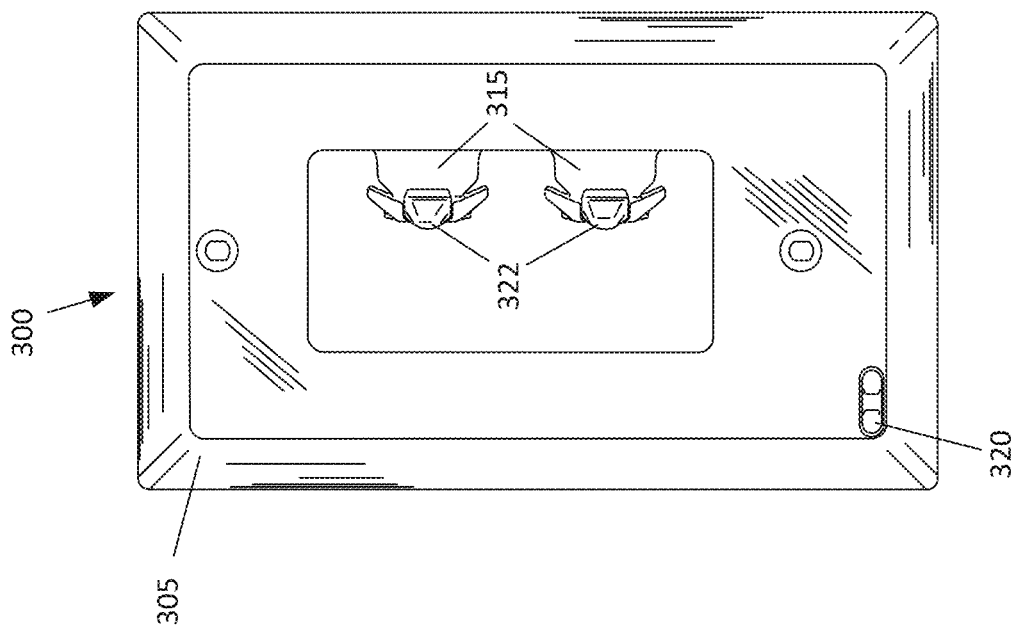
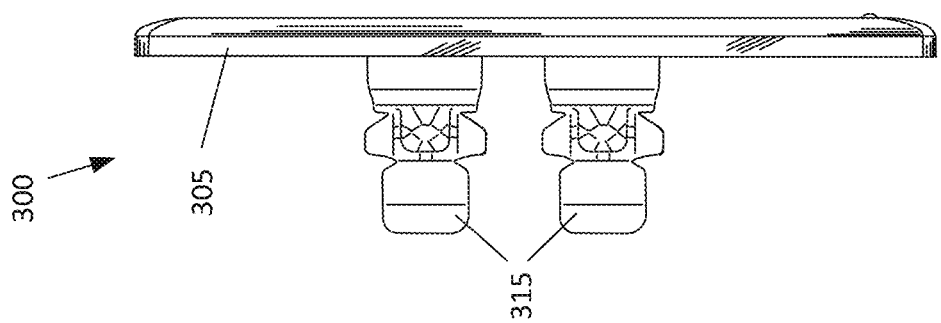
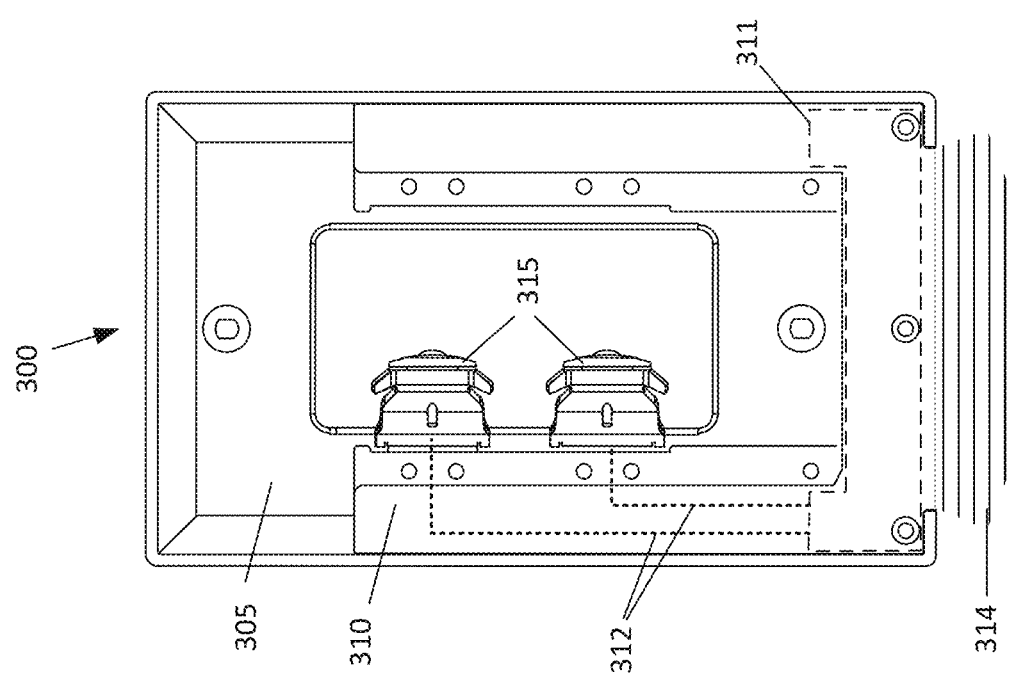
Fig. 3C
Fig. 3B
Fig. 3A

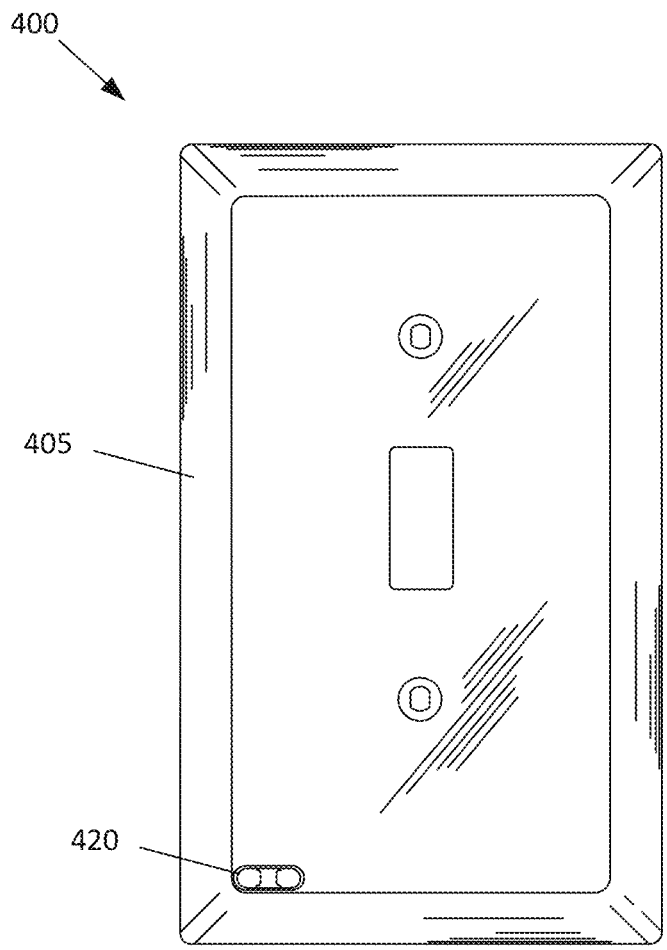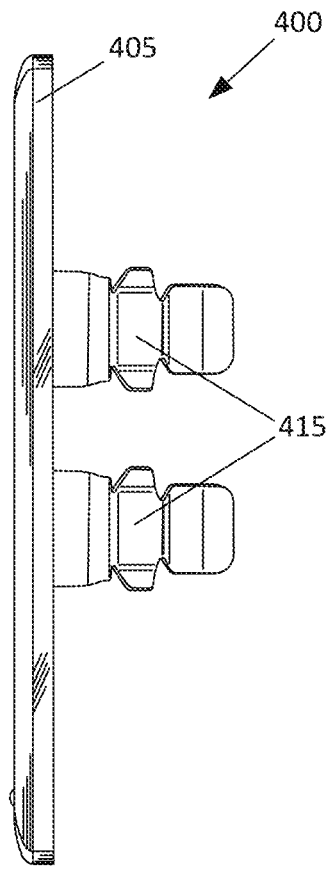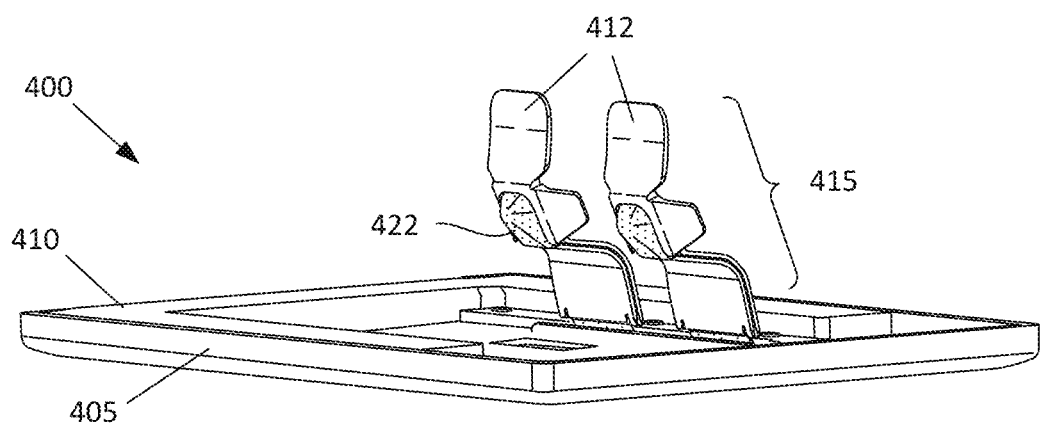
Fig. 4A  Fig. 4B
Fig. 4C

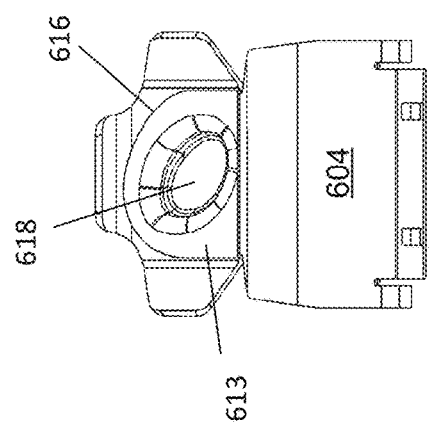
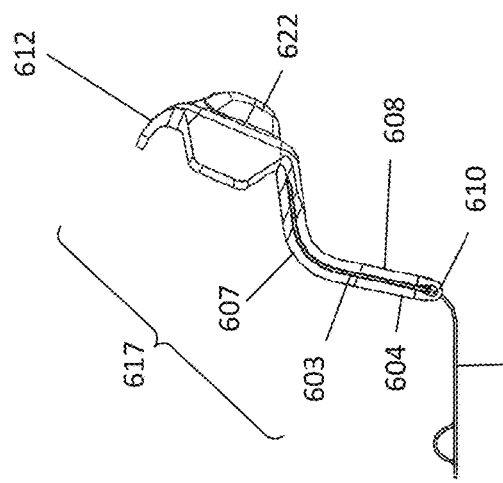
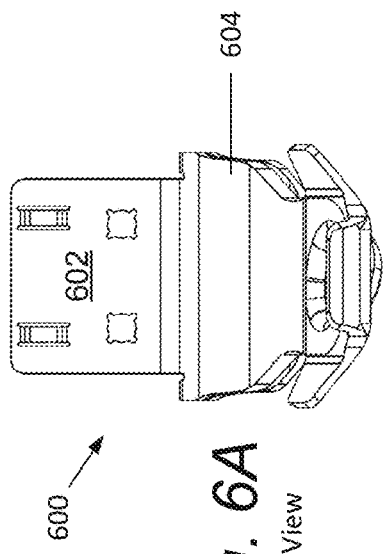
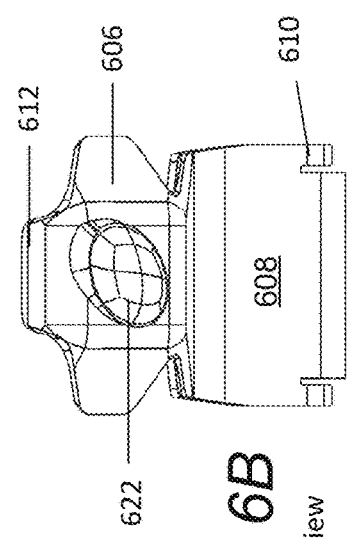
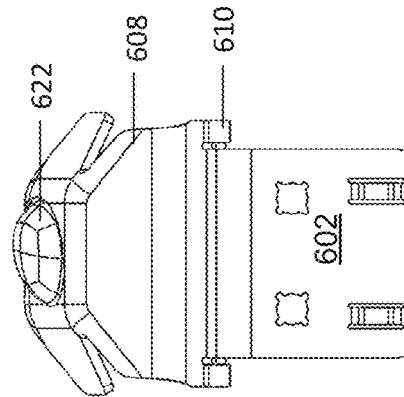
Fig. 6A Top View
Fig. 6B Front View
Fig. 6C Bottom View
Fig. 6D Side View
Fig. 6E Back View

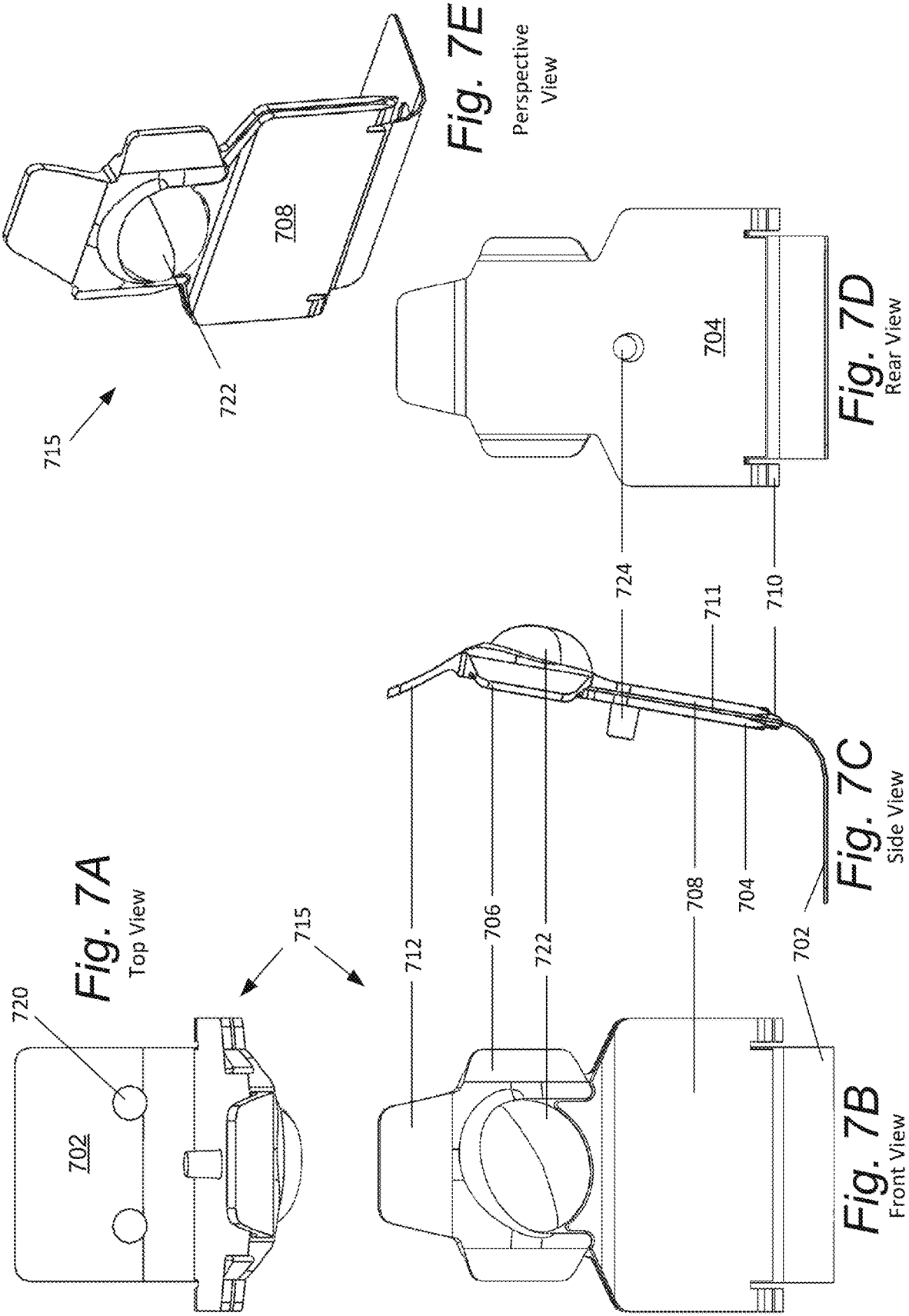

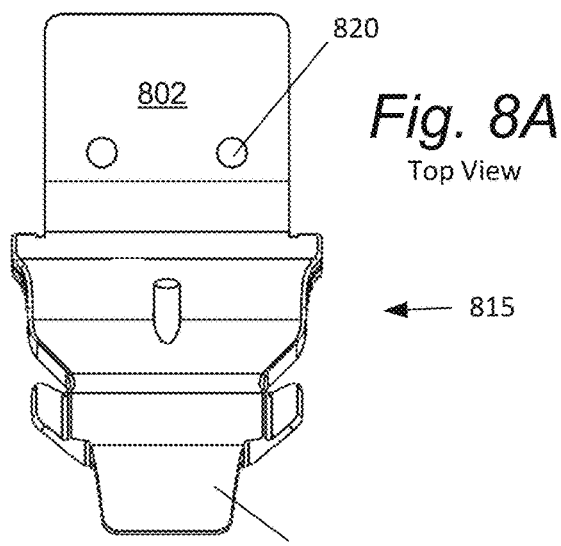
*Fig. 8A*
Top View
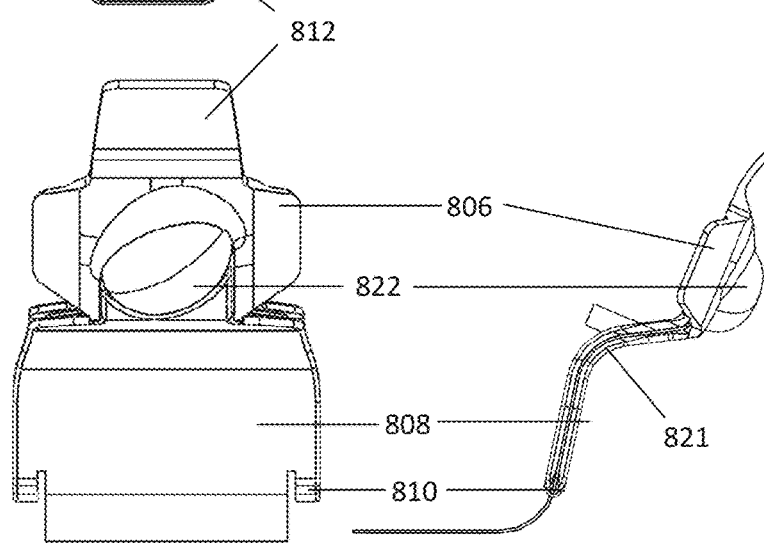
*Fig. 8B*
Front View
*Fig. 8D*
Side View
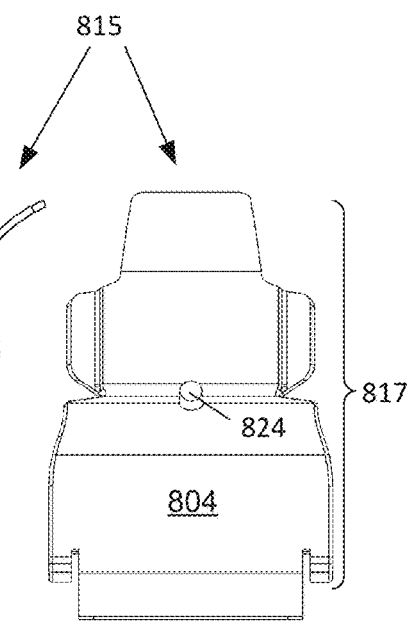
*Fig. 8E*
Rear View
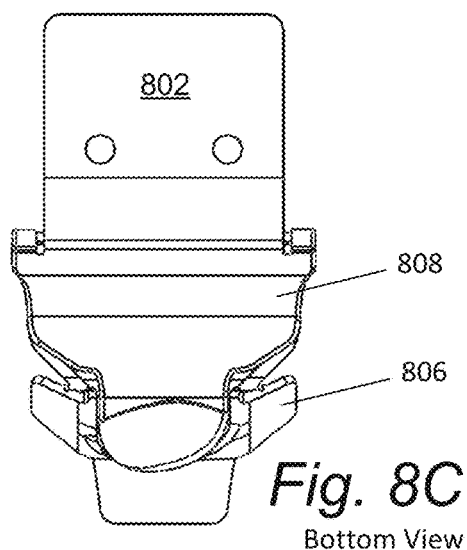
*Fig. 8C*
Bottom View

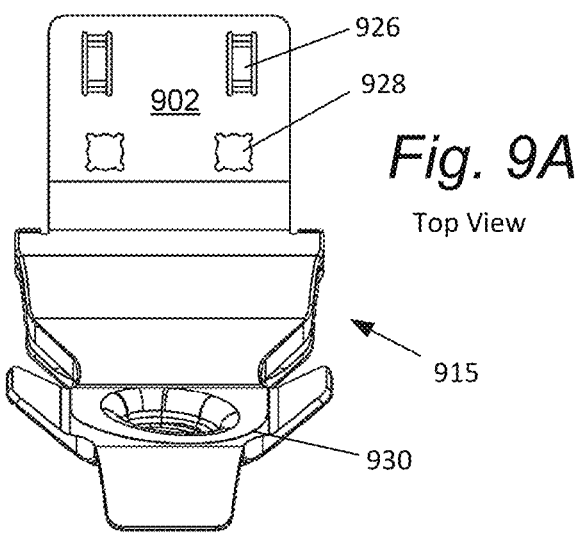
*Fig. 9A*
Top View
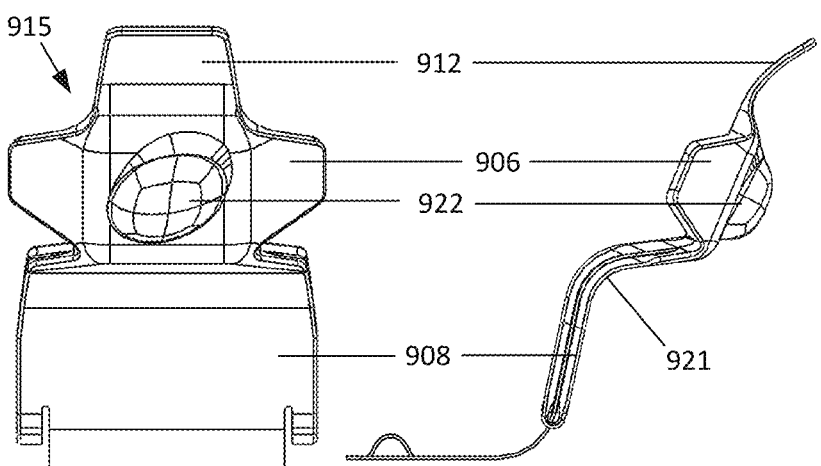
*Fig. 9B*
Front View
*Fig. 9C*
Side View
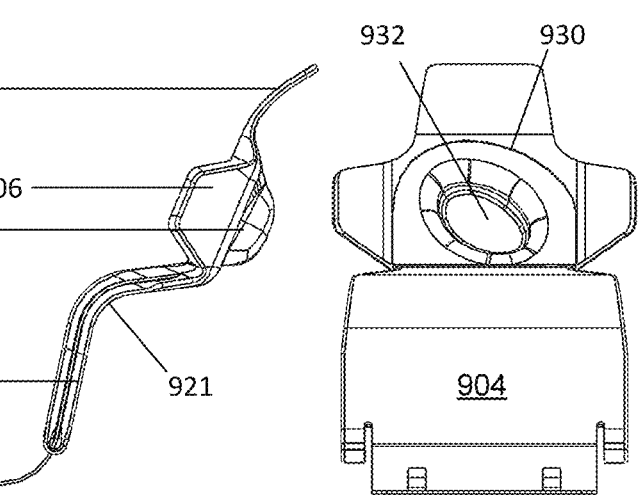
*Fig. 9D*
Rear View
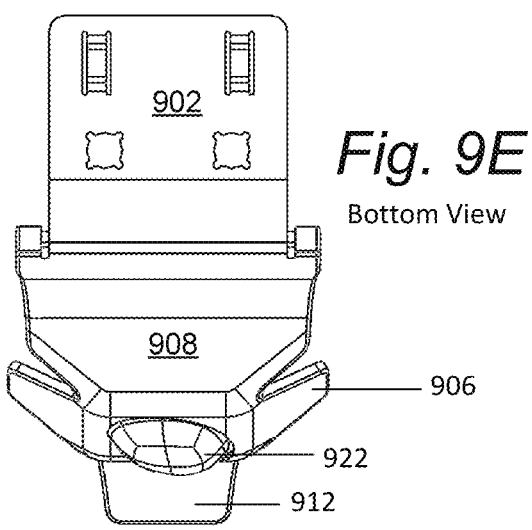
*Fig. 9E*
Bottom View

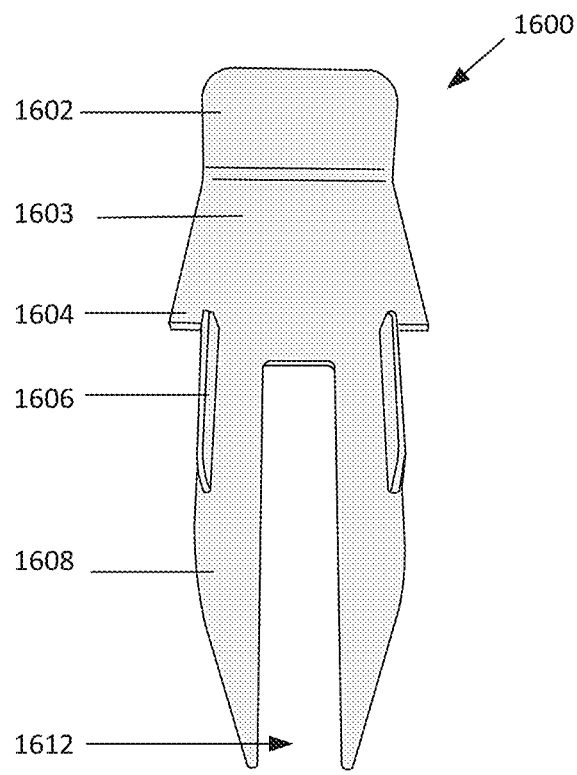
Fig. 16A
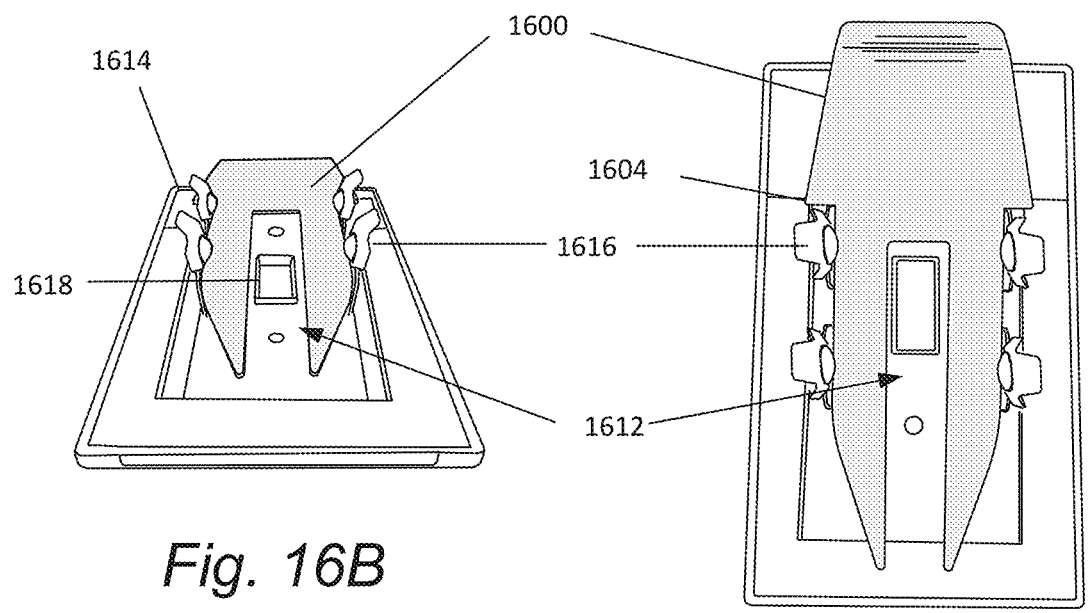
Fig. 16B
Fig. 16C

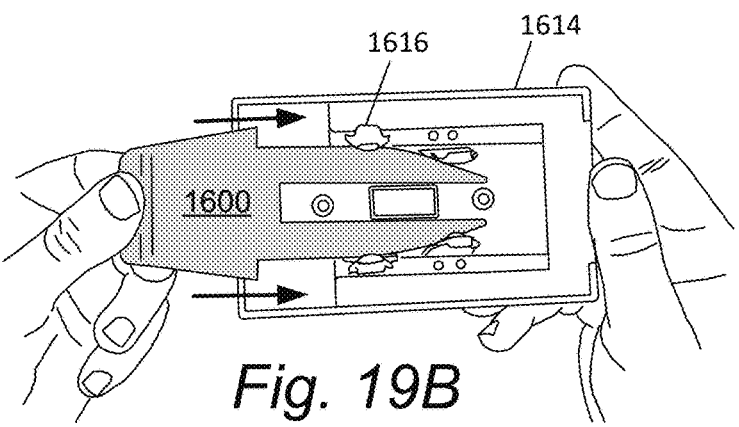
Fig. 19B
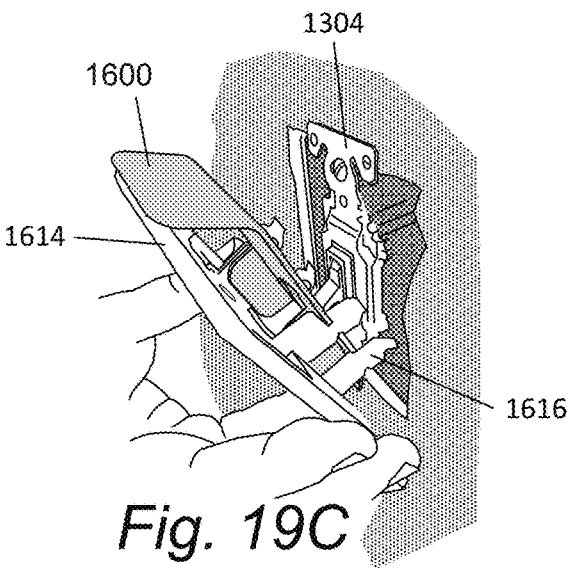
Fig. 19C
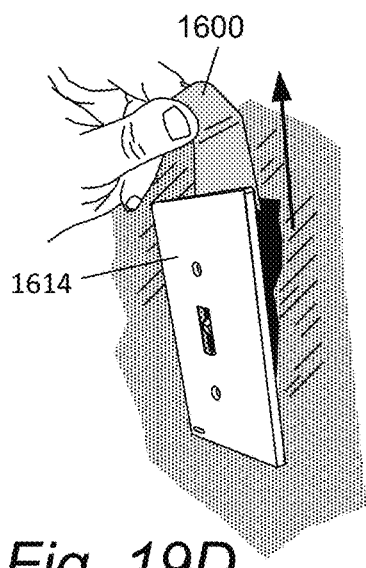
Fig. 19D
Insert install tool between prongs on back of active cover plate
1902
↓
Place active cover plate with install tool over light switch (toggle or décor)
1904
↓
Pull up on install tool to remove it, push the active cover plate over the light switch
1906
↓
Secure active cover plate in place with screw(s)
1908
Fig. 19A

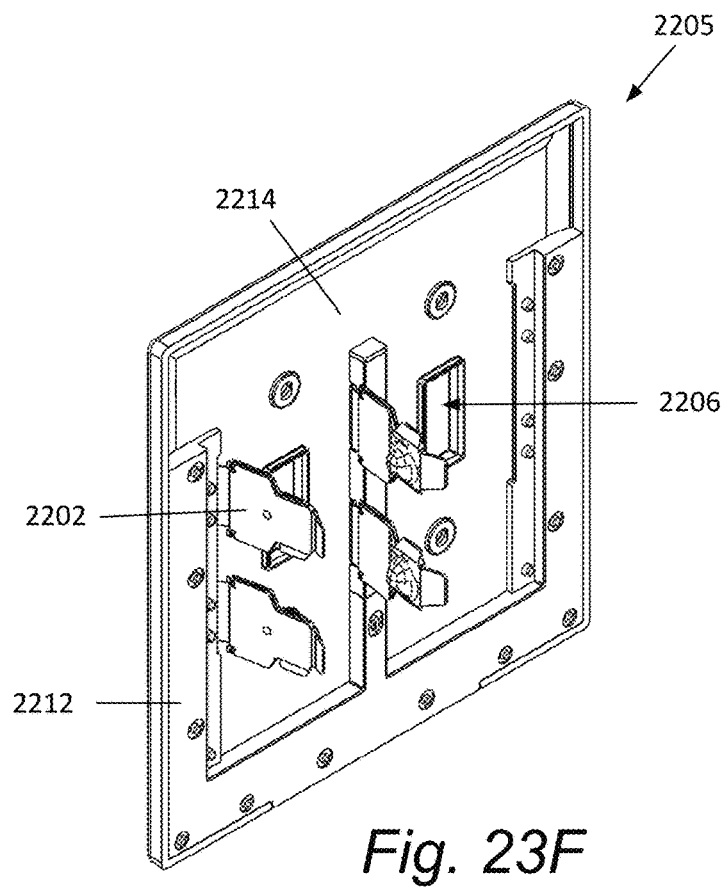
Fig. 23F
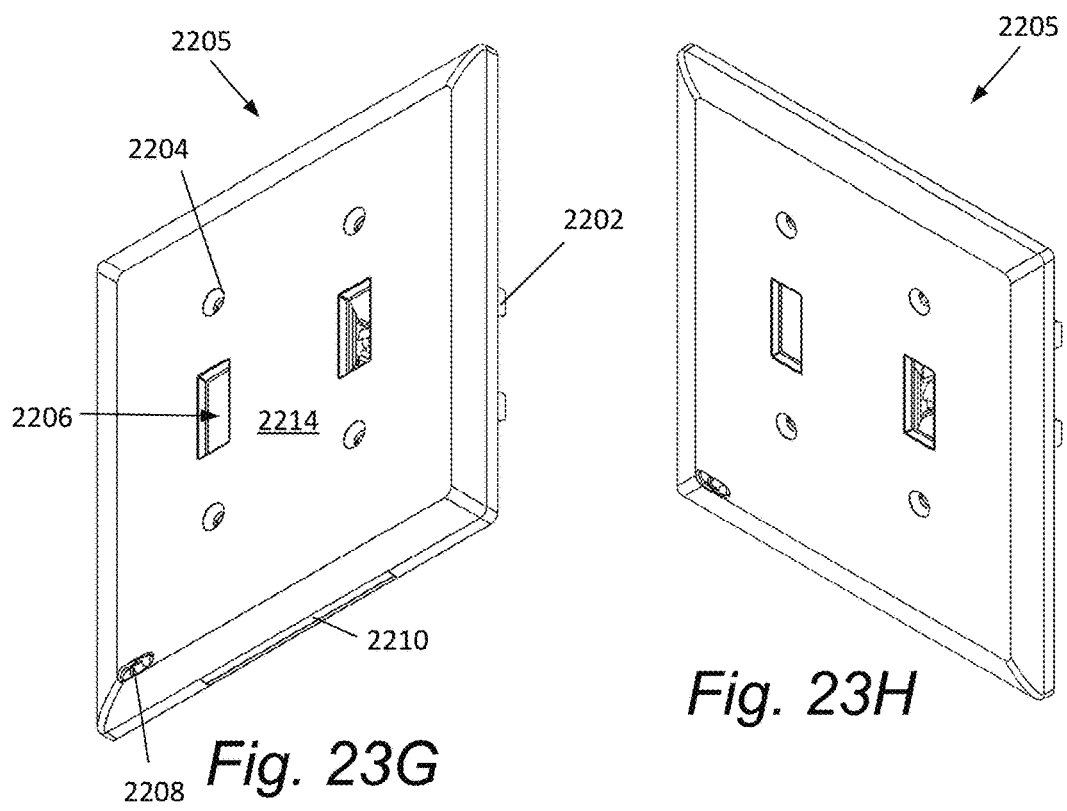
Fig. 23G
Fig. 23H

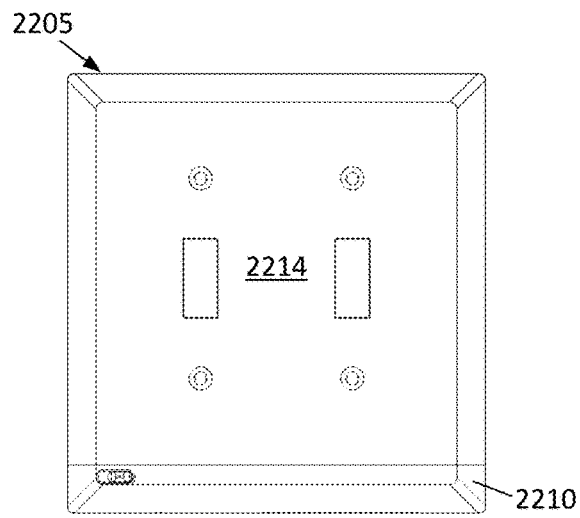
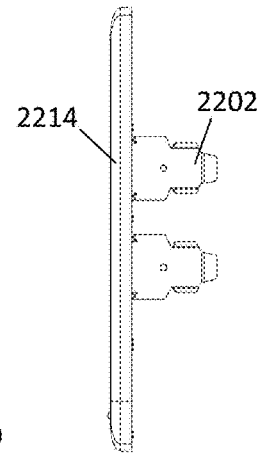
Fig. 24M   Fig. 24N
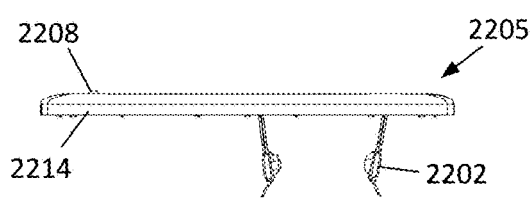
Fig. 24O
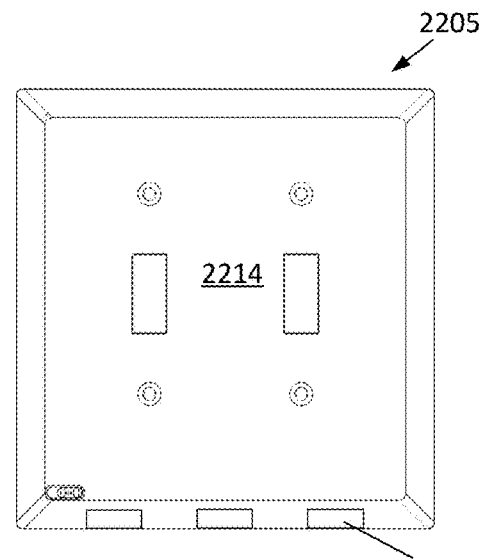
Fig. 24P
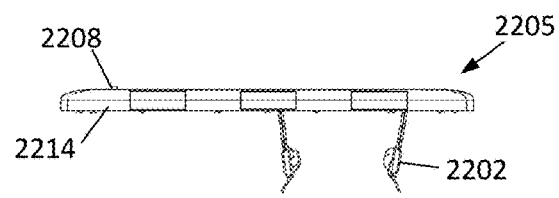
Fig. 24Q

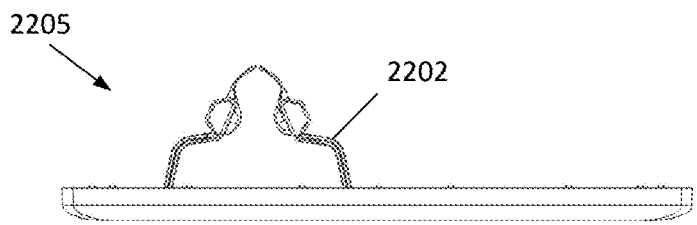
Fig. 25A
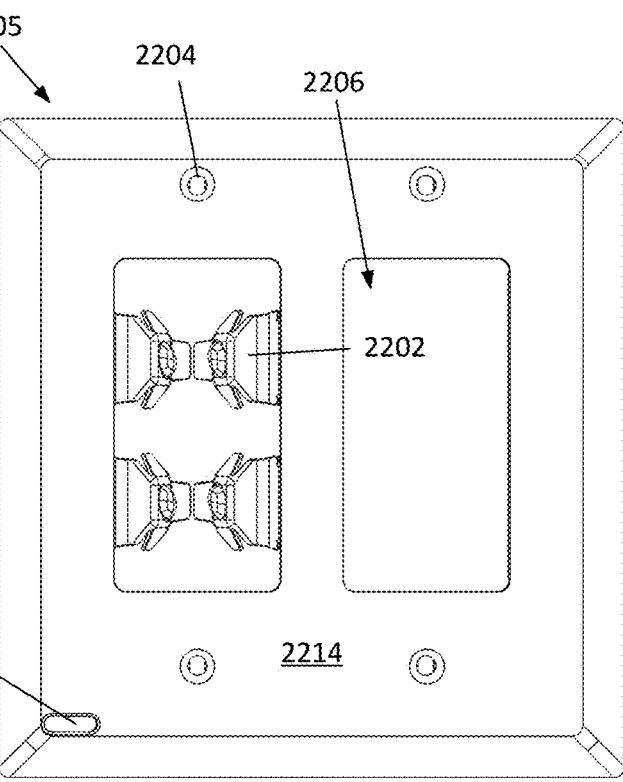
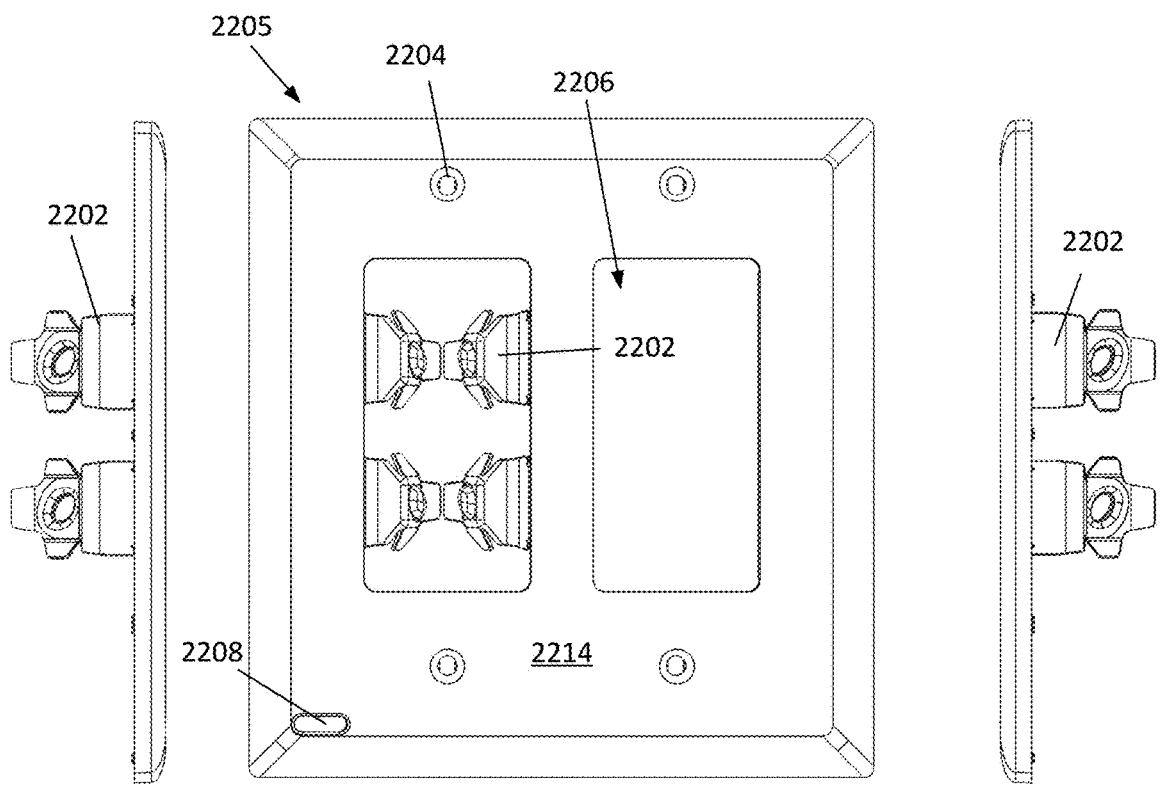
Fig. 25B    Fig. 25C    Fig. 25D
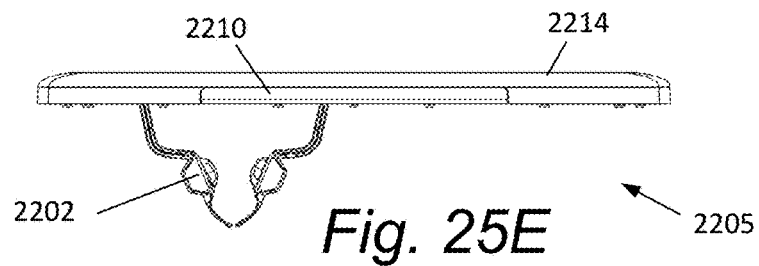
Fig. 25E

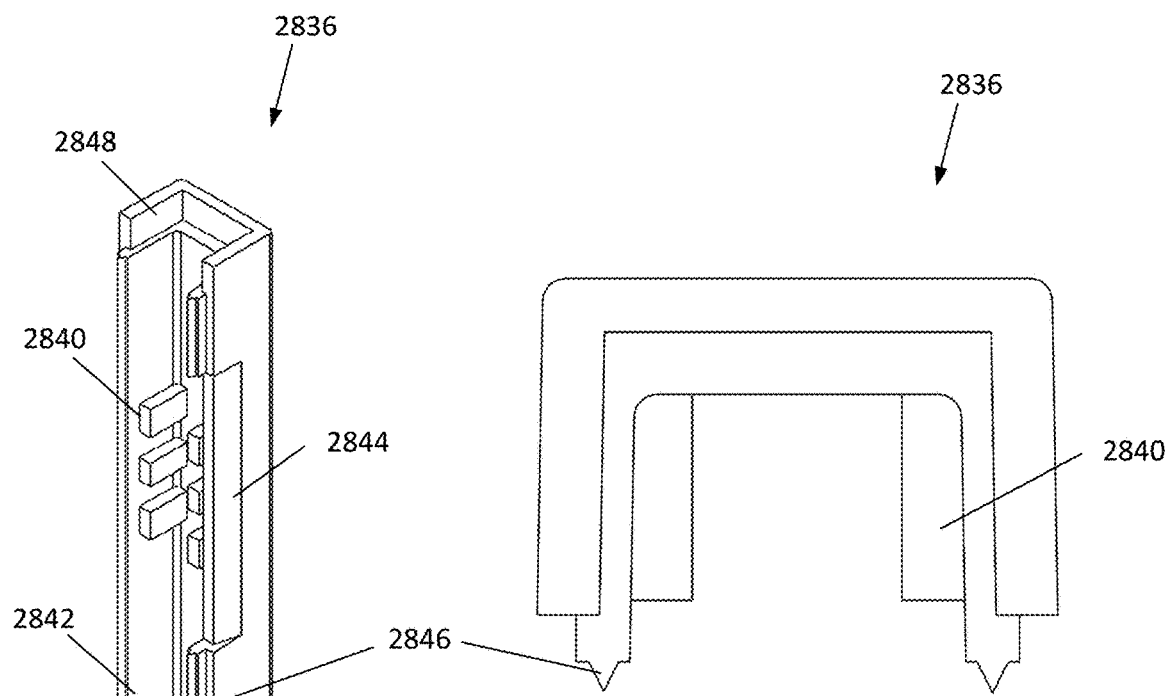
Fig. 28D
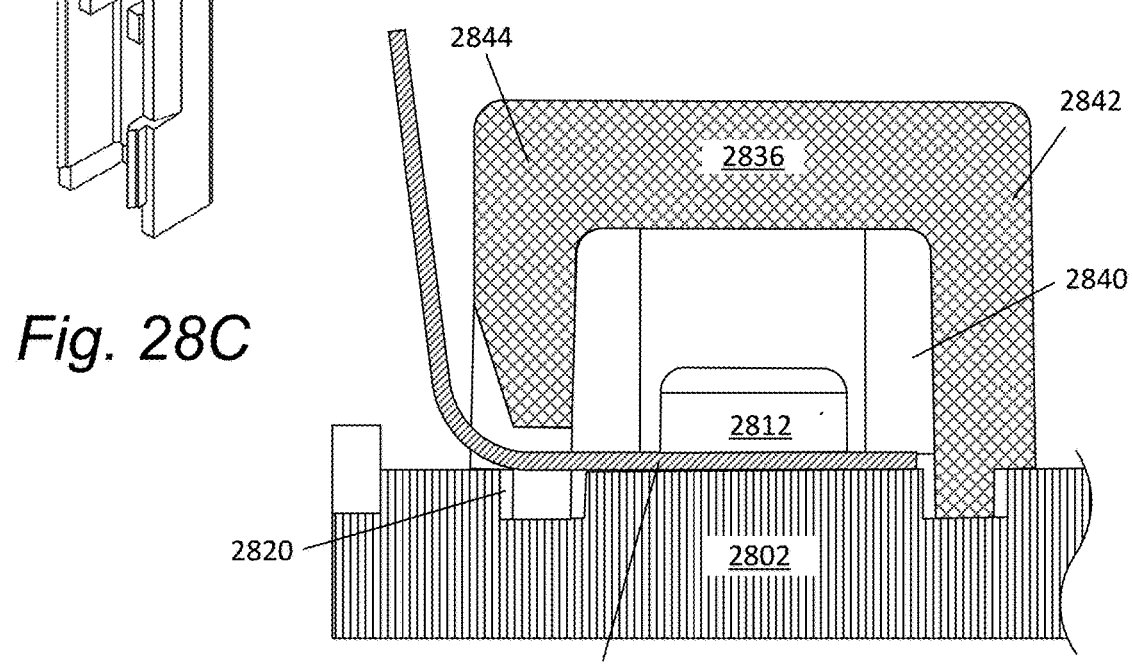
Fig. 28C
Fig. 28E

Section A-A

Section A-A

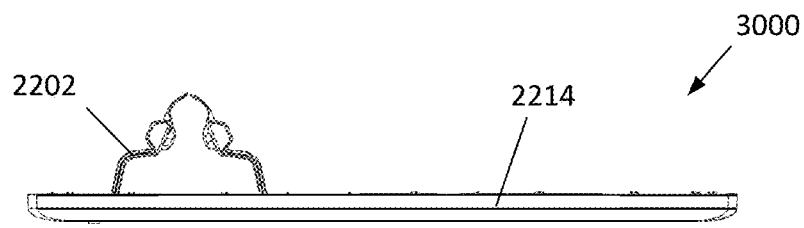
Fig. 30A
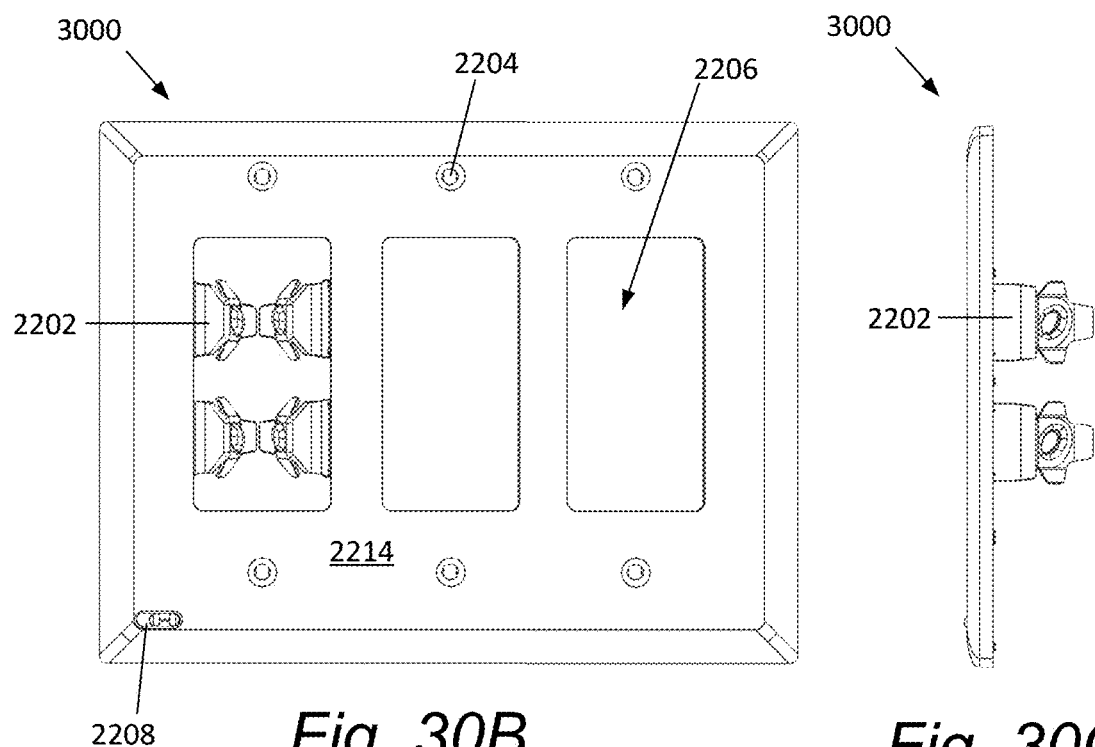
Fig. 30B
Fig. 30C
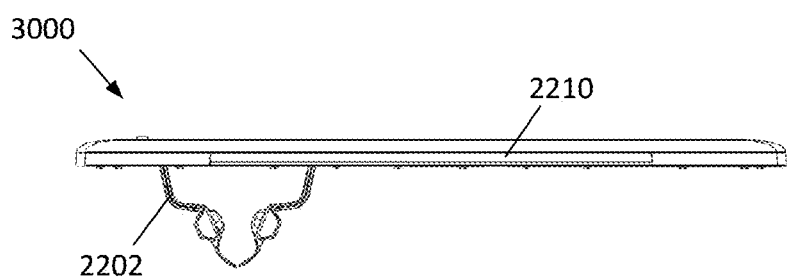
Fig. 30D

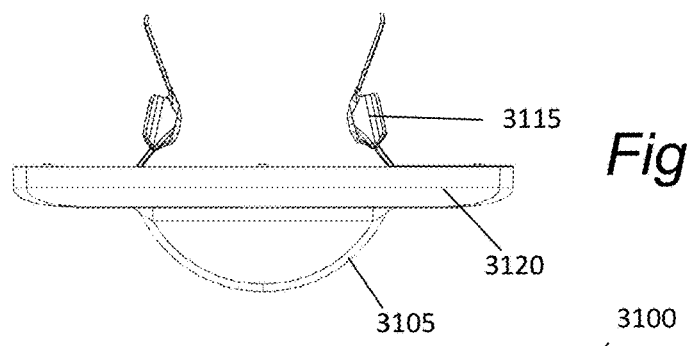
*Fig. 31A*
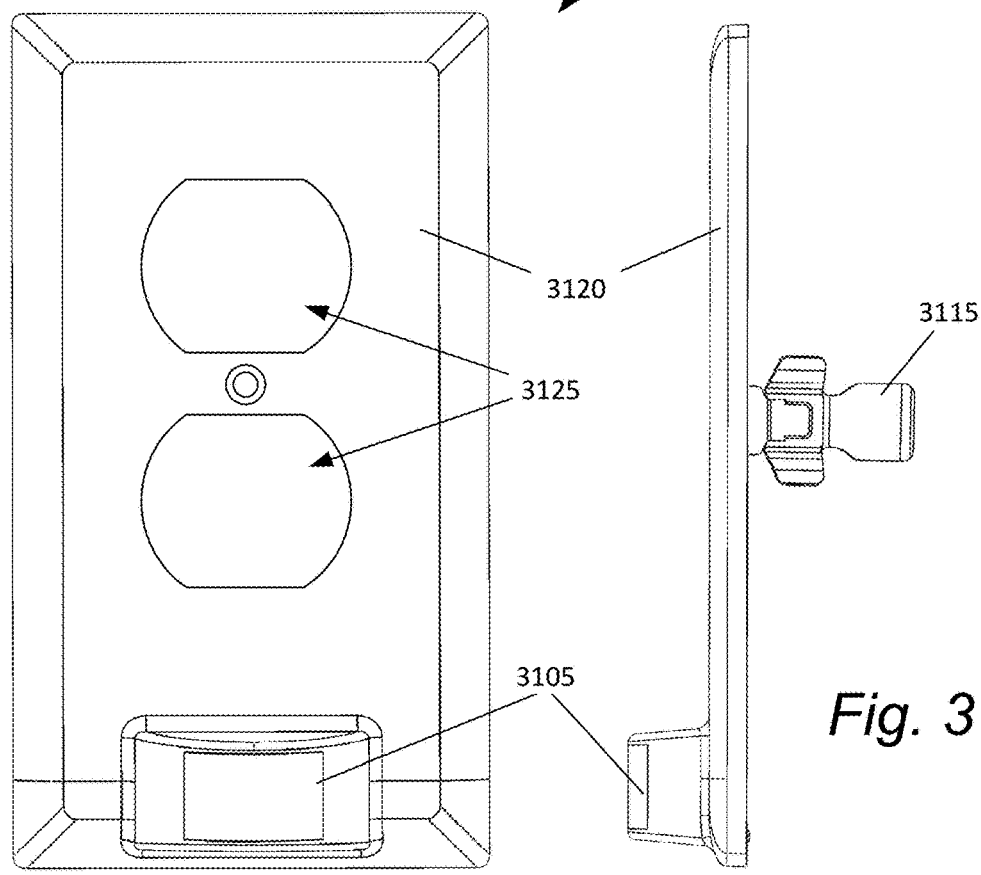
*Fig. 31B*
*Fig. 31C*
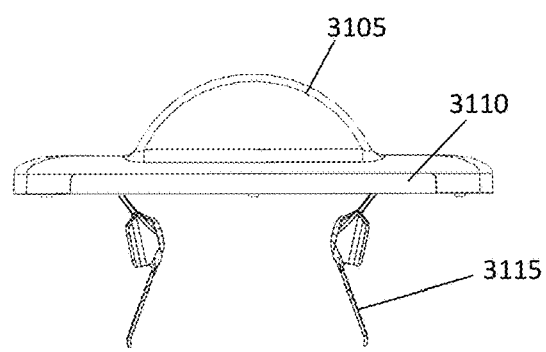
*Fig. 31D*

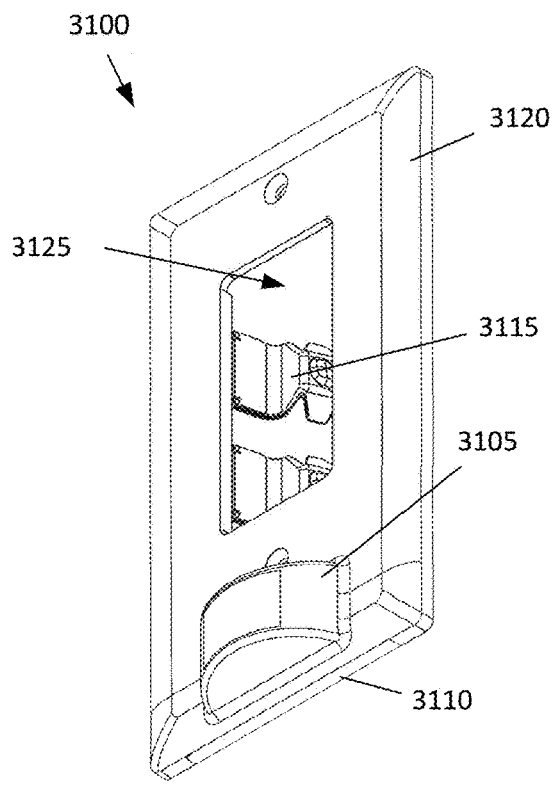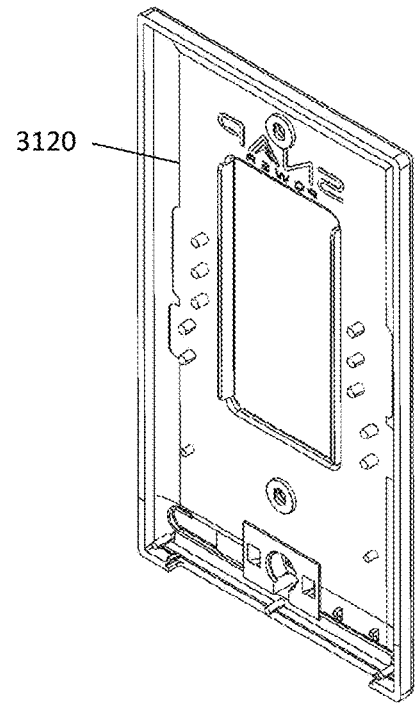
*Fig. 31E*  *Fig. 31F*
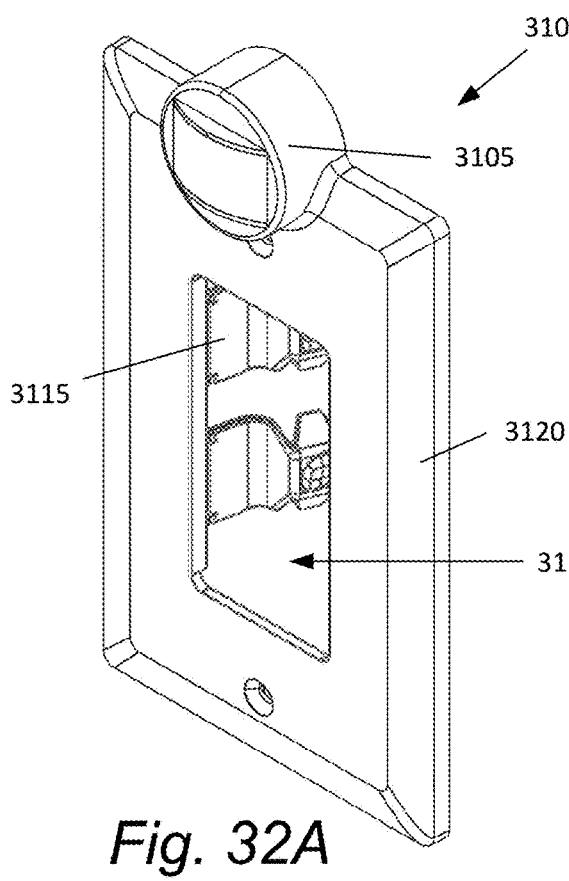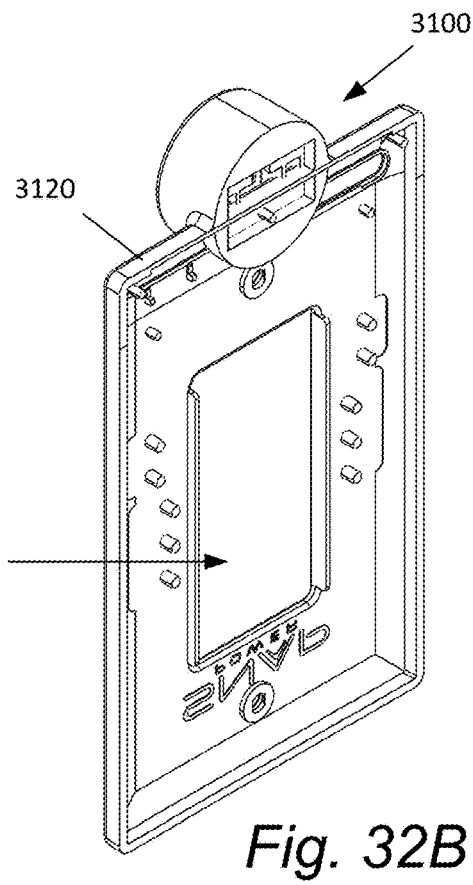
*Fig. 32A*  *Fig. 32B*

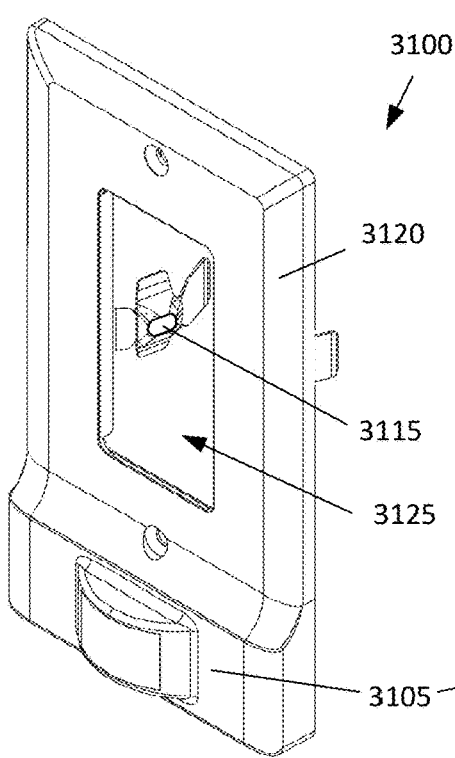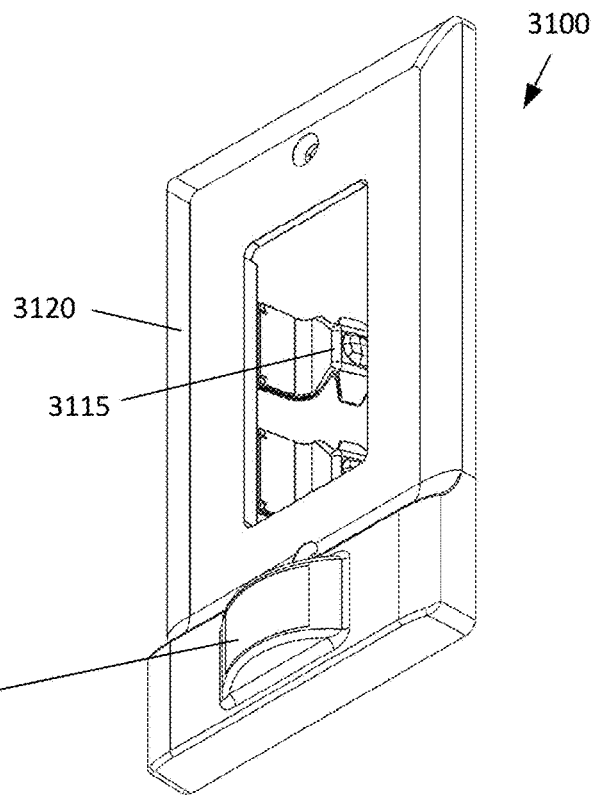
*Fig. 33E*  *Fig. 33F*
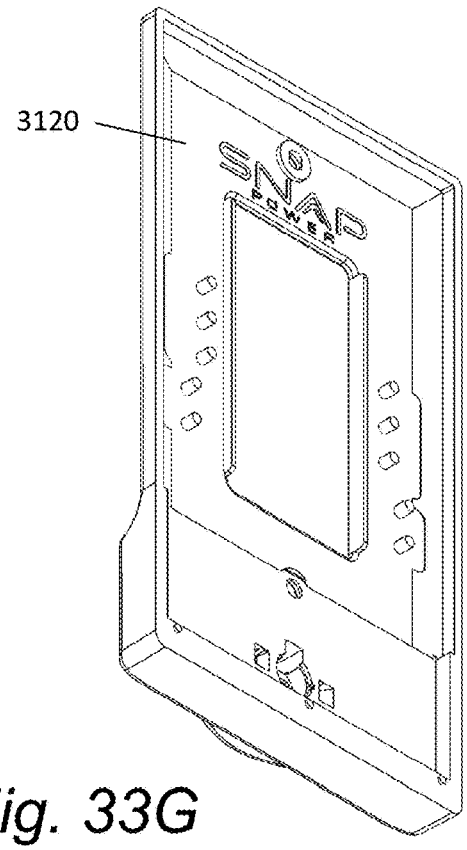
*Fig. 33G*

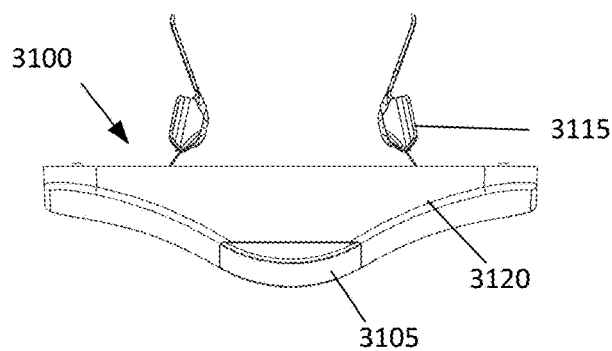
*Fig. 34A*
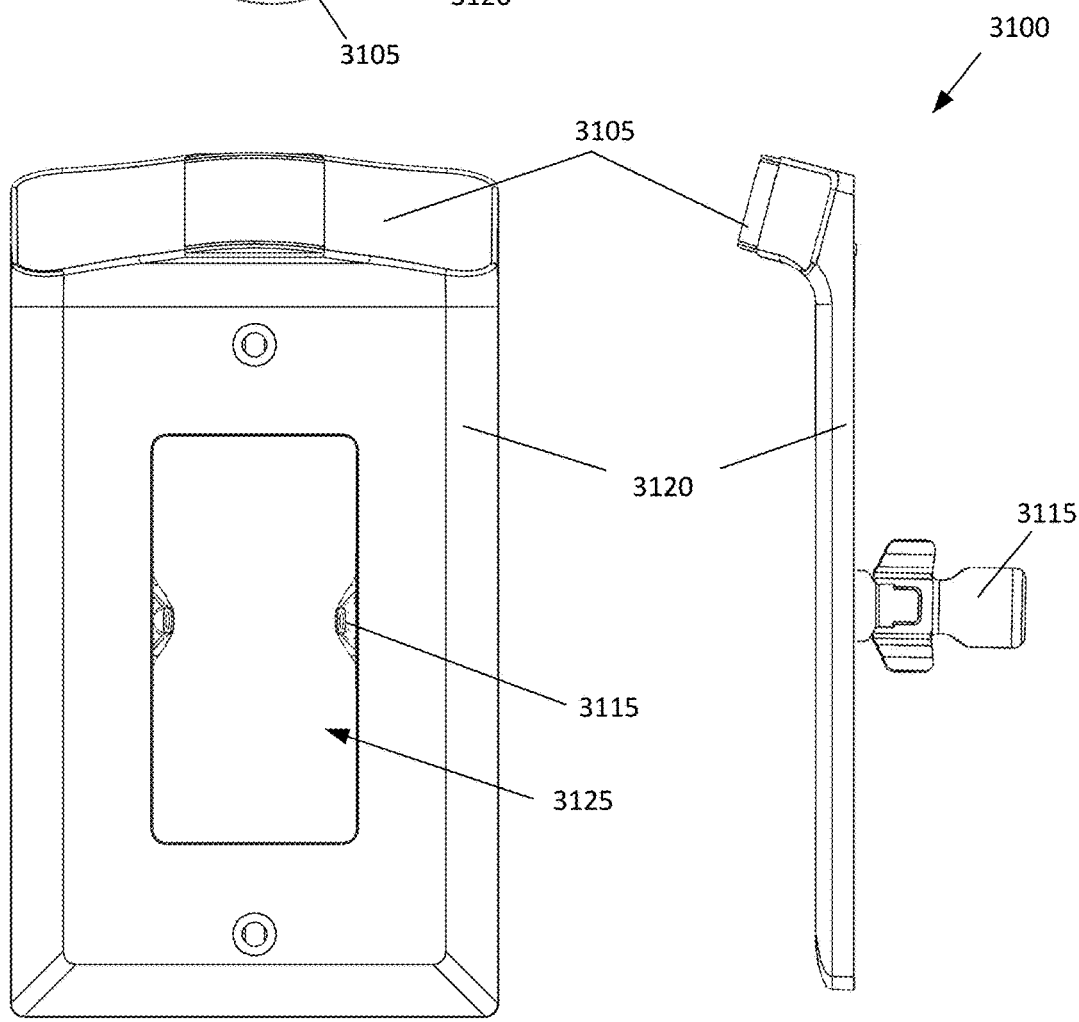
*Fig. 34B*  *Fig. 34C*
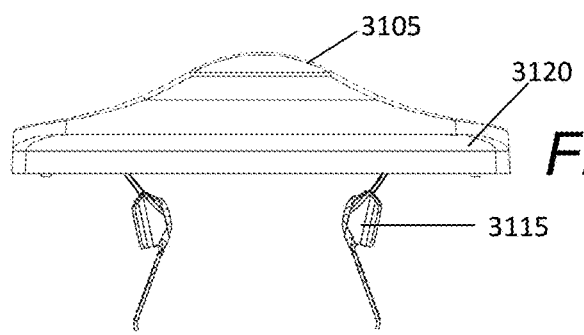
*Fig. 34D*

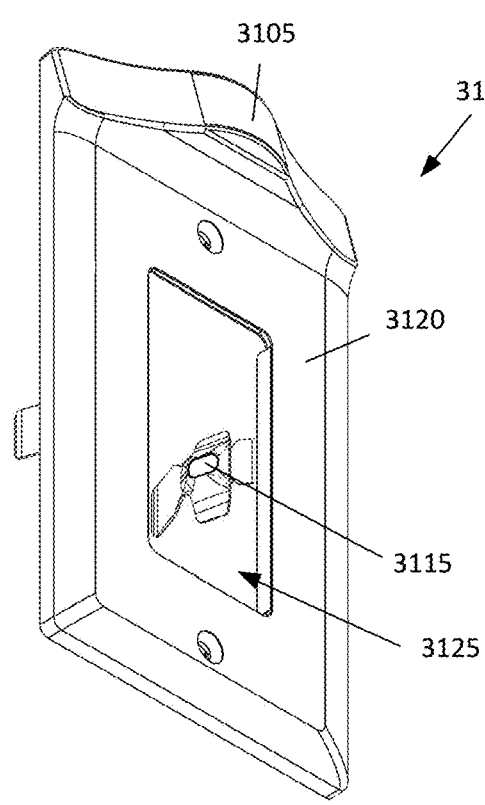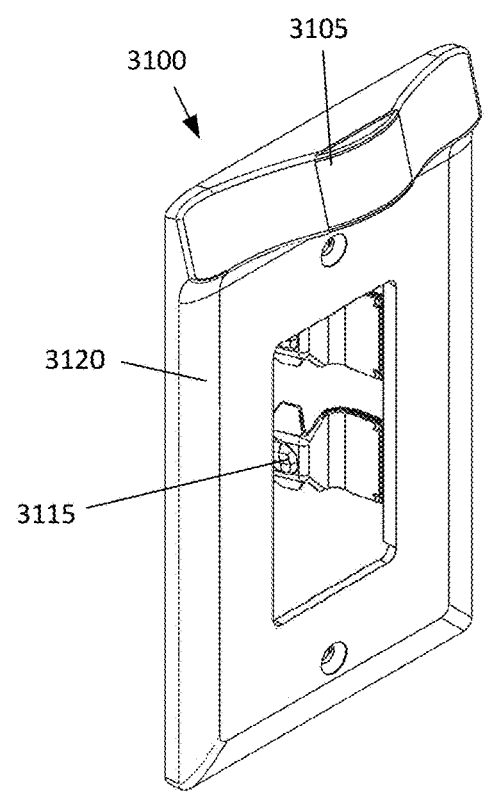
Fig. 34E
Fig. 34F
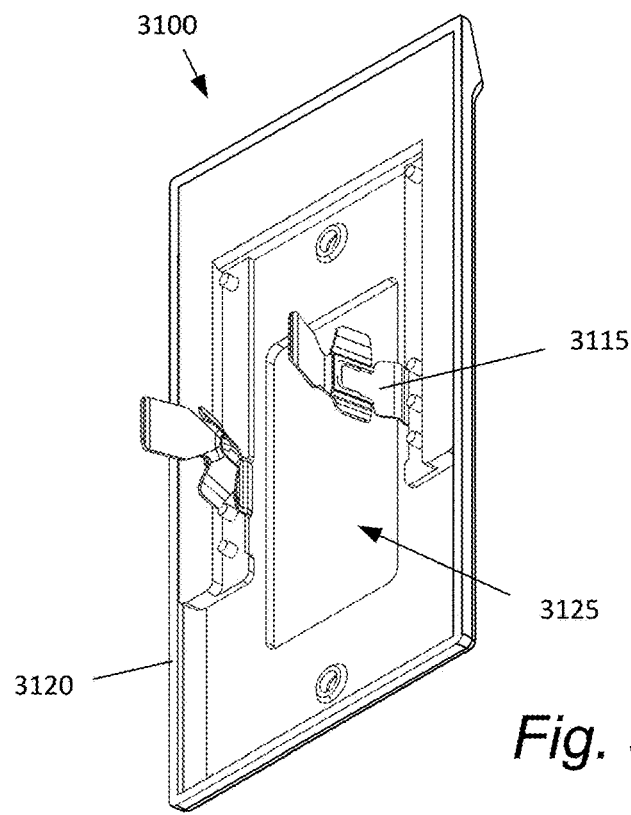
Fig. 34G

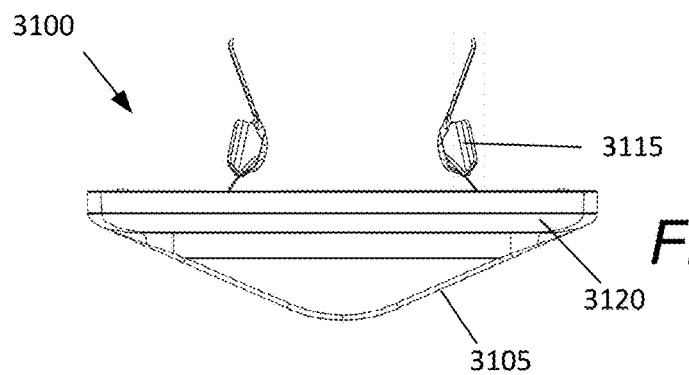
Fig. 35A
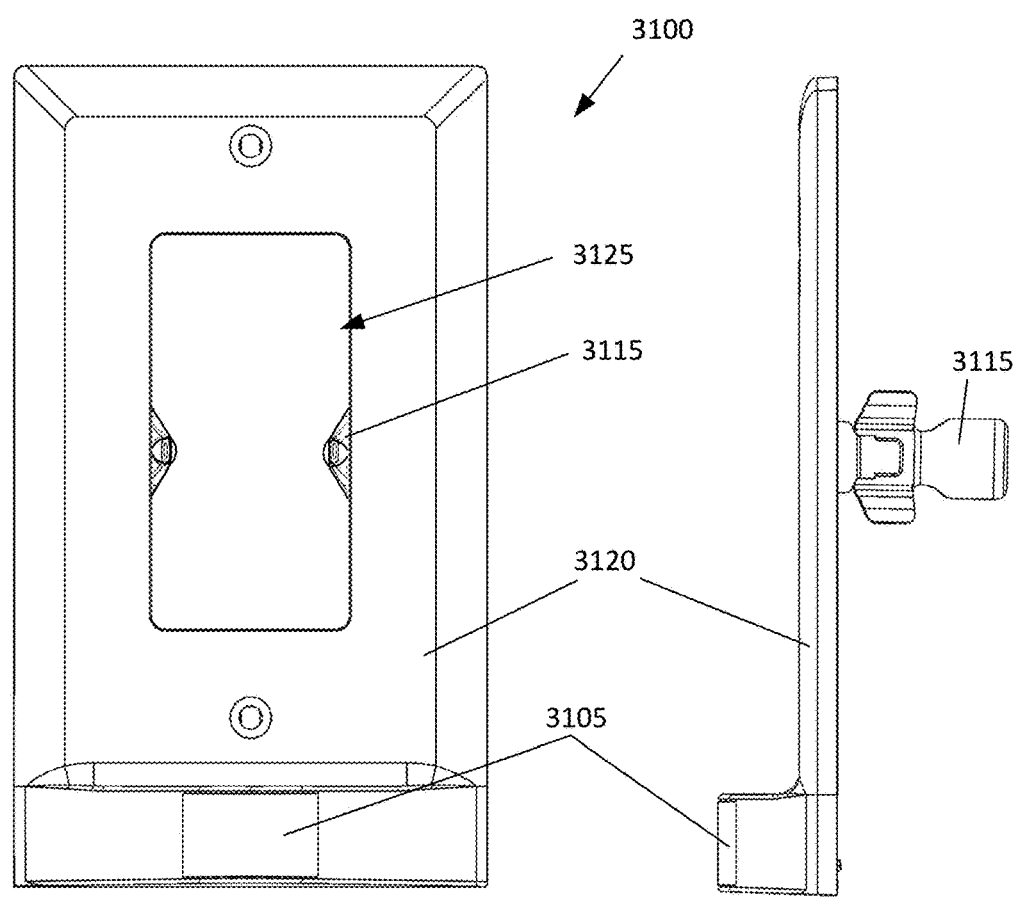
Fig. 35B
Fig. 35C
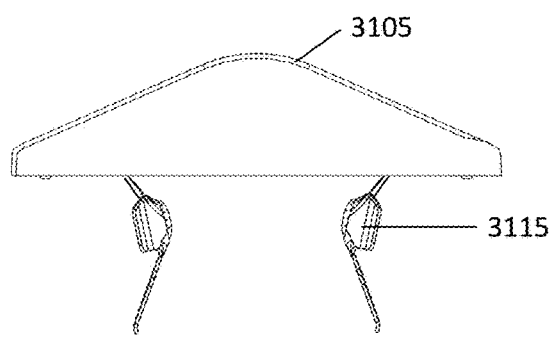
Fig. 35D

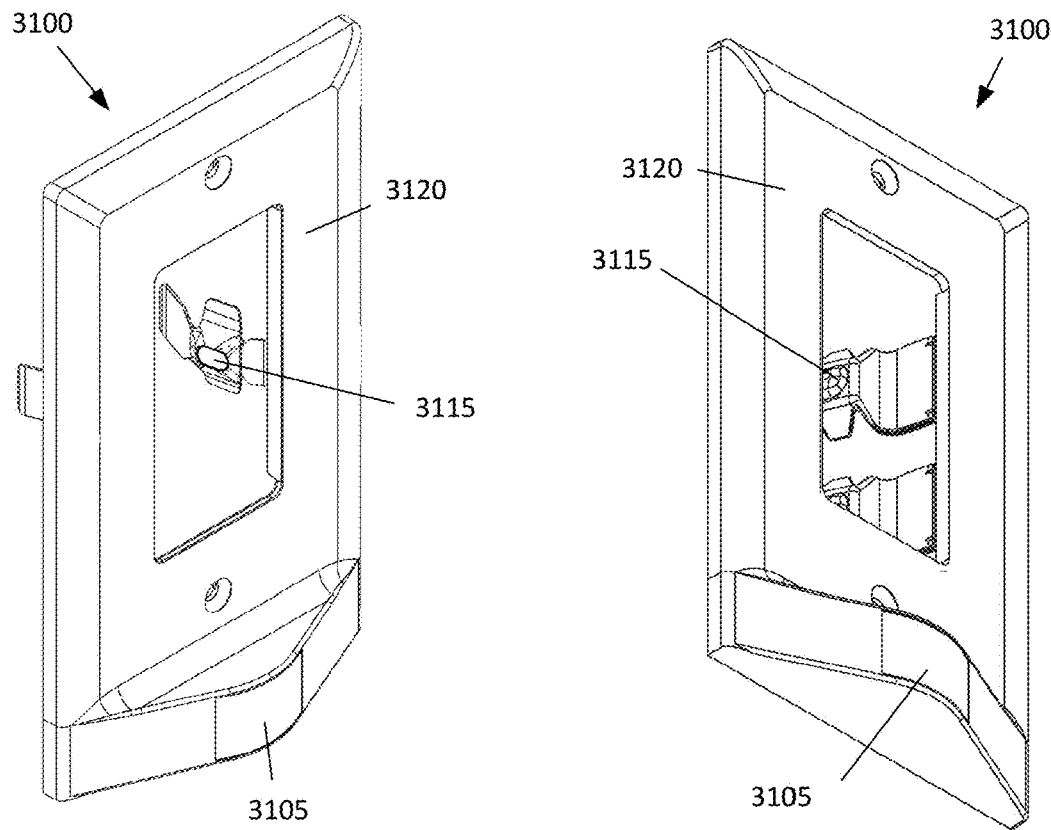
Fig. 35E
Fig. 35F
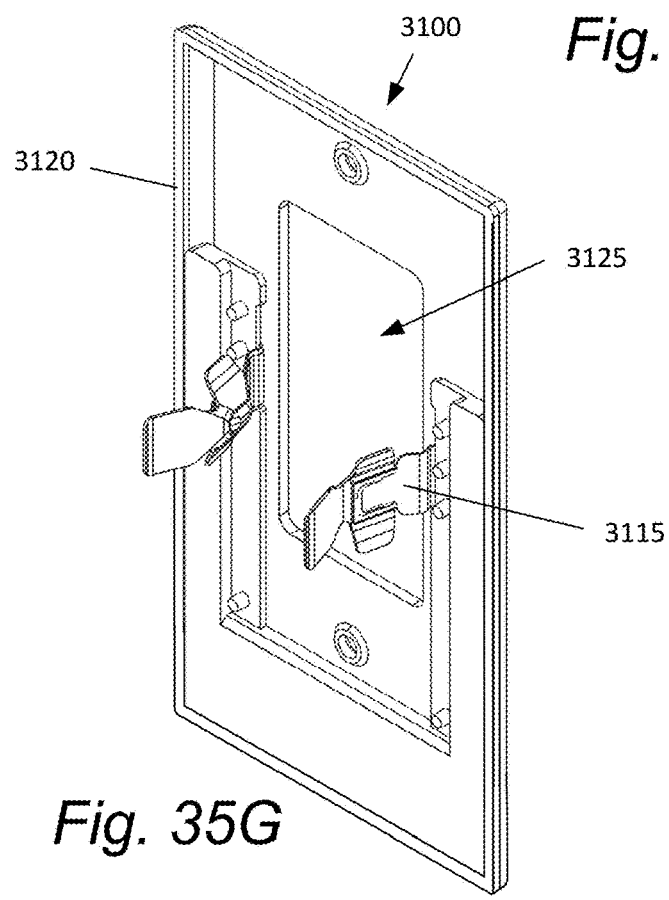
Fig. 35G

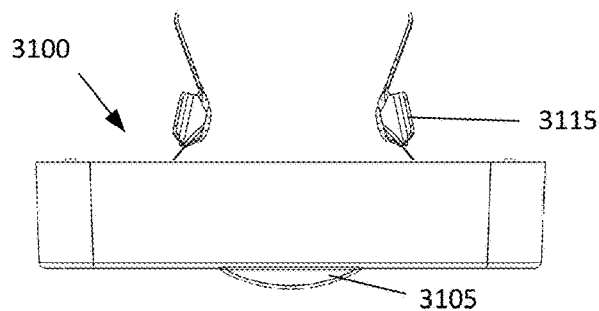
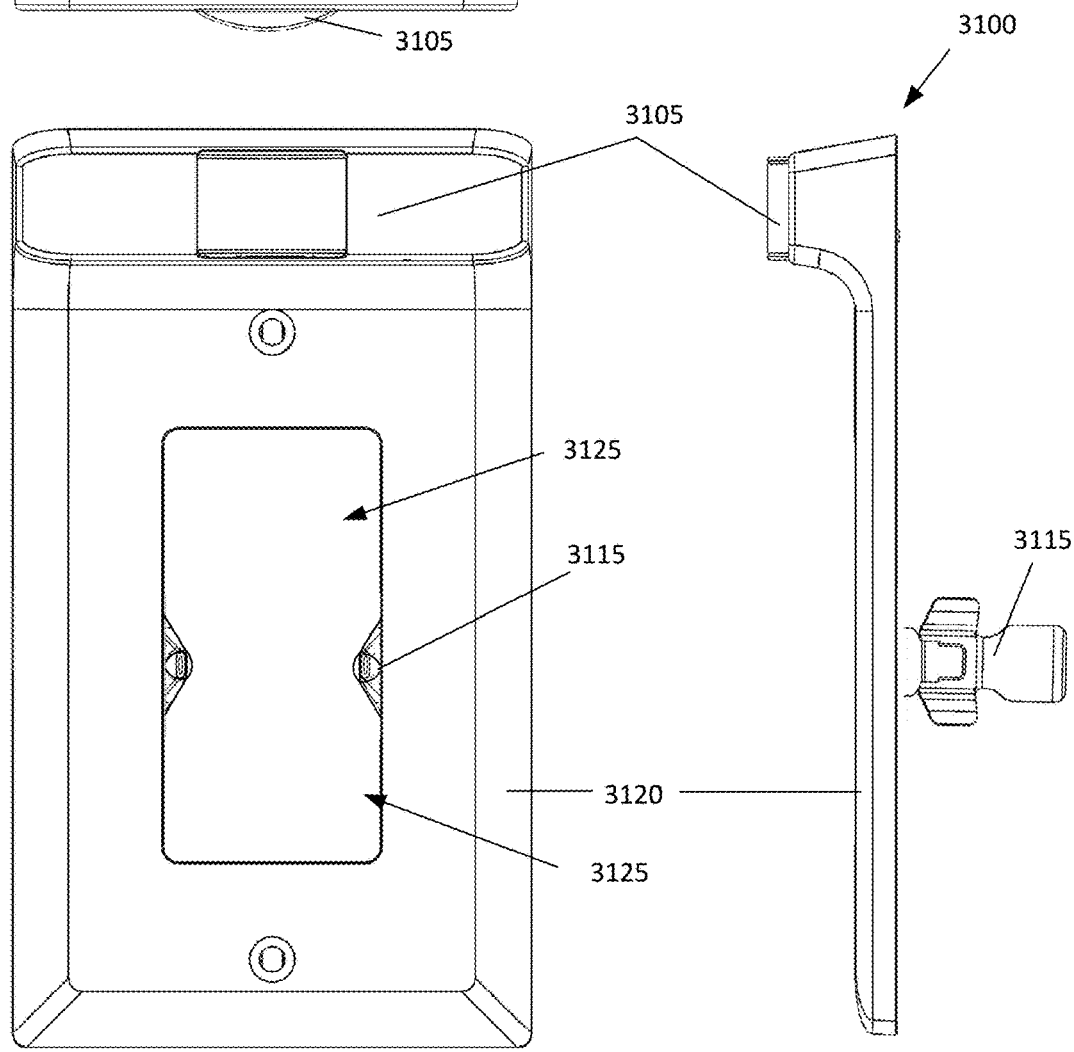
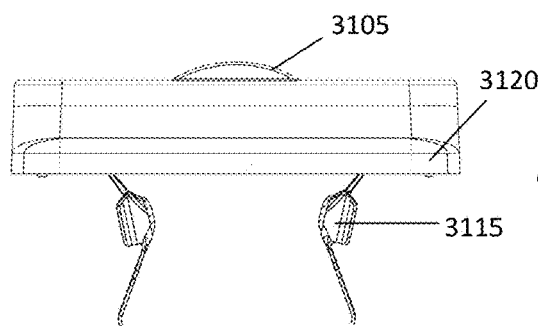
Fig. 36A
Fig. 36B
Fig. 36C
Fig. 36D

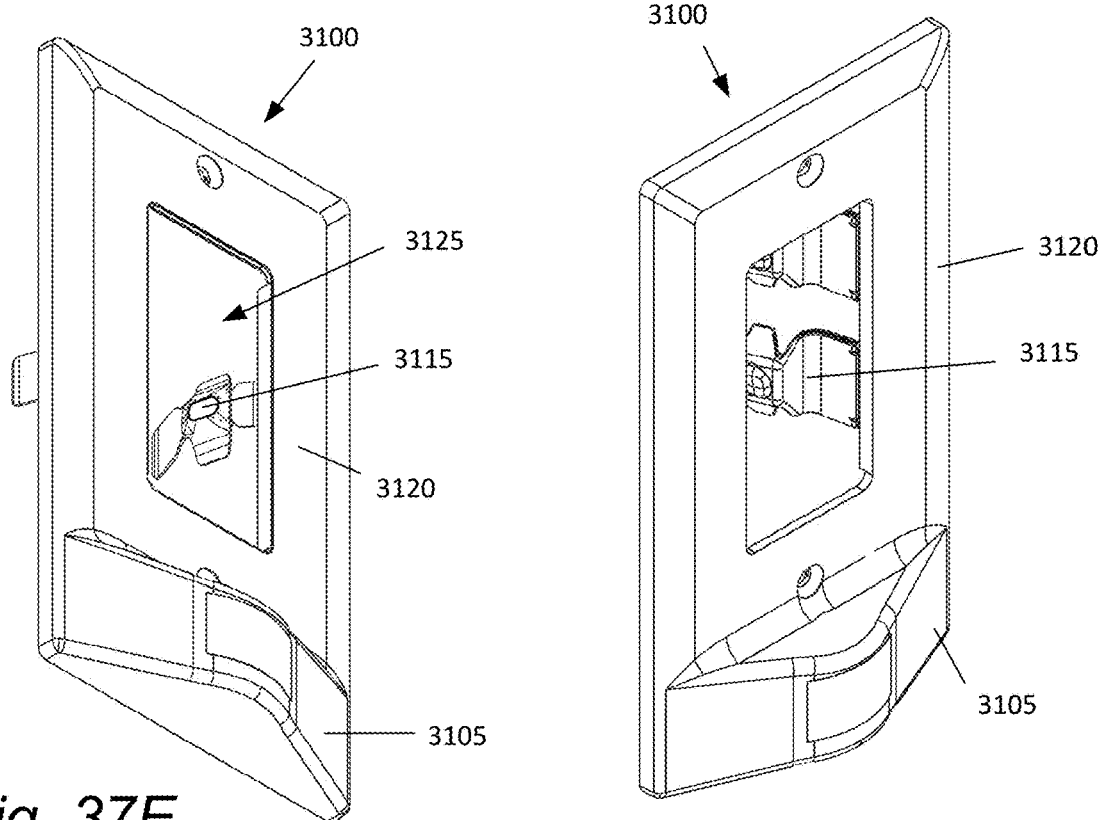
*Fig. 37E*
*Fig. 37F*
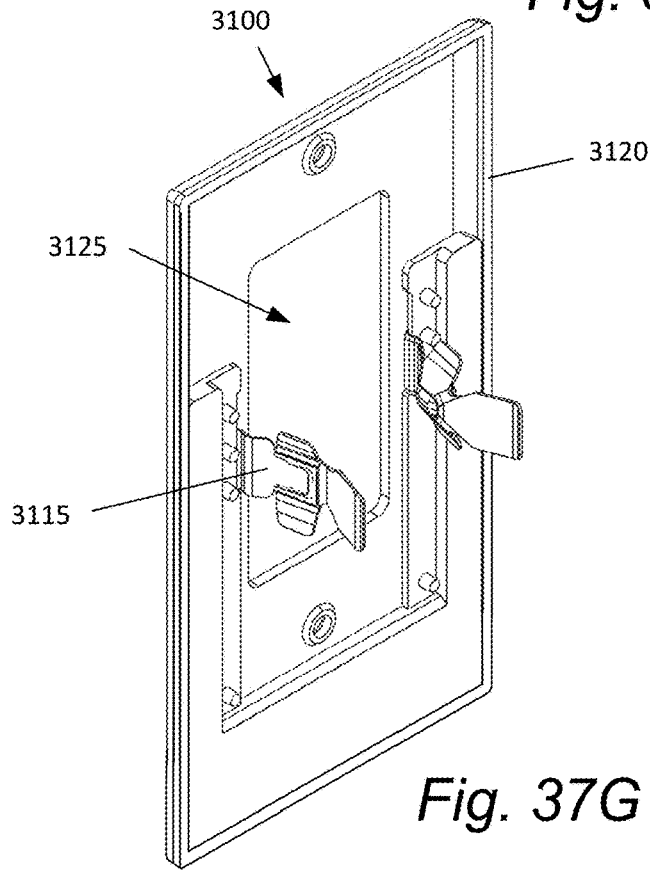
*Fig. 37G*

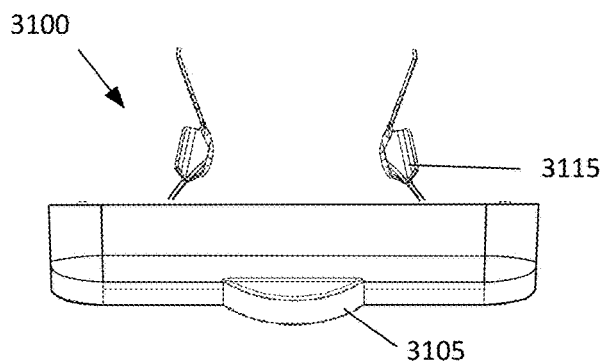
*Fig. 38A*
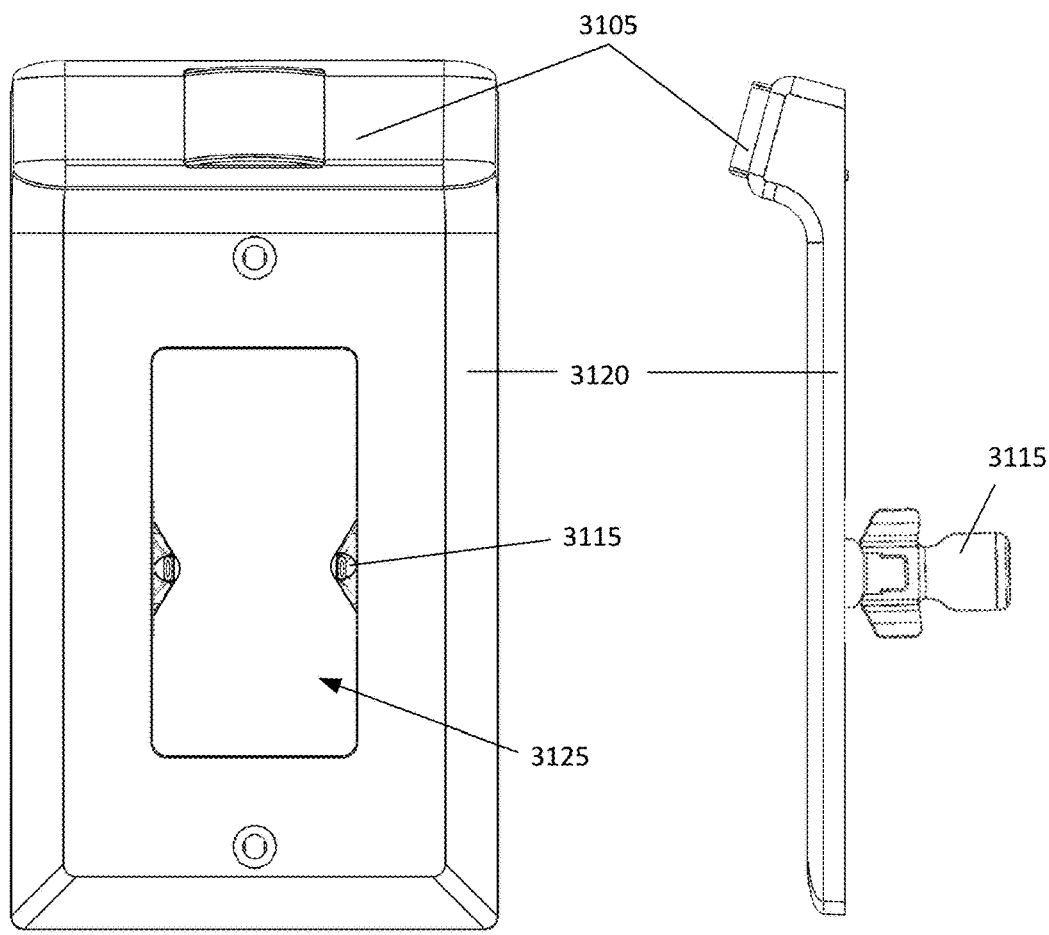
*Fig. 38B*     *Fig. 38C*
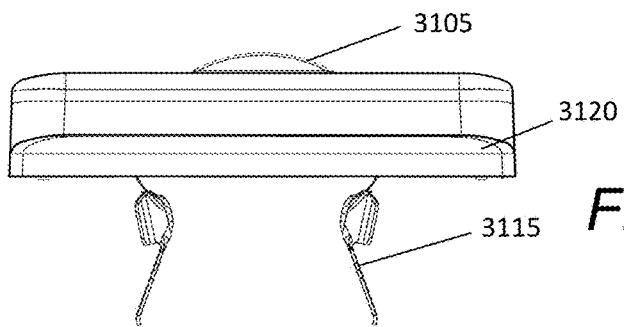
*Fig. 38D*

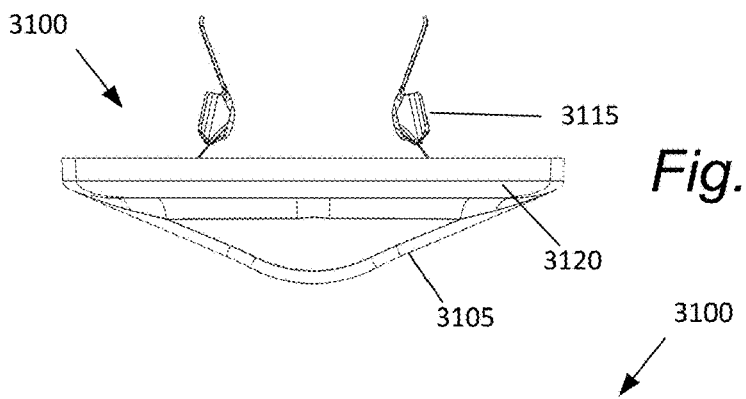
Fig. 39A
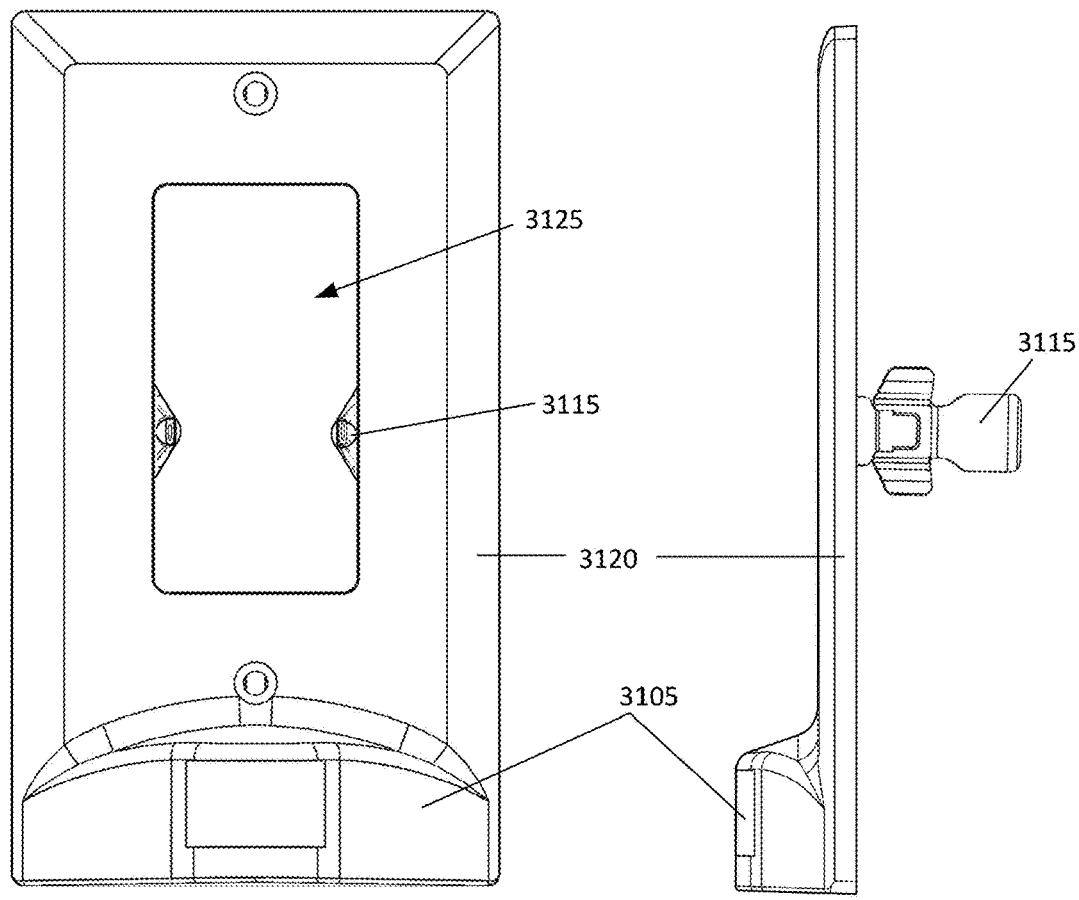
Fig. 39B
Fig. 39C
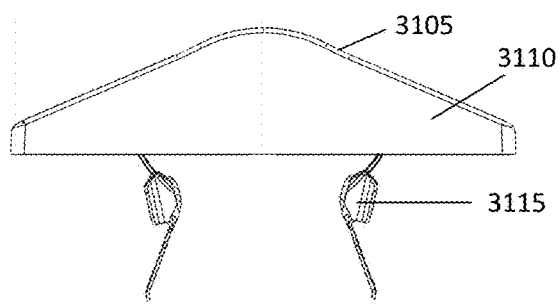
Fig. 39D

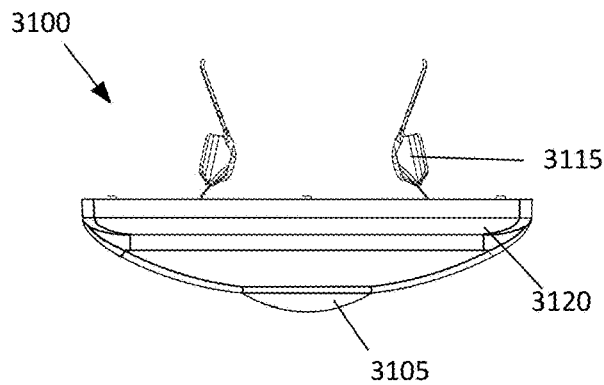
*Fig. 41A*
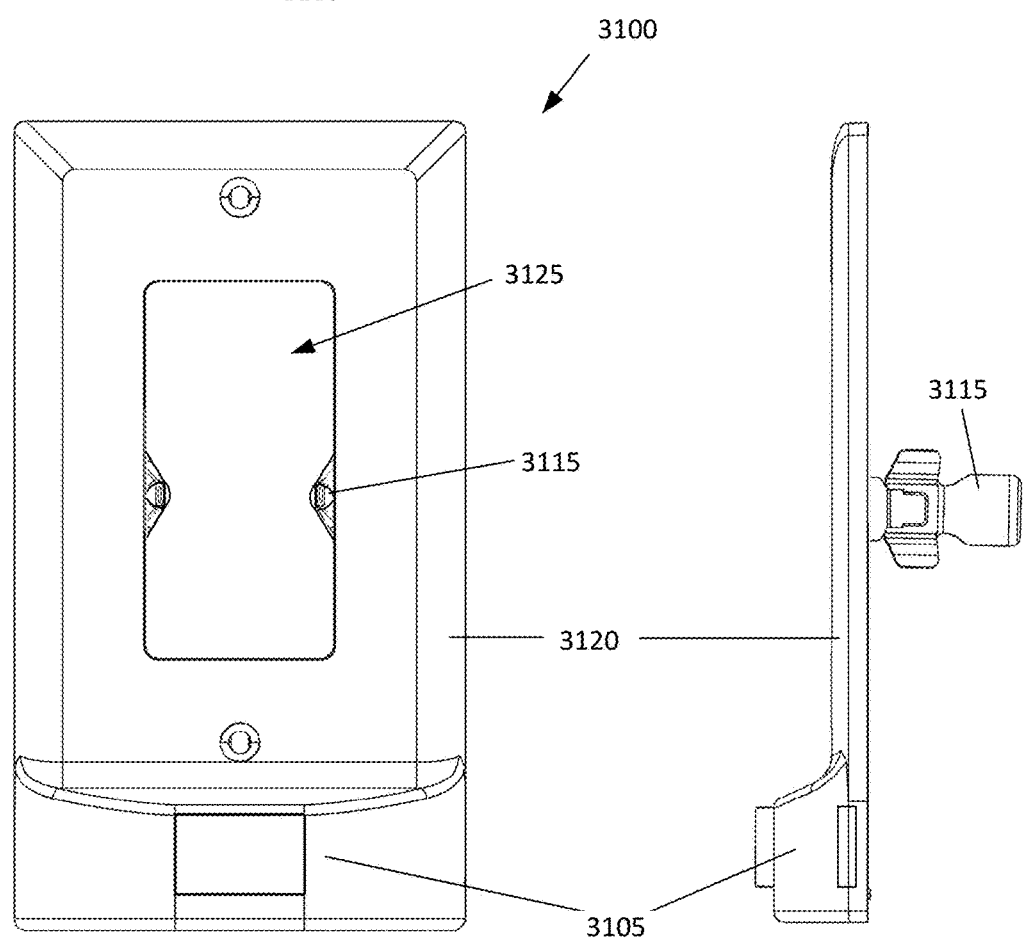
*Fig. 41B*  *Fig. 41C*
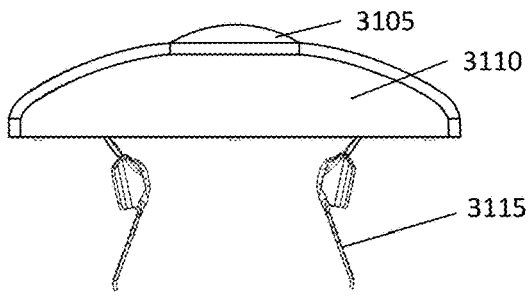
*Fig. 41D*

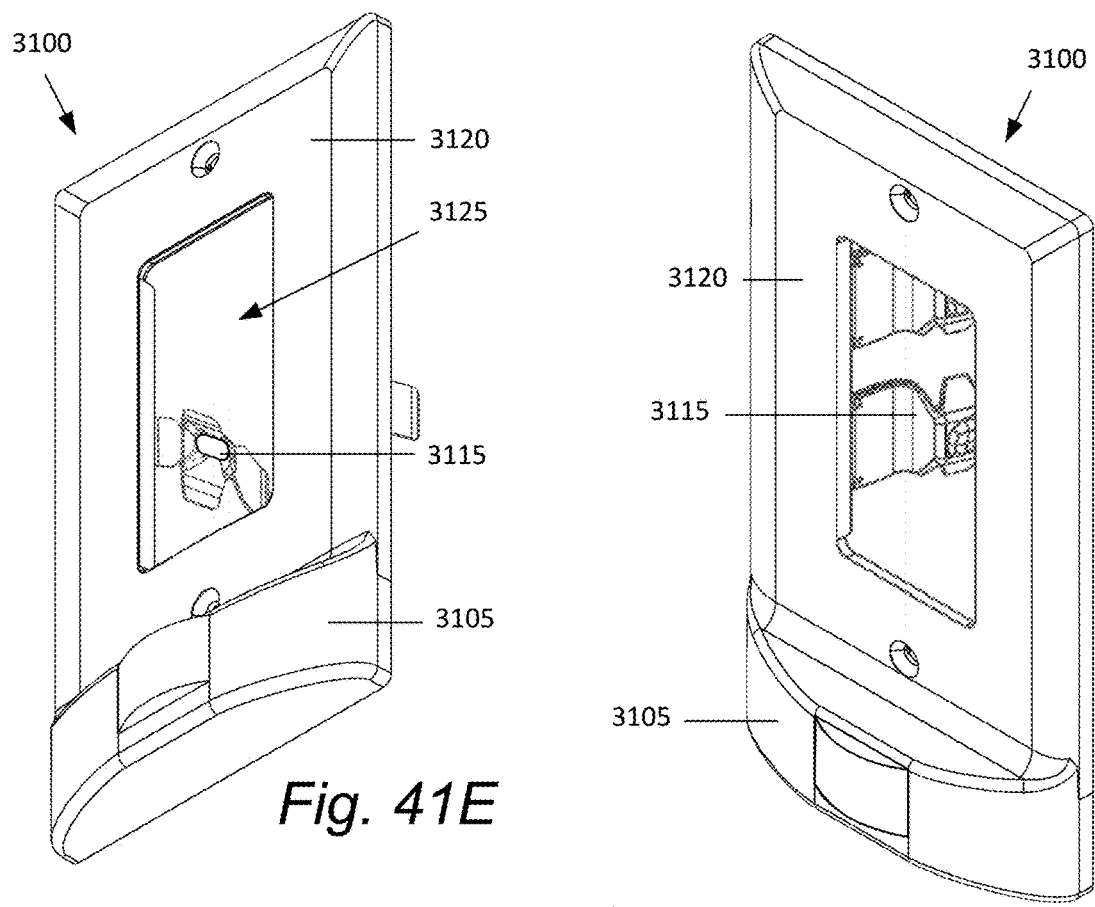
Fig. 41E
Fig. 41F
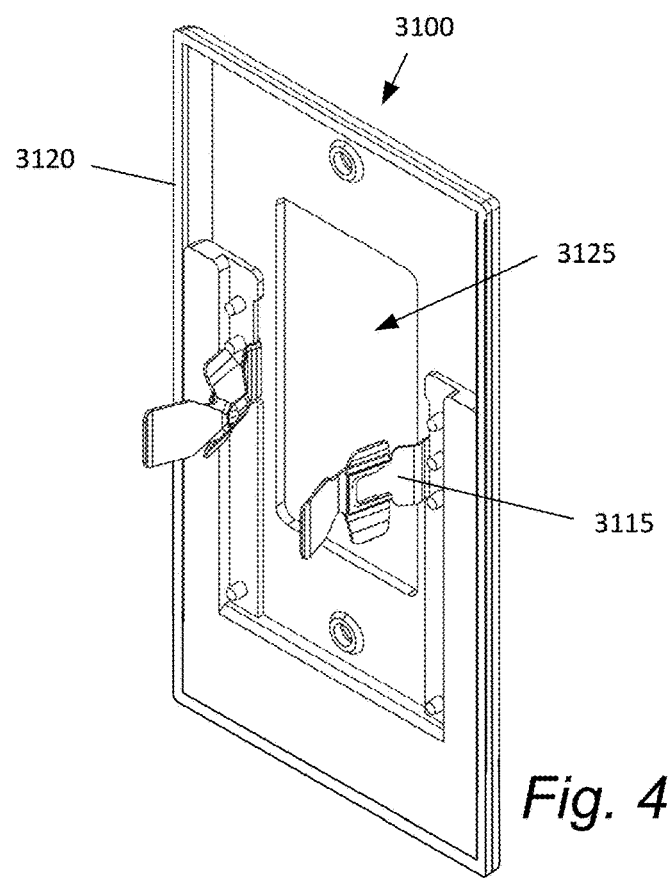
Fig. 41G

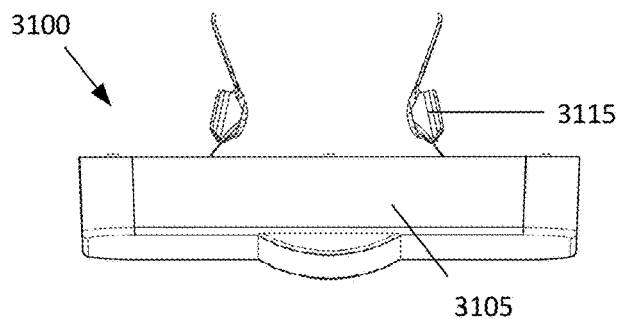
*Fig. 42A*
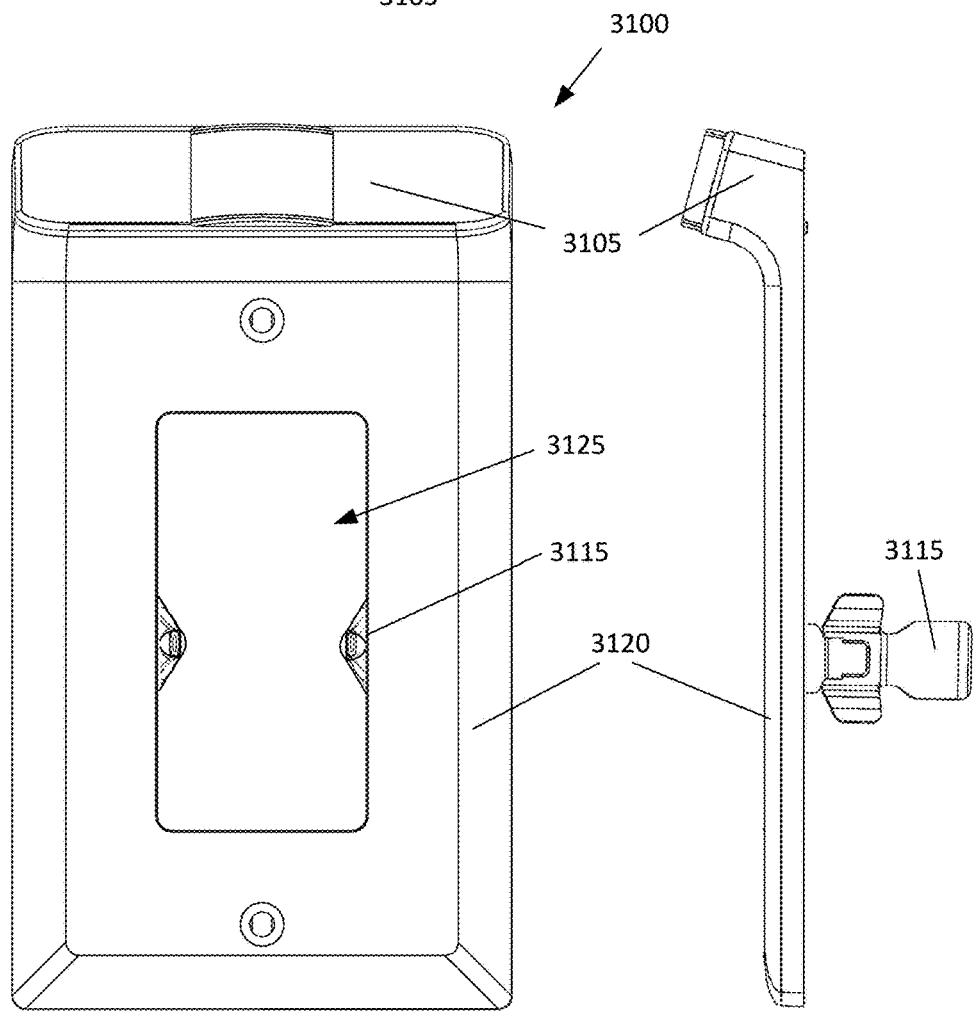
*Fig. 42B*  *Fig. 42C*
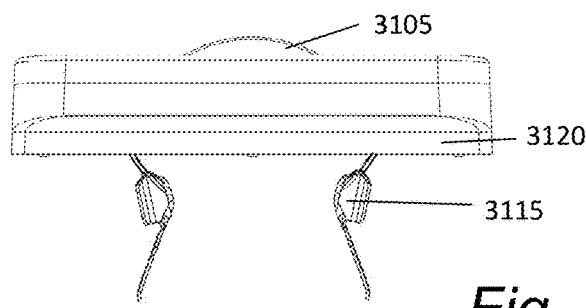
*Fig. 42D*

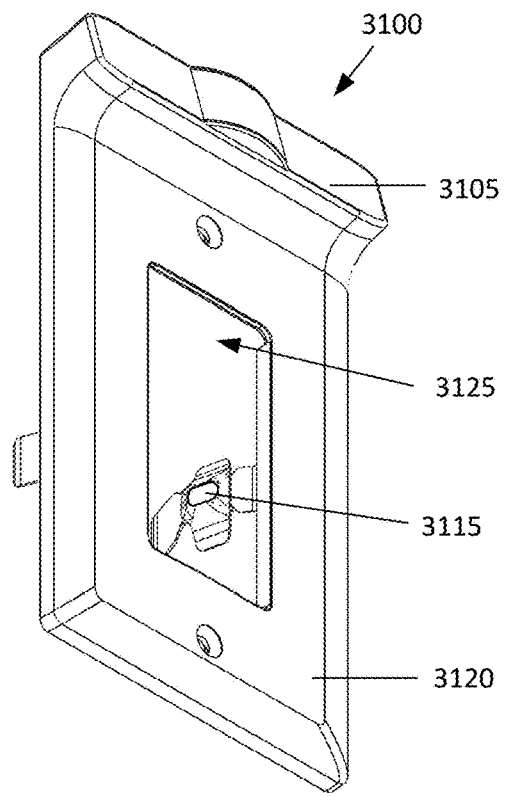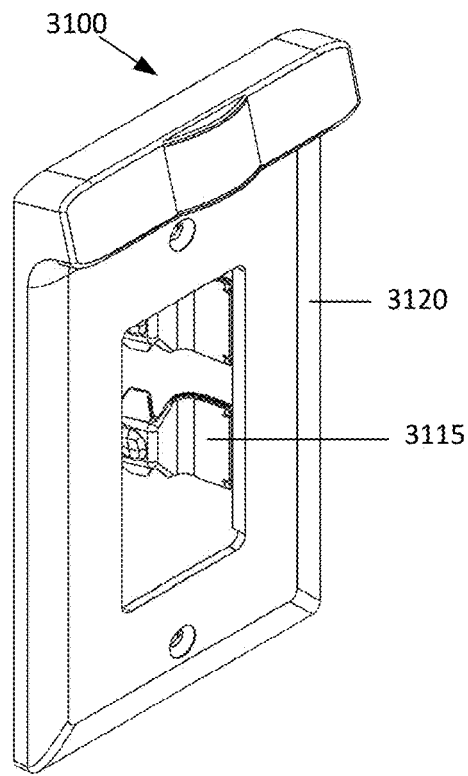
*Fig. 42E*    *Fig. 42F*
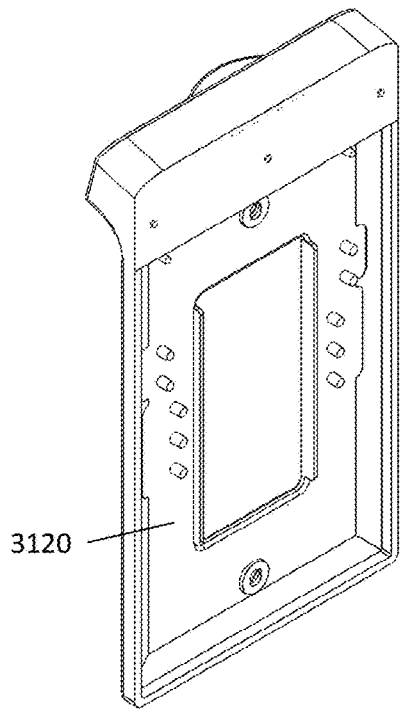
*Fig. 42G*

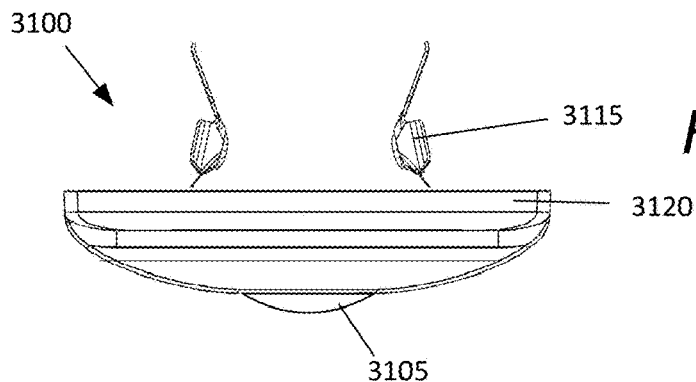
*Fig. 43A*
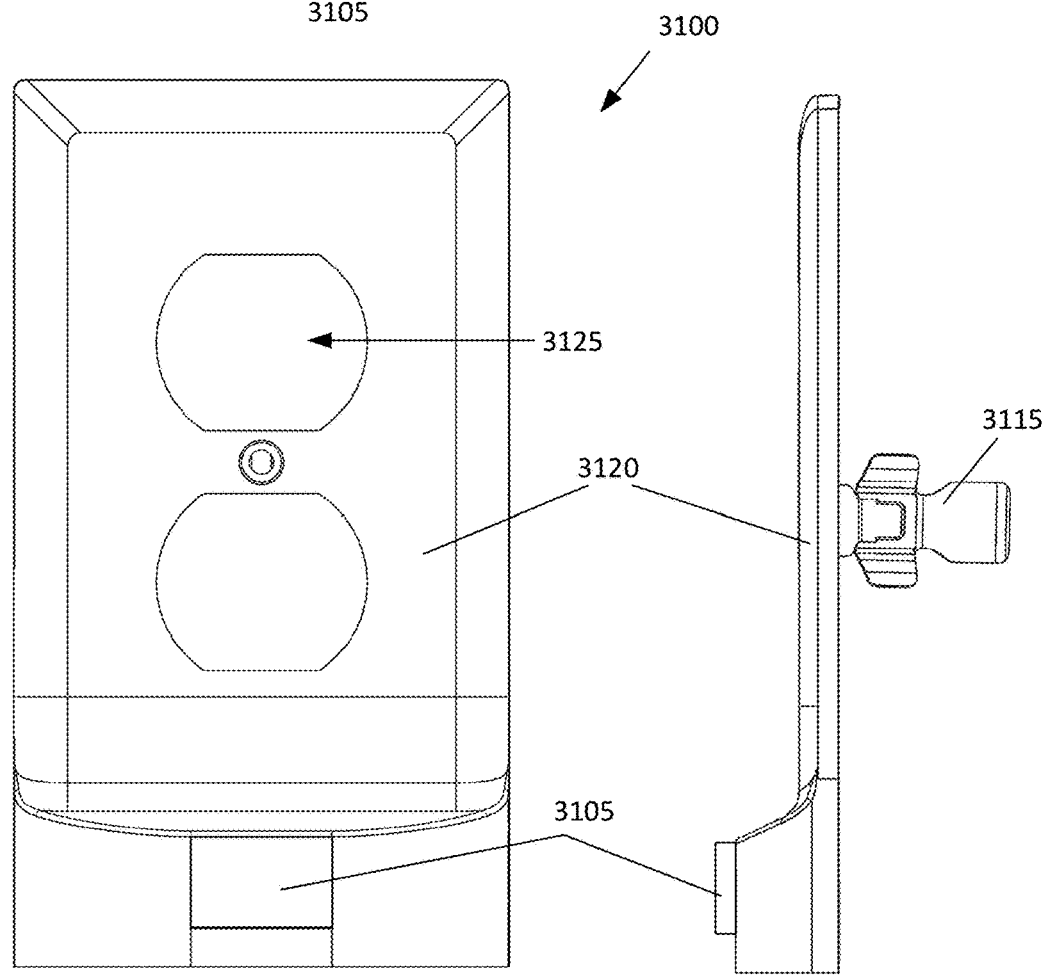
*Fig. 43B*  *Fig. 43C*
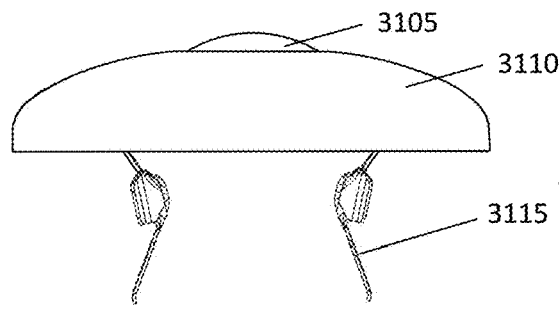
*Fig. 43D*

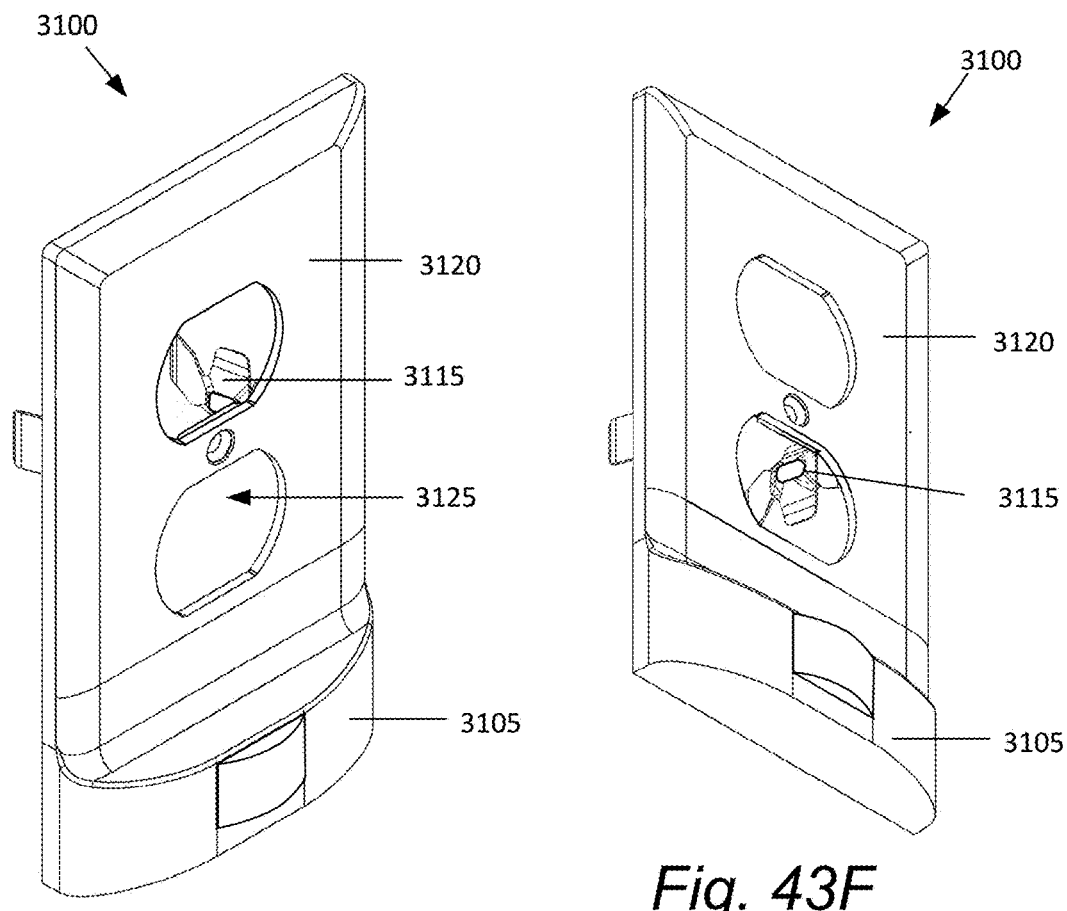
Fig. 43E
Fig. 43F
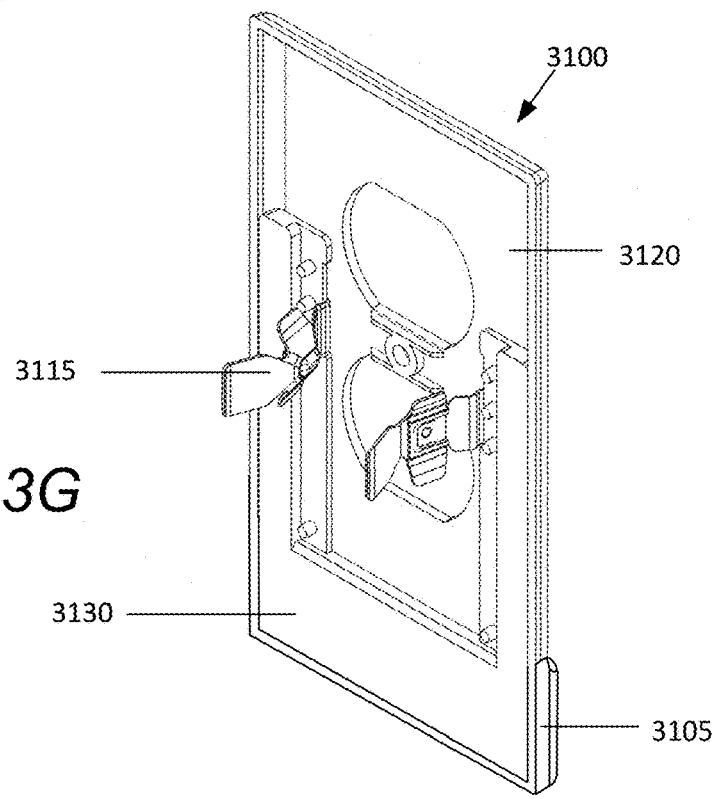
Fig. 43G

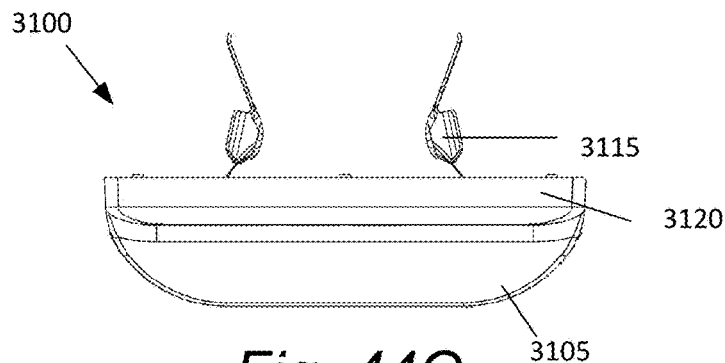
Fig. 44O
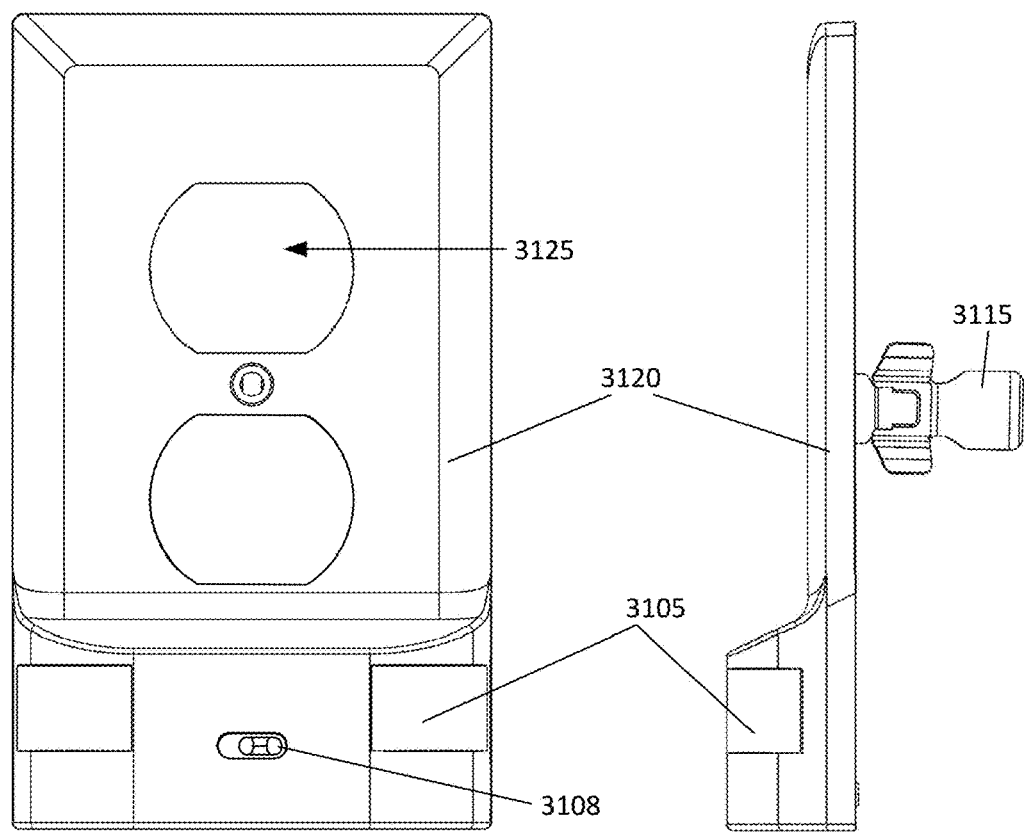
Fig. 44P
Fig. 44Q
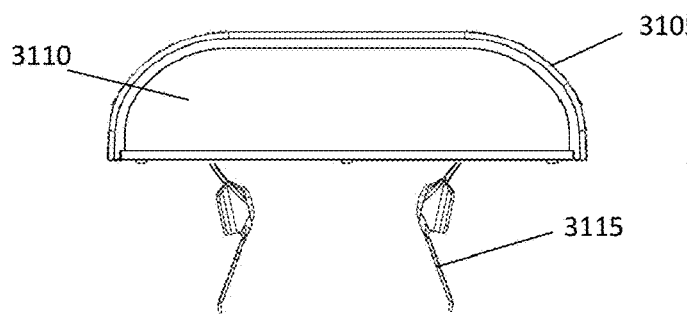
Fig. 44R

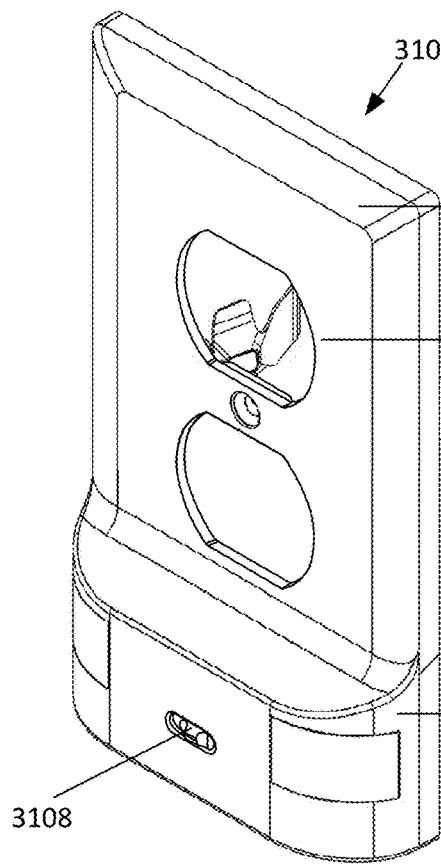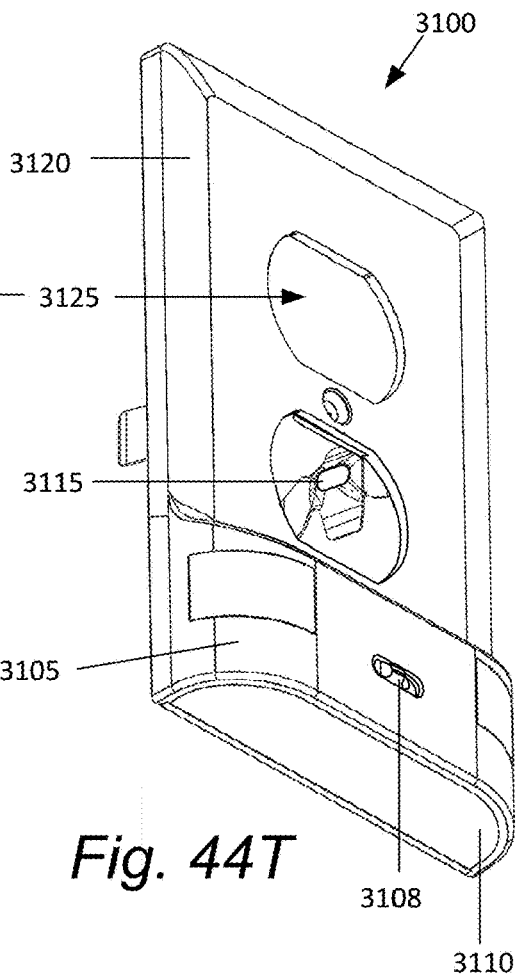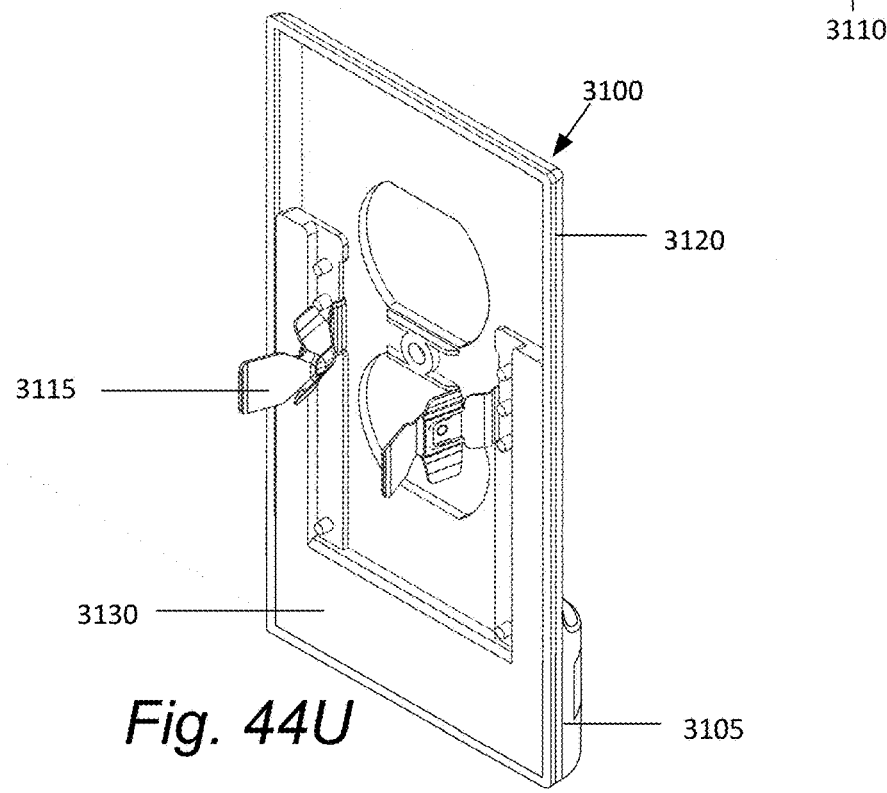
Fig. 44S
Fig. 44T
Fig. 44U

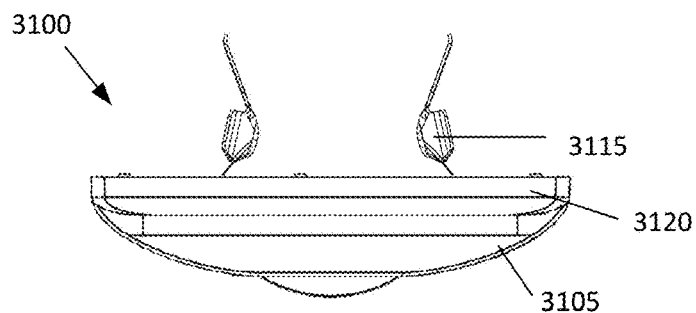
Fig. 44V
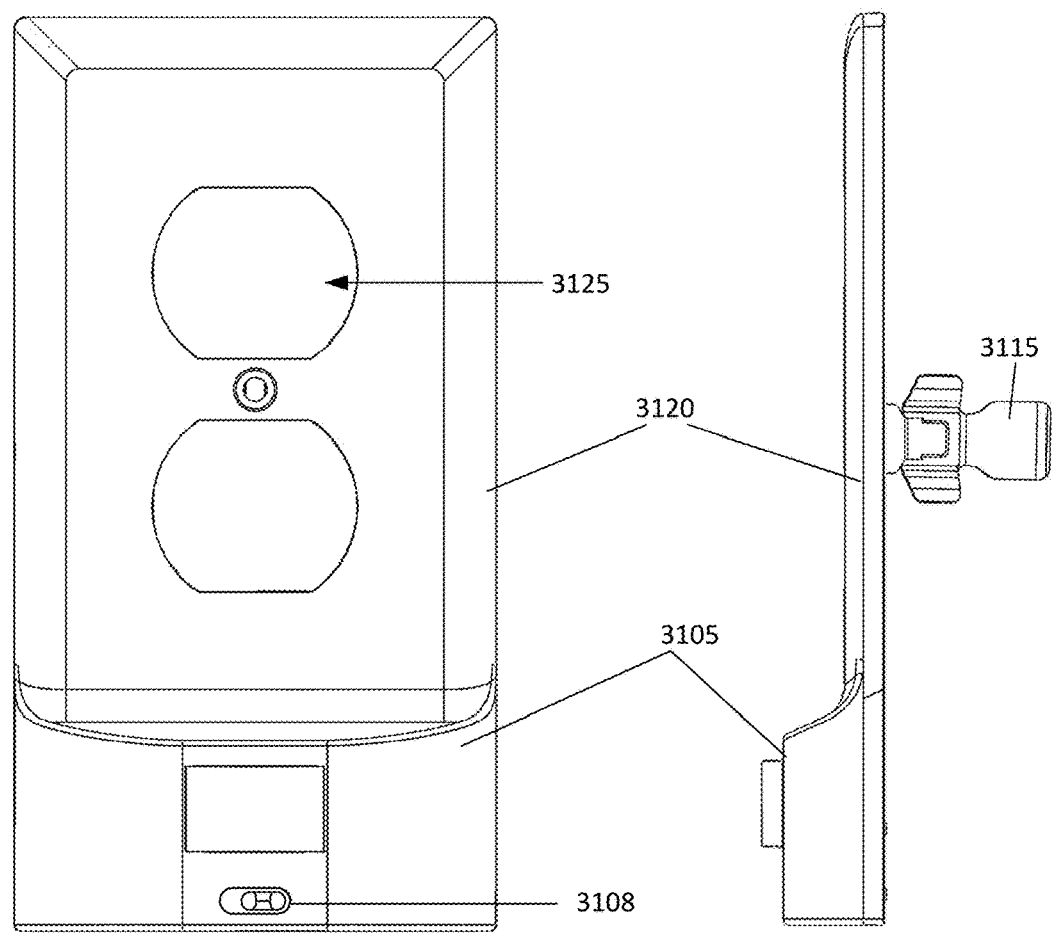
Fig. 44W
Fig. 44X
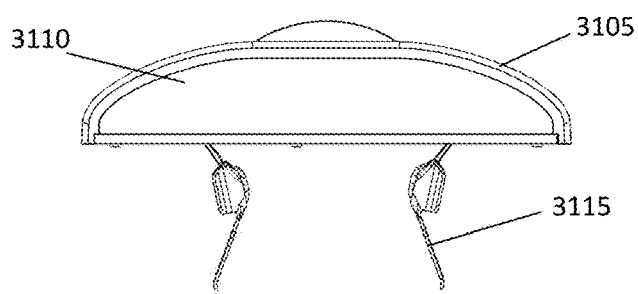
Fig. 44Y

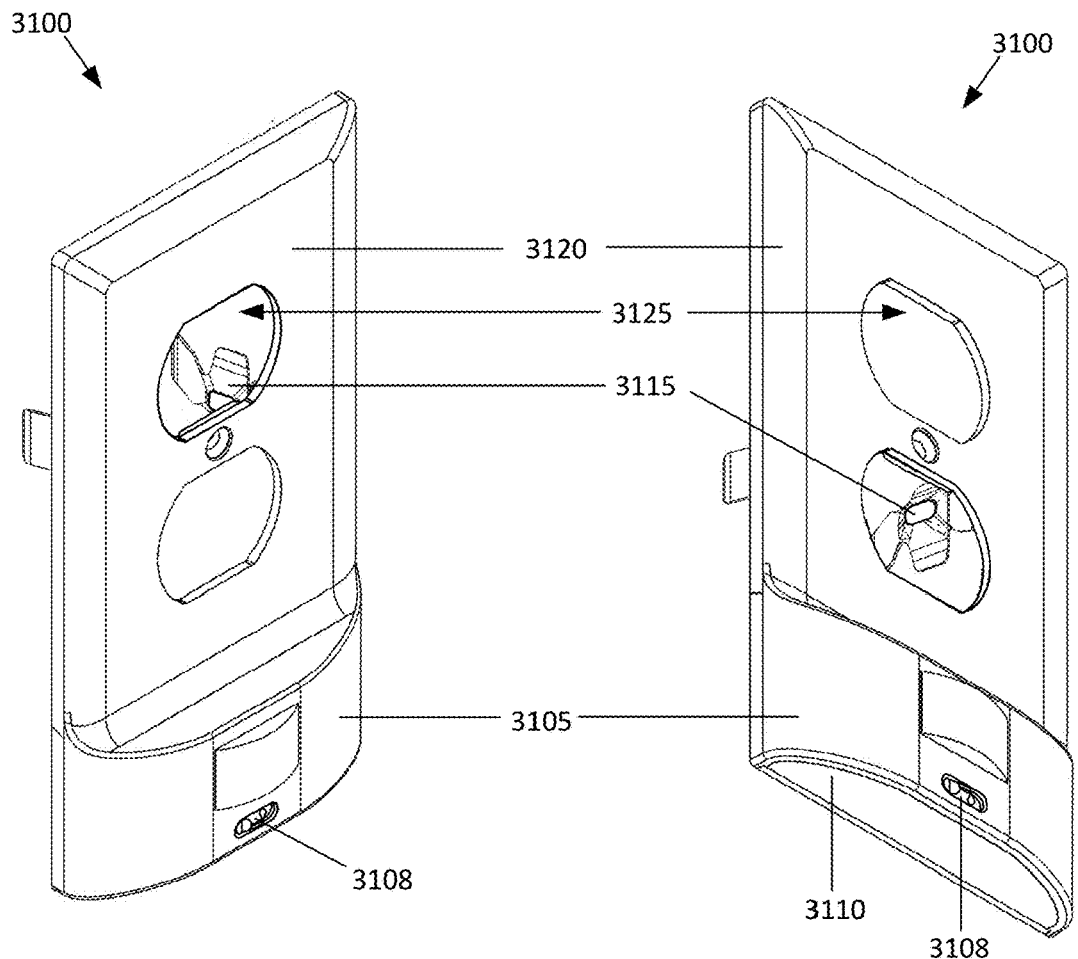
*Fig. 44Z*     *Fig. 44AA*
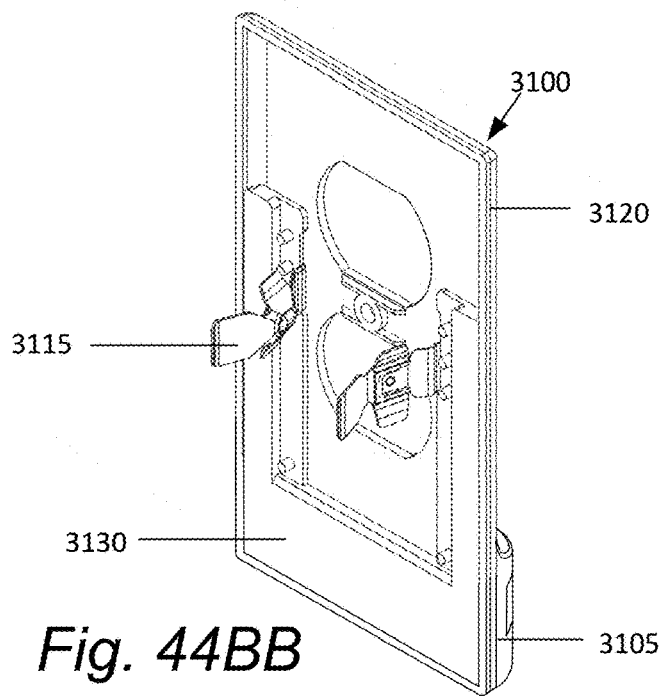
*Fig. 44BB*

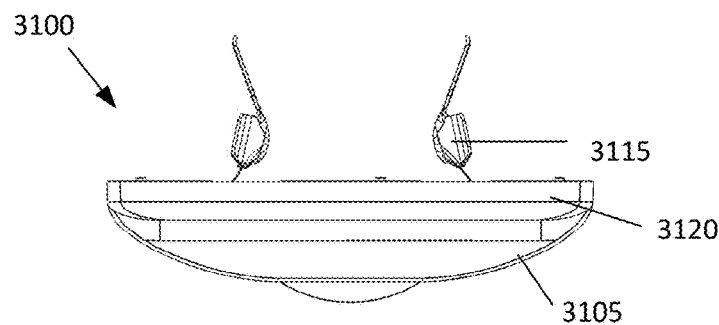
Fig. 44CC
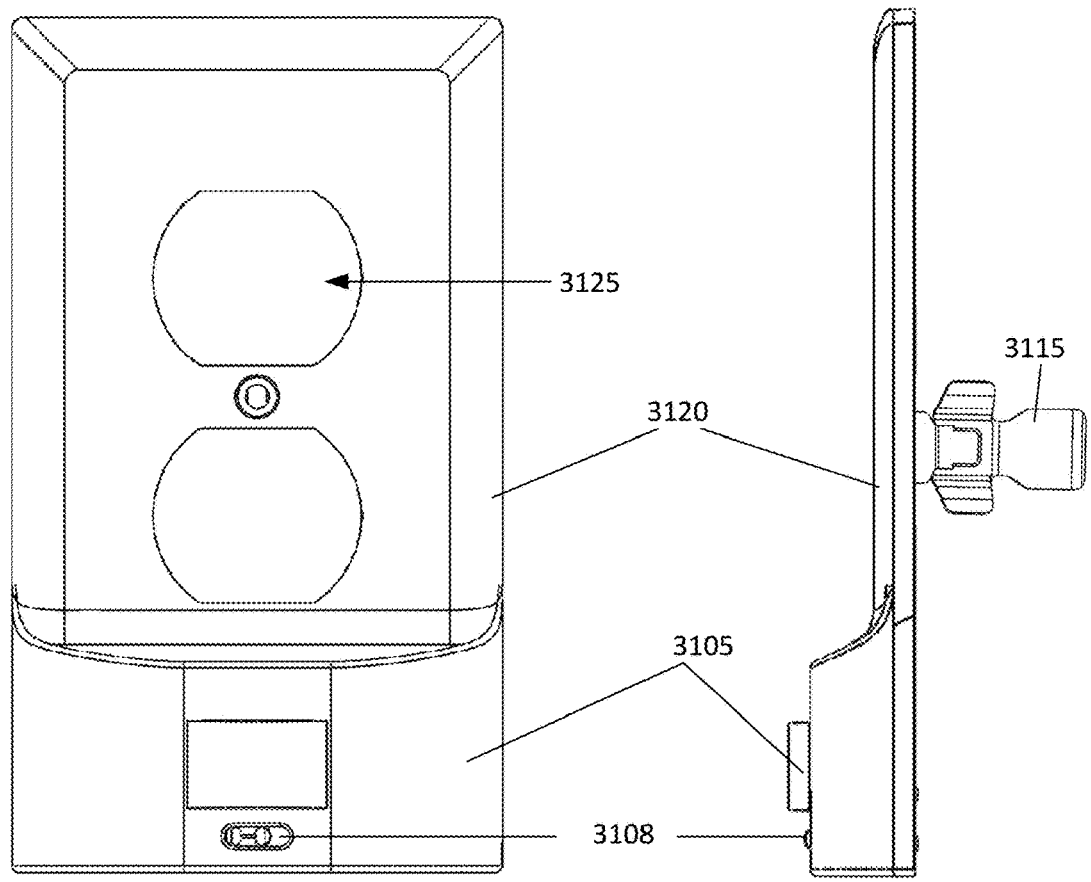
Fig. 44DD
Fig. 44EE
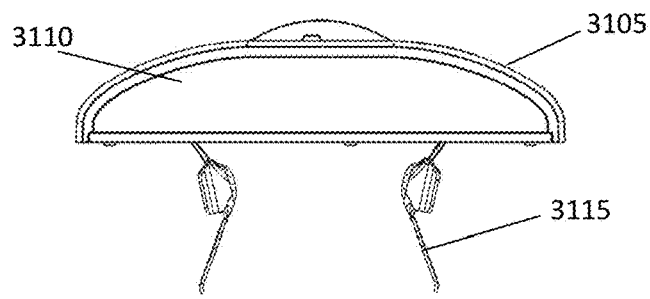
Fig. 44FF

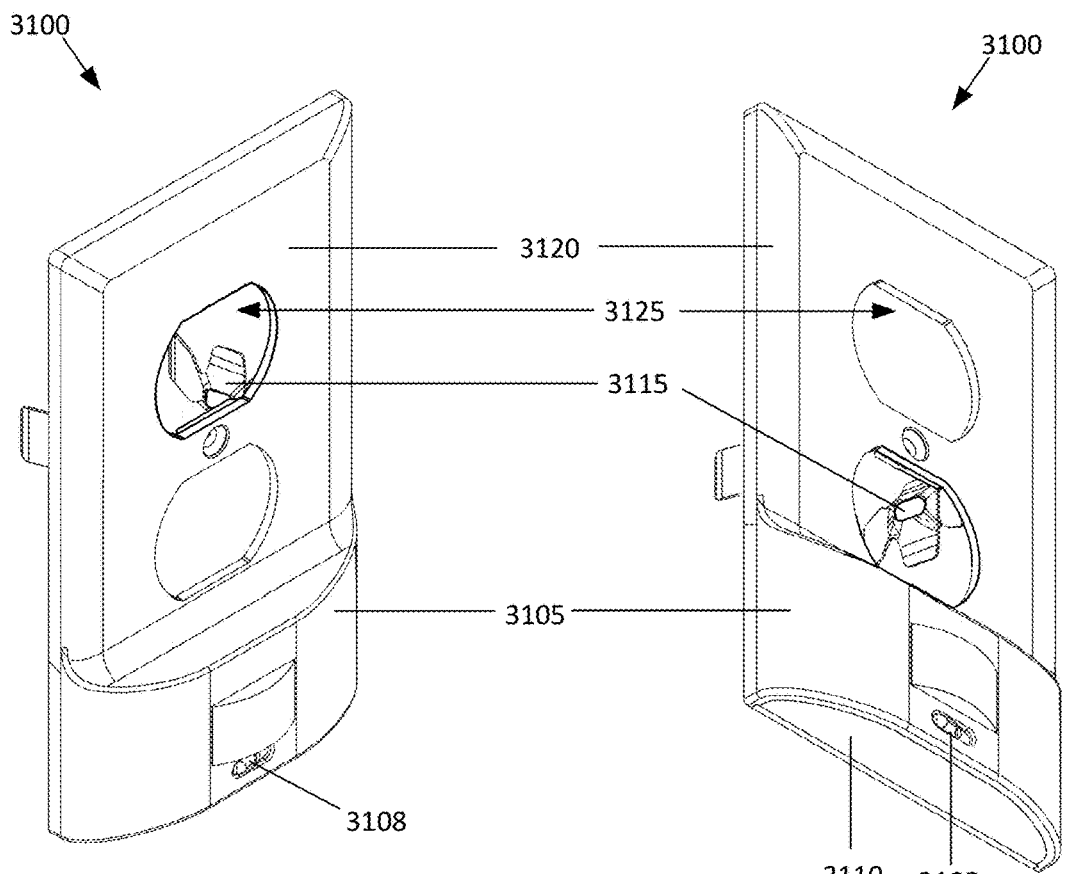
Fig. 44GG
Fig. 44HH
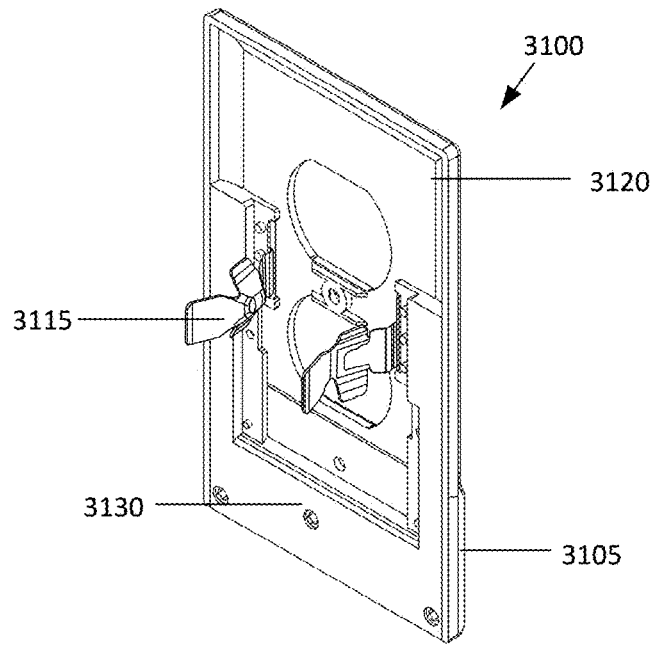
Fig. 44II

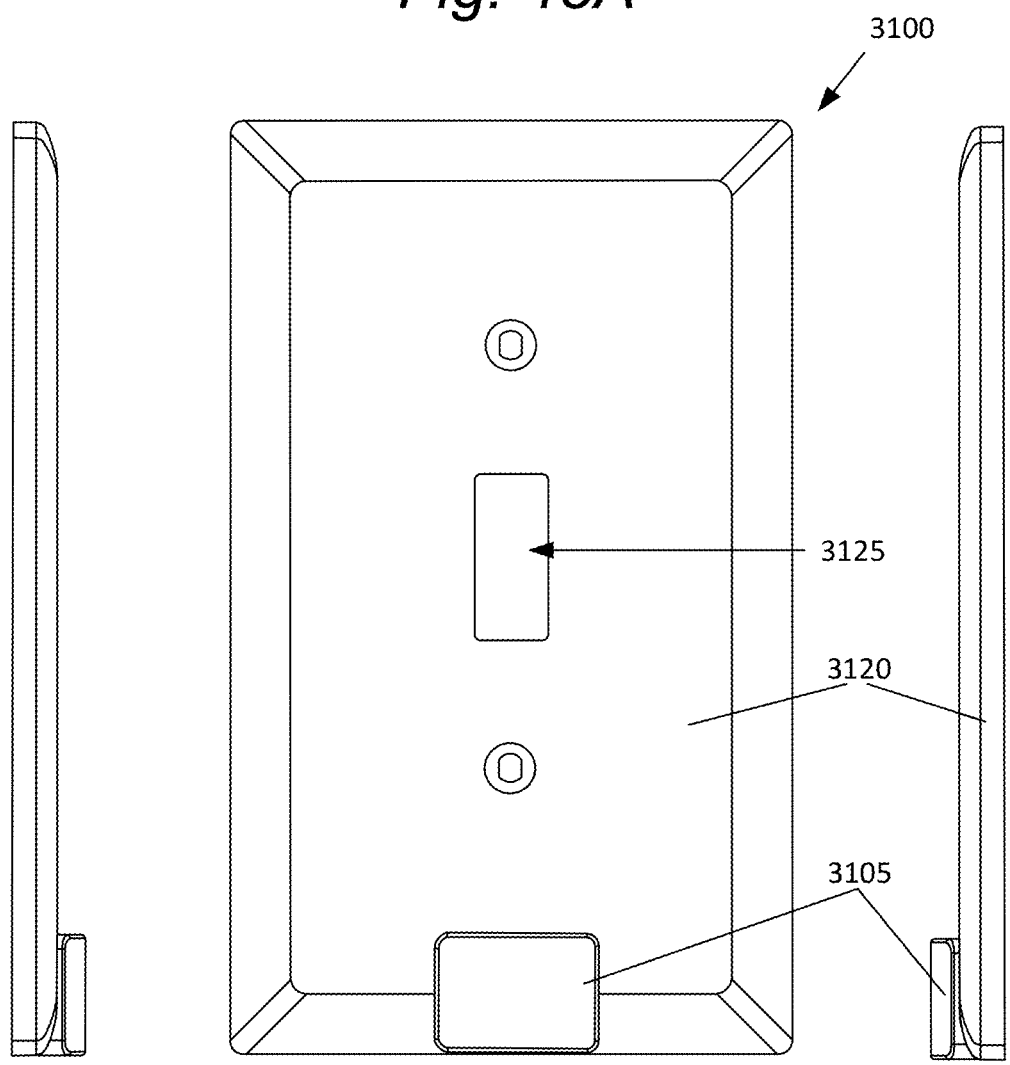

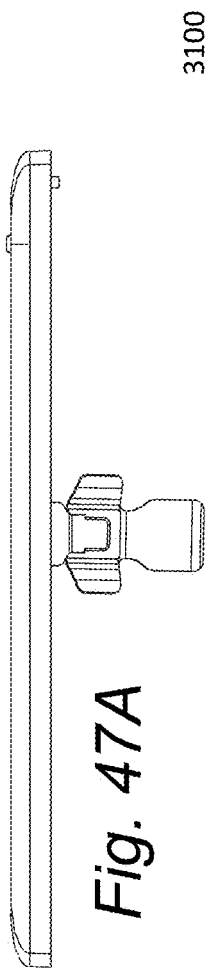
Fig. 47A
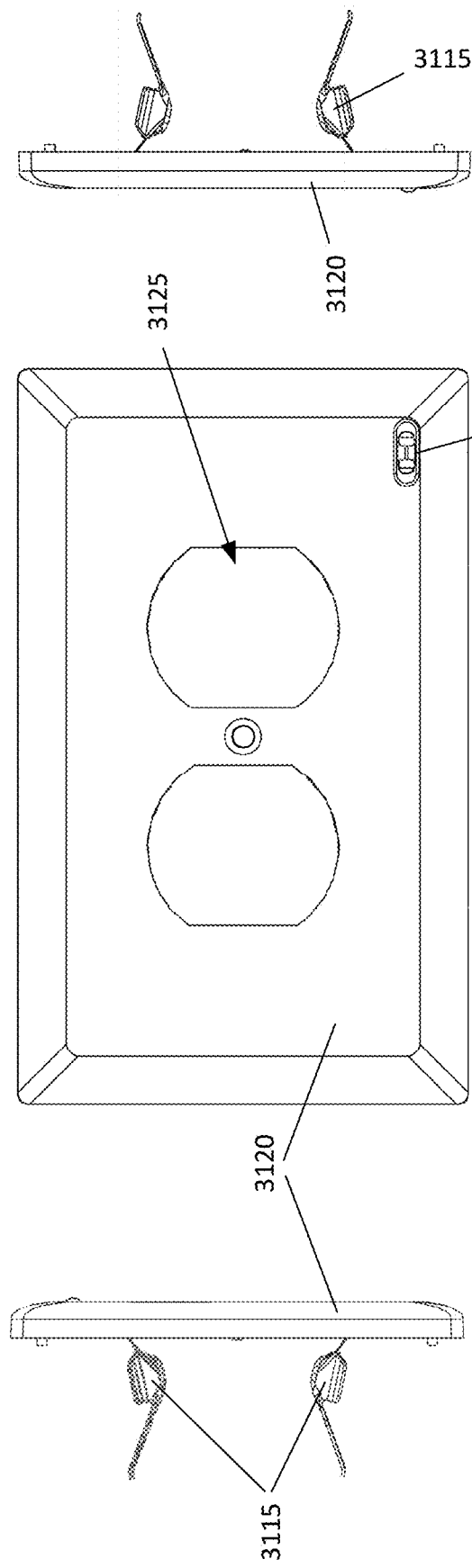
Fig. 47B
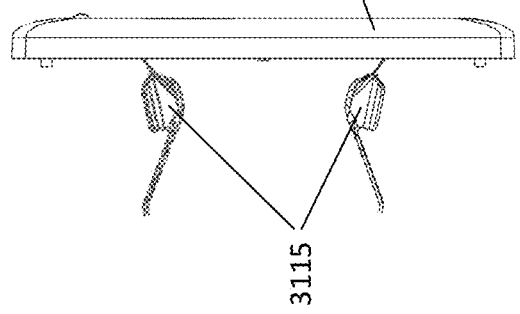
Fig. 47D
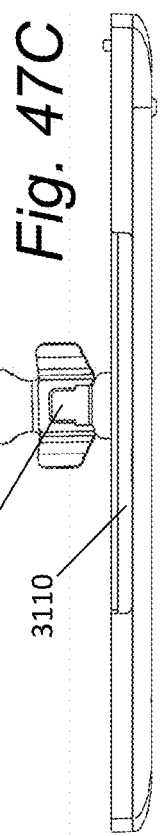
Fig. 47C
Fig. 47E

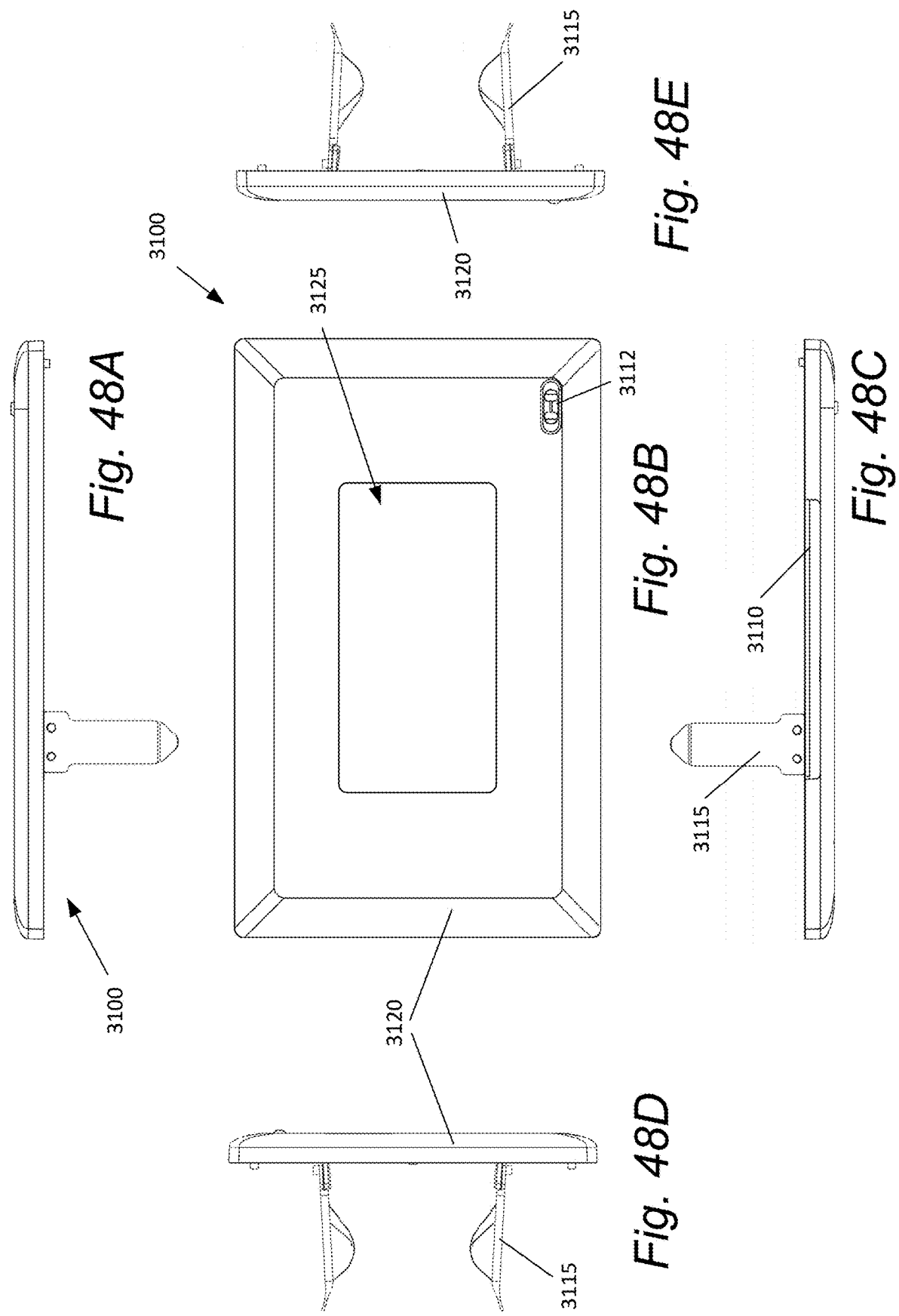

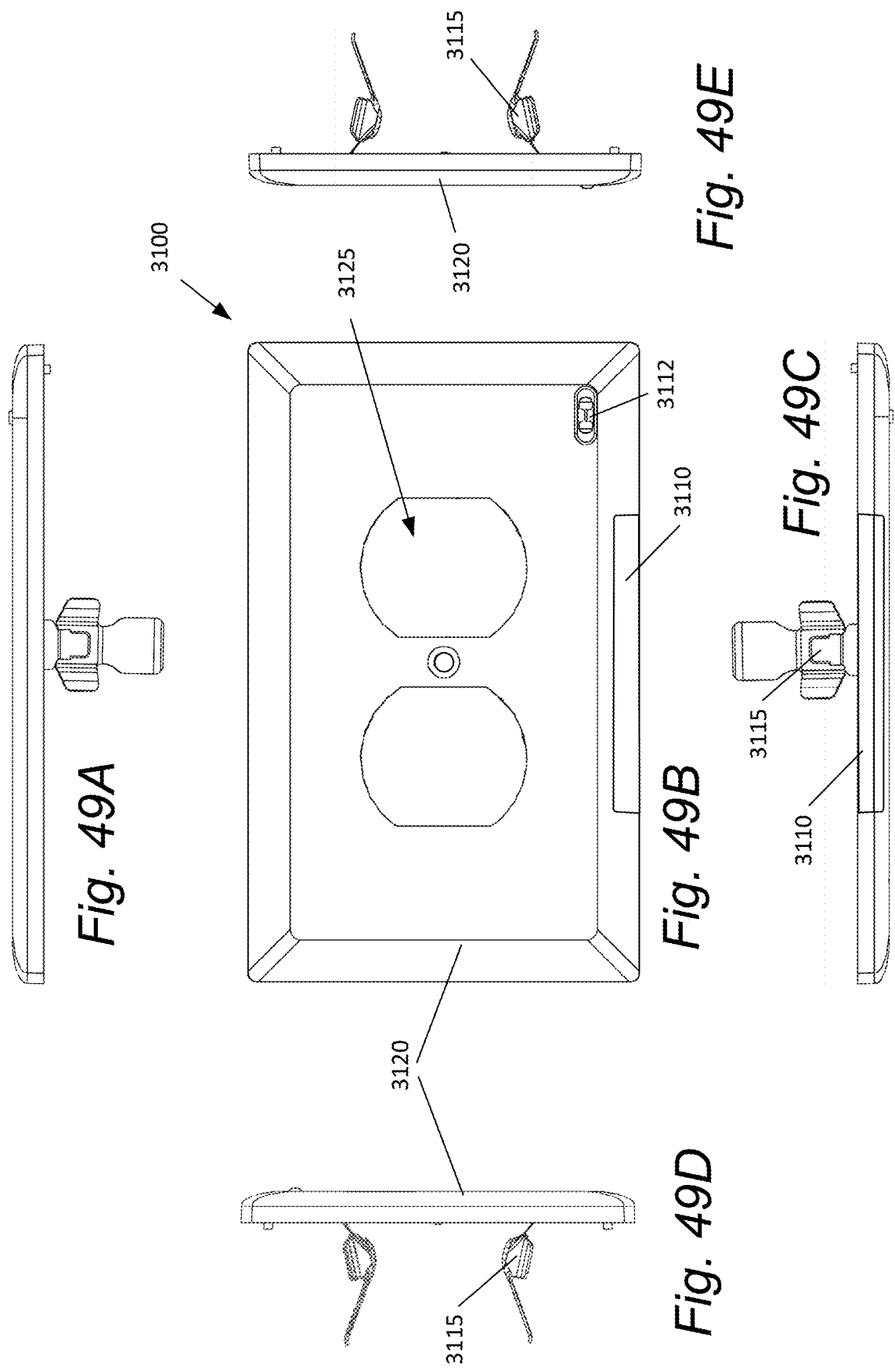

form a part of the specification.

ACTIVE COVER PLATES

RELATED APPLICATIONS

The present application incorporates the following applications and patents by reference in their entireties:

U.S. Provisional Application No. 62/579,033, filed on Oct. 30, 2017;
U.S. Provisional Application No. 62/536,452, filed on Jul. 24, 2017;
U.S. Provisional Application No. 62/522,691, filed on Jun. 21, 2017;
U.S. Provisional Application No. 62/460,094, filed on Feb. 17, 2017;
U.S. Provisional Application No. 62/279,831, filed on Jan. 18, 2016;
U.S. Provisional Application No. 62/081,539, filed on Nov. 18, 2014;
U.S. Provisional Application No. 62/027,784, filed on Jul. 23, 2014;
U.S. Provisional Application No. 61/906,651, filed on Nov. 20, 2013;
U.S. Provisional Application No. 61/836,972, filed on Jun. 19, 2013;
U.S. Provisional Application No. 61/778,386, filed on Mar. 12, 2013;
U.S. Provisional Application No. 61/720,131, filed on Oct. 30, 2012;
U.S. Provisional Application No. 61/574,344, filed on Aug. 1, 2011;
U.S. Design patent Ser. No. 29/629,812, filed on Dec. 15, 2017;
U.S. Design patent Ser. No. 29/608,301, filed on Jun. 20, 2017;
U.S. Design patent Ser. No. 29/608,300, filed on Jun. 20, 2017;
U.S. Design patent Ser. No. 29/608,299, filed on Jun. 20, 2017;
U.S. Design patent Ser. No. 29/608,297, filed on Jun. 20, 2017;
U.S. Design patent Ser. No. 29/608,296, filed on Jun. 20, 2017;
U.S. Design patent Ser. No. 29/608,295, filed on Jun. 20, 2017;
U.S. Design patent Ser. No. 29/608,294, filed on Jun. 20, 2017;
U.S. Design patent Ser. No. 29/608,292, filed on Jun. 20, 2017;
U.S. Design patent Ser. No. 29/599,679, filed on Apr. 5, 2017;
U.S. Design patent Ser. No. 29/598,255, filed on Mar. 23, 2017, issued as U.S. Pat. No. D819,426;
U.S. Design patent Ser. No. 29/594,007, filed on Feb. 14, 2017;
U.S. Design patent Ser. No. 29/594,005, filed on Feb. 14, 2017;
U.S. Design patent Ser. No. 29/594,003, filed on Feb. 14, 2017;
U.S. Design patent Ser. No. 29/594,002, filed on Feb. 14, 2017;
U.S. Design patent Ser. No. 29/551,208, filed on Jan. 11, 2016, issued as U.S. Pat. No. D809,899;
U.S. Design patent Ser. No. 29/522,406, filed on Mar. 30, 2015, issued as U.S. Pat. No. D810,697;
U.S. Design patent Ser. No. 29/522,404, filed on Mar. 30, 2015, issued as U.S. Pat. No. D781,241;
U.S. patent application Ser. No. 15/920,047, filed on Mar. 13, 2018;
U.S. patent application Ser. No. 15/870,832, filed on Jan. 12, 2018;
U.S. patent application Ser. No. 15/708,082, filed on Sep. 18, 2017;
U.S. patent application Ser. No. 15/496,872, filed on Apr. 25, 2017, published as US 2017-0229853 A1;
U.S. patent application Ser. No. 15/486,280, filed on Apr. 12, 2017, published as US 2017-0222417 A1; issued as U.S. Pat. No. 9,917,430;
U.S. patent application Ser. No. 15/486,277, filed on Apr. 12, 2017, published as US 2017-0222414 A1, issued as U.S. Pat. No. 9,899,814;
U.S. patent application Ser. No. 15/486,273, filed on Apr. 12, 2017, published as US 2017-0222364 A1, issued as U.S. Pat. No. 9,871,324;
U.S. patent application Ser. No. 15/481,318, filed on Apr. 6, 2017, published as US 2017-0214229 A1. issued as U.S. Pat. No. 9,882,361;
U.S. patent application Ser. No. 15/481,280, filed on Apr. 6, 2017, published as US 2017-0214188 A1, issued as U.S. Pat. No. 9,882,318;
U.S. patent application Ser. No. 15/428,099; filed on Feb. 8, 2017, published as US 2017-0208663 A1, issued as U.S. Pat. No. 9,832,841;
U.S. patent application Ser. No. 15/409,508, filed on Jan. 18, 2017, published as US 2017-0208657 A1, issued as U.S. Pat. No. 9,807,829;
U.S. patent application Ser. No. 15/406,404, filed on Jan. 13, 2017, published as US 2017-0125947 A1, issued as U.S. Pat. No. 9,742,111;
U.S. patent application Ser. No. 15/145,749; filed on May 3, 2016, published as US 2016-0248202 A1, issued as U.S. Pat. No. 9,787,025;
U.S. patent application Ser. No. 14/678,746, filed on Apr. 3, 2015, published as US 2015-0229079 A1, issued as U.S. Pat. No. 9,768,562;
U.S. patent application Ser. No. 14/549,143, filed on Nov. 20, 2014, published as US 2015-0075836 A1, issued as U.S. Pat. No. 9,362,728;
U.S. patent application Ser. No. 14/066,637, filed on Oct. 29, 2013, published as US 2014-0054060 A1, issued as U.S. Pat. No. 9,035,181;
U.S. patent application Ser. No. 14/066,621, filed on Oct. 29, 2013, published as US 2014-0054059 A1, issued as U.S. Pat. No. 9,035,180; and
U.S. patent application Ser. No. 13/461,915, filed on May 2, 2012, published as US 2013-0032594 A1, issued as U.S. Pat. No. 8,912,442.

BACKGROUND

Modern buildings include wiring to deliver electrical power to lights, outlets, and other devices. The electrical wiring terminates in an electrical box in a wall, ceiling, floor or connected to another structural element. Connections are made to the wiring in the electrical box. For example, electrical wiring may be connected to switches by stab-in connectors or with screw terminals on the sides of the switch body. After installation, a cover plate is placed over the switch body to cover the opening to the box while allowing access to manually manipulate the switches.

BRIEF DESCRIPTION OF THE DRAWINGS

The accompanying drawings illustrate various examples of the principles described herein and are a part of the specification. The illustrated examples are merely examples and do not limit the scope of the claims.

FIGS. 1A-1D are views of two different switches, according to one example of principles described herein.

FIGS. 3A-3C show an illustrative active cover plate for a rocker light switch, according to one example of principles described herein.

FIGS. 4A-4C show an illustrative active cover plate for a toggle light switch, according to one example of principles described herein.

FIGS. 6A-6E show one illustrative embodiment of a prong for an active cover plate, according to one example of principles described herein.

FIGS. 7A-7E show one illustrative embodiment of a prong for an active cover plate, according to one example of principles described herein.

FIGS. 8A-8E show one illustrative embodiment of a prong for an active cover plate, according to one example of principles described herein.

FIGS. 9A-9E show one illustrative embodiment of a prong for an active cover plate, according to one example of principles described herein.

FIGS. 16A-16E are diagrams of illustrative active cover plates and installation tools for multi-pole light switches, according to one example of principles described herein.

FIGS. 19A-19D include a flow chart illustrations of a method for installing an active cover plate using an installation tool, according to one example of principles described herein.

FIGS. 22A-22G, 23A-23H, 24A-24EE, 25A-25J, 26A-26I, and 27A-27I show views of various active cover plates for double gang light switches, according to one example of principles described herein.

FIGS. 28A-28H show illustrative elements and techniques for securing prongs to a multi-gang active cover plate, according to one embodiment of principles described herein.

FIGS. 31A-31F show one illustrative example of an active cover plate with a protrusion that provides additional volume for circuitry and/or sensors, according to one example of principles described herein.

FIGS. 32A-32F show one illustrative example of an active cover plate with a protrusion that provides additional volume for circuitry and/or sensors, according to one example of principles described herein.

FIGS. 33A-33G show one illustrative example of an active cover plate with a protrusion that provides additional volume for circuitry and/or sensors, according to one example of principles described herein.

FIGS. 34A-34G show one illustrative example of an active cover plate with a protrusion that provides additional volume for circuitry and/or sensors, according to one example of principles described herein.

FIGS. 35A-35G show one illustrative example of an active cover plate with a protrusion that provides additional volume for circuitry and/or sensors, according to one example of principles described herein.

FIGS. 36A-36G show one illustrative example of an active cover plate with a protrusion that provides additional volume for circuitry and/or sensors, according to one example of principles described herein.

FIGS. 37A-37G show one illustrative example of an active cover plate with a protrusion that provides additional volume for circuitry and/or sensors, according to one example of principles described herein.

FIGS. 38A-38G show one illustrative example of an active cover plate with a protrusion that provides additional volume for circuitry and/or sensors, according to one example of principles described herein.

FIGS. 39A-39G show one illustrative example of an active cover plate with a protrusion that provides additional volume for circuitry and/or sensors, according to one example of principles described herein.

FIGS. 41A-41G show one illustrative example of an active cover plate with a protrusion that provides additional volume for circuitry and/or sensors, according to one example of principles described herein.

FIGS. 42A-42G show one illustrative example of an active cover plate with a protrusion that provides additional volume for circuitry and/or sensors, according to one example of principles described herein.

FIGS. 43A-43G show one illustrative example of an active cover plate with a protrusion that provides additional volume for circuitry and/or sensors, according to one example of principles described herein.

FIGS. 45A-45I show one illustrative example of an active cover plate with a protrusion that provides additional volume for circuitry and/or sensors, according to one example of principles described herein.

FIGS. 47A-47G show one illustrative example of an active cover plate with a light pipe or other illumination along one or more of the side edges of the cover plate, according to one example of principles described herein.

FIGS. 48A-48E show one illustrative example of an active cover plate with a light pipe or other illumination along one or more of the side edges of the cover plate, according to one example of principles described herein.

FIGS. 49A-49G show one illustrative example of an active cover plate with a light pipe or other illumination along one or more of the side edges of the cover plate, according to one example of principles described herein.

Throughout the drawings, identical reference numbers designate similar, but not necessarily identical, elements.

DETAILED DESCRIPTION

Figure 2A:
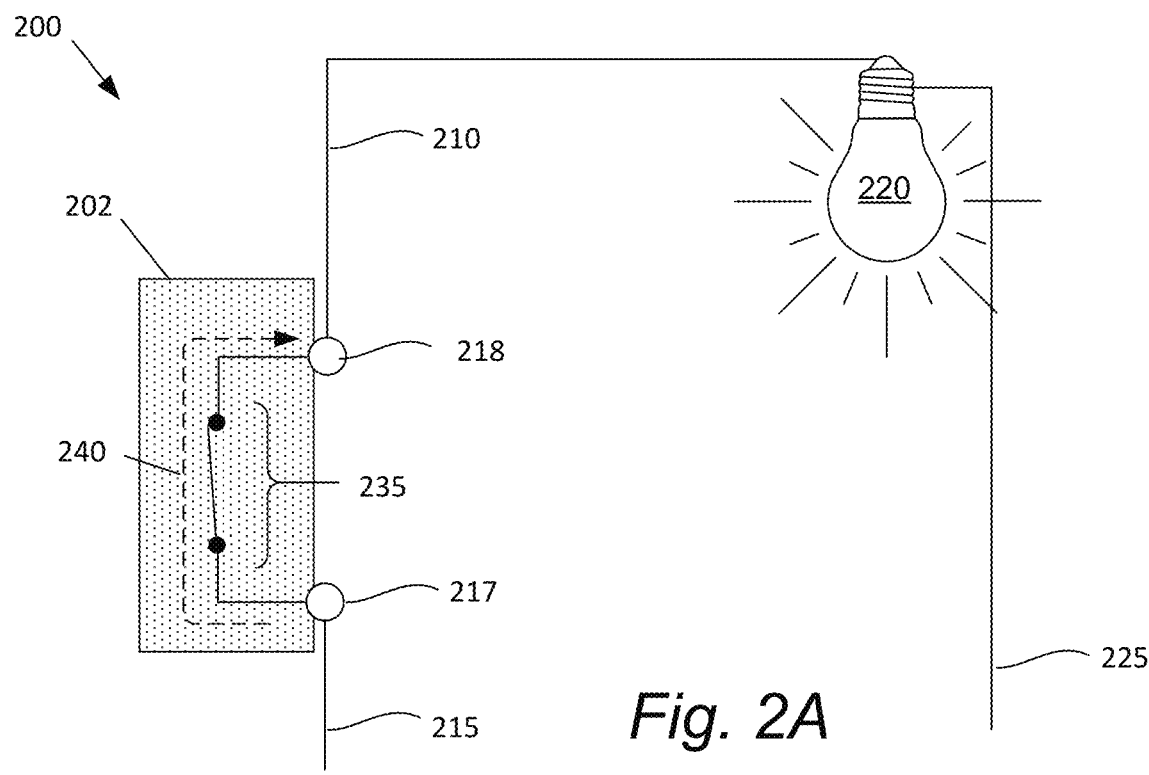
FIGS. 2A and 2B are diagrams of electrical systems that include a switch and a load controlled by the switch, according to one example of principles described herein.

Reference will now be made to the figures wherein like structures will be provided with like reference designations. In the following description, for purposes of explanation, numerous specific details are set forth in order to provide a thorough understanding of the present systems and methods. It will be apparent, however, that systems and methods may be practiced without these specific details. It is understood that the figures are diagrammatic and schematic representations of some embodiments of the invention, and are not limiting of the present invention, nor are they necessarily drawn to scale. Reference in the specification to "an example" or similar language means that a particular feature, structure, or characteristic described in connection with the example is included in at least that one example, but not necessarily in other examples. Additionally, features shown and/or described in connection with one figure may be combined with features shown and/or described in connection with other figures.

Switches are a standard electrical receptacle/fixture in modern homes. Switches are typically placed near entryways or doors so that a person entering or leaving an area can easily turn on or off the lights or appliances. The position of the switch installations makes them ideal for incorporating nightlights, guidelights, or illuminated images. For example, if a switch installation incorporated a nightlight, the nightlight would illuminate the entry way, the floor around the entryway and the light switch itself. The nightlight would provide a valuable reference point to allow a home owner to orient themselves and properly navigate the area.

While the attractiveness of nightlights incorporated into switch installations is clear, there are a number of significant challenges in designing a nightlight that is easy to install and provides the desired level of illumination without adverse effects.

Standard switches in North America (Canada, United States, Mexico, etc.) have two standard styles: toggle and decor. FIGS. 1A and 1B show a decor switch (100), also called a rocker switch. The switch (100) includes a rocker paddle (105) and a body (110). To change the state of the switch and its controlled load, the user depresses either the top or bottom of the paddle (105). This changes the internal state of contacts within the switch (105) to either connect or disconnect the electrical load from a power source. The body (110) of the switch includes two screw terminals (115, 120) and a yoke (130). The screw terminals (115, 120) serve as attachment points for electrical wiring. For example, a "hot" wire may be attached to one of the terminals and a traveler wire may be attached to the other terminal. The hot wire supplies electrical power to the switch and the traveler wire connects the switch to the electrical load. When the switch (100) is in the ON position, internal contacts connect the first screw terminal (115) to the second screw terminal (120) and electrical energy is available to the load. When the switch is in the OFF position, the internal contacts do not make a connection between the screw terminals and there is no electrical power available to the load.

The yoke (130) provides a structure to connect the switch (100) to a housing such as an electrical box. In some switches, the yoke or bracket (130) is metal and may be connected to a ground screw terminal (125). A ground wire may be connected to the ground screw terminal (125) to ensure that if there is a fault in the electrical system and electricity is applied to the yoke (130), this electricity will be dissipated through the ground wire.

FIGS. 1C and 1D show an illustrative example of a toggle switch (150). The switch (150) includes a toggle (165), a yoke (160), two screw terminals (172, 175) and a ground terminal (155). To operate the toggle switch (150) a user moves the toggle (165) either up or down to change the state of the internal contacts in the toggle switch (150). As discussed above, this either connects or disconnects the internal electrical path between the two screw terminals (172, 175). The yoke (160) in this example is metal and can be electrically connected to a ground wire using the ground screw terminal (155).

One method of connecting the wires to the screw terminals (172, 175) includes loosening the screws and wrapping the electrical wire around the shaft of the screw, then tightening the screw to sandwich the wire between the head of the screw and the switch body (170). FIG. 1D also shows an alternative mechanism for connecting wires to the screw terminals. This alternative connection uses stab-in connectors (177, 179). The end of the electrical wire is stripped and forced into the stab-in connectors (177, 179) to make an electrical connection with the internal contacts without utilizing screw terminals. Even when stab in connectors are used the screw terminals (172, 175) remain part of the electrical circuit.

FIG. 2A is a block diagram showing an illustrative electrical system (200) for controlling a load. In this example, the system (200) includes a switch (202), wiring (215, 210, 225) and an exterior load (220). In this case the exterior load (220) is illustrated as an overhead light, but the load could be any electrical load that can be controlled by a switch, including lamps, motors, fans, air conditioners, etc. Terminal A (217) of the switch (202) is connected to a hot wire (215). The hot wire (215) is part of the power distribution in the house or building and delivers electricity to the system. The switch (202) includes internal contacts (235) which control the flow of electrical current through the switch. In this case the internal contacts (235) are closed.

This allows a current flow (240) through the switch to terminal B (218) which is connected to a traveler wire (210) that is connected to the load (220). The current passes through the load (220) and into the neutral wire (225). The neutral wire (225) acts as a sink for the electrical current.

Figure 2B:
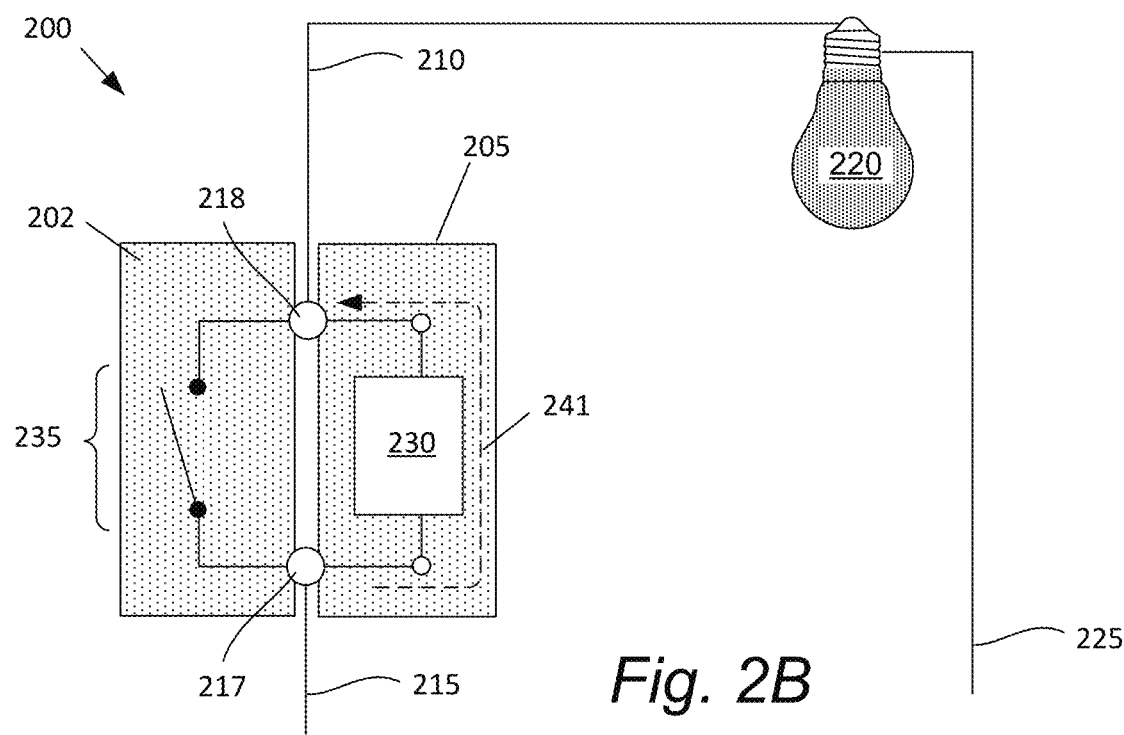

FIG. 2B is a block diagram showing an illustrative electrical system (200) for controlling a load (220) that has been modified by placing an active cover plate (205) over the switch (202). In this example, the internal contacts (235) are open so that no current flows through the switch (202) and the light (220) is nominally OFF. This creates a voltage differential across the terminals (217, 218), with terminal A (217) having a high voltage because it is connected to the hot wire (215) and terminal B (218) having a lower voltage because it is disconnected from the hot wire (215) and is connected to the neutral wire (225) through the load (220).

The active cover plate (205) contacts the terminals (217, 218) of the switch (202) to extract electrical power. Thus, in the configuration shown in FIGS. 2A and 2B, the active cover plate can only extract power when there is a voltage difference across the terminals (217, 218). When the internal contacts (235) are closed, the two terminals are electrically connected by the internal contacts and are at substantially the same voltage. There may be a very small voltage difference between the two terminals that is related to the contact resistance of the internal contacts. Ordinarily, this small voltage difference does not provide a useful amount of current. Thus, the load (230) inside the active cover plate (205) in the configuration shown in FIG. 2B may only have access to substantial amounts of electrical power when the internal contacts (235) are open and the switch is OFF.

The bypass current (241) passes from terminal A (217) to terminal B (218) through the load (230) in the active cover plate (205). Thus, the active cover plate (205) bypasses the switch (202) and independently introduces a current into the traveler wire (210) that then passes through the exterior load (220) and to the neutral wire (225).

FIGS. 3A, 3B and 3C show a rear, side, and front view, respectively, of an illustrative active cover plate (300) for a rocker or décor light switch (see e.g. FIGS. 1A, 1B). FIG. 3A shows that the active cover plate (300) includes a face plate (305), a back plate (310), and two prongs (315) extending rearward from the face plate (305). The prongs (315) are configured to contact the screw terminals (115, 120; FIG. 1A) of the décor light switch (100; FIG. 1A). A circuit board (311) represented by the dashed shape is sandwiched between the face plate (305) and the back plate (310). The circuit board (311) is connected to the prongs by conductors (312) represented by the dotted lines. When electrical power is available at the prongs (315) (i.e. when there is a voltage difference between the prongs) the circuit board (311) can produce illumination (314). In this case, the illumination (314) extends downward from a bottom edge of the active cover plate (300). There are a wide variety of other ways that the active cover plate (300) could be configured. For example, the illumination may project out of different locations and/or be presented in different patterns. The illumination may be a continuous bar or may be segmented into two, three or more segments. The illumination could be produced by individual LEDs, LED filaments or other light sources. The location and size of the circuit board is just one example. In other embodiments, the circuit board may be a different size such as a simple rectangle and/or may be divided into multiple sections or may be in other locations with respect to the cover plate. Further, the prongs may have different shapes, quantities and locations. For example, there may be two, three, four or five prongs at various locations and with various shapes on the cover plate. Several illustrative examples are described below.

FIG. 3B shows a side view of the active cover plate (300) with the prongs (315) extending rearward from the face plate (305). FIG. 3C shows a front view of the active cover plate (300) with the prongs (315) visible through the rectangular aperture of the face plate (305). The prongs (315) include contacts (322) that may be configured to contact the side screw terminals of a light switch (see e.g. 115, 120; FIG. 1A-1B).

In general, users of active cover plates may desire some amount of control over the light output or other functionality within the active cover plate. For example, the user may install an active cover plate over a light switch in an entry way and another active cover plate over a light switch in an adult bedroom. The user may want high levels of illumination near the entry way, but lower levels of illumination in the adult bedroom. Additionally or alternatively, the user may wish to turn the illumination function off for a period of time. Further, the user may wish to perform any number of other operations, including changing the color or color temperature of the illumination. The switch/lens cover (320) can provide this control by allowing the user to manually select various functions of the cover plate (300).

FIGS. 4A, 4B and 4C show a front, side, and rear perspective view, respectively, of an illustrative active cover plate (400) for a toggle or standard light switch (see e.g. FIGS. 1C, 1D). FIG. 4A shows a front of the active cover plate (400), including the face plate (405) and the switch (420) in the lower left corner of the face plate. FIG. 4B shows a side view of the active cover plate (400) with prongs (415) extending rearward from the faceplate (405).

FIG. 4C shows that the active cover plate (400) includes a faceplate (405), a back plate (410), and two prongs (415) extending rearward from the face plate (405). The prongs (415) are configured to contact the screw terminals (172, 175; FIG. 1D) of the toggle light switch (150; FIG. 1D). The prongs (415) include insulating hoods (412) and contact surfaces (422). The insulating hoods (412) provide for smooth installation and prevent undesired electrical contact with surrounding conductors when the cover plate is installed over the switch (150, FIG. 1C). The contact surfaces (422) are configured to contact the screw head or other conductors of the side screw terminals (172, 175; FIG. 1D) on the light switch.

Figure 5:
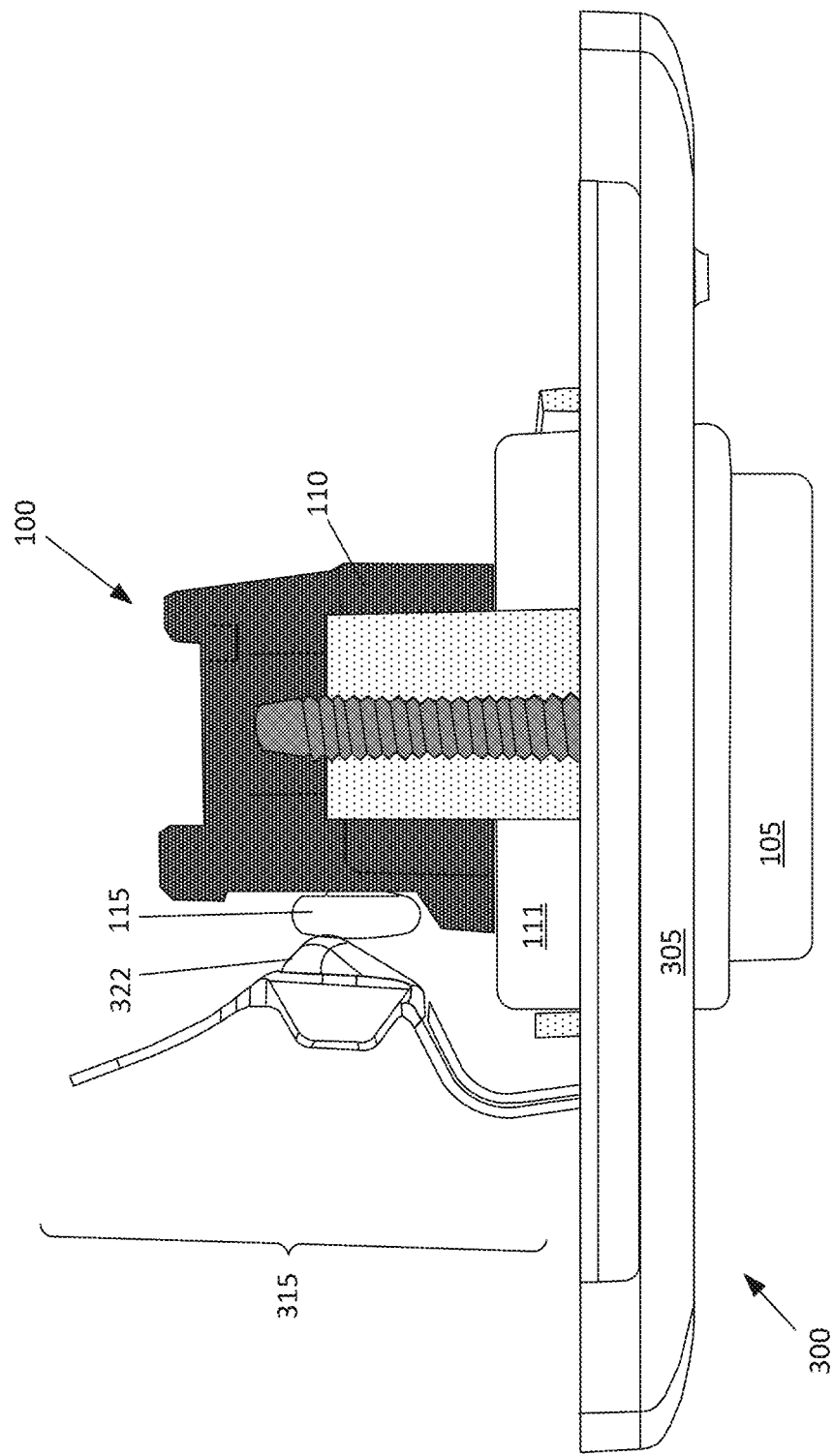
FIG. 5 shows an active cover plate installed over a rocker light switch, according to one example of principles described herein.

FIG. 5 is an end view of an active cover plate (300) installed over a décor switch (100). The faceplate (305) of the active cover plate fits around the rocker/paddle (105) of the light switch (100). The prongs (315) extend rearward around the shoulder (111) of the switch body (110) so that the contact surfaces (322) electrically contact the screw terminals (115, 120, FIGS. 1A, 1B). The contact between the contacts (322) and the screw terminals (115) supplies electrical power to the circuit in the active cover plate (300). This is only one example of a technique for extracting power from the switch or wiring. A variety of other techniques could also be used. For example, the cover plate may have wires with a stripped portion or spade connectors that could be attached to the screw terminals on the switch or directly to the wiring that supplies electrical power to the switch.

FIGS. 6A-6E show one illustrative embodiment of a prong (600) for an active cover plate. FIG. 6A is a top view of the exemplary prong (600). FIG. 6B is a front view, FIG. 6C is a bottom view, FIG. 6D is a side view and FIG. 6E is a rear view of the prong (600). This prong (600) may be used in any of a variety of active cover plates, including active cover plates for rocker/decor light switches that have two or four prongs. For example, this prong or other prong may be used for both toggle and rocker light switches. As discussed above, the prong may be attached to the faceplate/back plate and extends rearward from the faceplate.

In this example, the prong includes both front (608) and rear insulation (604). This insulation may protect the conductive elements of the prong from contact with other conductive elements that may be present during installation or operation of the active cover plate. The front insulation (608) may insulate against electrical contact with the metal yoke of light switches or other elements and the rear insulation (604) may insulate against electrical contact with electrical conductors in the electrical box and against contact with conducting electrical boxes.

In this case, the insulating cover (617, FIG. 6D), comprising the rear insulation (604), front insulation (608), side ramps (606) and main ramp (612), may all be formed as a single piece of insulating material, with the front insulation (608) connected to the rear insulation (604) along a bottom edge(s) by a living hinge(s) (610). The living hinge (610) in this example is a thin piece of plastic that bends to allow the front insulation (608) and rear insulation (604) to sandwich the flexible conductor (603) between them. The front and rear insulation (608, 604) can be joined using any of a number of techniques, including sonic welding, adhesive, heat pressing, cold pressing (such as compressing a stake or post that connects the front and rear insulation), or other suitable technique. In this example, the top portions of the front and rear insulation are joined by a sonic welding joint (613) as shown in FIG. 6E. The rear insulation (604) includes a depression (618) that mates with the backside of the contact (622). This produces a join line (616) between the front and rear insulation.

In this case the flexible conductor (603) is a flexible metal strip that forms both the base (602) which is secured to the faceplate, backplate or other element, and the contact (622) which is formed in the flexible metal strip. A variety of other conductors could be used including wire, flexible circuitry, conductive plastic or other appropriate conductor. The prong may have any of a variety of shapes, including the shape shown in FIGS. 6A-6D. For example, the prong (600) may have an elbow or bend (607) that allows the prong to reach around the shoulder of a rocker/decor light switch (see e.g. FIGS. 5, 17B).

The contact (622) protrudes out of an aperture in the insulation. The contact may be formed in any of a number of ways. It may be an integral part of the flexible metal strip or it may be a separate piece, such as a rivet or other appropriate conductor that is electrically connected to the flexible conductor (603). The contact (622) in this example has a generally oval or elliptical shape. This shape allows for contact with screw terminals with different locations/sizes on a range of different light switches. In this example, the primary or major axis of the contact is at an angle with respect to a vertical line of symmetry of the prong and with respect to a vector that is perpendicular to the rear surface of the face plate. This rotation may serve a number of purposes, including preventing arcing between structures on the light switch.

The prongs may also include a number of ramps (606, 612) surrounding the contact. As discussed previously, the ramps (606, 612) allow the active cover plate to be installed more easily. The side ramps (606) allow for vertical motion of the active cover plate to align the prongs with the screw terminals and the aperture in the face plate with the light switch toggle and/or rocker. The main ramp (612) in this case is a short, curved shape. This shape is sufficient to guide the prongs around the outlet and outward when the screws in the screw terminals are screwed out. In other words, the main ramps (612) are just long enough not to catch between the head of the screw and the body of the outlet when the screws are out. The length of the main ramp (612) in this example is significantly shorter than in some other embodiments. The length of the main ramp (612) may be short to prevent interference with other elements in the box. In light switch installations, the body of the light switch is often narrower than outlets which tends to have the prongs protrude into the central area of the box rather than along the walls in outlet installations. This brings the prongs into closer proximity to (and potentially into contact with) wires in the box. This may be for a number of reasons: first, there may be a number of wire bundles, wire nuts and other elements in the receptacle box. In some instances, it was found that long main ramps may contact these elements in the receptacle box and lift the contacts away from the screw terminals. This can be mitigated by shortening the main ramps and rapidly curving the main ramp away from the switch body (outward). Second, when these prongs are used in two prong configurations (see e. g. active cover plates shown in FIGS. 3A-4C) because both prongs are on the same side of the switch body, there may be reduced need for the prongs to guide the light switch cover plate around the body of the light switch. The prongs can be inserted on the appropriate side of the light switch and then the cover plate moved into place to align the aperture in the face plate of the cover plate with the toggle or rocker of the light switch.

FIGS. 7A-7E show one illustrative embodiment of a prong for an active cover plate. FIG. 7A is a top view of the exemplary prong (715). FIG. 7B is a front view, FIG. 7C is a side view, FIG. 7D is a rear view and FIG. 7E is a perspective view of the prong (715). This prong (715) may be used in any of a variety of active cover plates, including active cover plates for toggle light switches that have two or four prongs. As discussed above, the prong (715) may be attached to the faceplate/back plate and extends rearward from the faceplate (see e.g. FIGS. 16B-16E).

In one illustrative embodiment, four of these prongs (715) may be used in an active cover plate with four prongs for a toggle light switch as shown in FIGS. 16B-16E and 19B-19D. This configuration will work with a variety of light switches including single pole switches (two screw terminals and a ground terminal), three-way switches (three screw terminals and ground terminal) and four-way (four screw terminals and ground terminal) light switches. Illustrative examples of these light switches are shown in FIGS. 1C, 1D, 13 and 14.

As shown in FIGS. 7A-7E, the prong (715) in this embodiment may be different in some respects than other illustrative prongs described herein. In this configuration, the prongs (715) may be straighter than in other embodiments. This may be for a number of reasons. The toggle light switches (see e.g. FIGS. 1C, 1D, 13 and 14) vary in width but typically do not have the wide shoulders and recessed screw terminals of the rocker/decor switches. Consequently, the bend or elbow in the prongs more specifically designed for rocker light switches may not be needed (see e.g. FIGS. 6A-E and FIGS. 9A-9E for examples of prongs specifically designed for rocker light switches). Further, the straight/upright configuration of the prongs (715) may allow for an easier installation over the lights switches.

In this example, the prong (715) includes a flexible conductor (711), a base (702) with mounting apertures (720), rear insulation (704), front insulation (708), an off-axis contact (722), side ramps (706), and a main ramp (712).

The front and rear insulation (708, 704) may be separate pieces that are joined to each other or may be formed as a single piece that is folded or formed around the contact (722). As shown in FIGS. 7A, 7C, and 7D, the front and rear insulation (708, 704) may be joined by a joining post (724) that can be swaged, heat staked, cold staked, glued, etc., to join the front and rear insulation. A variety of other techniques could also be used to join the front and rear insulation (708, 704), such as sonic welding, mechanical fasteners, etc. As discussed above, the front and rear insulation (708, 704) may be designed to protect the conductive elements of the prong from contact with other conductive elements that may be present during installation or operation of the active cover plate. In this case, the insulating cover, comprising the rear insulation (704), front insulation (708), side ramps (706) and main ramp (712) may all be formed as a single piece of molded material, with the front insulation (708) connected to the rear insulation (704). This connection could be formed in a variety of ways, including using a living hinge(s) (710). The main ramp in this embodiment, is generally angled away from the contact and relatively straight and short. This shape can assist in guiding the prongs around the outlet and outward when the screws in the screw terminals are screwed out. The length of the main ramp (712) may be short to prevent interference with other elements in the box. In light switch installations, the body of the light switch is often narrower than outlets which tends to have the prongs protrude into the central area of the box rather than along the walls in outlet installations. This brings the prongs into closer proximity to (and potentially into contact with) wires in the box.

FIGS. 8A-8E show one illustrative embodiment of a prong (815) for active cover plates. FIG. 8A is a top view of the exemplary prong (815). FIG. 8B is a front view, FIG. 8C is a bottom view, FIG. 8D is a side view, and FIG. 8E is a rear view of the prong (815). This embodiment has some similarities with the prong described above and shown in FIG. 6A-6E and includes an elbow (821). The prong (815) can be used in any of a variety of active cover plates, including active cover plates for rocker light switches that have two or four prongs. However, as with other prong designs, the prong and/or principles that it embodies may be used in conjunction with a variety of other configurations of light switches, including toggle light switches.

In this example, the prong (815) includes a base (802) with mounting apertures (820), rear insulation (804), front insulation (808), an off-axis contact (822), side ramps (806), and a main ramp (812). The front and rear insulation (808, 804) may be separate pieces that are joined to each other or may be formed as a single piece that is folded or formed around the contact. As shown in FIGS. 8A, 8D, and 8E, the front and rear insulation (808, 804) may be joined by a joining post (824) that can be swaged, heat staked, cold staked, glued, etc., to join the front and rear insulation (808, 804). A variety of other techniques could also be used to join the front and rear insulation, such as sonic welding, mechanical fasteners, etc. As discussed above, the front and rear insulation (808, 804) may be designed to protect the conductive portions of the prong from undesirable contact with other conductive elements that may be present during installation or operation of the active cover plate. In this case, the insulating cover (817), comprising the rear insulation (804), front insulation (808), side ramps (806) and main ramp (812) may all be formed as a single piece of molded material, with the front insulation (808) connected to the rear insulation (804). This connection could be formed in a variety of ways, including using a living hinge(s) (810) and securing it with the joining post (824).

The main ramp (812) in this embodiment generally has a forward/inwardly curving profile. This forward leaning profile may place the tips/ends of the ramps closer together than the contacts. This profile may be counter intuitive, particularly in four prong configurations (see e.g. FIG. 17A) because the main ramps of the opposing prongs obscure the opening between the prongs and would interfere with the switch passing between the prongs. However, when the prongs are installed with the aid of an installation tool (see e.g. FIG. 17E) the prongs and main ramps are positioned outward and the ramps become more vertical and assist the user in guiding the cover plate over the electrical receptacle (see e.g. FIGS. 17C, 18, and 19).

FIGS. 9A-9E show one illustrative embodiment of a prong (915) for an active cover plate. This prong is similar in many respects to the prong shown in FIGS. 6A-6E and FIGS. 8A-8E. FIG. 9A is a top view of the exemplary prong (915). FIG. 9B is a front view, FIG. 9C is a side view, FIG. 9D is a rear view, and FIG. 9E is a bottom view of the prong (915). In this example, the prong (915) includes a base (902) with mounting apertures (928), rear insulation (904), front insulation (908), an off-axis contact (922), side ramps (906), and a main ramp (912). The base (902) may wire attach features (926) and mounting features (928) such as apertures. The front and rear insulation (908, 904) may be separate pieces that are joined to each other or may be formed as a single piece that is folded or formed around the contact. These are only examples. Prongs could have a number of variations and alternative features. In this embodiment, the contact (922) may be round, rectangular, or some alternative geometry instead of an off-axis oval. In this embodiment, the prong (915) includes an indentation in the rear insulation (932) that conforms to the back side of the contact (922). In this example, the front insulation (908) uniformly covers the front of the prong and wraps around to the rear insulation. The joint/joining line (930) between the front and rear insulation occurs on the back side of the contact. The front and back insulation (908, 904) can be joined together along this joint/join line (930) using a variety of techniques including sonic welding.

As discussed above, when secured to a faceplate as part an active cover plate the main ramps are very close in their relaxed position (without the install tool in place). The elbows (921) allow the prongs to fit around the shoulders of decor light switches. It should be noted, that although these prongs are specifically designed to be used with decor/rocker light switches, they may be used with toggle light switches or in other situations as well.

The prongs shown and described above and in other locations in documents incorporated by reference are only illustrative examples. A number of different geometries, materials, and configurations could be used. For example, the geometry of the prongs could be changed to any appropriate configuration that was adapted to fit or contact the screw terminals of the light switches. For example, as discussed in previously filed documents, there may be one or more contacts on a prong. The insulation configurations may be different. The conductors used may have different geometries, including using wires as the strip conductors. The number of prongs may be adapted to specific or general electrical receptacle configurations. These and any of a number of other modifications could be made within the teachings and principles described herein.

Figure 10A:
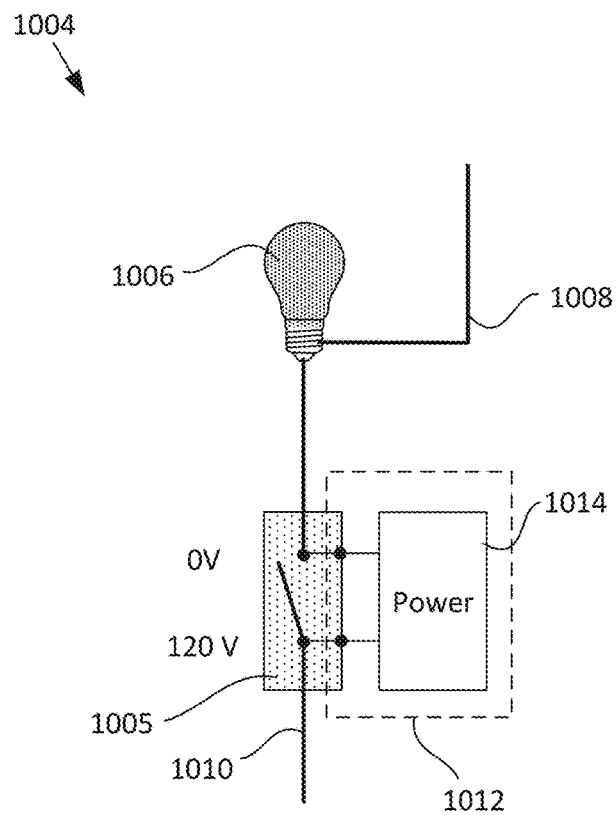
FIGS. 10A and 10B are diagrams of illustrative circuits that include light switches, loads and active cover plates connected over the light switches, according to one example of principles described herein.

FIG. 10A shows a block diagram of an electrical system (1004) that includes an active cover plate (1012) that is installed over a switch (1005) which is connected to a hot wire (1010) and controls an external load (1006). When the switch is in the open position (as shown), one terminal of the switch has 120V and the other terminal has a lower voltage (shown here as 0V). In this configuration, the active cover plate (1012) has access to the voltage difference between the two terminals and can extract power from the switch by passing a current from a first terminal of the switch, through the circuit (1014) and into the lower voltage terminal (labeled "0V"), through the external load (1006) and into the neutral wire (1008). As mentioned elsewhere, there may be a limit to the amount of current and/or power that can be utilized by the circuit (1014) before the external load (1006) reacts in an undesirable way (for example a light bulb may flash or illuminate).

Figure 10B:
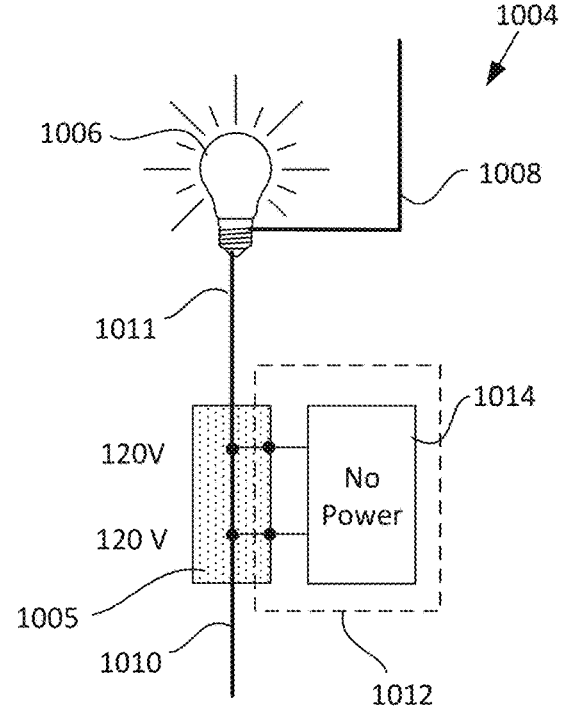

FIG. 10B shows the same electrical system (1004) with the light switch (1005) in the ON position. In this position, the hot wire (1010) is connected to the traveler wire (1011) and electrical current flows directly to the load (1006) and out the neutral wire (1008). The two terminals are electrically connected in the switch and have the same approximate voltage at each terminal. In this case the circuit (1014) in the active cover plate (1012) does not have access to power because the two terminals have the same voltage potential (120V).

The examples given above are only illustrative circuit designs. There are a number of other configurations and circuit designs that could be used in accordance with the principles described. There may be additional techniques that provide larger amounts of power from a switch without causing undesirable behavior by the load controlled by the switch. For example, users who turn on a light switch typically want the area to be illuminated immediately. This is because the user is typically stepping into a room and needs the illumination to help them navigate and/or see the contents of the area. However, users may not particularly care that lights immediately turn off when a switch is turned off. For example, upon going to bed, a user may appreciate that the lights don't immediately turn off, because the gradual dimming of the lights provides their eyes time to adjust to the darkness and gives them time to get to the bed before the room is entirely dark.

This desirable "dimming" effect can be utilized to extract energy from the light switch circuit and store it in an active cover plate or other device. According to one embodiment, after the light switch is turned off, the circuit in the active cover plate allows relatively large amounts of current to flow through the circuit so that the light gradually dims. A capacitor, battery, or other storage device can tap into the current that is still flowing through the circuit and light as it dims. In one example, the mechanical switch itself is disconnected, but a significant amount of current passes through the parallel circuit in the active cover plate, charging the capacitor or other storage device. As the device charges, this current flow decreases and the lights gradually dim. In one embodiment, an ultra-capacitor is charged over the course of several seconds while the lights dim. The ultra-capacitor is then discharged to charge a lithium ion battery. However, this is only one embodiment. A variety of other embodiments could be used. For example, a fast charging battery could be charged during the dimming of the light and be used as a battery source to supply energy to the circuit at a later point or when the lights are on.

Other implementations for extracting power from light switch circuits includes never turning the light on and simply allowing the parallel circuit in the active cover plate to conduct all the power required by the load connected to the switch. Thus, when the light is on, the circuit could extract a significant amount of power from the current flow without disrupting the lighting. This creates the significant challenge of handling up to the maximum rated circuit capacity through the prongs or other contacts. Several approaches could be used individually or in combination to address this. For example, one approach would be to monitor current flow through the prongs and cover plate circuitry and throttle the flow if it became excessive or exceeded the current draw the prongs or circuitry were rated for. A similar approach would be to monitor the temperatures of the prongs and/or circuitry. If the temperatures were high, the circuit could shut down or reduce the amount of current. Other approaches may include circuitry that detects arcing or excessive contact resistance at the prongs. If arcing, heating or an increase in contact resistance was detected, the circuitry could shut down or throttle the current flow.

Figure 11A:
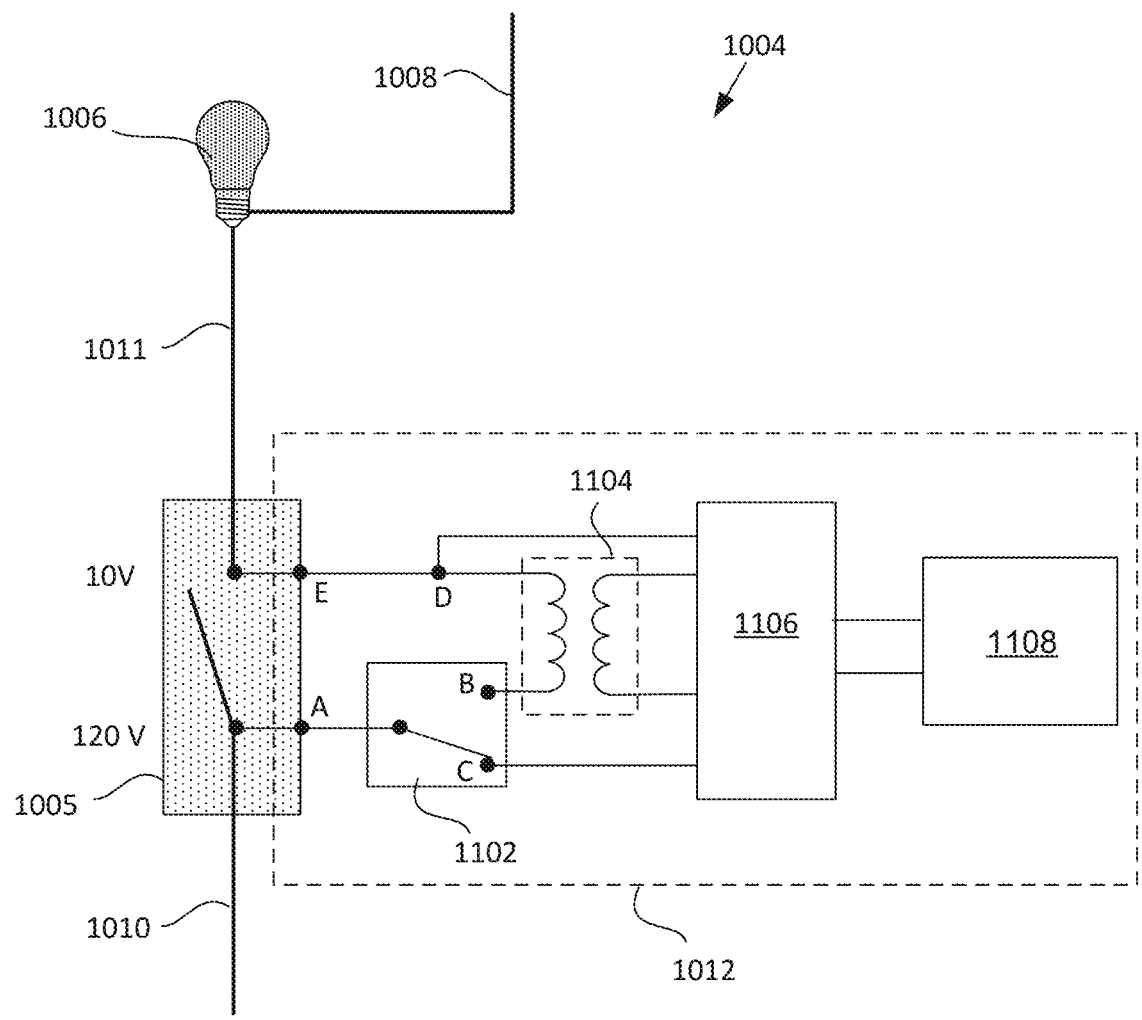
FIGS. 11A and 11B are diagrams of illustrative circuits that include light switches, loads and active cover plates connected over the light switches, according to one example of principles described herein.
Figure 11B:
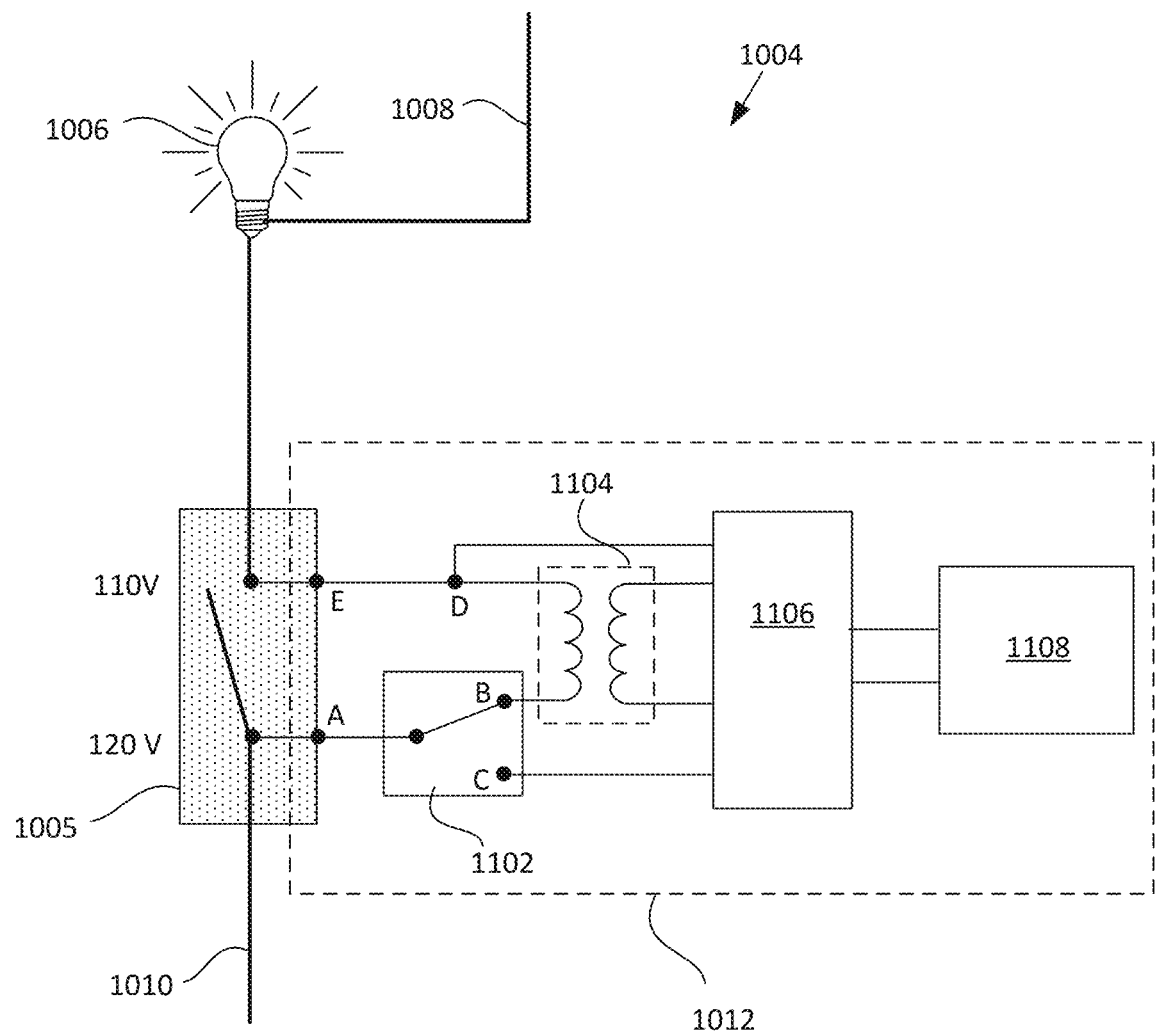

FIGS. 11A and 11B an illustrative electrical system (1004) that includes an active cover plate (1012) that is installed over a switch (1005) connected to a hot wore (1010) and a traveler wire (1011) and typically controls an external load (1006). In this example, the electrical system (1004) includes circuitry that allows the active cover plate (1012) to obtain power when the light switch is on or off. As shown in FIG. 11A, when the switch (1005) is in the open position (as shown), one terminal of the switch has 120V and the other terminal has a lower voltage (shown here as 10V). In this configuration, the active cover plate (1012) has access to the voltage difference between the two terminals and can extract power from the switch by passing a current from a first terminal of the switch, through the circuitry and into the lower voltage terminal (labeled "10V"). The current then passes through the external load (1006) and into the neutral wire (1008). As mentioned elsewhere, there may be a limit to the amount of current and/or power that can be utilized by the active cover plate circuit before the external load (1006) reacts in an undesirable way (for example a light bulb may flash or illuminate). To obtain power regardless of the on or off state of the load, the active cover plate (1012) includes an internal switch (1102), a regulator (1106) and a load (1108). The internal switch (1102) includes three nodes (A, B, and C). Node A is the input node and the internal switch can connect node A to either node B or node C. When there is a voltage difference across the switch terminals (nodes A and E) the internal switch (1102) may make a connection from node A to node C. This connects the voltage to the regulator (1106). The regulator is also connected to node D/E. The regulator (1106) can modify/condition the voltage/current that is available and supply it to the load (1108). In this configuration, the transformer (1104) is not electrically connected and does not have substantial current passing through it.

FIG. 11B shows the same electrical system (1004) but the load (1006) is ON and receiving power through the active cover plate (1012). In this example, the two terminals A and E of the switch (1005) remain open and have different voltages. Terminal/node A has the input line voltage (nominally 120 V). The internal switch (1102) connects node A and node B. Node B is connected to one leg of a transformer (1104). The electrical current flows from node A to node B, through the transformer and out to node D and node E. In this case there is some voltage drop through the transformer leg BD. This was arbitrarily selected to be a 10 volt drop, which is reflected in the 110 voltage at node E. The opposite leg of the transformer (1104) is connected to the regulator (1106) which uses the power transferred by the transformer (1104) to power the load (1108). Consequently, the electrical power supplied to the load (1006) passes from node A to node E through the cover plate (1012).

The configurations shown in FIGS. 11A and 11B allow the active cover plate (1012) to obtain power whether the load is off or on. This is significant because it allows the active cover plate (1012) installed over a light switch to support a wider range of loads, including loads that need a constant power source. For example, loads that may need a constant power source include networking, sensor, and actuation loads. In one embodiment, the light switch may include a motion or other occupancy sensor(s) that communicate wirelessly to other devices and/or cover plates. The active cover plate (1012) may include any number of additional components, including capacitors or batteries to better accommodate transient power events.

Figure 12:
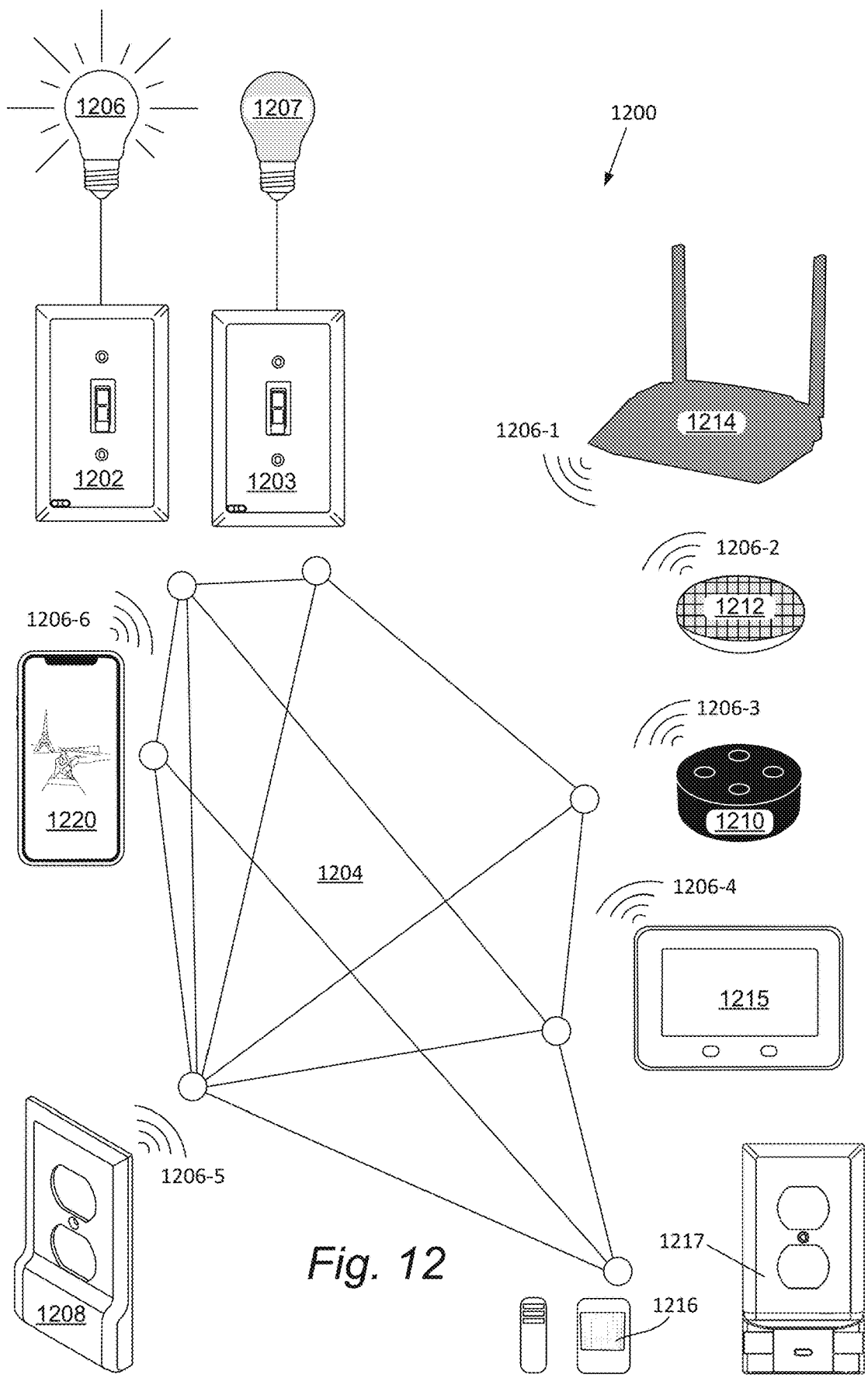
FIG. 12 is a diagram of a system for controlling loads with active cover plates, according to one embodiment of principles described herein.

FIG. 12 shows an illustrative system (1200) that uses various active cover plates (1202, 1203, 1208, 1217) to control various loads, provide illumination and/or sense environmental conditions. In one embodiment, several of the active cover plates (1202, 1203) contain a circuit that includes the principles described with respect to FIGS. 11A and 11B. Specifically, the active cover plates (1202, 1203) are capable of activating a load without changing the position the manual switch. In this example, a first active cover plate (1202) has activated the load (1206) by routing the current through the cover plate while the manual light switch remains off. The second active cover plate has switched the load (1207) off. Thus, control of the internal switch (1102, FIGS. 11A, 11B) in the active cover plates (1202, 1203) provides for control of their respective loads (1206, 1207). The active cover plates (1202, 1203) may have wireless or wired interconnectivity to send and receive signals from other devices. In this example, the active cover plates (1202, 1203) connect to a mesh network (1204) as represented by the nodes adjacent to the active cover plates. The mesh network may be of any appropriate type, including Bluetooth Low Energy (BLE), Thread, Zigbee, Z-Wave, 802.11 based mesh networks, or other appropriate or future developed network. Although the network is illustrated as being a mesh network, other network topologies and protocols may be appropriate. For example, master/slave networks may be used. A second WiFi network (1206-1 to1206-6) is also shown. However, because the WiFi network consumes a large amount of power, power constrained devices such as battery powered sensors (1216) and active cover plates (e.g. 1202, 1203) connected to light switches may use the lower power mesh network protocol (1204). In other embodiments, the active cover plate(s) mounted over light switches may actuate to manually change the position of the switch mounted in the electrical box upon receiving an externally or internally generated command.

In the system (1200) may also include various mobile devices (1220), routers (1214), various smart devices such a Google Home (1212) or Amazon's Alexa (1210) devices, various home security devices (e.g. 1215), motion active cover plates (1217), and various sensors (1216). In one embodiment, an active cover plate (1208) can be used as a bridge to translate/relay data from the mesh network (1204) to devices that use other protocols. For example, if the network uses Zigbee or Z-Wave, the bridge active cover plate (1208) could translate the communications into another protocol such as Wi-Fi or BLE so that more devices could participate. One significant consideration of which protocol to use for the mesh network is the power consumption required to participate. It may be beneficial for devices that have limited power input or reserves for the network/protocol to have lower power requirements. Examples of devices with more limited available power may include battery or solar powered sensors, mobile devices, active cover plates connected to sensitive loads, etc. Network protocols that have lower power requirements may include BLE, Zigbee, security communications in designated or other bands (e.g. 433 MHz, 900 MHz, 1800 MHz, etc.) and Z-Wave networks. Future arising networks and custom networks may also be used. In this example, the bridge active cover plate (1208) is shown as a cover plate that is configured for outlets, where there are fewer power restrictions than light switches. Consequently, it has access to more power and can transmit and receive at multiple frequencies and with higher powered protocols than other devices with more limited power.

In one example, a user may wish to turn off a light (1206) but is out of the house. Using their mobile phone, the user communicates over the internet/cell network to the router (1214) which may not have direct access to the low power protocol/mesh network to control the BLE lighting control active cover plate (1202). The router sends a Wi-Fi signal which is accepted by the bridge active cover plate (1208) and translated into BLE protocol and passed through the mesh (1204) to the lighting control active cover plate (1202) which then changes the configuration of its internal switch or other element to turn the light (1206) off. For example, the configuration of the internal switch may be changed from making a connection between terminals A and B (as shown in FIG. 11B) to making a connection between A and C (as shown in FIG. 11A).

The previous examples are directed to single pole switches that have two screw terminals for connection of hot and neutral wires and one additional screw terminal for connection of a ground wire. These single pole switches are used where only one switch controls the exterior load. However, the principles described herein also apply to situations where multiple switches control the load, multi-pole switches are used. For example, three-way and four-way switches are used in rooms with multiple entrances, such as hallways, stairways, and larger rooms. One light switch is located at each entrance so that a user entering from any entrance can control the overhead lights. The electrical system is configured so that changing the state of any switch results in a change in the load state. Consequently, the lights can be turned ON or OFF from any entryway/switch.

The embodiments described above are only illustrative. The network may have more components or less components than illustrated. For example, a group of active cover plates that contain motion detectors (e.g. 1217) or other sensors may communicate between each other without other components or networks. For example, there may be a network of motion sensing active cover plates that include one or more cover plates with motion sensors. There may be additional active cover plates that are connected to the network or receive commands from the network that do not have motion or other sensors. When motion is detected by an active cover plate, it may send a signal to other active cover plates that signals them to take an action. For example, a motion sensing active cover plate (1217) may be located near an entrance to a home. When the motion sensing active cover plate (1217) senses motion, it may take an internal action (such as illuminating the surrounding area or turning on an exterior light) as well as sending a signal to other active cover plates that are connected to its network or subnetwork. These active cover plates may then respond by taking appropriate actions such as illuminating, increasing illumination, decreasing illumination, turning off illumination, forwarding the command/signal to other active cover plates, etc. In some embodiments, a subnetwork or channel may be manually or electronically selected by a user to group the cover plates. For example, a user may select a "group 1" designation for an entry way motion detector active cover plate and hallway guidelight active cover plates. This can be performed manually by moving a switch on the selected active cover plates to a position labeled "1". After this grouping, when the motion detector guidelight at the entry way detects motion, it will illuminate and signal other guidelights in the group to also illuminate. This signaling could be accomplished through electronic, sound, optical or other communication techniques. Guidelights that are not in "group 1" will not illuminate. In another example, the user may have two motion sensing active cover plates in different entryways to a kitchen, with illuminating active cover plates mounted over the kitchen counter. The user designates this group of active cover plates as "group 2". If either of the motion sensing active cover plates detects motion, they send a signal that causes the illuminating active cover plates over the kitchen counter to brighten for a specific amount of time after motion ceases to be detected. There are a variety of other implementations. For example, each active cover plate in a group may be configured to detect motion. Upon sensing motion, a first active cover plate sends an optical signal to any other guidelight in its group by flashing its lights in a manner that isn't detectable by the user. Any active cover plate in the group that detects this optical signal then illuminates and repeats the signal. In this situation, the active cover plates in the group may sequentially illuminate as the optical signal spreads throughout the group. In this example, grouping may not be necessary.

Figure 13:
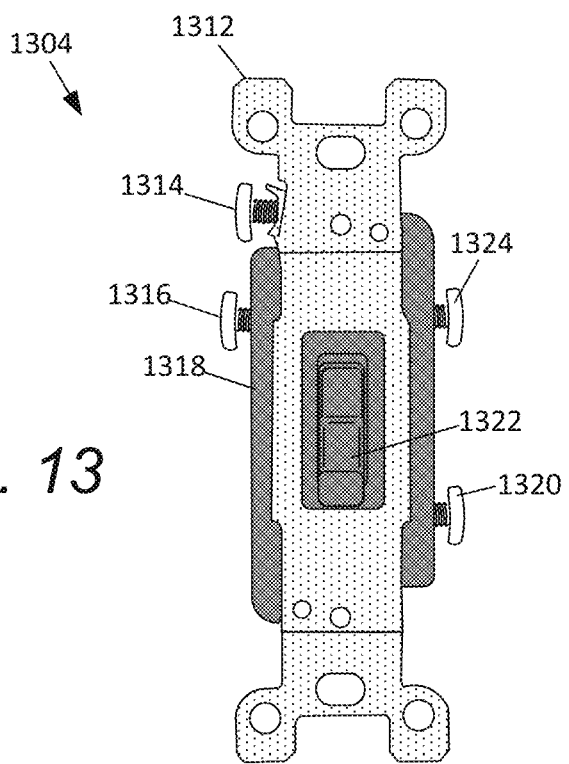
FIG. 13 shows one example of a three-way light switch, according one example of principles described herein.

FIG. 13 is a front view of an illustrative three-way switch (1304). This three-way switch (1304) includes a body (1318), and a yoke/mounting bracket (1312) attached to the body. A ground screw terminal (1314) is connected to the bracket (1312). The bracket (1312) also includes various apertures and threaded holes for mounting of the switch (1304) to an electrical box and for mounting a face plate over the switch. The switch (1304) also includes three screw terminals (1316, 1320, and 1324). These screw terminals allow electrical wires to be mechanically fastened and electrically connected to the switch. A toggle (1322) allows the user to mechanically change the position of internal contacts to change the electrical configuration of the switch. For example, a first screw terminal (1324) may be electrically connected to a second screw terminal (1320). However, when a user mechanically moves the toggle upward to a new location, the internal contacts may be reconfigured to connect the first screw terminal (1324) to a third screw terminal (1316).

This is just one embodiment of a three-way switch. A variety of other three-way switch configurations may also be used in conjunction with the principles described. For example, the three-way switch may have a rocker rather than a toggle, or the wiring may be connected to stab in connectors on the rear of the switch body rather than directly to the screw terminals. The three-way switch and other switches described herein may also include various sensors and actuators. For example, the switches may include motion detectors and/or actuators to remotely/automatically control the loads/lights connected to the switch.

Figure 14:
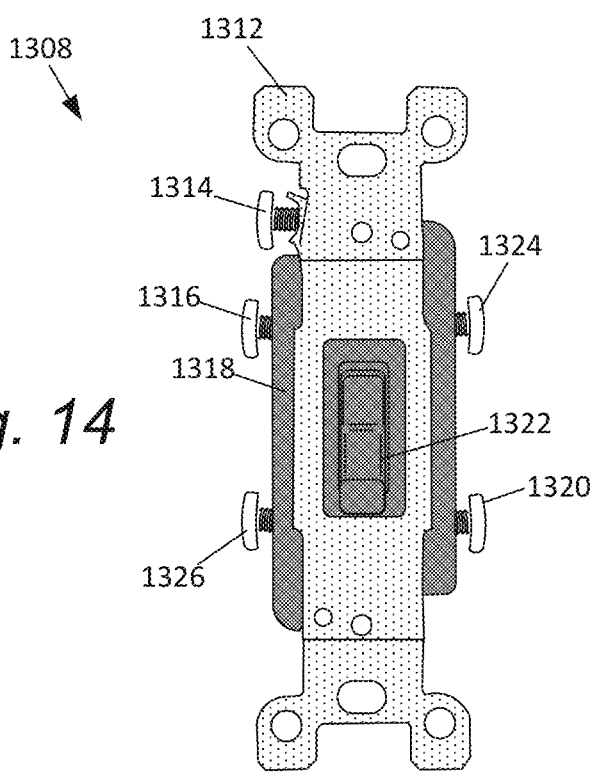
FIG. 14 shows one example of a four-way light switch, according one example of principles described herein.

FIG. 14 is a front view of an illustrative four-way switch (1308). The four-way switch may include many of the same features as a three-way switch. For example, this four-way switch (1308) includes a body (1318), and a yoke/mounting bracket (1312) attached to the body. A ground screw terminal (1314) is connected to the bracket (1312). However, in additional to the three screw terminals (1316, 1320, 1324), the four-way switch (1304) also includes a fourth screw terminal (1326). Although the toggle (1322) allows the user to mechanically change the electrical configuration of the switch, the internal contacts are different than in a three-way switch. In this example, in a first configuration a first screw terminal (1324) may be electrically connected to a second screw terminal (1320) and the third screw terminal (1316) may be connected to the fourth screw terminal (1326). However, when a user mechanically moves the toggle upward to a new location, the internal contacts are reconfigured to connect the first screw terminal (1324) to the fourth screw terminal (1326) and the third screw terminal (1316) is connected to the second screw terminal (1320). The above example is only illustrative of the principles described. Different switches may have various other implementations.

Examples of electrical systems that include three-way and four-way switches are given below. Unlike illustrative single pole switches shown and described in FIGS. 1A-1D, these multi-pole switches do not have a preferred orientation. For single pole switches, it is standard practice to mount the switches so that moving the toggle upward turns the light ON and moving the toggle downward turns the light OFF. Mounting a single pole light switch upside down would result in counterintuitive operation for the user. Because single pole light switches have a consistent mounting configuration, the location of the screw terminals is also fairly consistent (typically on the right of the switch when facing the front of the switch). Thus, the two prongs on active cover plates intended for use with single pole switches (see e.g. FIGS. 3A, 3B, 3C, 4A, 4B, 4C, 5) can be located to consistently contact the screw terminals. However, for three-way and four-way switches, simply repositioning the toggle/rocker of any switch in the electrical system will change the state of the load/lights. Thus, three-way and four-way light switches can be mounted upside down or right side up without interfering with the user's operation. This makes the locations of the screw terminals less predictable.

Further, as the configuration of the electrical system changes as a result of users reconfiguring various light switches, the electrical interconnections between the various screw terminals also changes. A pair of screw terminals that can supply electrical power to an active cover plate in a first configuration may not be able to supply electrical power in a second configuration. Thus, for an active cover plate to reliably receive electrical power, the active cover plate may be configured to contact multiple screw terminals and select the screw terminals that have electrical power for a given configuration.

Figure 15A:
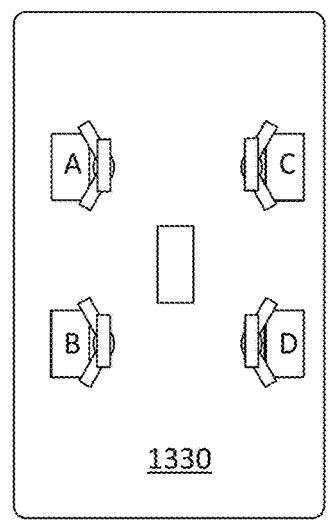
FIGS. 15A-15C are diagrams of illustrative prongs and active cover plates for multi-pole light switches, according to one example of principles described herein.

FIG. 15A is a diagram of a rear view of an active cover plate (1330) that includes four prongs (A, B, C, D) and is configured to be compatible with both three-way and four-way light switches. When the cover plate (1330) is placed over a three-way switch, one of the prongs will not connect with a screw terminal. For example, the cover plate (1330) may be placed over the three-way switch (1304, FIG. 13) and prong A may contact the first screw terminal (1324), prong B may contact the second screw terminal (1320) and contact C may contact the third screw terminal (1316). Prong D will rest on the body (1318) of the switch (1304) and will not make contact with a screw terminal. If the three-way switch (1304) is mounted upside down, prong C may contact the second screw terminal (1320), contact B may contact the first screw terminal (1324) and prong D may contact the third screw terminal (1316) with prong C resting on the body (1318) and may not contact a screw terminal. Thus, this configuration, which includes more prongs on the active cover plate than there are terminals on the light switch accommodates multiple light switch mounting orientations.

For four-way switches, the prongs (A, B, C, and D) of the active cover plate (1330) may contact all four of the screw terminals when the light switch is mounted upside down or right side up. However, there is no requirement that each of the prongs contact a screw terminal. The active cover plate can extract power from the light switches if there is a voltage difference between the screw terminals that will support electrical current flow.

Figure 15B:
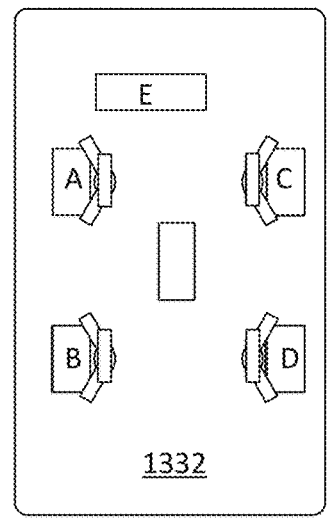

FIG. 15B shows an alternative configuration of an active cover plate (1332). In this configuration, a fifth prong (E) has been added to the other prongs (A, B, C, and D). This prong will make electrical contact with the ground screw terminal. It may contact the yoke of the light switch (which is connected to the ground wire) or directly contact the ground screw terminal.

Figure 15C:
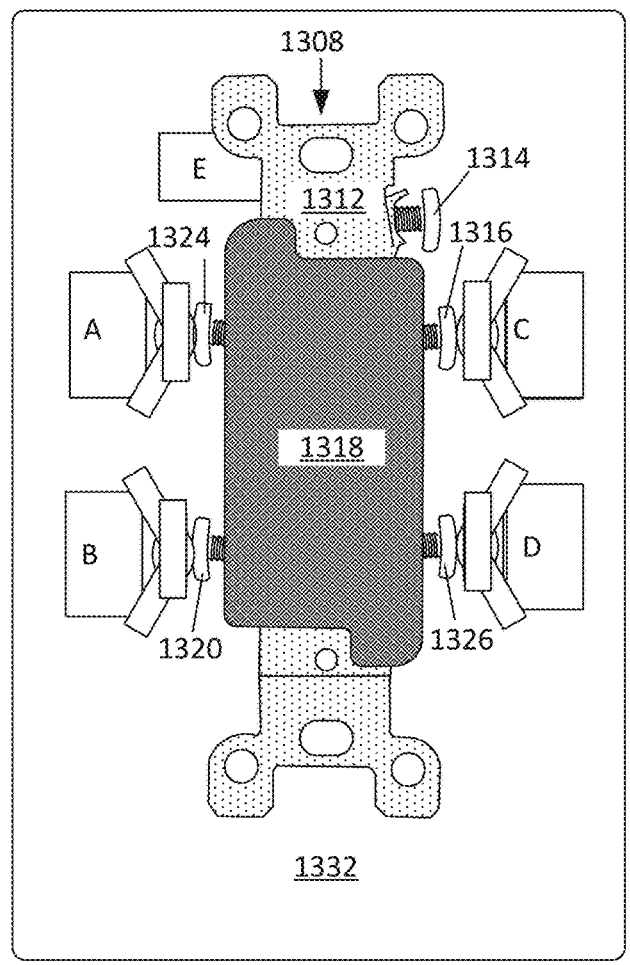

FIG. 15C shows a rear view of an active plate (1332) installed over a four-way switch (1308). For purposes of illustration, electrical wires are not shown connected to the screw terminals but are assumed to be in place. In this example, prong A may contact the first screw terminal (1324), prong B may contact the second screw terminal (1320) and contact C may contact the third screw terminal (1316), and prong D may contact the fourth screw terminal (1326). Prong E contacts the conductive bracket/yoke (1312) that is electrically connected to a ground screw terminal (1314).

In general, an active cover plate for installation over a multi-pole light switch may include a face plate and at least three prongs extending rearward from the faceplate to electrically contact terminals of the multi-pole switch. A circuit in the active cover plate is connected to and draws power from the prongs. However, as discussed above, there may not be a voltage difference between a given pair of these prongs that will support electrical current flow. Thus, the circuit in the active cover plate will have to select or reselect the screw terminals that have a voltage difference each time the electrical system is reconfigured.

However, the inclusion of four prongs can make installation more difficult. All four prongs are placed around the light switch body, with two prongs on each side of the light switch body. To correctly install the active cover plate the prongs are directed into the space around the light switch but inside of the receptacle box.

FIGS. 16A, 16B, and 16C show an install tool (1600) and its use in spreading the prongs apart. FIG. 16A shows an install tool (1600) that may be used to spread the prongs before installation. This install tool (1600) is inserted between the prongs. In this example, the installation tool (1600) includes body (1603), a handle (1602), stand offs (1606), a toggle slot (1612), and tapered extensions (1608). The handle (1602) is configured to be grasped by the user and is used to manipulate the install tool (1600) during an installation.

The stand-offs (1606) are configured to contact the rear surface of the face plate of the active cover plate and locate the tapered extensions (1608) at a correct height off the rear surface. The tapered extensions (1608) are configured to be inserted between the prongs, with the tips of the extensions being closer together than the prongs. When the install tool (1600) is inserted between the prongs, the prongs slide along the tapered outer edge of the extensions (1608), gradually spreading apart as the tool (1600) continues to be inserted between the prongs. When a shoulder (1604) contacts the prongs, the install tool is fully inserted between the prongs and the cover plate is ready to install over the light switch. The fully inserted install tool is shown in FIGS. 16B and 16C.

FIG. 16B is a perspective view of a toggle install tool (1600) installed between the prongs (1616) of a toggle style active cover plate (1614). The aperture (1618) is configured to receive the toggle light switch handle. The handle can extend through the slot (1612) and can pass into the aperture (1618).

FIG. 16C shows the shoulder (1604) contacting the prongs. The prongs (1616) are bent outward to fit over the switch body.

Figure 16D:
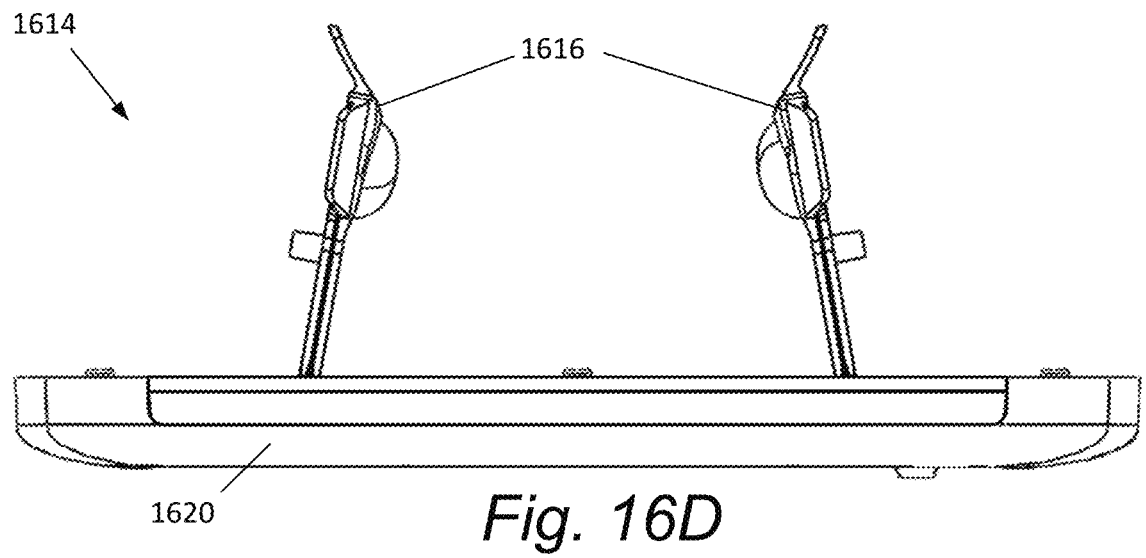
Figure 16E:
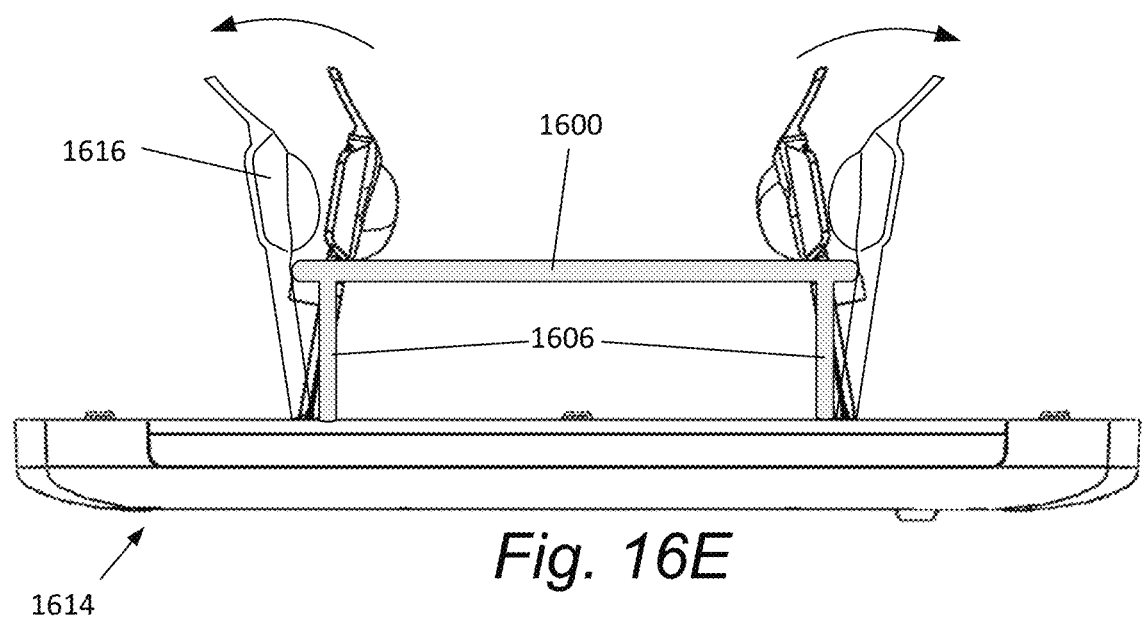

Now referring to FIGS. 16D and 16E of the four-prong toggle active cover plate (1614), FIG. 16D shows a bottom view of the active cover plate (1614) with a profile side view of the prongs (1616). The prongs are connected to the faceplate (1620) and/or the backplate. As shown in FIG. 16D the prongs may be angled inward. In other embodiments, the prong may have an even greater angle. Consequently, it may be difficult to spread and maneuver all four of the prongs around a light switch while lining up the cover plate to interface with the light switch.

When the install tool (1600) is installed (FIG. 16E) the prongs (1616) move/bend outward. The standoffs (1606) position the install tool (1600) at the correct/desired height. The install tool/active cover plate (1600/1614) are then ready to be installed over the toggle light switch.

Figure 17A:
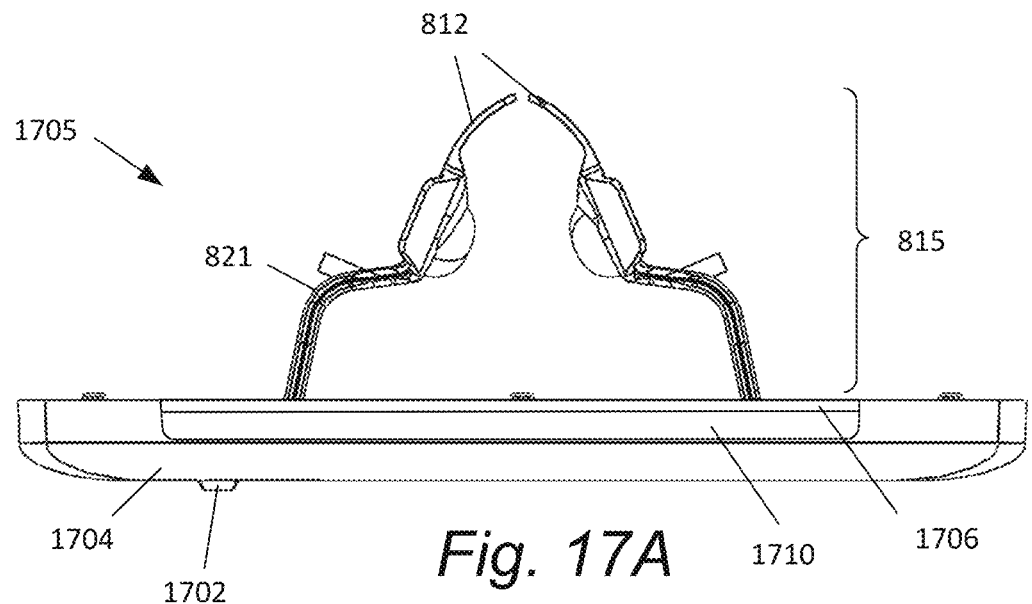
FIGS. 17A-17D are diagrams of illustrative active cover plates, prongs, and installation tools for multi-pole light switches, according to one example of principles described herein.
Figure 17B:
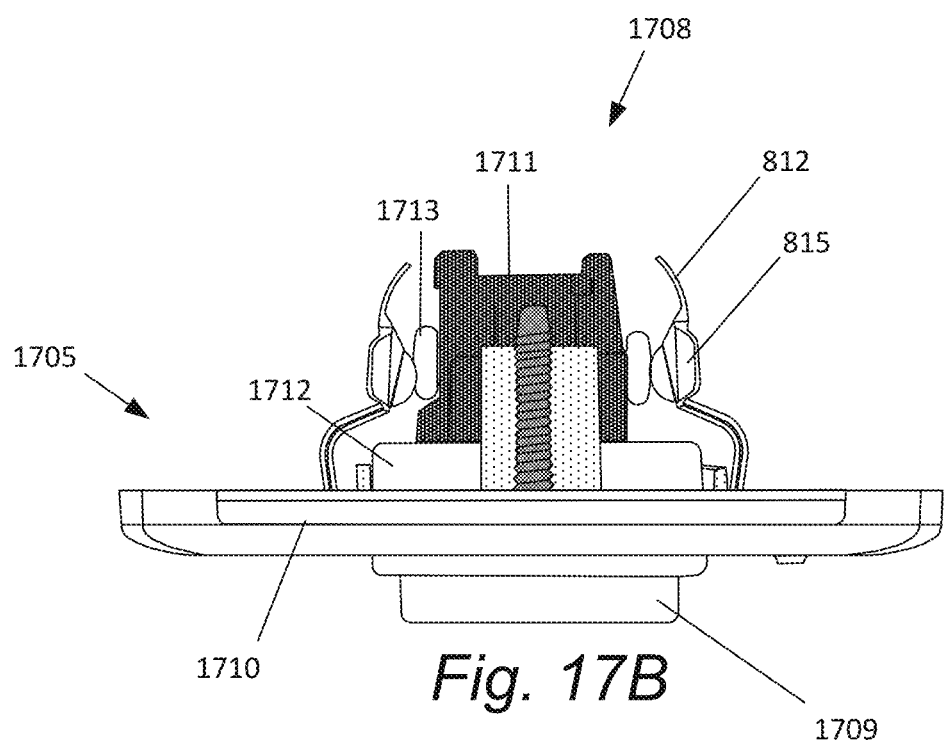

FIGS. 17A-17E are pictures showing an illustrative embodiment of a four-prong active cover plate (1705) for installation over a decor/rocker light switch (1708, FIG. 17B). The prongs (815) in this embodiment may be different in some aspects than shown in other examples. In this configuration, the prongs include a bend or elbow (821), with the prong extending more directly upward as it leaves the back of the cover plate and then bending inward. As discussed above, this bend (821) can allow the prongs (815) to reach around shoulders (1712, FIG. 17B) on décor light switches (1708). These shoulders (1712) are present in at least some décor designs as a result of the wider face of the rocker/paddle (1709) that is exposed for user interaction. This larger/wider rocker (1709) may be desirable for a number of reasons, including easier manipulation of the rocker by the user. However, behind the rocker face there is no need for the width to continue. To save materials, expense and weight, the designers of the light switches decrease the width of the switch body (1711). This results in a design where the screw terminals (1713) are recessed behind the shoulder. In some cases, the width of the body (1711) where the screw terminals (1713) are located can be significantly narrower than the face of the switch. This is reflected in FIG. 17A, where the prongs in their relaxed position have a relatively narrow gap between the contacts on the opposing prongs to accommodate the relatively narrow switch body (1711) and closely spaced screw terminals (1713). However, the prongs have the flexibility and configuration to also contact more widely spaced screw terminals (i.e. screw terminals of three and four-way light switches which tend to have wider bodies).

The main ramps (812) of the décor prongs are different in some respects than other prongs. As shown in FIG. 17A, the main ramps (812) extend inward with a reverse curve, so that the tips of the ramps on opposing prongs may actually be closer together than the contacts. This may be counter intuitive because one of the functions of the main ramps (812) is to guide the active cover plate over and around the light switch body. However, with the tips of the ramps (812)

very close together in the four-prong cover plate, it could be difficult to manually spread the prongs apart and around the light switch body during the installation of the cover plate. FIG. 17A is a bottom view of the illustrative four prong active cover plate for decor light switches. This image also shows the tips of the prongs coming very close to each other. Also shown in FIGS. 17A, 17B are various additional elements of the active cover plate, including the face plate (1704), the switch/sensor cover (1702), the light pipe (1710), and back plate (1706).

As discussed above, the inclusion of four prongs can make installation more difficult. All four prongs are placed around the light switch body, with 2 prongs on either side of the light switch body, in the space around the light switch but inside of the receptacle box. In one embodiment shown in FIGS. 17C and 17D, an install tool (1714) is used to spread the prongs before installation. This install tool (1714) is inserted between the prongs (815). In this example, the install tool (1714) for the décor light switch active cover plates (1705) is different in some respects than the install tool (1600, FIGS. 16A-16C, 16E) for the toggle active cover plate (1614). In this example, the decor install tool includes a body (1703), handle (1716) on one end of the body, a tapered extension (1720) on the other end of the body, and shoulders (1718). The décor install tool (1714) may not need standoffs because it is secured in place by the bend/elbow (821) in the prongs (815). Further, the décor install tool (1714) does not need a slot or space in the extension because the extension will not interfere with the relatively low-profile rocker (1709, FIG. 17B) on the light switch. The handle (1716) is configured to be grasped by the user and is used to manipulate the install tool (1714) during an installation. When the install tool (1714) is inserted between the prongs (815), the prongs slide along the tapered outer edge (1722) of the extension (1720), gradually spreading apart as the tool (1714) continues to be inserted between the prongs (815). When a shoulder (1718) contacts the prongs (815), the install tool (1714) is fully inserted between the prongs (815) and the cover plate (1705) is ready to install over the light switch.

Figure 17C:
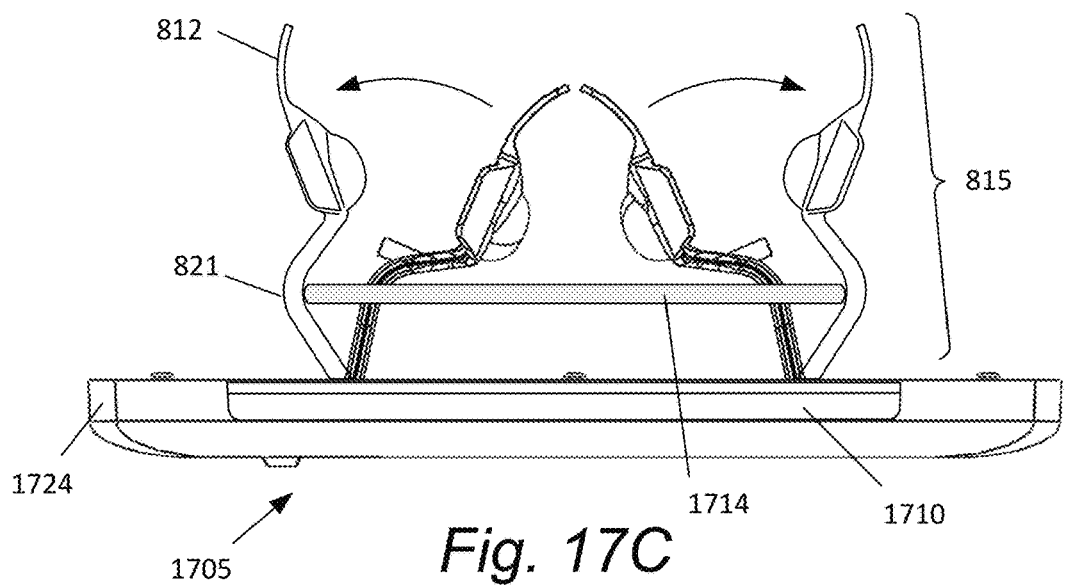
Figure 17D:
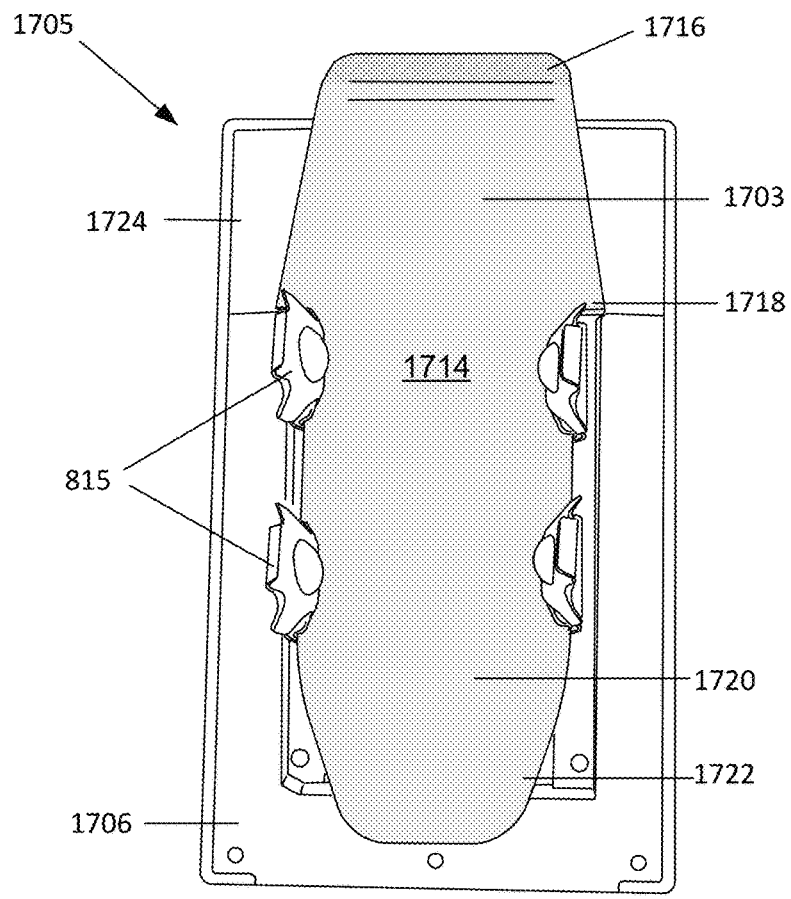

The inserted install tool (1714) is shown in FIGS. 17C and 17D. The install tool (1714) has been inserted between the prongs (815) and has spread the prongs apart with the shoulders (1718) contacting the edges of the prong. With the install tool (1714) in place, the main ramps (812) (the portion of the insulation that extends farthest rearward from the cover plate) are nearly vertical and are configured to guide the cover plate (1705) over the decor/rocker light switch (1708, FIG. 17B). The edges of the insertion tool rest in the elbow of the prongs. Specifically, FIGS. 17D and 17E are diagrams of the install tool (1714) being inserted between the prongs (815). The prongs (815) move outward as the install tool (1714) is inserted.

Figure 18:
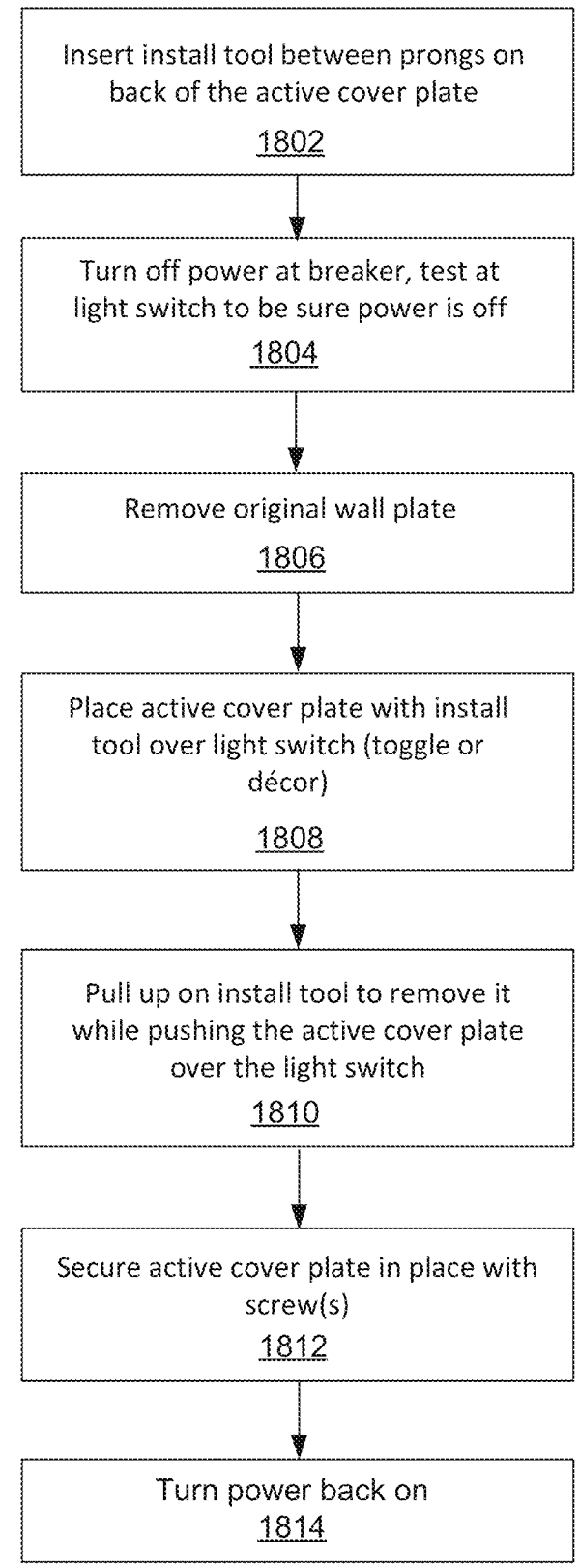
FIG. 18 is a flow chart for installing an active cover plate over an electrical receptacle, according to one embodiment of principles described herein.

FIG. 18 is a flow chart showing one illustrative method for installing an active cover plate over a receptacle such as a light switch. At some point in the process, the install tool may be inserted between the prongs on the back of the cover/cover plate (step 1802). This may occur at the factory where the install tool may be inserted between the prongs prior to packaging the cover plate. Alternatively, a user may insert an install tool that is separate from the cover plate. For example, an install tool may be provided separately and used to install multiple cover plates. The step of inserting an install tool may be performed at any time prior to the placing of the active cover plate over the electrical receptacle. For example, the install tool may be placed between the prongs prior to packaging of the active cover plate.

The power is turned off at the breaker and the light switch is tested to be sure that the power is off (step 1804). For example, the light switch could be flipped on and off after the breaker is shut off to determine if the light or other load receives electrical power. The original cover plate is then removed (step 1806). Additionally or alternatively, a meter or other sensor could be used to check for power at the light switch after the original cover plate is removed.

After the original cover plate is removed and the power is off, and the active cover plate with the install tool in place is placed over the light switch (toggle, décor, or other) (step 1808). The install tool is between the prongs and holds the prongs apart so that the light switch body can be placed between the prongs. As the active cover plate is moved over the light switch body and the prongs are on either side of the light switch body, the install tool can be removed by sliding the install tool upward/downward from between the prongs. This allows the prongs to relax somewhat and contact the sides of the light switch body. While removing the install tool, the active cover plate/active cover plate can be pushed farther over the light switch until the toggle or rocker of the light switch engages with the corresponding aperture in the cover plate (step 1810). The active cover plate can then be secured in place with screw(s) to connect it to the light switch body (step 1812). With the active cover plate in place, the power can be turned back on (step 1814).

The method given above is only an illustrative example There may be a number of variations to the method shown. For example, the order of the steps may be changed, additional steps may be added, and some steps may be removed. For example, the cover plate may be installed without turning the power off if the installing individual is an electrician who is both comfortable and knowledgeable about working with live circuits. In some embodiments, the active cover plate may not include fasteners such as a screw. A variety of techniques may be used to secure the active cover plate over the switch. For example, the active cover plate may snap into place or use magnets or other connection elements. An additional step that could be added is testing the active cover plate to determine if the lights in the cover plate illuminate when the area is dark and the mechanical control switch on the cover plate (if any) is in the ON position. In some situations, the step of pulling the install tool to remove it may be separate from the step of pushing the functional wall plate over the light switch. Although these steps can be performed together the steps could be performed sequentially or the prongs themselves may pull the cover plate into position over the light switch. Additionally, in some situations an installation tool may be configured differently or not used at all.

FIGS. 19A-19D show one exemplary method for installing the active cover plates (1614) over light switches. In this method, the install tool (1600) is inserted between the prongs (1616) on the back of the active cover plate/active cover plate as shown in FIG. 19B (step 1902). The active cover plate (1614) with the install tool (1600) in place can be installed over the light switch (step 1904). This step can be the same for both toggle and décor light switches. FIG. 19C shows the active cover plate (1614) with the install tool (1600) being placed over a toggle light switch (1304). The install tool (1600) holds the prongs (1616) apart so that they pass around the body of the light switch (1304). In this case the toggle extends through the slot in the install tool (1600). The installer then pulls up on the handle of the install tool (1600) to remove it from between the prongs (1616) and pushes the active cover plate farther onto/over the light switch (step 1906). This is shown in FIG. 19D. In some situations, the active cover plate (1614) may simply snap over the light switch (1304) without any additional action from the user. In other situations, the user may push the active cover plate over the electrical receptacle or light switch until the active cover plate is flush with the wall and/or the desired portion of the electrical receptacle protrudes through apertures in the active cover plate. The active cover plate can then be secured in place with screws (step 1908) or other fastening technique.

Double gang light switches are used where it is desirable for two different loads to be separately controlled from the same location. For example, at an entry way, it may be desirable for there to be a first switch to control an exterior light and a second switch to control an interior light. Typically, these lights switches are single pole, three-way or four-way light switches that are installed adjacent to each other in a double sized outlet receptacle box. A double gang configuration is only one example; the principles described can also be applied to triple gang light switch configurations, quadruple gang light switch configurations, etc.

Figure 20:
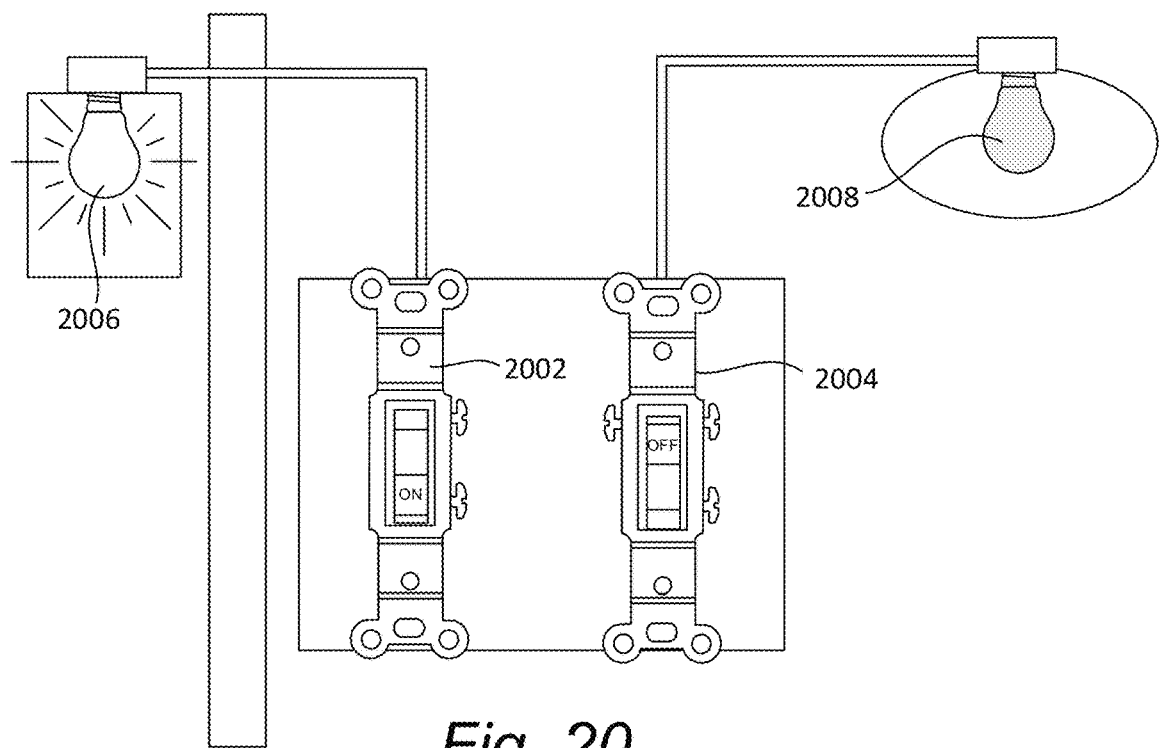
FIG. 20 is an illustrative diagram of an electrical system that includes a double gang light switch installation that controls two separate loads, according to one example of principles described herein.
Figure 21:
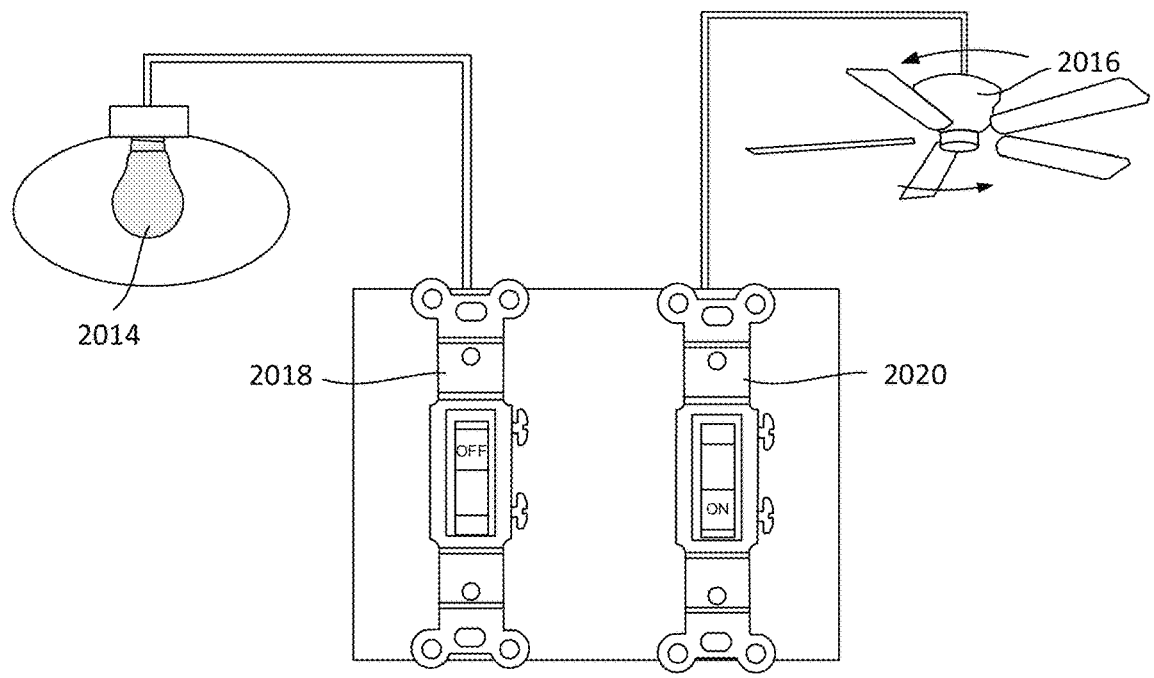
FIG. 21 is another illustrative diagram of an electrical system that includes a double gang light switch installation that controls two separate loads, according to one example of principles described herein.

FIGS. 20 and 21 show two different double gang switch installations. In a first installation shown in FIG. 20, the switch (2002) on the left controls a porch light (2006) and the switch (2004) on right controls an interior room light (2008). A user may wish for the porch light (2006) to remain on at night while the interior room light (2008) is switched off. To install an active cover plate over this switch installation, it can be desirable for the active cover plate to draw power from the room light switch (2004) on the right instead of the porch light switch (2002) on the left. As discussed previously, this is because there is no voltage difference across the screw terminals of the porch light switch when the porch light switch is on. The users may want to have the interior illuminated by the active cover plate at night but still leave the porch light (2006) or other exterior light on. This can be accomplished by having the active cover plate draw power from the right light switch (2004) which is switched off when the room is dark.

FIG. 21 shows an opposite light switch configuration. In this case, the left light switch (2018) controls the room light (2014) and the right light switch (2020) controls the overhead fan (2016). The light switch (2014) in the room may be off at night but the overhead fan (2016) may continue to operate (i.e. overhead fan switch (2020) may be left on a significant portion of the time). Thus, in this case, it is desirable for the active cover plate placed over the double gang light switches (2018, 2020) to draw power from the room light switch (2018) on the left instead of the overhead fan switch (2020) on the right because this light switch is off when the room is dark. Consequently, to be suitable for a broad range of situations and users, an active cover plate for multi-gang light switches may be able to draw power from one light switch or the other, or from both. There are many approaches that could be used to resolve this issue. In one embodiment, the double gang active cover plates could be reconfigurable during manufacturing without additional or specialized parts for any given configuration. This approach is further described with respect to FIGS. 28A-28H and 29A-29I.

Figure 22A:
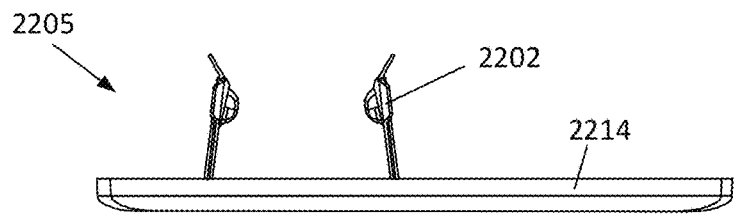
Figures 22B, 22C, 22D:
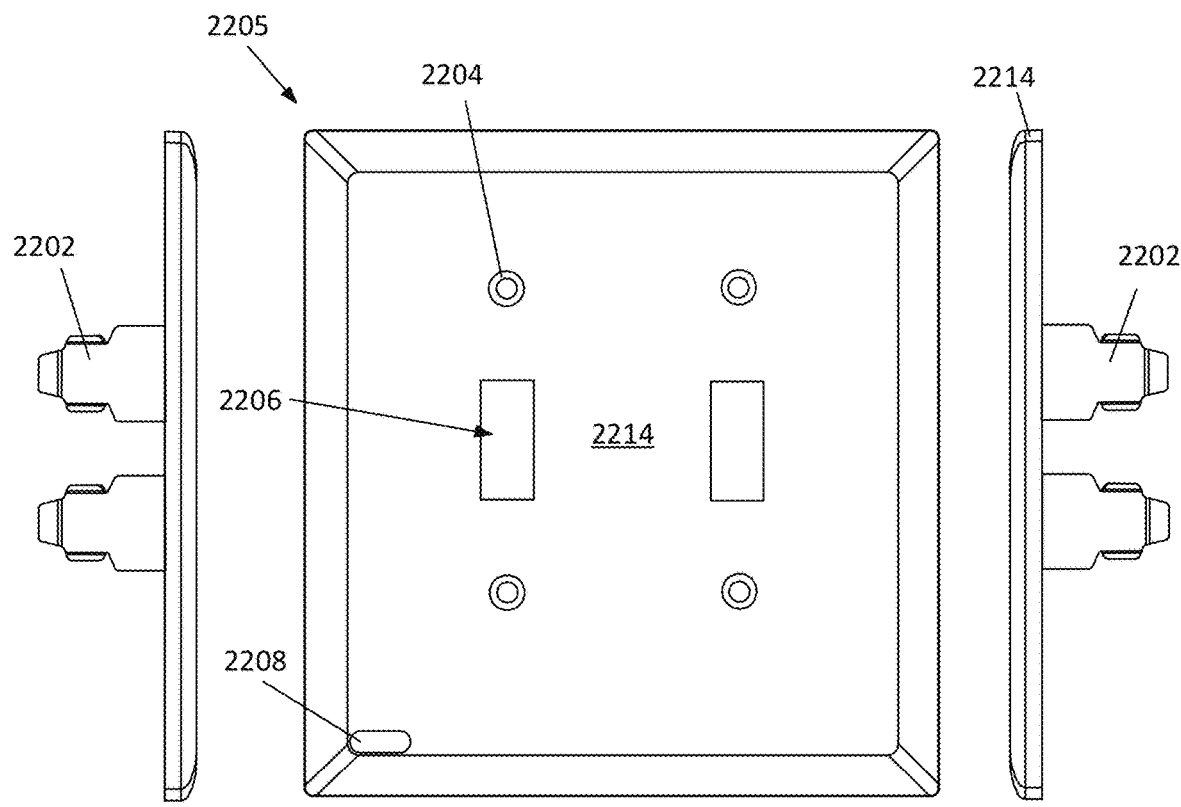
Figure 24A:
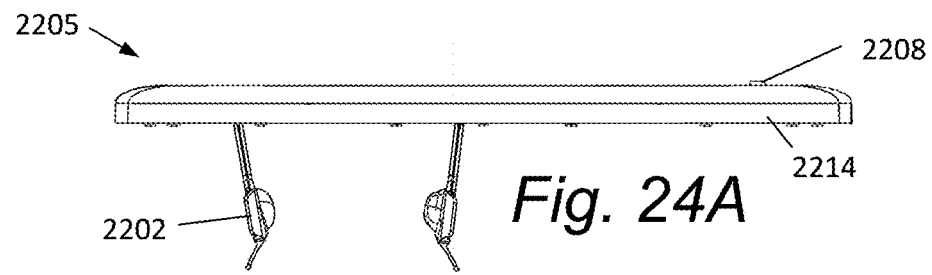
Figure 24B:
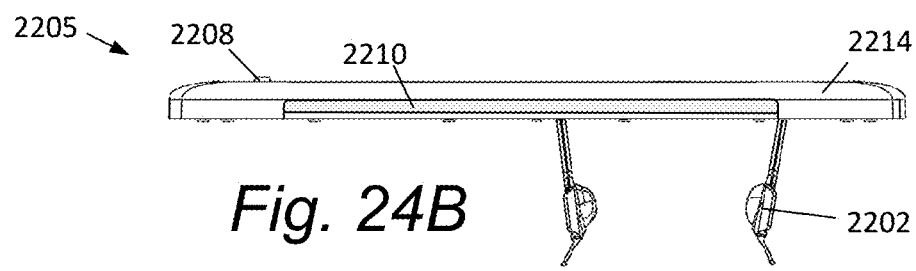

FIGS. 22A-22E show one example of an active cover plate (2205) for double gang light switches. FIG. 22A shows a top view of the active cover plate (2205) with the prongs (2202) extending out from the rear of the faceplate (2214). FIG. 22B shows a side view of the active cover plate (2205) and the rear/outboard side of the prongs (2202). FIG. 22C shows a front view of the active cover plate (2205). In this embodiment, the active cover plate includes a faceplate (2214) with apertures (2204) for connectors and apertures (2206) to accept the toggle light switch handles. This example shows a switch/light sensor cover (2208) in the lower left-hand corner. The shape, size and location of the switch/light sensor cover could be selected in a variety of ways. For example, the switch/light sensor cover (2208) may be in the center, right or higher up on the plate. It could also have a variety of shapes including round, oval, or any other suitable shape. A number of examples of active cover plates with alternative sensor sizes, shapes, and locations are shown in FIGS. 24R-24EE.

Figure 22E:
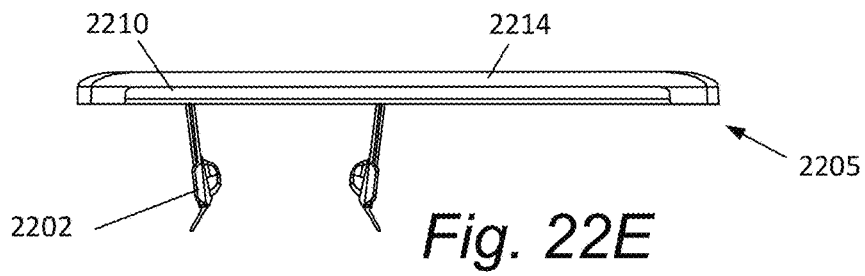

FIG. 22D shows the right side view of the active cover plate with prongs (2202) extending from the faceplate (2214). FIG. 22E shows a bottom view of the active cover plate (2205) and prongs (2202) with the light pipe (2210) on the bottom edge of the faceplate (2214). As discussed above the light pipe allows for light from the LEDs to be conducted out of the active cover plate. The light pipe (2210) could have a variety of different shapes and sizes. A variety of these alternative embodiments are shown in FIGS. 24A-24Q. In this example, the light pipe (2210) has a length that extends across the majority of the bottom edge of the face plate (2214). As discussed and shown below, the light pipe could have a different length and/or geometry.

Figure 22F:
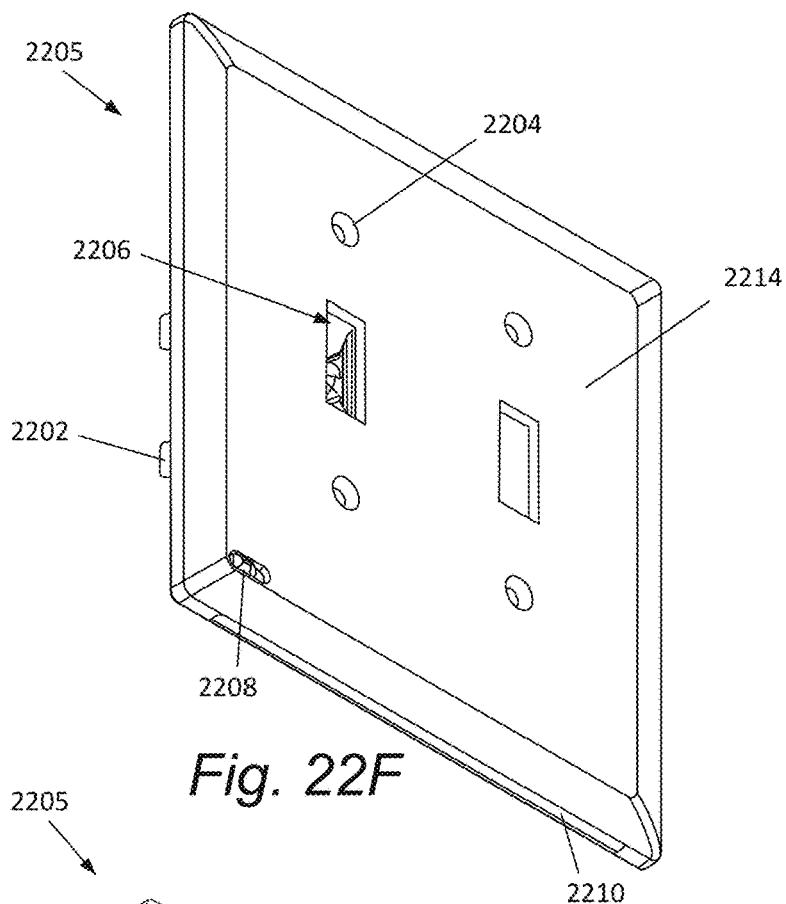
Figure 22G:
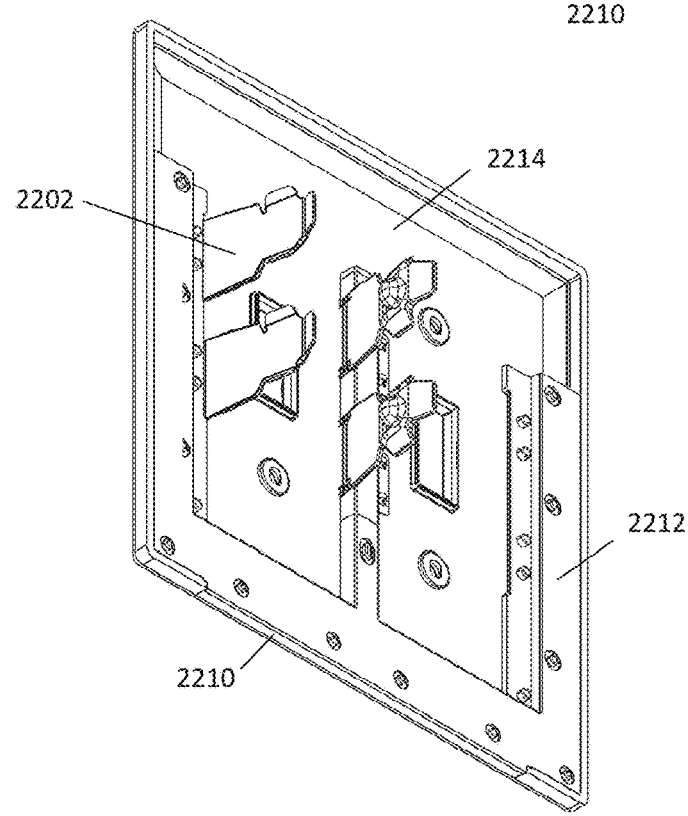

FIG. 22F shows a front perspective view of the active cover plate (2205) with the light pipe (2210) along the bottom edge of the faceplate (2214). Visible in this view are the apertures (2206) to accept light switch toggles, fastener apertures (2204), light sensor/switch (2208) and some portions of the prongs (2202). FIG. 22G shows a rear perspective view of the active cover plate (2205). Visible in this is the rear surface of the faceplate (2214), the prongs (2202) mounted to the back of the faceplate, the light pipe (2210) and the back plate (2212). The back plate may covers/encapsulates the internal circuitry, wiring and may helps secure at least some of the prongs in place. The prongs (2202) shown are only illustrative and could have a variety of other configurations. For example, the prongs could be mounted in a different location (e.g. mounted on the other side of the rear of the face plate to contact the screw terminals of the other light switch). Further, there could be a different number of prongs, for example, there could be one prong (used in conjunction with a separate conduction mechanism), two prongs, three prongs, or five or more prongs. The prongs could have a significantly different shape and configuration than shown in FIGS. 22A-22G.

Figure 23A:
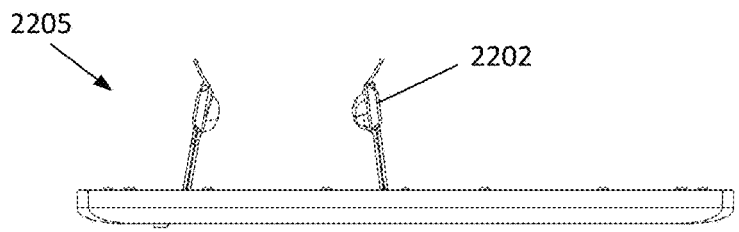
Figures 23B, 23C, 23D:
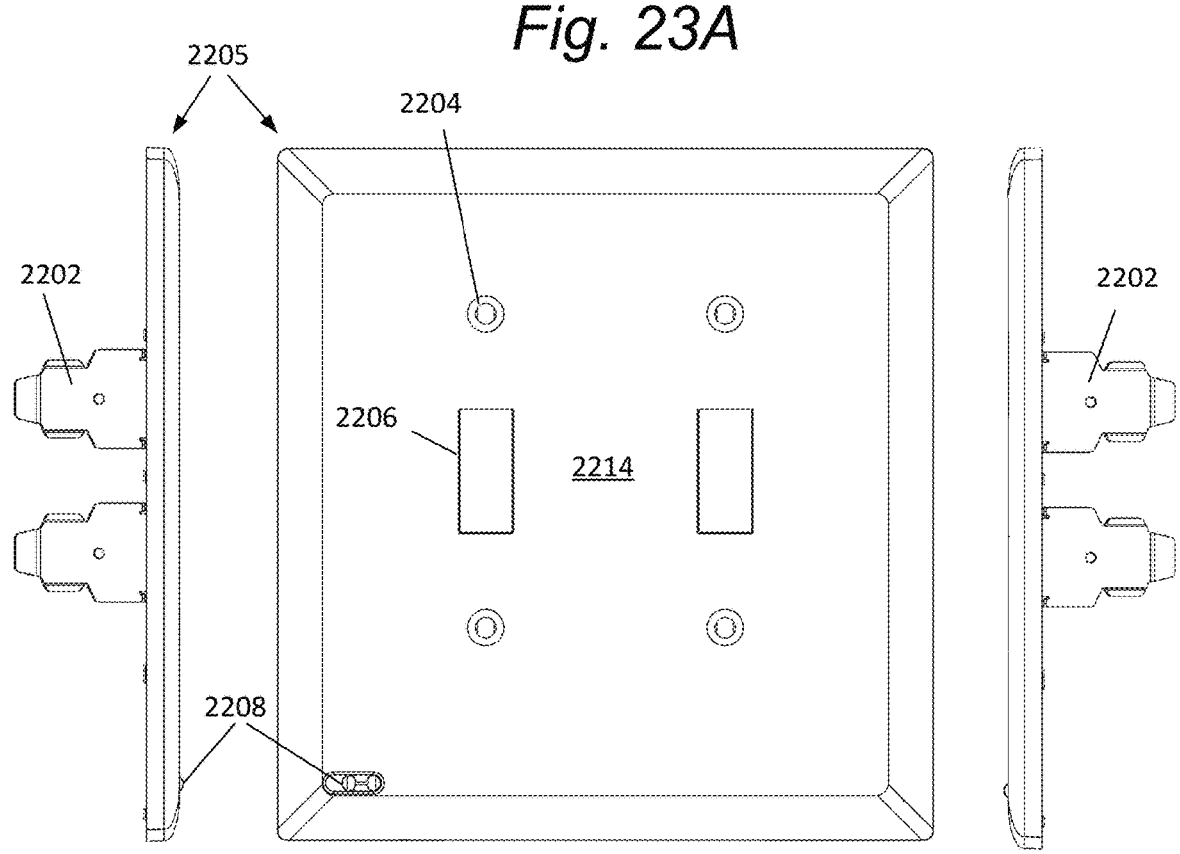
Figure 23E:
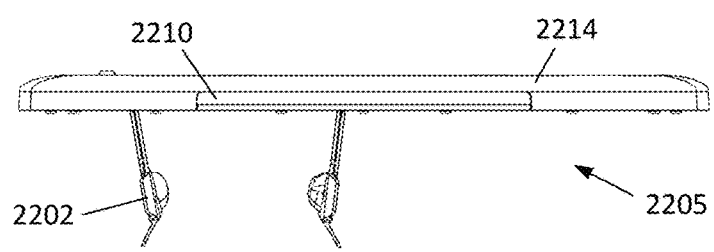

FIGS. 23A-23H show another embodiment of the active cover plate (2205) for double gang light switches. FIG. 23A shows a top view of the active cover plate (2205) with the prongs (2202) extending out from the rear of the plate. FIG. 23B shows a side view of the active cover plate (2205). FIG. 23C shows a front view of the active cover plate (2205) that includes a faceplate (2214) with apertures for connectors (2204), apertures (2206) to accept the toggle light switch handles, and a switch/light sensor cover (2208) in the lower left-hand corner. FIG. 23D shows the opposite side view and FIG. 23E shows a bottom view with the light pipe (2210). In this example, the light pipe is significantly shorter than the light pipe shown in FIGS. 22A-22G. The light pipe in this embodiment is closer to half the overall length of the bottom edge rather than extending across a majority bottom edge of the face plate.

FIG. 23F shows a rear perspective view of the active cover plate. Visible in this view is the rear surface of the faceplate (2214), the prongs (2202) mounted to the back of the faceplate, the toggle apertures (2206) and the back plate (2212). The back plate may cover/encapsulate the internal circuitry, wiring and may help secure at least some of the prongs in place. As discussed above, the prongs (2202) shown are only illustrative and could have a variety of other configurations.

FIG. 23G shows a front perspective view of the active cover plate (2205). Visible in this view are the toggle apertures (2206) in the faceplate (2214), fastener apertures (2204), switch/light sensor (2208), the shorter light pipe (2210) and some portions of the prongs (2202). FIG. 23H shows another front perspective view that shows the top edge of the active cover plate (2205).

FIGS. 24A-24G are bottom views of the active cover plate (2205) that show a number of exemplary embodiments of the light pipe and prong configurations. Throughout FIGS. 24A-24G, various types, geometries and locations of prongs (2202) and switch/lens covers (2208) are shown to demonstrate that the face plate (2214), light pipe (2210), prongs (2202) and switch/lens covers (2208) designs are mutually independent and can be combined/configured in a variety of ways. For example, a wide range of light pipe designs can be combined with various prong and switch/lens cover designs.

In FIG. 24A the active cover plate (2205) includes prongs (2202) are located on the left, the tip of the switch/lens cover (2208) on the right, but there is no light pipe visible. In this embodiment, the light pipe may be located on a different edge of the faceplate (2214) or the material that forms the cover plate may be translucent/transparent. Alternatively, the cover plate may not have a lighting functionality and consequently no light pipe is required. FIG. 24B shows the prongs (2202) mounted on the opposite side of the face plate (2214) of the active plate (2205) and a moderate length light pipe (2210) extending across its bottom edge. As discussed above, the prongs (2202) may be shifted to the opposite side of the plate (2205) to draw power from a different light switch. The switch/lens cover (2208) is on the left.

Figure 24C:
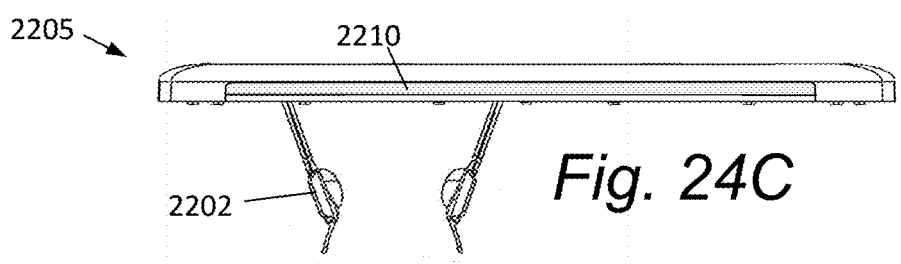
Figure 24D:
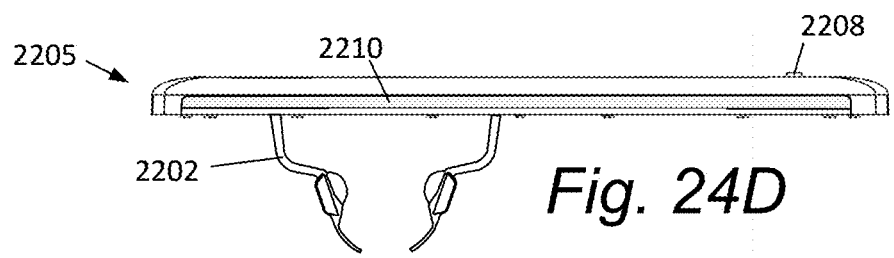
Figure 24E:
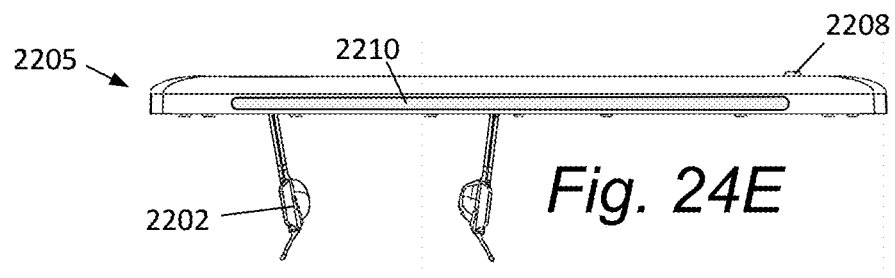

FIG. 24C shows an active cover plate (2205) that includes a longer light pipe (2210) with prongs (2202) on the left that have a different angle than shown above. In general, the angle and position of the prongs (2202) can be selected to contact the broadest range of screw terminals on a target group of screw terminals. The switch/lens cover may be present but not visible in this view (see e.g. FIGS. 25A-25E). FIG. 24D shows an active cover plate (2205) with a longer light pipe (2210) with a set of prongs (2202) with an elbow that are on the left. FIG. 24E shows an active cover plate (2205) with prongs (2202) on the left and the switch/lens cover (2208) on the right. In this example, the light pipe (2210) is symmetrical and a different geometry than previous examples. The light pipes may have a range of different shapes and sizes. In this example, the light pipe (2210) has rounded ends.

Figure 24F:
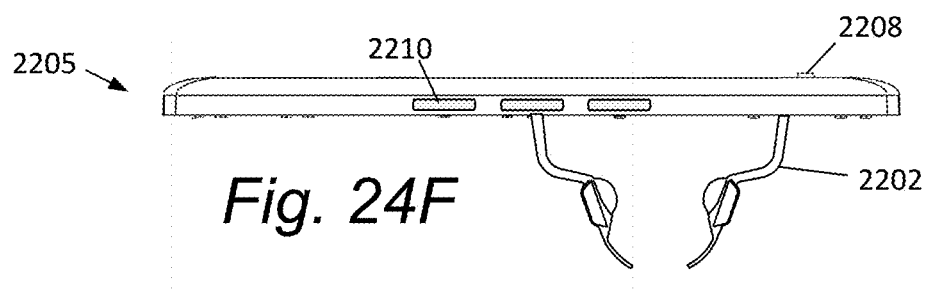
Figure 24G:
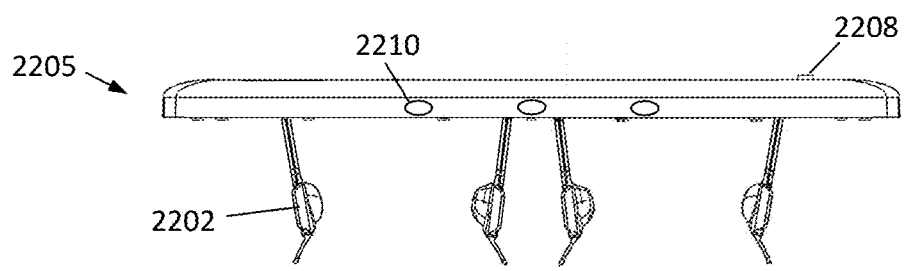

FIG. 24F shows an active cover plate (2205) with a segmented light pipe (2210) along its bottom edge. The light pipe (2210) may have any number of segments and these segments may have any appropriate size, shape and spacing. In this example, both the switch/lens cover (2208) and the rocker style prongs (2202) are on the right. FIG. 24G shows an active cover plate (2205) for a double gang installation with segmented light pipe (2210) that includes three apertures. These apertures may have any shape or size, including round, oval, ovaloid, oblong, elliptical, egg-shaped, ellipsoidal, arched with one or more flat surfaces, rectangular with one side arched, or other shape. This example also shows that the active cover plate (2205) may have any number of prongs (2202), including prongs that surround both apertures of the double gang active cover plate. This may provide a number of advantages, including being able to power the active cover plate from either or both of the light switches it is installed over.

Figure 24H:
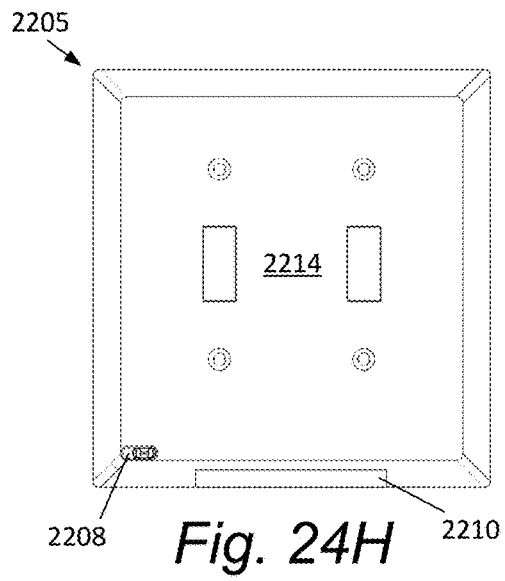
Figure 24I:
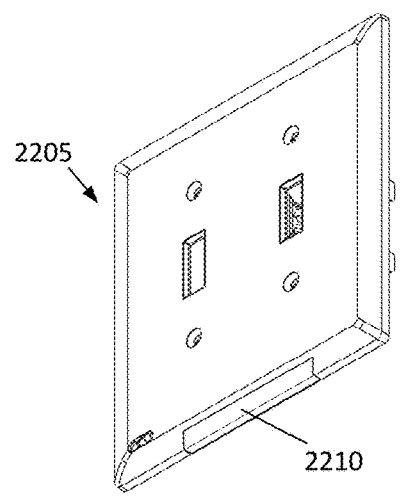
Figure 24J:
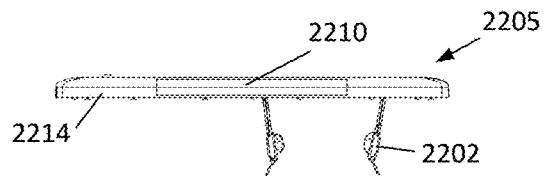

As shown in FIGS. 24A-24G and other figures, the light pipe (2210) design is independent of the prongs (2202) and the style of the active cover plate (2205). Any light pipe design could be used with any style of active cover plate (e.g. outlet, GFCI, rocker, toggle, or other active cover plate design). Any light pipe design could be used with any prong style, number of prongs, or prong configurations, including any prong design that is shown, including prongs with elbows, straight prongs, prongs on the left or right or both, prongs with other designs that are disclosed in documents incorporated by reference herein, future prongs, etc. For FIGS. 24A-24G, additional views of the active cover plates, including top, side, front and back views are shown in other figures (see e.g. FIGS. 22A, 22B, 22C, 22D, 23A, 23B, 23C, 23D, 25A, 25B, 25C, 25D, 27A, 27B, 27D, etc.). These additional figures show and describe the elements shown in FIGS. 24A-24G. FIGS. 24H-24L show additional examples of cover plates with various styles of light pipes. For example, FIGS. 24H-24Q show various views of an active cover plate (2205) with a light pipe (2210) that wraps around the front surface of the faceplate (2214). FIG. 24H shows an active cover plate (2205) with a faceplate (2214) with toggle apertures and a light sensor/switch (2208) on the lower left of the plate. The light pipe (2210) wraps around to the front of the faceplate (2214). This allows for light to be projected at higher angles into the room. This may be desirable in some situations where more uniform illumination throughout the room is preferred. However, these wrap around light pipes may also shine into the user's eyes. Consequently, the light pipes may include textures or be illuminated by multiple LEDs or other larger area light source to avoid hot spots. FIG. 24J shows a bottom view of the cover plate (2205) with the light pipe (2210) and prongs (2202) extending from the back of the faceplate (2214). Side and top views of the active cover plate are shown in other figures (see e.g. FIGS. 22A, 22B, 22D, 23A, 23B, 23D, 25A, 25B, 25D, 27A, 27B, 27D).

Figure 24K:
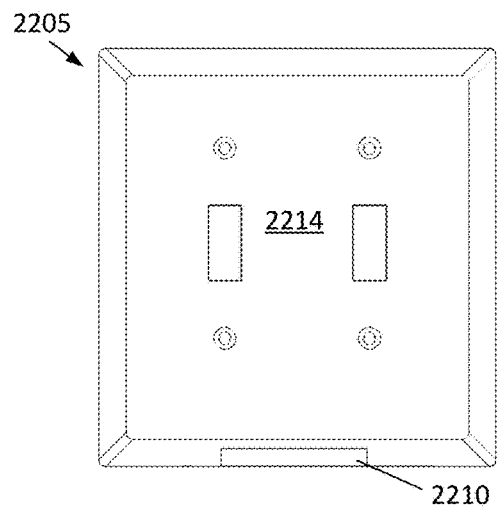
Figure 24L:
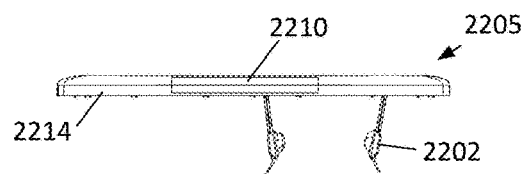
Figure 24R:
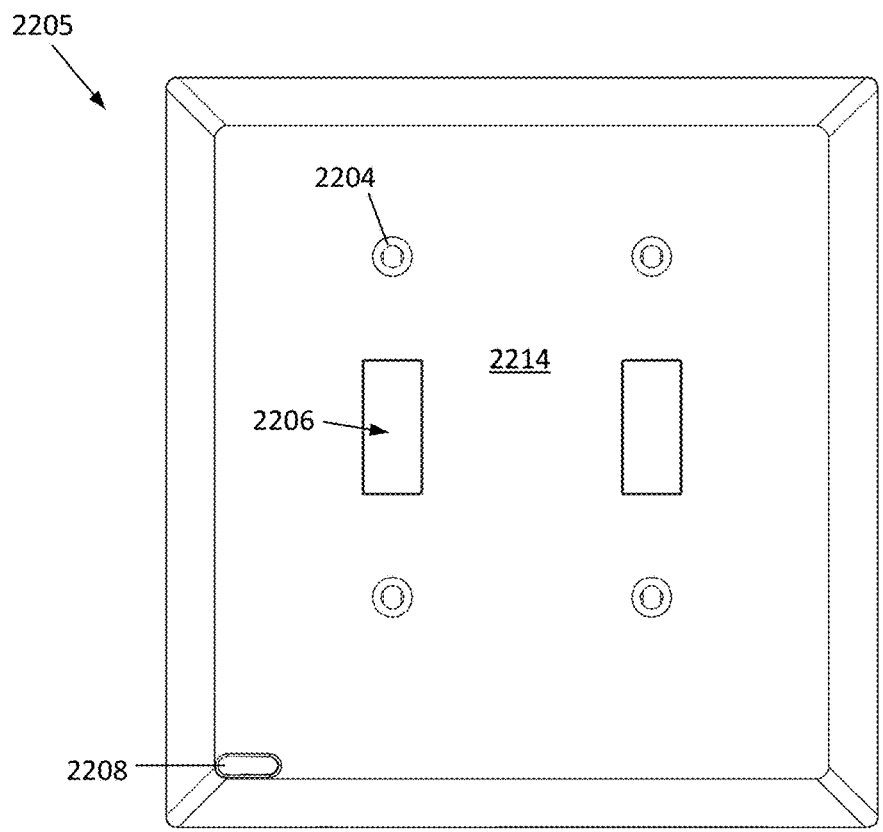

FIGS. 24K and 24L show various views of an active cover plate (2205) with a light pipe (2210) that wraps around the front surface of the faceplate (2214). FIG. 24K shows an active cover plate (2205) with a faceplate (2214) with toggle apertures. The light pipe (2210) wraps around to the front of the faceplate (2214) and is shorter than the light pipe shown in FIGS. 24H, 24I and 24J. As discussed above, the wrapping of the light pipe onto the front surface of the faceplate allows for light to be projected at higher angles into the room. FIG. 24L shows a bottom view of the cover plate (2205) with the light pipe (2210) and prongs (2202) extending from the back of the faceplate (2214). Side and top views of the active cover plate are shown in other figures (see e.g. FIGS. 22A, 22B, 22D, 23A, 23B, 23D, 25A, 25B, 25D, 27A, 27B, 27D). For example, FIGS. 22A, 22B, and 22D show top and side views of the active cover plate. The rear of the active cover plate in this and other examples is not visible during use and many have a variety of configurations.

FIGS. 24M-24O show various views of an active cover plate (2205) with a light pipe (2210) that includes/is formed from the bottom portion of the faceplate (2214). For example, the bottom portion of the faceplate (2210) may be transparent or translucent. FIG. 24O shows a bottom view of the cover plate (2205) with the light pipe (2210) and prongs (2202). FIG. 24N shows a right side view of the active cover plate (2205) with the faceplate (2214) and prongs (2202). The left side view may be substantially similar (a mirror image) to the right side view shown in FIG. 24N. Top views of this embodiment are shown in other figures (see e.g. FIGS. 22A, 23A).

FIGS. 24P and 24Q show various views of an active cover plate (2205) with a segmented light pipe (2210) that wraps around the front surface of the faceplate (2214). FIG. 24P shows an active cover plate (2205) with a faceplate (2214) with toggle apertures. The light pipe segments (2210) wrap around to the front of the faceplate (2214). As discussed above, this allows for light to be projected at higher angles into the room. FIG. 24Q shows a bottom view of the cover plate (2205) with the light pipe (2210) and prongs (2202) extending from the back of the faceplate (2214). Side and top views of the active cover plate are shown in other figures (see e.g. FIGS. 22A, 22B, 22D, 23A, 23B, 23D, 25A, 25B, 25D, 27A, 27B, 27D). For example, FIGS. 22A, 22B, and 22D show top and side views of the active cover plate (2205). The rear of the active cover plate in this and other examples is not visible during use and many have a variety of configurations.

FIG. 24R shows a front view of an active cover plate (2205) with toggle apertures (2206) and fastener apertures (2204) in the faceplate (2214). As discussed above, the light sensor aperture/cover (2208) may have a variety of shapes and locations. In this example, a light sensor aperture/cover/switch (2208) is in the lower left-hand corner of the faceplate and has a generally oval shape. For example, it may take the form of a switch, a lens cover, or a combination of both. The cover (2208) may have any of a variety of three dimensional shapes, including protruding shapes like a dome, flat, or inward shapes such as a concave shape. Other views of this configuration are shown in other figures. For example, top, left side, right side, bottom and rear views are shown in FIGS. 22A, 22B, 22D, 22E, and 22G respectively. Alternative bottom views are shown in FIGS. 24A-24G, with the exceptions that the switch/cover (2208) may be absent or have a different configuration and the prongs (2202) may have a variety of other configurations.

Figure 24S:
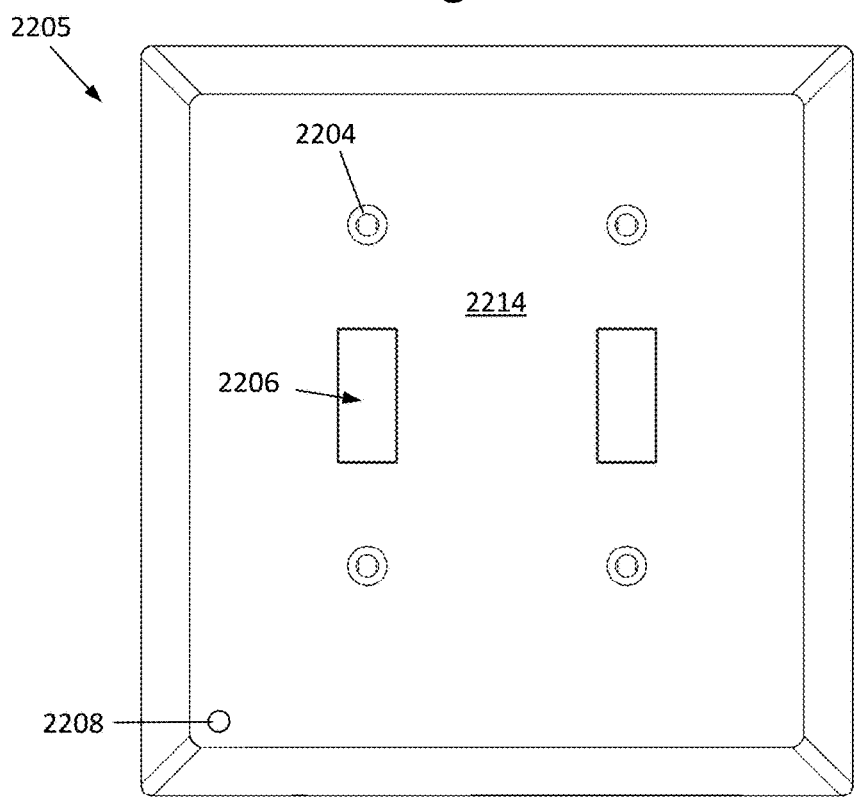

For example, FIG. 24S shows a light sensor aperture/cover (2208) that is round and located in the lower left corner of the face plate (2214), slightly spaced away from the edges. FIG. 24S also shows a front view of an active cover plate (2205) with toggle apertures (2206) and fastener apertures (2204) in the faceplate (2214). Other views of this configuration are shown in other figures. For example, top, left side, right side, bottom and rear views are shown in FIGS. 22A, 22B, 22D, 22E, and 22G respectively. Alternative bottom views are shown in FIGS. 24A-24G, with the exceptions that the switch/cover (2208) may be absent or have a different configuration and the prongs (2202) may have a variety of other configurations.

Figure 24T:
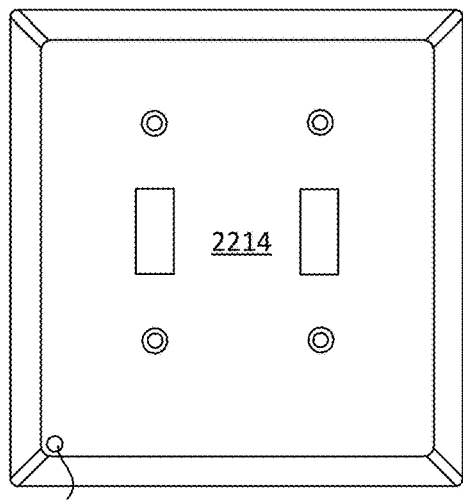
Figure 24U:
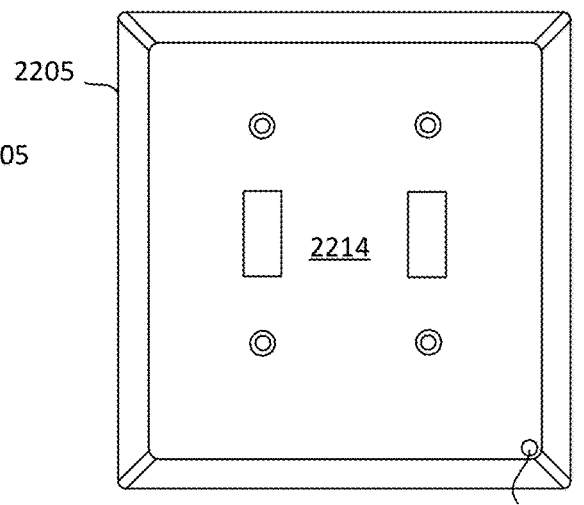
Figure 24V:
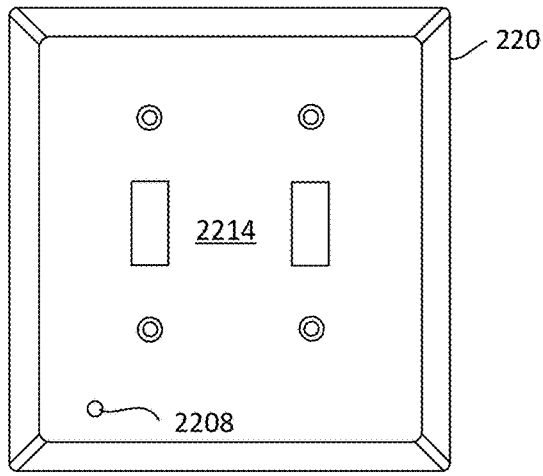
Figure 24W:
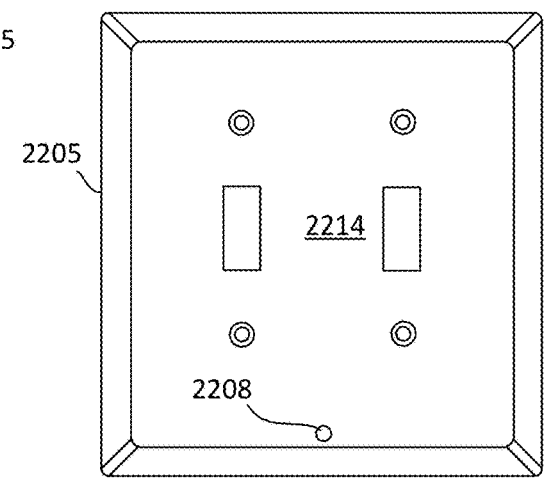

FIGS. 24T-24Y show various other exemplary embodiments an active cover plate (2205) with a light sensor/switch/lens cover or other apertures (2208) in the faceplate. FIG. 24T shows a slightly larger round aperture/cover (2208) in the face plate (2214) that is proportionally located closer to the rounded corner of active cover plate (2205). FIGS. 24U, 24V, and 24W show the round aperture/cover in various locations on the active cover plates (2214). FIG. 24U shows the round aperture/cover (2208) in the opposite corner of the faceplate (2214). FIG. 24V shows an active cover plate (2205) with a round aperture/cover (2208) spaced away from the edges of the faceplate (2214). This may accommodate circuit boards with light sensors in various other locations. FIG. 24W shows the round aperture/cover (2208) in the center region of the faceplate (2214) of the active cover plate (2205). Other views of these configurations are shown in other figures. For example, top, left side, right side, bottom and rear views are shown in FIGS. 22A, 22B, 22D, 22E, and 22G respectively. Alternative bottom views are shown in FIGS. 24A-24G, with the exceptions that the switch/cover (2208) may be absent or have a different configuration and the prongs (2202) may have a variety of other configurations.

Figure 24X:
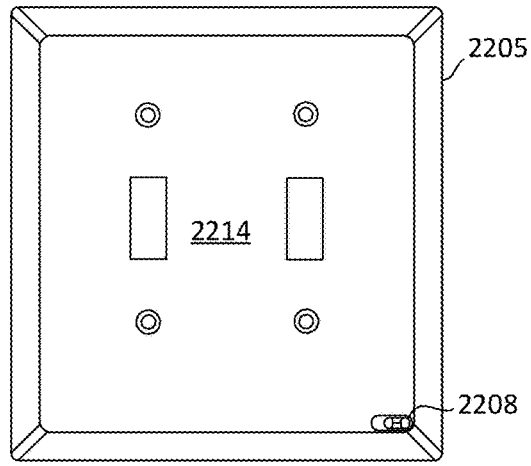
Figure 24Y:
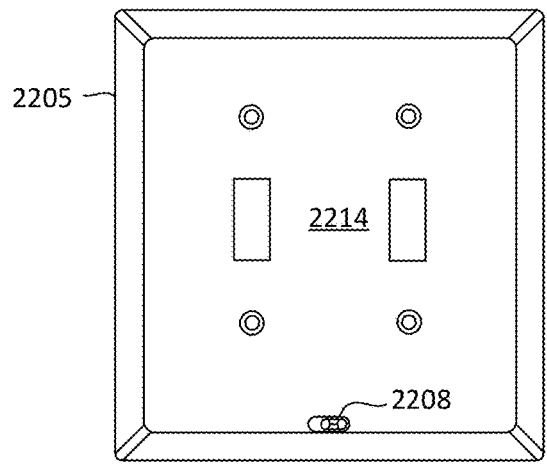

FIGS. 24X and 24Y show an active cover plate with the switch cover/light sensor aperture (2208) located at various locations along the lower portion of the face plate (2214). Additional views of these configurations are shown in other figures. For example, top, left side, right side, bottom and rear views are shown in FIGS. 23A, 23B, 23D, 23E, and 23F respectively. Alternative bottom views are shown in FIGS. 24A-24G, with the exceptions that the switch/cover (2208) may be absent or have a different configuration or location and the prongs (2202) may have a variety of other configurations.

Figure 24Z:
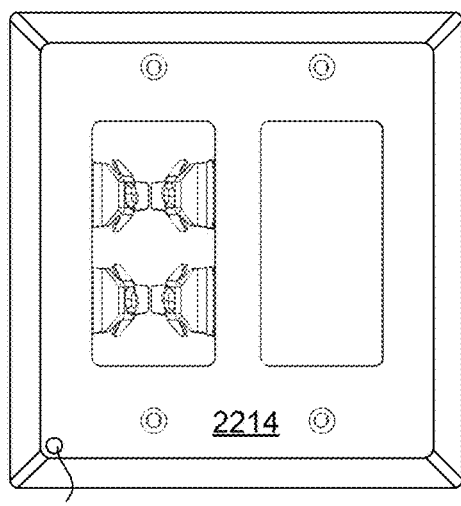
Figure 24A:
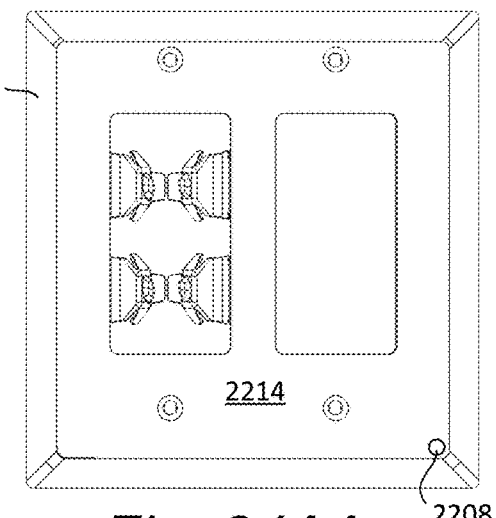
Figure 24B:
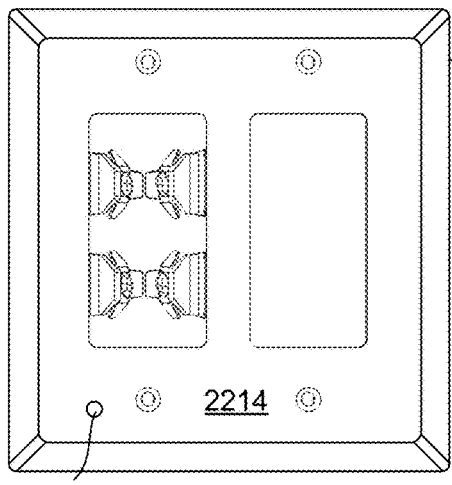
Figure 24C:
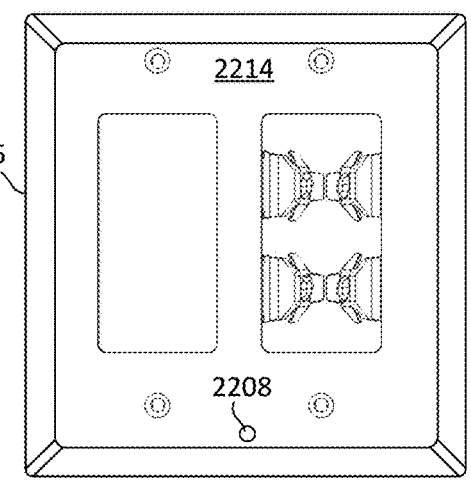
Figure 24D:
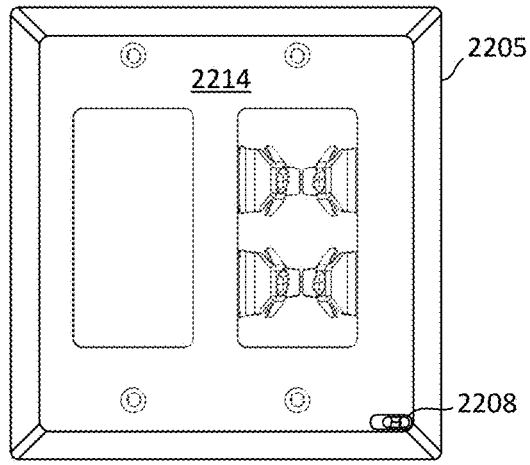
Figure 24E:
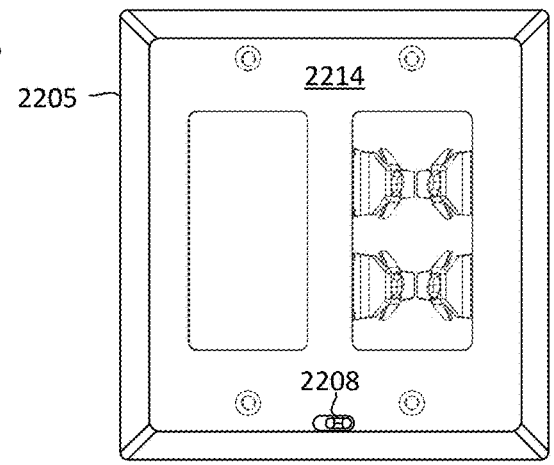
Figure 25F:
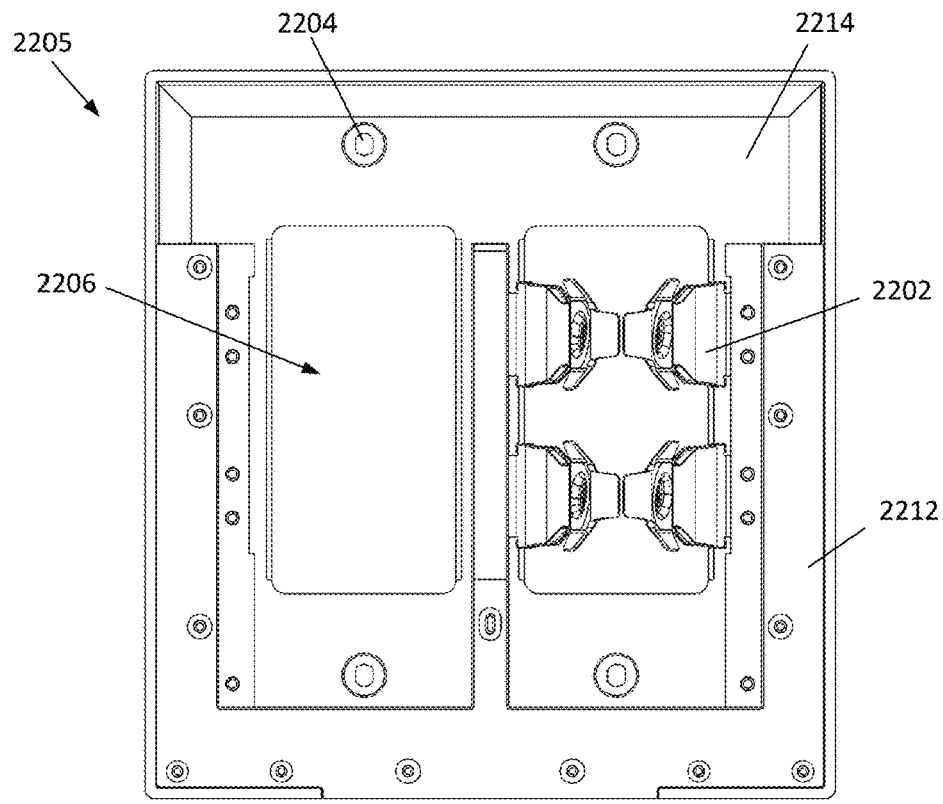
Figure 25G:
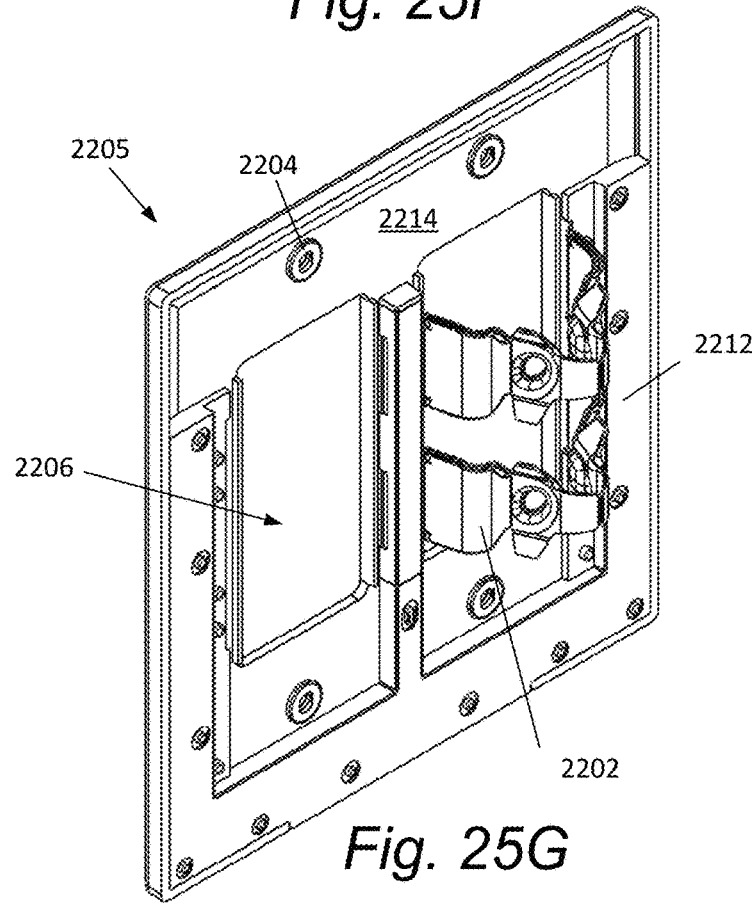

FIGS. 24Z-24EE are front views of various illustrative active cover plate (2205) configured for double gang rocker light switch installations. FIG. 24Z shows a front view of an active cover plate (2205) with rocker apertures and fastener apertures in the faceplate (2214). In this example, the light sensor aperture/cover (2208) is round and in the lower left-hand corner. As discussed above, the light sensor aperture/cover (2208) may have a variety of shapes and locations. Other views of this embodiment are shown in various other figures. For example, FIG. 25A is the top view, FIGS. 25B and 25D are side views, and FIG. 25E is one example of a bottom view. FIGS. 25F and 25G are examples of rear views. Alternative bottom views are shown in FIGS. 24A-24G, with the exceptions that the switch/cover (2208) may be absent/have a different configuration/location and the prongs (2202) may have a variety of configurations.

Figure 26A:
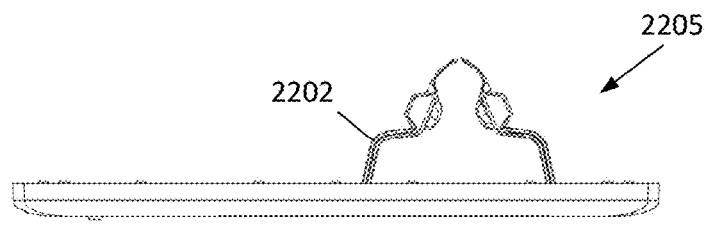
Figures 26B, 26C, 26D:
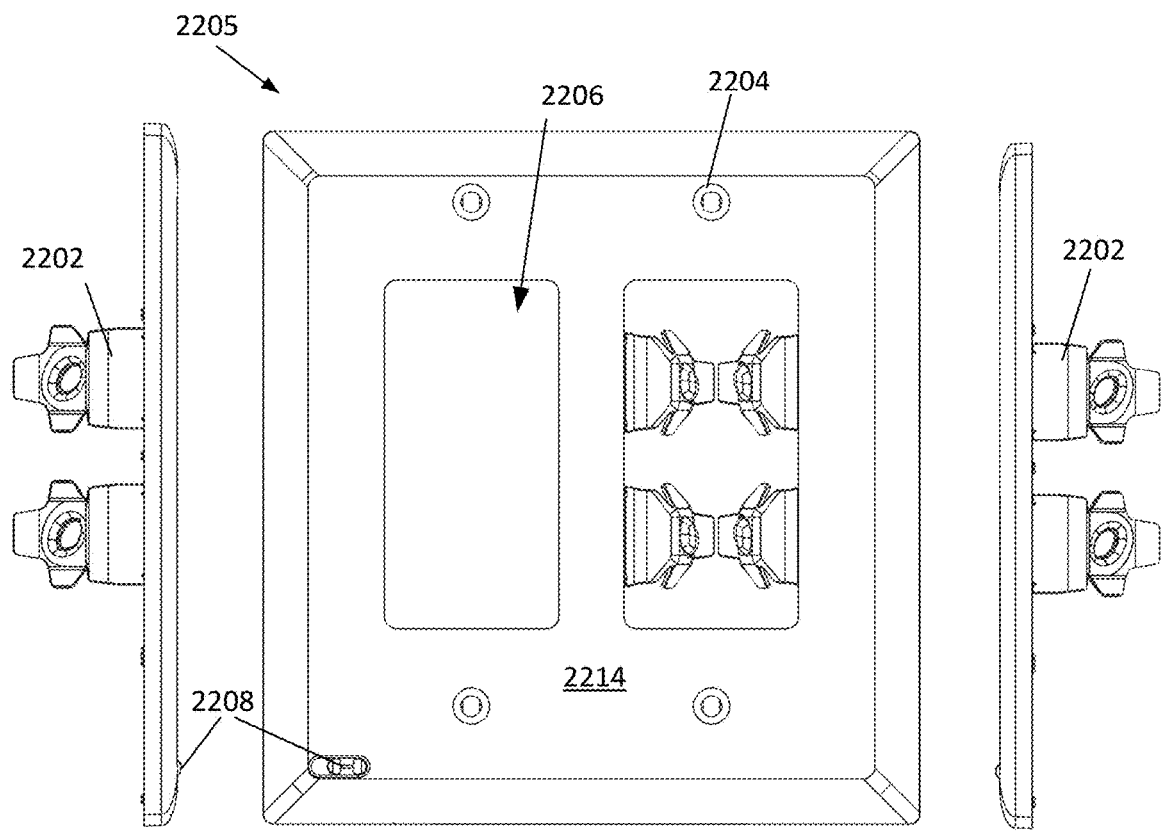
Figure 26E:
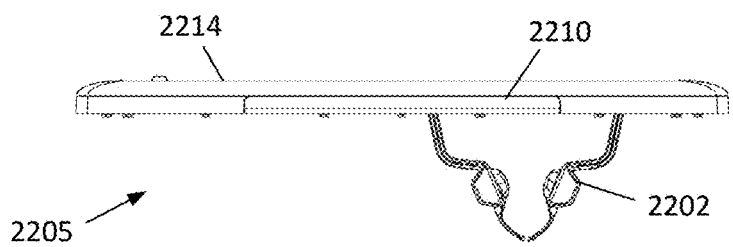
Figure 26F:
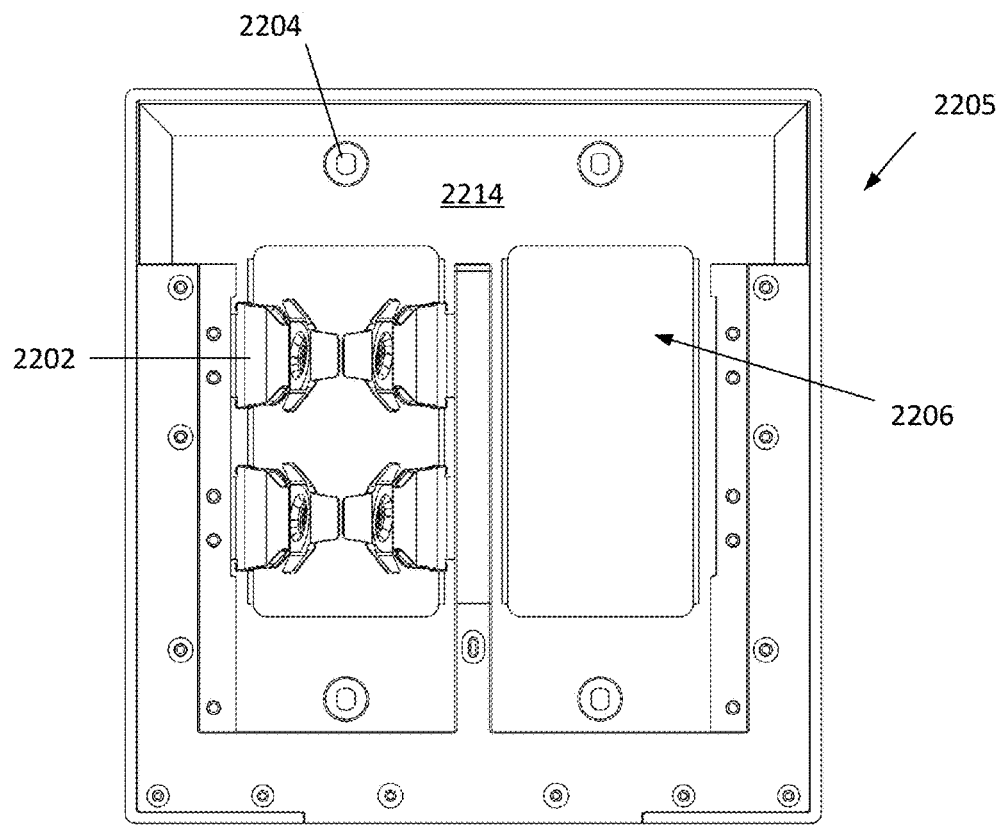
Figure 26G:
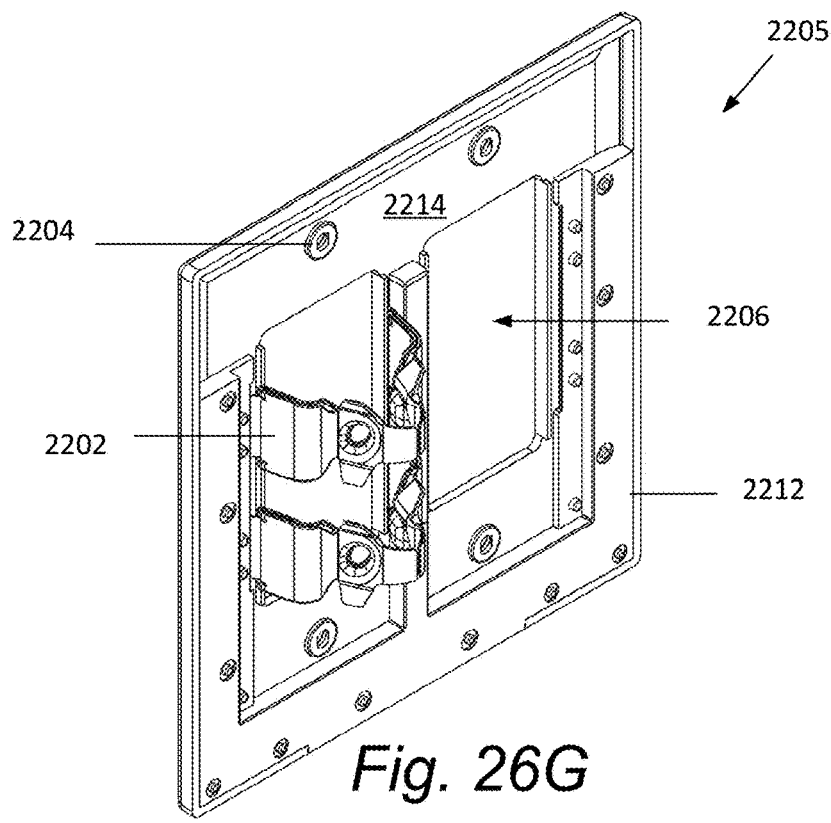

FIG. 24AA shows an active coverplate (2205) with a light sensor aperture/cover (2208) that is round and located in the lower right corner of the face plate (2214), slightly spaced away from the edges. FIGS. 24BB-24EE show active cover plates (2205) with various other exemplary embodiments of light sensor or other apertures. FIG. 24BB shows a cover plate (2205) with the round aperture/cover (2208) spaced away from the edges of the faceplate (2214). This may accommodate circuit boards with light sensors in various other locations. FIG. 24CC shows the round aperture/cover (2208) in the center of the bottom edges of the active cover plate (2208). FIGS. 24DD and 24EE show the switch cover/light sensor aperture (2208) located at various locations along the lower portion of the face plate (2214). Other views of this embodiment are shown in various other figures. For example, FIG. 26A is the top view, FIGS. 26B and 26D are side views, and FIG. 26E is one example of a bottom view. FIGS. 26F and 26G are examples of rear views. Alternative bottom views are shown in FIGS. 24A-24G, with the exceptions that the switch/cover (2208) may be absent/have a different configuration/location and the prongs (2202) may have a variety of configurations.

FIGS. 25A-25I show one illustrative embodiment of an active cover plate (2205) for double gang rocker switches. FIG. 25A shows a top view of the active cover plate (2205) with the prongs (2202) extending out from the rear of the plate. FIG. 25B shows a side view of the active cover plate (2205) with prongs (2202) extending rearward. FIG. 25C shows a front view of the active cover plate (2205). In this embodiment, the active cover plate includes a faceplate (2214) with apertures for connectors (2204) and large rectangular apertures (2206) to accept the rocker light switch paddles. This example shows a switch/light sensor cover (2208) in the lower left-hand corner. As discussed above, switch cover/light sensor aperture may a variety of shapes and locations.

FIG. 25D shows the opposite side view and FIG. 25E shows a bottom view of the active cover plate (2205) with prongs (2202) and with the light pipe (2210). As discussed above the light pipe allows for light from the LEDs to be conducted out of the active cover plate. The light pipe (2210) could have a variety of different shapes and sizes. In this example, the light pipe (2210) has a length that extends across only a portion of the bottom edge of the face plate (2214). As explained previously, the light pipe (2210) can have a range of sizes and configurations.

Figure 25H:
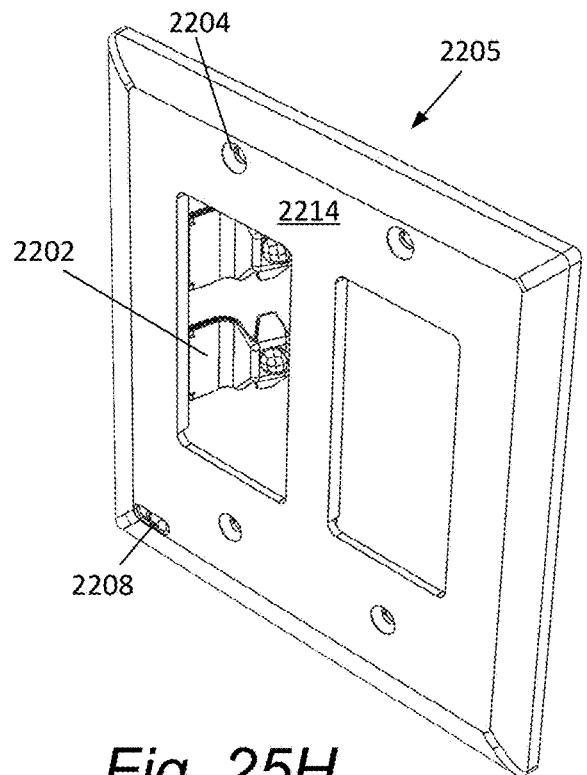
Figure 25I:
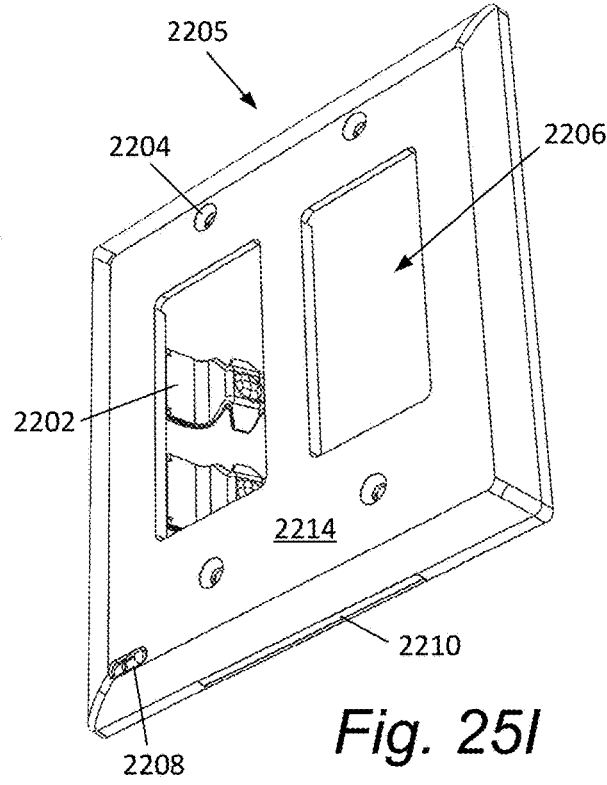
Figure 25J:
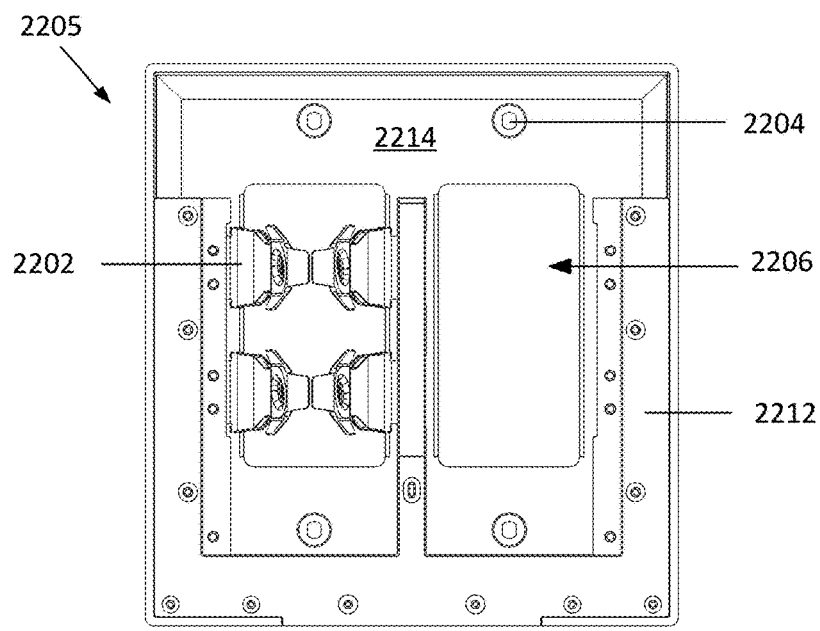

FIGS. 25F-25J show various views of the active cover plate (2205). FIGS. 25F-25G show a rear view and a rear perspective view, respectively. Visible in these views is the rear surface of the faceplate (2214), the prongs (2202) mounted to the back of the faceplate, the light pipe (2210) and the back plate (2212). The back plate (2212) covers/encapsulates the internal circuitry, wiring and helps secure at least some of the prongs in place. Also shown are the fastener apertures (2204) and the apertures (2206) to accept the light switch rocker. The prongs (2202) shown in the figures are only illustrative and could have a variety of other configurations. FIGS. 25H and 25I show front views of an embodiment of the active cover plate (2205) with a switch handle (2208) that may protrude out of the faceplate (2214). Also shown are apertures (2206) for the rocker switches and apertures for the fasteners (2204) with prongs (2202) extending rearward from the faceplate (2214). The light pipe (2210) is shown on the bottom side of the faceplate in FIG. 25I. FIG. 25J shows an embodiment of the faceplate with the prongs (2202) surrounding the opposite aperture (2206) of the faceplate (2214). This view and other views also show the back plate (2212) and fastener apertures (2204).

FIGS. 26A-26I show one illustrative embodiment of an active cover plate (2205) for double gang light rocker switches with the prongs (2202) on the right-hand side when viewing the active cover plate (2205) from the front. This allows power to be extracted from the right-hand switch in the double gang light switch installation instead of from the left-hand switch (see e.g. the embodiment shown in FIGS. 25A-25I). FIG. 26A shows a top view of the active cover plate (2205) with the prongs (2202) extending out from the rear of the faceplate. FIG. 26B shows a side view of the active cover plate (2205) and prongs (2202). FIG. 26C shows a front view of the active cover plate (2205) and prongs (2202). In this embodiment, the active cover plate includes a faceplate (2214) with apertures for connectors (2204) and large rectangular apertures (2206) to accept the rocker light switch paddles. This example shows a switch/light sensor cover (2208) in the lower left-hand corner. As discussed above, switch cover/light sensor aperture may a variety of shapes and locations.

FIG. 26D shows the opposite side view of the active cover plate (2205) and prongs (2202). FIG. 26E shows a bottom view of the active cover plate (2205) with prongs (2202) and a light pipe (2210). As discussed above the light pipe allows for light from the LEDs to be conducted out of the active cover plate. The light pipe (2210) could have a variety of different shapes and sizes. In this example, the light pipe (2210) has a length that extends across only a portion of the bottom edge of the face plate (2214).

Figure 26H:
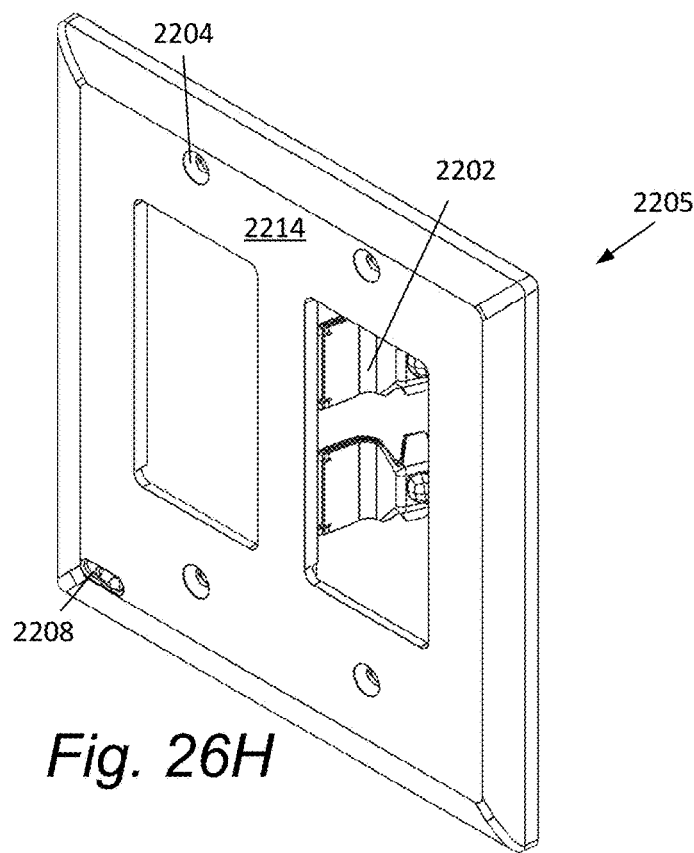
Figure 26I:
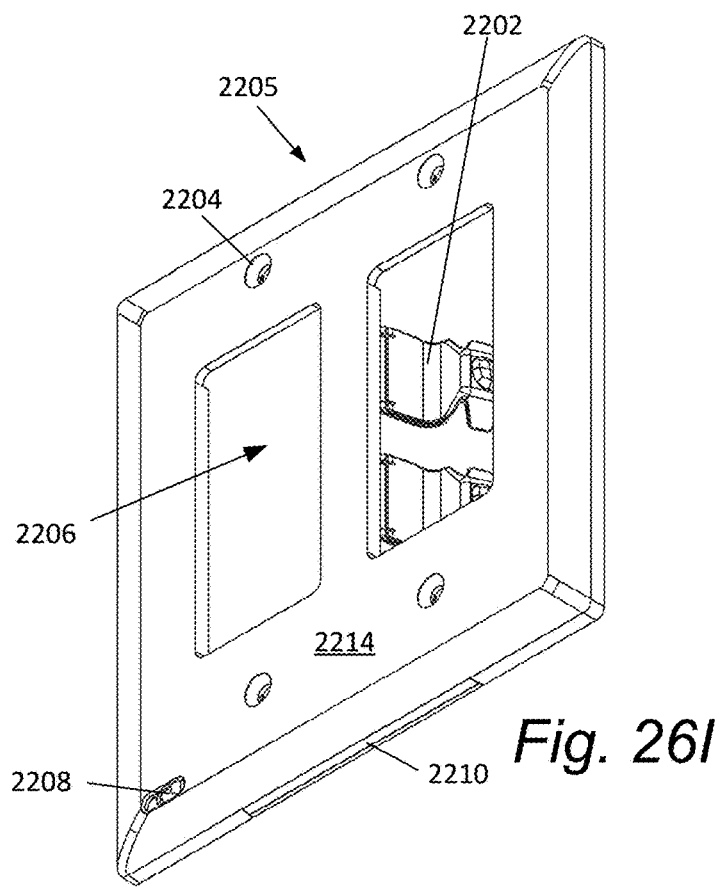

FIGS. 26F-26I show various views of the active cover plate (2205). FIGS. 26F-26G show, respectively, a rear view and a rear perspective view of the active cover plate (2205). Visible in these views are the rear surface of the faceplate (2214), the prongs (2202) mounted to the back of the faceplate and the back plate (2212). The back plate (2212) covers/encapsulates the internal circuitry, wiring and helps secure at least some of the prongs in place. The prongs (2202) shown are only illustrative and could have a variety of other configurations. FIGS. 26H and 26I show front perspective views of the active cover plate (2205) with apertures (2206) through which the prongs (2202) are visible. The switch/lens cover/light sensor aperture (2208) on the lower left of the faceplate and the light pipe (2210, FIG. 27I) is shown along the lower edge of the faceplate (2214).

Figure 27A:
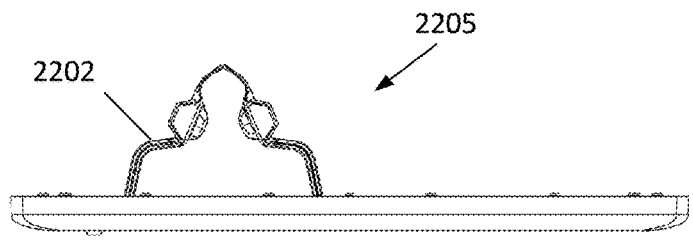
Figures 27B, 27C, 27D:
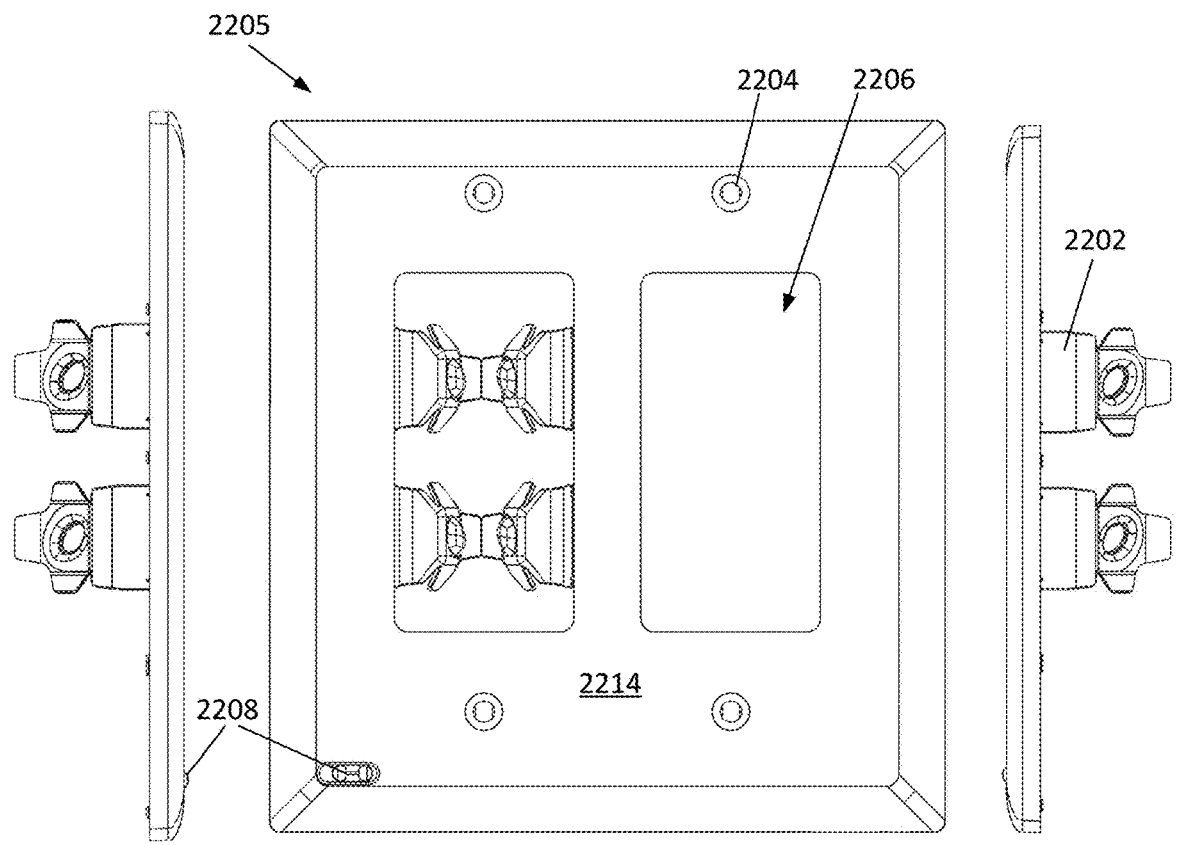

FIGS. 27A-27I show one illustrative embodiment of an active cover plate (2205) for double gang rocker switches with the prongs (2202) on the left-hand side when viewing the active cover plate from the front. This allows power to be extracted from the right-hand switch in the double gang light switch installation instead of from the right-hand switch (compare the embodiment shown in FIGS. 26A-26I). FIG. 27A shows a top view of the active cover plate (2205) with the prongs (2202) extending out from the rear of the plate. FIG. 27B shows a side view of the active cover plate (2205) with a portion of the switch/sensor cover (2208) extending from the faceplate. FIG. 27C shows a front view of the active cover plate (2205). In this embodiment, the active cover plate includes a faceplate (2214) with apertures for connectors (2204) and large rectangular apertures (2206) to accept the rocker light switch paddles. This example shows a switch/light sensor cover (2208) in the lower left-hand corner. As discussed above, switch cover/light sensor aperture may a variety of shapes and locations.

Figure 27E:
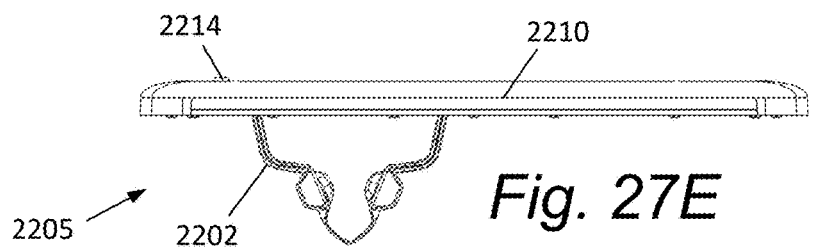

FIG. 27D shows the opposite side view of the active cover plate (2205) with prongs (2202) and FIG. 27E shows a bottom view with the light pipe (2210), prongs (2202), and sensor cover/switch (2214). As discussed above the light pipe allows for light from the LEDs to be conducted out of the active cover plate. The light pipe (2210) could have a variety of different shapes and sizes. In this example, the light pipe (2210) has a length that extends across a substantial portion of the bottom edge of the face plate (2214).

Figure 27F:
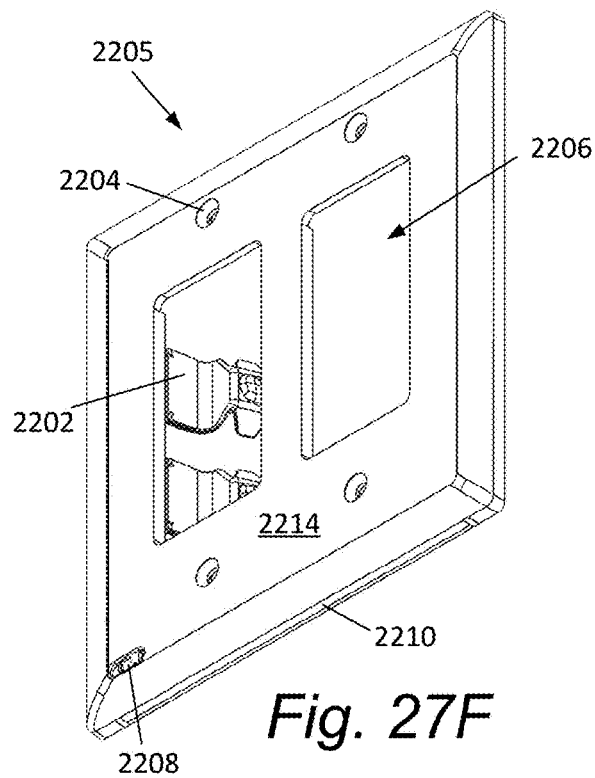
Figure 27G:
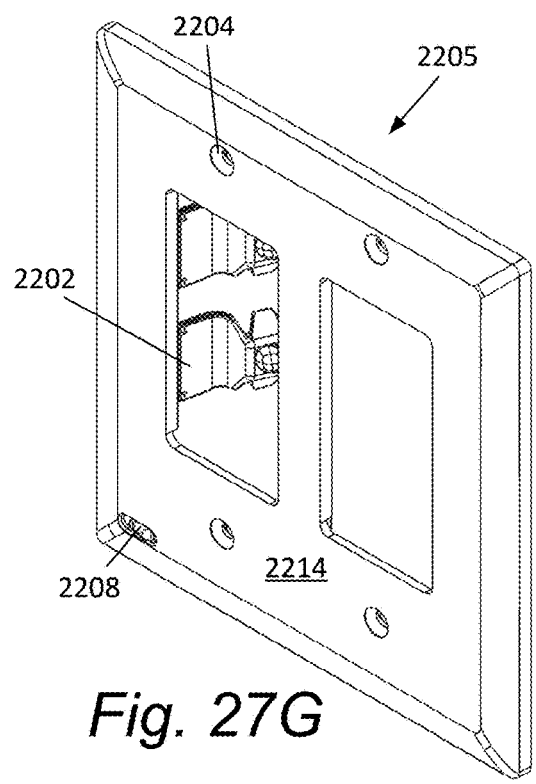
Figure 27H:
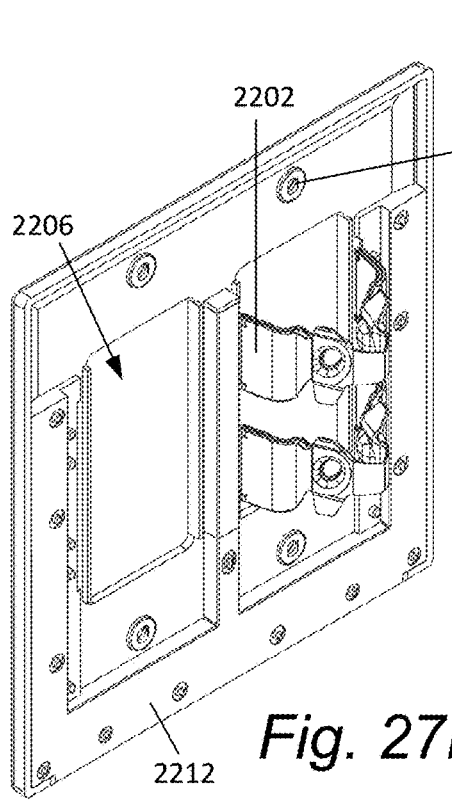
Figure 27I:
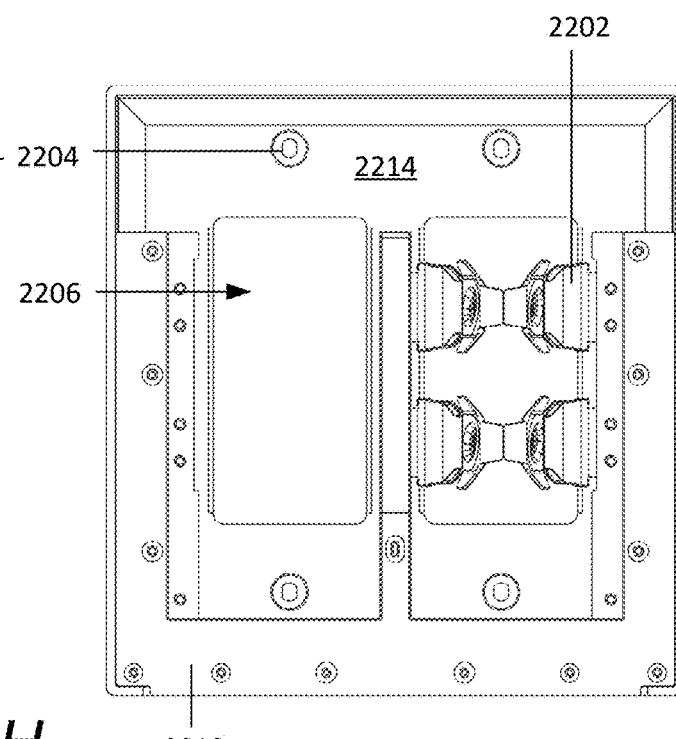

FIGS. 27F-27I show various views of the active cover plate (2205). FIGS. 27F and 27G show front perspective views of the active cover plate (2205). FIGS. 27H-27I show a rear perspective and rear views of the active cover plate (2205), respectively. Visible in these views the switch/sensor cover/lens (2208), the prongs (2202) mounted to the back of the faceplate (2214) around the apertures (2206), the light pipe (2210, FIG. 27F) and the back plate (2212, FIGS. 27H, 27I). Fastener apertures (2204) are configured to accept fasteners to hold the active cover plate in place over the electrical receptacle installation.

Figure 28A:
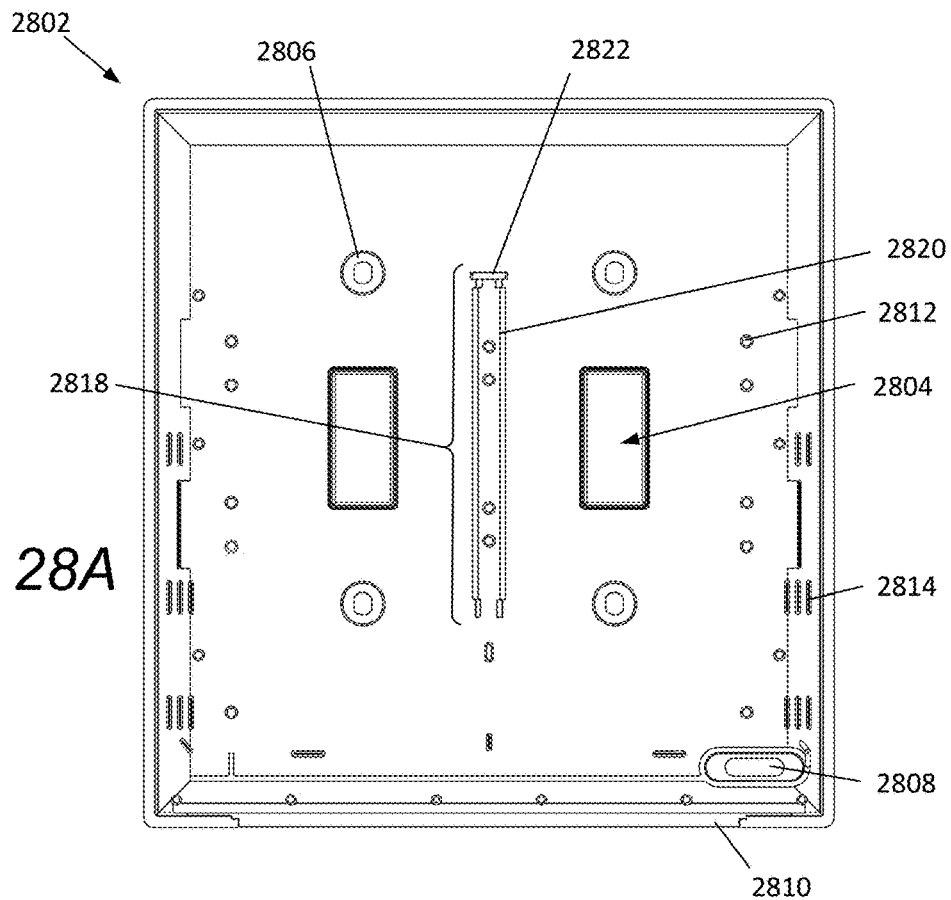

FIGS. 28A-28H show one illustrative example of an active cover plate design that allows for prongs to selectively placed on either the right or the left side of a double gang active cover plate. As discussed above, these different configurations can allow the power to be drawn from either the right or the left light switch. FIG. 28A shows a face plate (2802) for double gang toggle active cover plate. The face plate (2802) includes apertures (2804) for the toggle pieces to extend through, fastener apertures (2806) for the fasteners to pass through, a light pipe aperture (2810) and a sensor aperture (2808). In this illustrative example, the faceplate (2802) further includes a variety of posts (2812) that can be used to secure the prongs, back plate, circuit board, or other elements. There is a central prong attachment area (2818) that includes an end block (2822) and several channels (2820). These features in the central prong attachment area (2818) are designed to secure prongs in the central portion of the faceplate. There may also be a number of wire routing features (2814) that are included (these features are discussed with respect to FIG. 29A-29I).

Figure 28B:
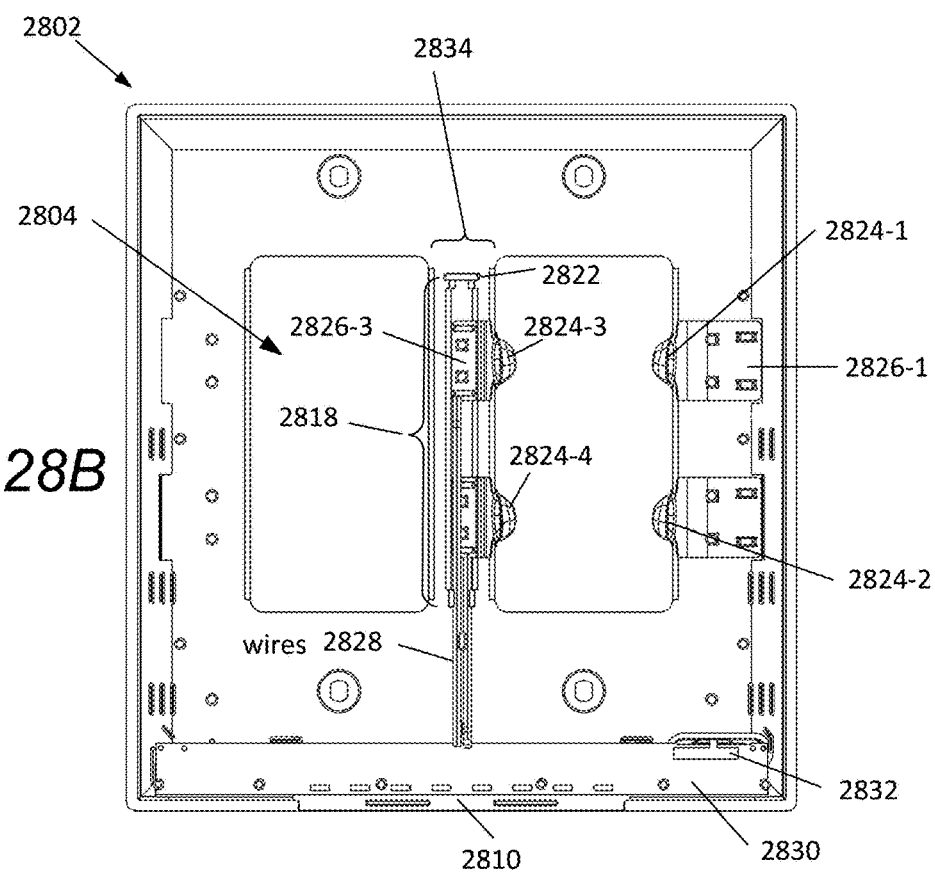

FIG. 28B shows a different embodiment of the faceplate (2802). In this embodiment, the faceplate is configured to be used as part of an active cover plate for a double gang rocker switch installation. The faceplate (2802) includes two larger apertures (2804) that allow the rocker paddles of the rocker light switches to extend through the faceplate and be accessible for manual manipulation. In between the two apertures (2804) there is a thin central bar (2834). The central prong attachment area (2818) is located on the thin central bar (2834).

Figures 28F, 28G:
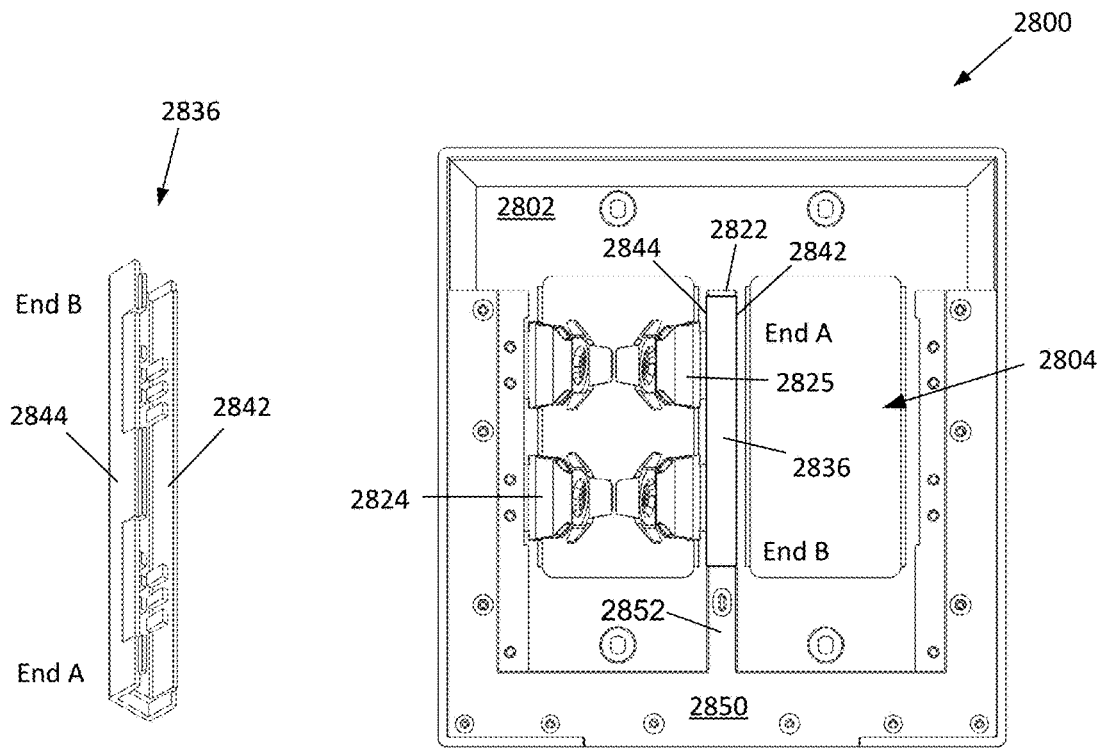

In this example, bases (e.g. 2826-1, 2826-3) of prongs (2824-1, 2824-1, 2824-3, 2824-4) are connected over posts (e.g. 2812, FIG. 28A). The prongs are located on the right side of the face plate when viewing the faceplate from that back as shown in FIG. 28A. The prongs (2824-1, 2824-2) on the outboard side of the faceplate (2802) have a relatively large surface area on the faceplate to make a connection between the base of the prongs and the rear surface of the faceplate. However, the prongs (2824-3, 2824-4) that are located on the thin central bar (2834) have significantly less room to make the connection. Further, forces exerted by these prongs may cause deformation of the thin central bar (2934) unless it is reinforced. To address these issues, the prong bases (e.g. 2826-3) of the inboard prongs (2824-3, 2824-4) are significantly reduced so that the bases will fit in the central prong attachment area (2818) on the thin central bar (2834). Wires (2828) are shown connected to the two inboard prongs (2824-3, 2824-4) and connected to the circuit board (2830). A switch (2832) is also shown attached to the circuit board. Wires would also be connected to the outboard prongs (2824-1, 2824-2) but these wires are not shown in this figure. This embodiment is only illustrative of one of the many different ways the principles described could be implemented. For example, a variety of different prong types and numbers of prongs could be used. For example, one, two, three, four, five, six, seven, or more prongs could be used. The types of prongs could vary. For example, FIG. 28G shows different prongs that those shown in FIG. 29B.

FIG. 28C shows a U-shaped channel (2836) that is configured to be attached over and joined to the central prong attachment area (2818, FIGS. 28A, 28B). The U-shaped channel (2836) may be designed to secure both of the inboard prongs to the faceplate, to reinforce the thin bar in the central portion of the face plate and be reconfigurable to allow for inboard prongs to be secured to and extend from either the right or the left of the thin bar (2834, FIG. 28B). In this example, the U-shaped channel (2836) includes a solid side (2842), a slotted side (2844), a number of hold down blocks (2840), and one or more sonic welding features (2846). Additionally, the channel may include recessed areas (2848) on either end. These recessed areas are designed to accept the end block (2822) molded into the face plate. Depending on which way the channel is oriented with respect to the face plate the end block will fit in one or the other of the recessed areas (2848).

This is only one example of a channel that could be used. There could be a range of variations that could be used. For example, instead of multiple hold down blocks, there could be only one. The channel could have a variety of shapes instead of a U shape, including rectangular, square, pyramidal, arched, or other shape. Instead of using sonic welding to secure the channel to the face plate a variety of other techniques could be used, including adhesive, cold or hot pressing, friction fit, snap fit or other suitable connection technique. Instead of having slots on one side, the channel could have slots on both sides or may not have slots at all.

FIG. 28D shows an end view of the illustrative U-shaped channel (2836), looking down its length. The hold down blocks (2840) are seen extending inward from the sides (2842, 2844; FIG. 28C) and the sonic welding features (2846) are shown extending downward from the sides.

FIG. 28E shows a cross section of the U-shaped channel (2836) connected to the faceplate (2802) and securing the prong base (2826) over the posts (2812). In this example, the sonic welding features extend into the channels (2820) in the face plate (2802). The sharp ridges of the sonic welding features are melted and joined to the face plate (2802) by the sonic welding process. The hold down blocks (2840) press downward on the upper surface of the prong base (2826) and push it against the surface of the faceplate and secure the prong base over the posts (2812). In this example, the slotted side (2844) of the channel is on the left side (as shown in the drawing). The slots allow for the prong to extend out of the channel and upward/rearward from the face plate.

Thus, in this example, the channel (2836) secures the inboard prongs to the faceplate and, as shown in later drawings, can be reversed to allow for the prongs to be assembled and secured on the opposite side. Further, because of the channels relatively large cross section, greater moment of inertia, and secure connection with the face plate, the channel may significantly reinforce the thin bar in the central portion of the face plate. This can be important because the prongs may generate a substantial amount of spring force as they contact the screw terminals of light switches or other electrical receptacles they are installed over. This can produce moments on the thin central bar which may, over time, twist undesirably. The channel adds a significant amount of rigidity to prevent this twisting.

FIG. 28F shows another view of the U-shaped channel (2836) with its solid side (2842) and slotted side (2844). In this view one end of the channel is labeled End A and the opposite end is labeled End B. FIG. 28G shows an active cover plate (2800) with apertures (2804) for rocker light switches or double gang decor outlets. The U-shaped channel (2836) is secured in place on the rear of the face plate (2802). In this example, the End A is on the top side (the side farthest way from the circuit board and light pipe) and End B is located on the bottom (closer to the circuit board and light pipe). This allows the end block (2822) to fit into the recess (2848, FIG. 28C) in end A. The central upward extending portion (2852) of the back plate (2850) extends into the recess in end B.

This orientation of the channel (2836) allows the inboard prongs (2825) to extend to the left (looking at the active cover plate (2800) from the rear as shown in the FIG. 28G). Specifically, the slotted side (2844) of the channel (2836) is on the left and provides clearance for the inboard prongs (2825) to extend to the left. The solid side (2842) of the channel is on the right. The corresponding pair of outboard prongs (2824) are mounted to the far left of the active cover plate (2800).

Figure 28H:
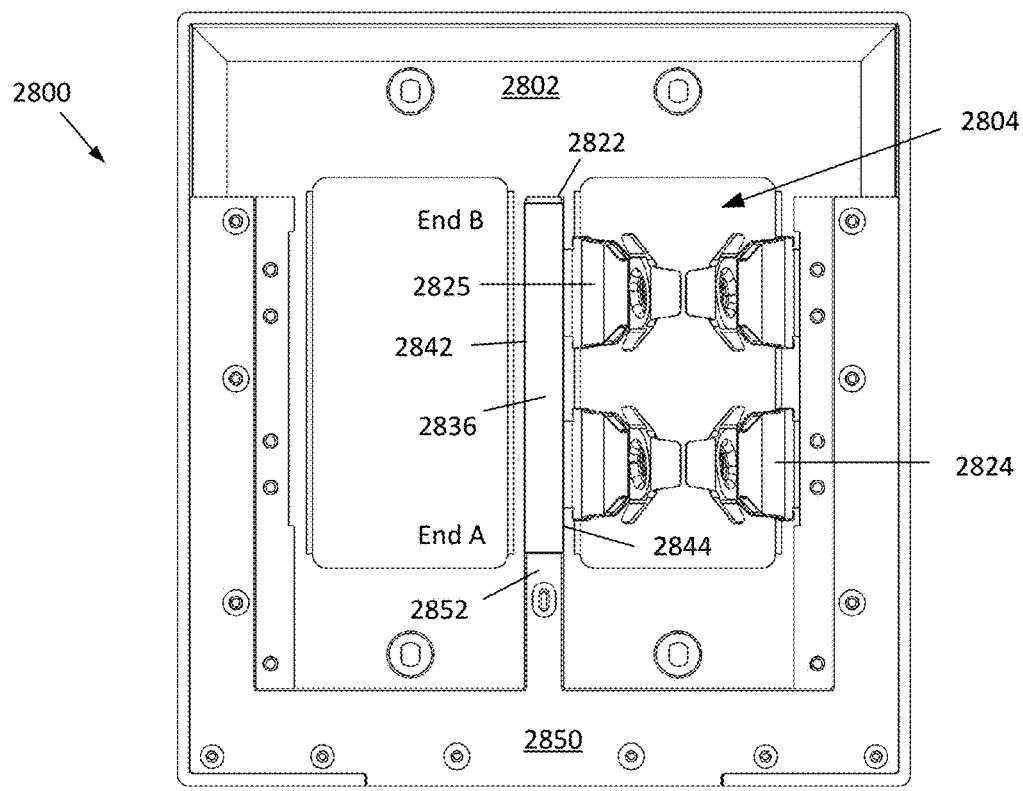

FIG. 28H shows the channel (2836) flipped to mount the opposite direction, so that End B is up, End A is down, and the slotted side (2844) is now facing the right. This allows the inboard prongs (2825) to be secured to the central bar and extend to the right. As before the corresponding outboard prongs (2824) are mounted opposite on the far right of the face plate (2802). The four prongs (2824, 2825) match the location of screw terminals on an electrical receptacle to allow for electrical power to be drawn. As discussed above, the electrical receptacle may be a light switch that may have two screw terminals, three screw terminals, four screw terminals or more.

In one example, the method for assembling the active cover plate (2800) that uses the channel may include the following steps. First, the prongs/wire/circuit board assembly is placed on the rear of the face plate. This may involve placing the prongs over the posts, placing the circuit in position, and, if the wires are not already soldered in place, soldering the wires to the prongs and/or circuit board and placing the wires into the wire channels/guides. The back plate is then put in place and then the channel is placed over the prong attachment area on the central portion of the faceplate. The back plate and channel are then secured in place. This is only one illustrative example of a method for assembling an active cover plate. The steps may be reordered, additional steps may be added, or steps may be removed. For example, there may be a step where the orientation of the prongs and channel are selected so that the inboard prongs extend in the desired direction. The prongs and channel are then placed in the desired locations.

Figure 29A:
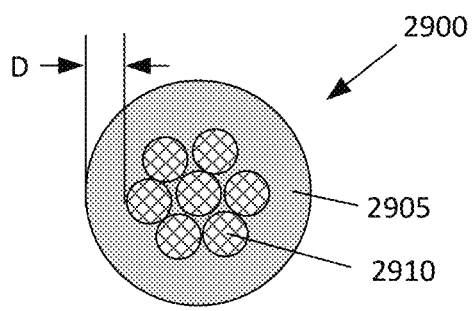
FIGS. 29A-29I show illustrative elements and techniques for spacing conductors in a multi-gang active cover plate, according to embodiments of principles described herein.
Figure 29B:
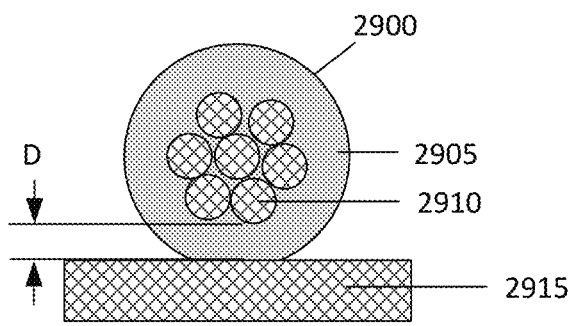
Figure 29C:
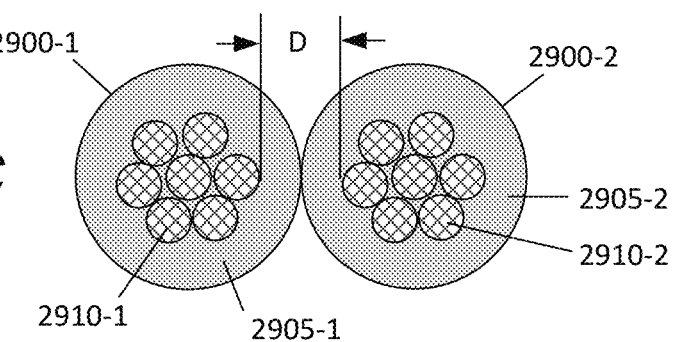

FIGS. 29A-29C show various wire configurations. Wires are used as electrical conductors to connect various electrical components together. In some embodiments of active cover plates, wires are used to connect the prongs to the circuit. FIG. 29A shows a cross section of an illustrative wire (2900). The wire (2900) may include one or more conductors (2910) (typically metallic threads or wires). The conductors (2910) may have various configurations and arrangements and may be surrounded by an electrically insulating sheath (2905). The insulating sheath (2905) may have a number of purposes, including holding the conductors (2910) together, protecting them from damage, and preventing undesirable electrical contact between the conductors and external elements. The level of insulation provided by the sheath (2910) is dependent on a variety of factors including the thickness of the sheath and the material the sheath is made from. The thickness of the effective insulation between conductors or the exterior of the wire is labeled D in FIG. 29A and subsequent figures.

FIG. 29B shows the dimensional thickness D between the conductors (2910) in the wire (2900) and an exterior conductive body (2915). In this case the dimensional thickness D is equal to the thickness of the insulation (2905). If the voltage difference between the conductors (2910) and the exterior body (2915) exceeds the level of insulation provided by the conductor, an electrical arc may form. Arcing may be undesirable for a number of reasons, including heating, degradation of the materials surrounding the arc, and loss of electrical power. FIG. 29C shows two adjacent wires (2900-1, 2900-2). In this case the arcing distance (D) is twice the amount of insulation (2905-1, 2905-2) thickness. In general, it can be desirable for the conductors (2910-1, 2910-2) to be spaced at or greater than some minimum distance that will prevent accidental arcing even under the most extreme circumstances. This minimum spacing as a function of voltage, materials, and design is specified in a number of standards including Underwriters Laboratory standards, printed circuit board standards, and various government or quasi-government standards such as the National Electrical Code.

Figure 29D:
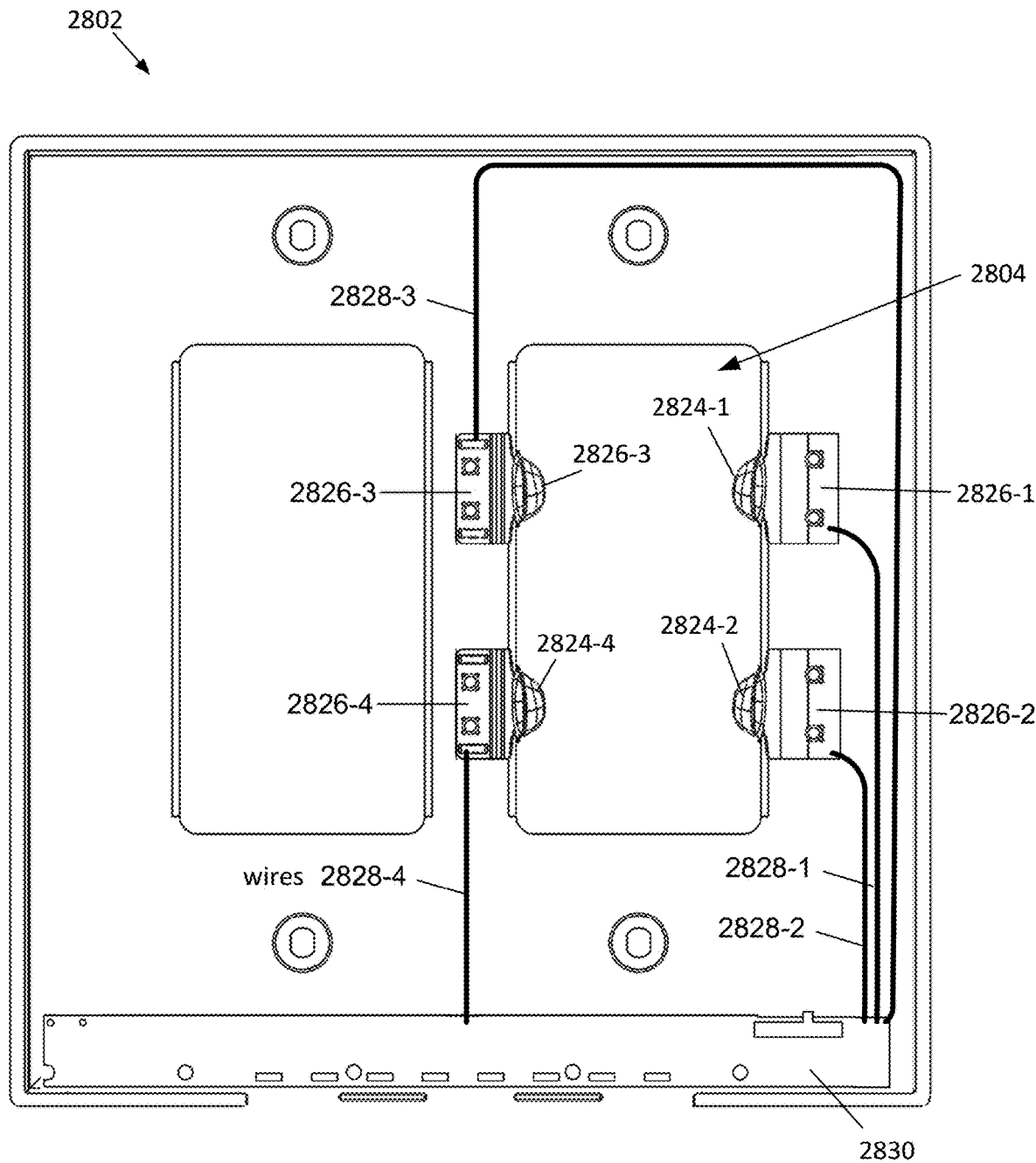

FIG. 29D shows a rear view of a faceplate (2802) with prongs (2824-1, 2824-2, 2824-3, 2824-4), wires (2828-1, 2828-2, 2828-3, 2828-4) and circuitry (2830) installed. The wires (2828-1, 2828-2, 2828-3, 2828-4) are connected to the bases (2826-1, 2826-2, 2826-3, 2826-4) of the prongs. The routing of the wires (2828-1, 2828-2, 2828-3, 2828-4) from the prongs (2824-1, 2824-2, 2824-3, 2824-4) to the circuit (2830) can be challenging. Each prong may have a different voltage present. For example, if the active cover plate is installed over a light switch connected to 120 volts alternating current (120 VAC), then the instantaneous voltage on the prong could be 170 V. If the active cover plate is installed over a light switch connected to 277 VAC, the instantaneous voltage will be higher. At the same time, an adjacent prong/wire may have much lower or negative voltage. Further, there may be transient surge voltages from a number of sources that are conducted by the prongs/wires. Consequently, it can be desirable for a specific spacing between the wires in the active cover plate. As shown in FIG. 28D, the central portion of the face plate that separates the two apertures for the rocker switch paddles may be relatively narrow. The prong attachment and wiring are limited to the middle of the central portion. This leaves little room for additional spacing between wires (see e.g. FIG. 28C with adjacent wires) or for additional spacing between the wire from a first prong and the base of an adjacent prong (see e.g. FIG. 29B, where the wire is resting on a conductive element). The embodiment shown in FIG. 29D addresses this issue by routing the wire (2838-3) from the upper inboard prong (2826-3) around the top of the aperture (2804) and down the opposite outboard side of where there is more room to achieve the desired wire spacing. This is a viable option for wire routing. However, it may have several disadvantages. First, the wire (2828-3) passing around the aperture (2804) is long, leading to higher costs and to a higher wire resistance. Consequently, the wire (2828-3) may need to be a larger in diameter to reduce the electrical resistance and to follow safety regulations. Further, the back plate may need to be expanded cover the wire routed around the aperture. The larger back plate may lead to increased costs and more mechanical interference between the cover plate and textures/obstructions surrounding the light switch installation. This larger back plate may result in the active cover plate not sitting flush with the wall after installation in some cases.

Figure 29E:
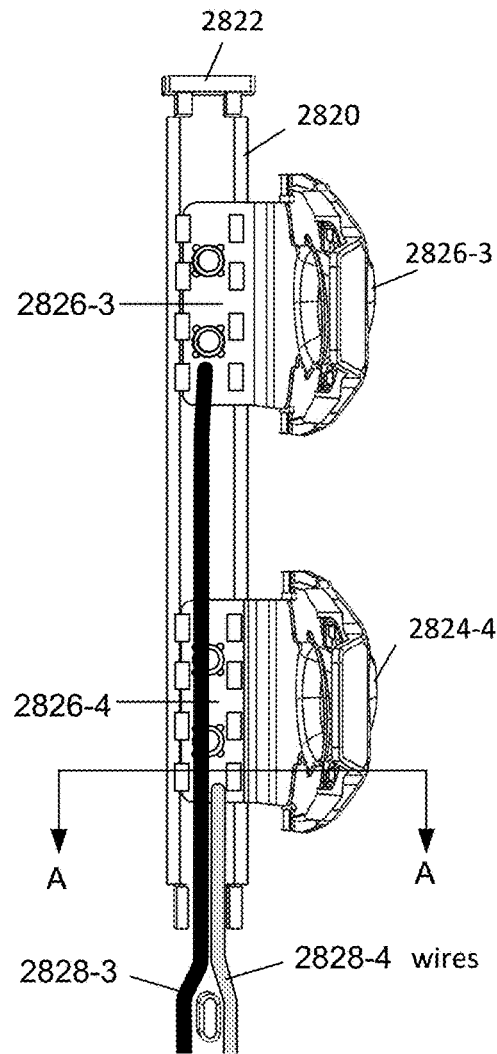
Figure 29F:
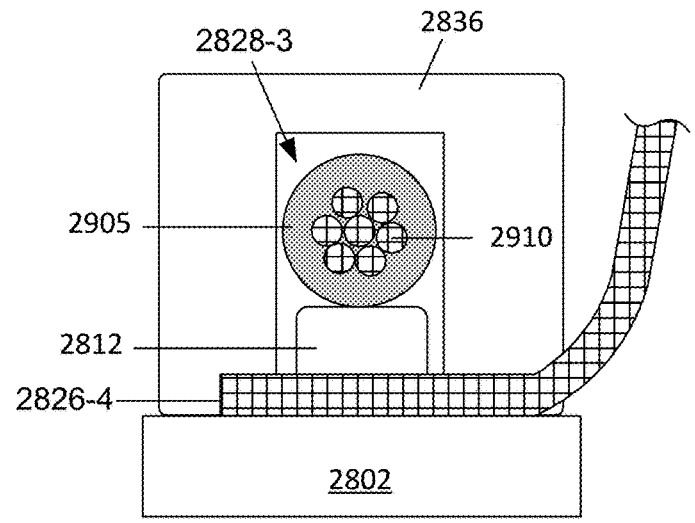
Figure 29G:
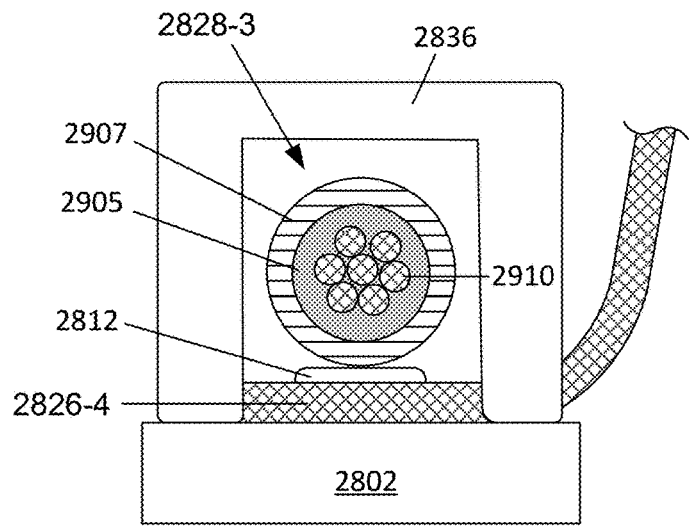

FIGS. 29E, 29F, and 29G show several embodiments that allow the wire (2828-3) from the upper inboard prong (2826-3) to pass over the base (2826-4) of the lower prong (2824-4) while maintaining the appropriate spacing. FIG. 29E is a top view the central bar with the spring clips in place and the wires running downward toward the circuit board. For clarity, the cover (2826) is not illustrated. FIG. 29F shows a cross section AA of the central bar (2802), wire (2828-3) and standoff post (2812) from FIG. 29E. FIG. 29F additionally shows an inverted U-shaped cover (2836) that is placed over the middle portion of the bar, the bases (2826-3, 2826-4) of the prongs and the standoff post (2812). As described above, the cover (2836) may be secured in place using a number of techniques including cold pressing, hot pressing, gluing, or sonic welding. In this example, the U-shaped cover (2836) constrains the position of the wire (2826-3) over the top of the standoff post (2812) and secures the prong base (2826-4) over the standoff post and to the rear surface of the face plate (2802). By positioning the wire (2828-3) on top of the standoff post (2812), the required physical separation between the conductors (2910) from the first prong (2826-3) and the underlying base (2826-4) of the second prong (2824-4, FIG. 29E) is maintained.

FIG. 29G shows an additional or alternative mechanism for maintain the distance between conductors (2910) in a wire (2828-3) and an exterior conductor (2826-4). In this example, the wire (2828-3) is surrounded by/includes an additional insulating layer (2907) in the location where the wire passes over the exterior conductor (2826-4). For example, the additional insulating layer (2828-3) may be a fiberglass or other sleeve that fits over the wire to provide the additional spacing. In this example, the standoff post (2812) may or may not be shorter than shown in FIG. 29F. The U-shaped cover (2836) provides stability and protection to secure the wire (2828-3) in place.

Figure 29H:
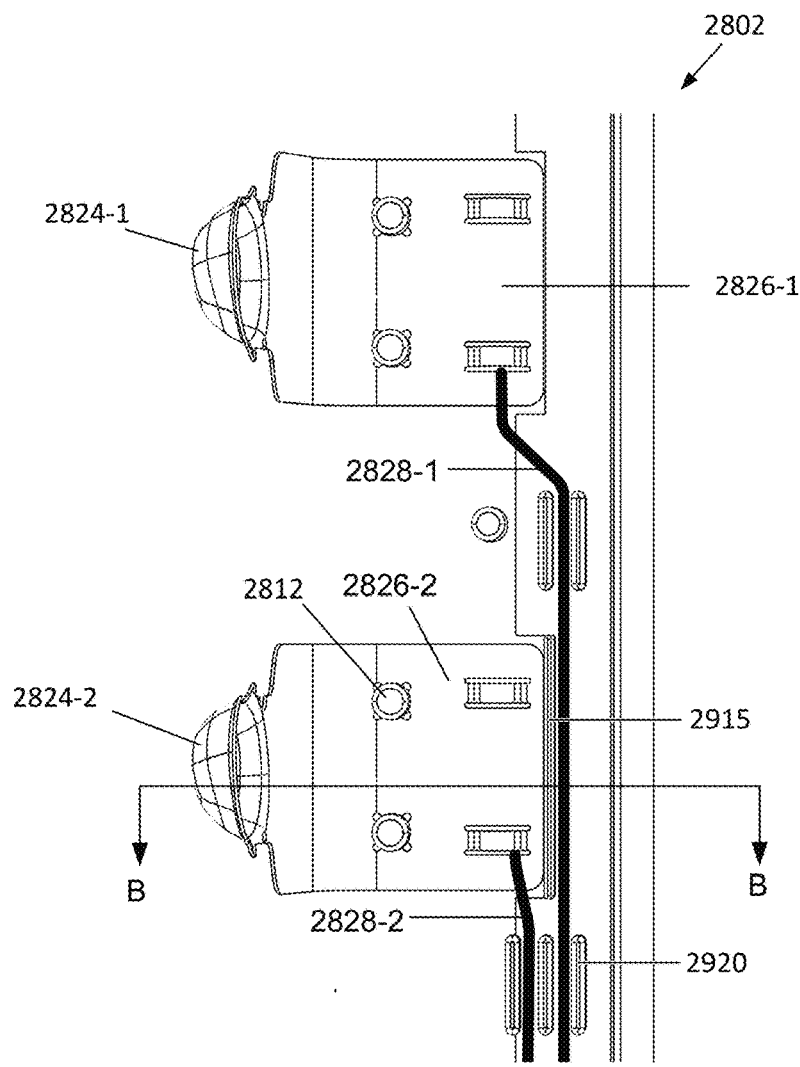
Figure 29I:
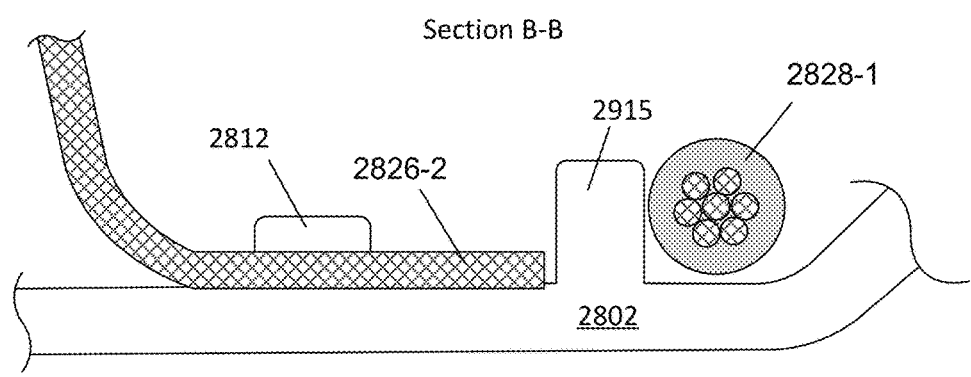

FIG. 29H and 29I show one technique for routing the wires (2828-1, 2828-2) between outboard prongs (2824-1, 2824-2) in an active cover plate. In this example, the prongs (2824-1, 2824-2) are connected to the faceplate (2802) using posts (2812). Wires (2826-1, 2826-2) are connected to the bases (2826-2, 2826-2) of the prongs. FIG. 29I is a cross-section BB of FIG. 29H. One example of the wiring technique includes placing/forming a wall (2915) on the outboard side of the lower prong base (2826-2). The wall may be an integral part of the faceplate (2802), a part of another component, or may be a separate. The wall (2915) ensures that the desired distance is maintained between the conductors in the wire (2828-1) and the base (2826-2).

Figure 30E:
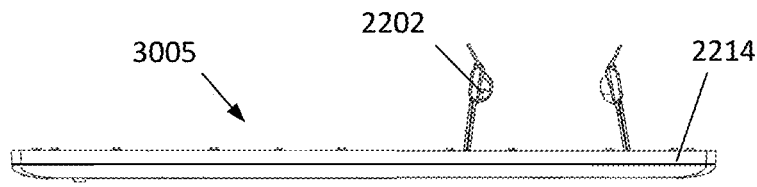
FIGS. 30A-30P show illustrative examples of multi-gang plates, according to one example of principles described herein.
Figure 30F:
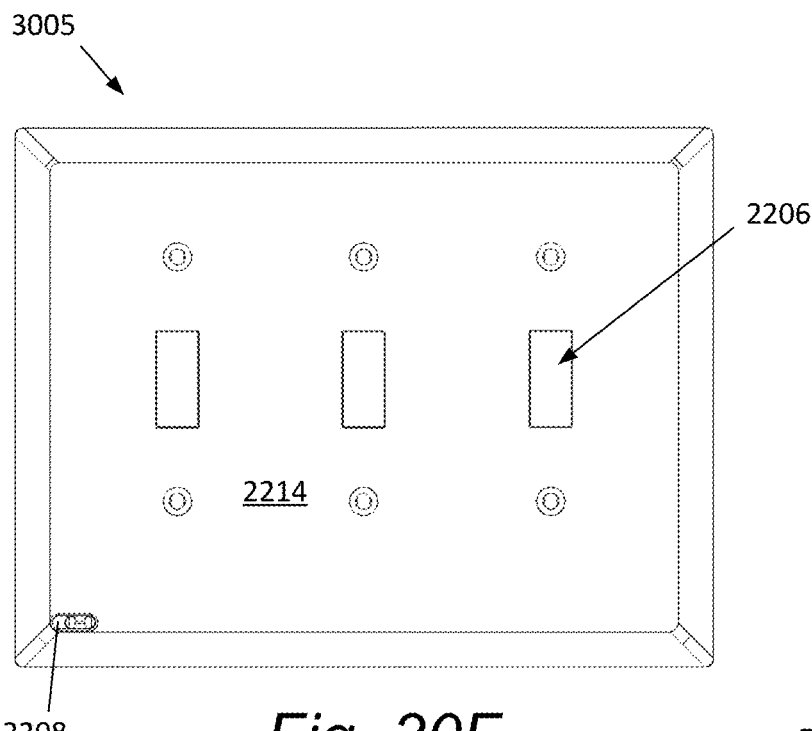
Figure 30G:
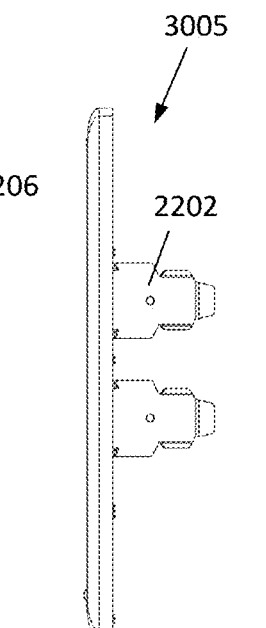
Figure 30H:
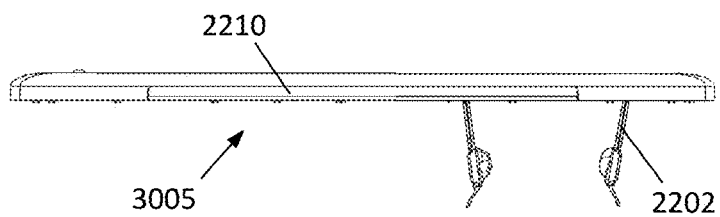
Figure 30I:
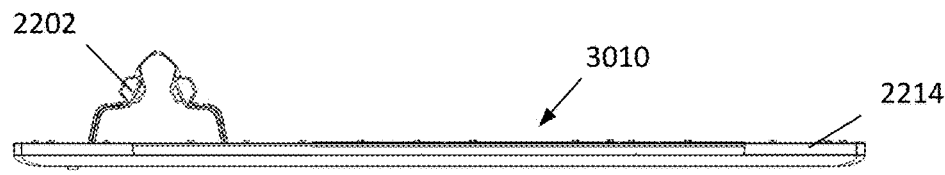
Figures 30J, 30K:
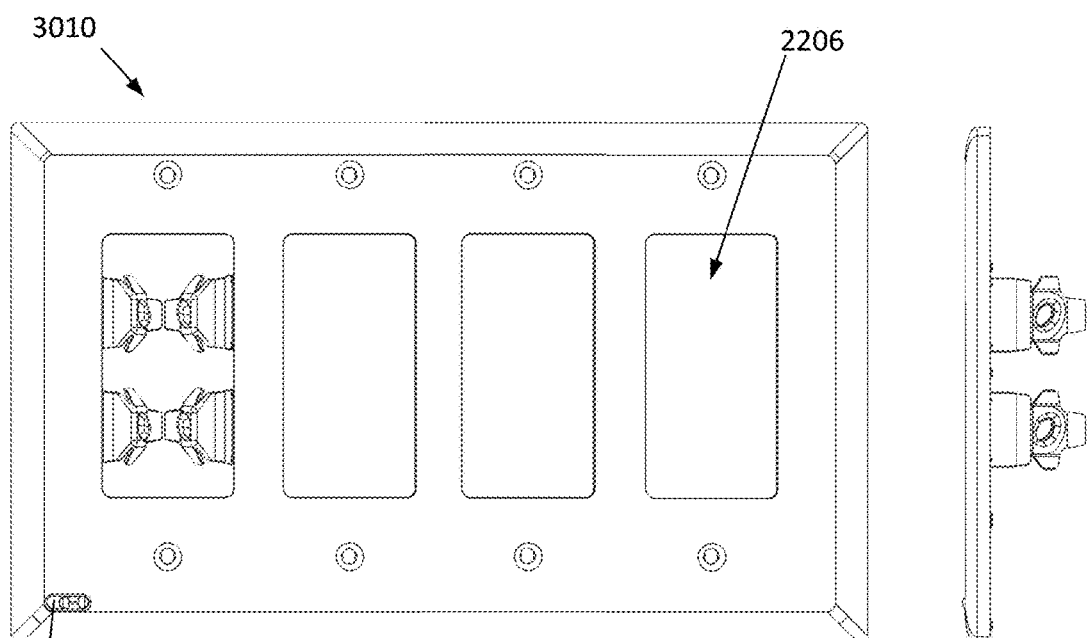
Figure 30L:
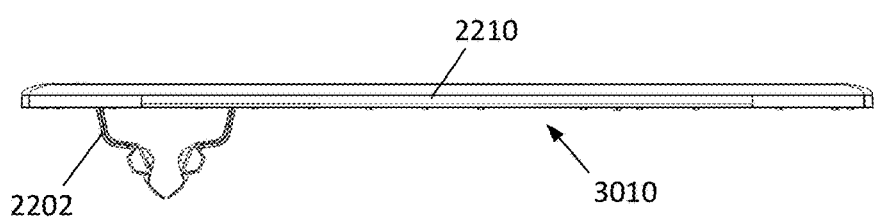
Figure 30M:
Figure 30N:
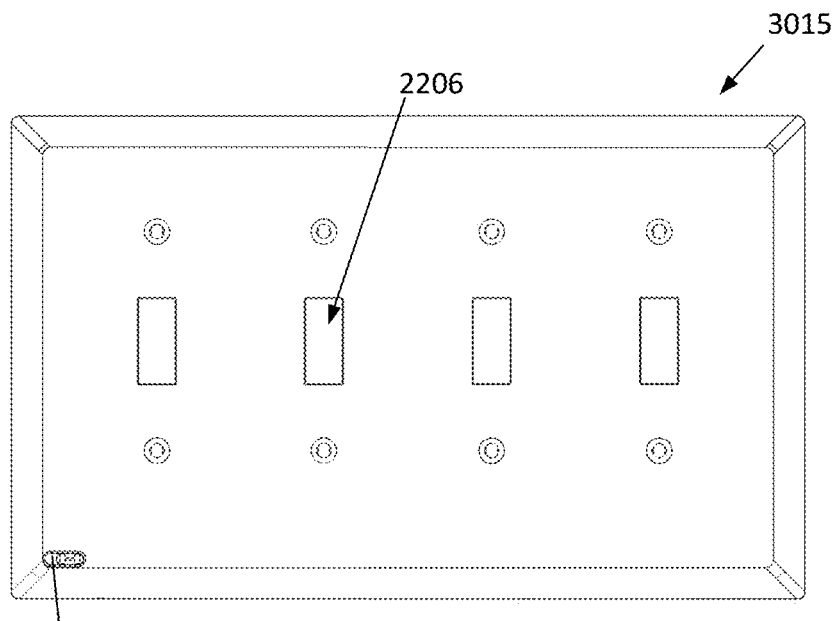
Figure 30O:
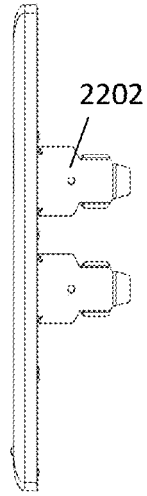
Figure 30P:
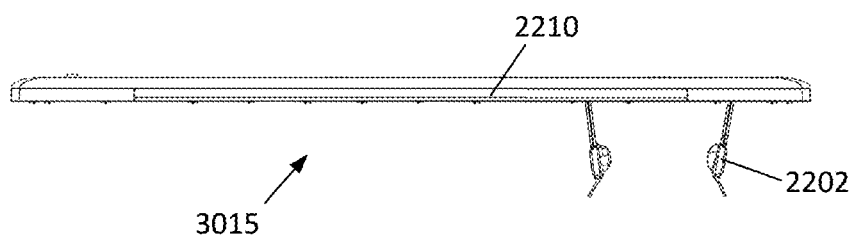

FIGS. 30A-30P show illustrative examples of additional multi-gang active cover plates. FIGS. 30A-30D show top, front, side and bottom views, respectively, of a triple-gang rocker cover plate (3000). Triple gang and other multi-gang electrical receptacles can be found in a variety of different locations. For example, when a home includes multiple lighting installations or lighting installations in multiple interconnected rooms, multi-gang light switch installations provide for convenient and often centralized control of the lighting. For example, in a home with an open floor plan, lighting may be used to visually segment the functions of the area. There may be recessed lighting near the TV and couches, a chandelier over the dining room table, work lighting in the kitchen, entryway lighting, accent lighting for art, etc. The multi-gang switch installations may be placed in any convenient location, such as an entryway or an opening between different functional areas. In this example, the multi-gang active cover plate (3000) includes three openings (2206) in the face plate (2214) for rocker light switches, with prongs (2202) located to draw power from the switch on the far left. The active cover plate (3000) can be secured in a variety of ways, including with apertures (2204) that can accept fasteners. In this example, the apertures (2204) are sized and positioned to allow screws to pass through the apertures and screw into threaded holes in the yokes of the various switches. A light pipe (2210) on the bottom edge allows for light to be projected out of the cover plate. A light sensor/lens/switch (2208) may also be present. As discussed above, these features may be sized and located in a variety of different configurations and combinations. As discussed above, the left side view may be substantially similar to the right side view. Further, the rear of the cover plate is not in view when the active cover plate is in use.

FIGS. 30E and 30H show front and bottom views, respectively, of a triple-gang toggle cover plate. FIGS. 30E and 30F show front and bottom views, respectively, of a four-gang rocker cover plate. FIGS. 30G and 30H show front and bottom views, respectively, of a four-gang toggle cover plate.

FIGS. 30E-30H show top, front, side and bottom views, respectively, of a triple-gang toggle cover plate (3005). In this example, the multi-gang active cover plate (3005) includes three openings (2206) in the face plate (2214) for toggle light switches, with prongs (2202) located to draw power from the switch on the far right. The prongs may be positioned to extract electrical power from any or all of the switches in the installations. One of the advantages of drawing power from more than one light switch may include better access to power (the active cover plate may still have access to electrical voltage even if one or more of the light switches in the on position), more distributed current distribution to avoid undesirable effects on the loads controlled by the switches, etc.

A light pipe (2210) on the bottom edge allows for light to be projected out of the cover plate. In this example, the light pipe (2210) extends along more than half of the bottom edge of the face plate. A light sensor/lens/switch (2208) may also be present. As discussed above, these features may be sized and located in a variety of different configurations and combinations. As discussed above, the left side view may be substantially similar to the right side view. Further, the rear of the cover plate is not in view when the active cover plate is in use.

FIGS. 30I-30L show top, front, side and bottom views, respectively, of a triple-gang toggle cover plate (3010). In this example, the multi-gang active cover plate (3010) includes four openings (2206) in the face plate (2214) for rocker light switches, with prongs (2202) located to draw power from the switch on the far left. As discussed above, the prongs may be positioned to extract electrical power from any or all of the switches in the installation. A light pipe (2210) on the bottom edge allows for light to be projected out of the cover plate. The active cover plate may also include a switch/lens/light sensor cover (2208). As discussed above, these features may be sized and located in a variety of different configurations and combinations. Further, the left side view of the quadruple gang active cover plate (3010) may be substantially similar to the right side view. Further, the rear of the cover plate is not in view when the active cover plate is in use.

FIGS. 30M-30P show top, front, side and bottom views, respectively, of a triple-gang toggle cover plate (3015). In this example, the multi-gang active cover plate (3015) includes four openings (2206) in the face plate (2214) for rocker light switches, with prongs (2202) located to draw power from the switch on the far right. As discussed above, the prongs may be positioned to extract electrical power from any or all of the switches in the installation. A light pipe (2210) on the bottom edge allows for light to be projected out of the cover plate. The active cover plate may also include a switch/lens/light sensor cover (2208). As discussed above, these features may be sized and located in a variety of different configurations and combinations. Further, the left side view of the quadruple gang active cover plate (3015) may be substantially similar to the right side view. The rear of the cover plate is not in view when the active cover plate is in use.

FIGS. 31A-31F show one illustrative example of an active cover plate (3100) with a protrusion (3105) that provides additional volume for circuitry and/or sensors. FIG. 31A is a top view of the active cover plate (3100). FIGS. 31B, 31C, 31D are, respectively, a front view, a side view, and a bottom view of the active cover plate. In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuitry. In this example, the protrusion (3105) includes a window for motion sensor and space for the motion sensor circuit. The active cover plate (3100) may include a variety of other elements, such as wireless transmission, illumination, etc. In this example, the active cover plate (3100) includes a light bar (3110) on the bottom edge of the faceplate. As discussed herein, the light bar(s) (if present) may have a variety of shapes, size, and locations.

There are several apertures (3125) in the faceplate (3120) to accept the electrical receptacle over which the active cover plate (3100) is configured to be fastened. In this embodiment, two apertures (3125) configured to fit over a duplex outlet are shown. However, as discussed herein, there may be a wide variety of apertures that could be formed in the faceplate. For example, apertures for toggle light switches, rocker light switches, multi-gang light switch installations, GFCI outlets, decor outlets, double outlet installations, and other electrical receptacles could be incorporated into the active cover plate.

FIG. 31E is a perspective view showing an embodiment of the active cover plate (3100) that includes an aperture (3125) for a rocker light switch and prongs (3115) that are adapted to contact a rocker light switch. There may be any number of prongs, for example, there may be two prongs, three prongs or four prongs. The protrusion (3105) extends from the face plate (3120) and the light pipe (3110) is located along one edge of the faceplate. FIG. 31F shows a rear perspective view of the faceplate (3120) without other associated components such as back plates, circuitry, and prongs. In this figure and other figures showing the back of the faceplate (3120), the faceplate has shown includes a number of features which may or may not be present in a final design. In particular, the protrusion may be more open than shown. In this and other figures (e.g. FIGS. 31-44), if there is only one side view shown, the opposite side view may be substantially similar to the side view illustrated (e.g. a vertical mirror image). Further, the rear of the active cover plate in this and other embodiments is typically not in view of the user when installed because the rear of the active cover plate is against the wall or covering the electrical box.

Figure 32C:
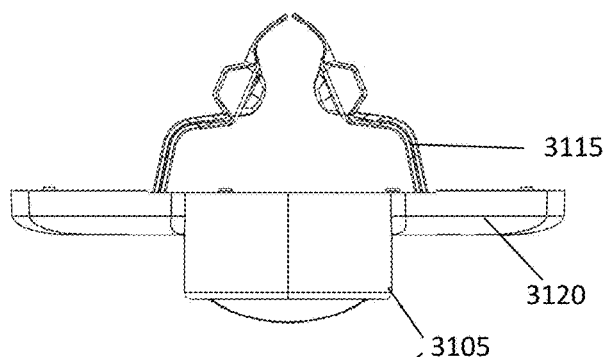
Figure 32D:
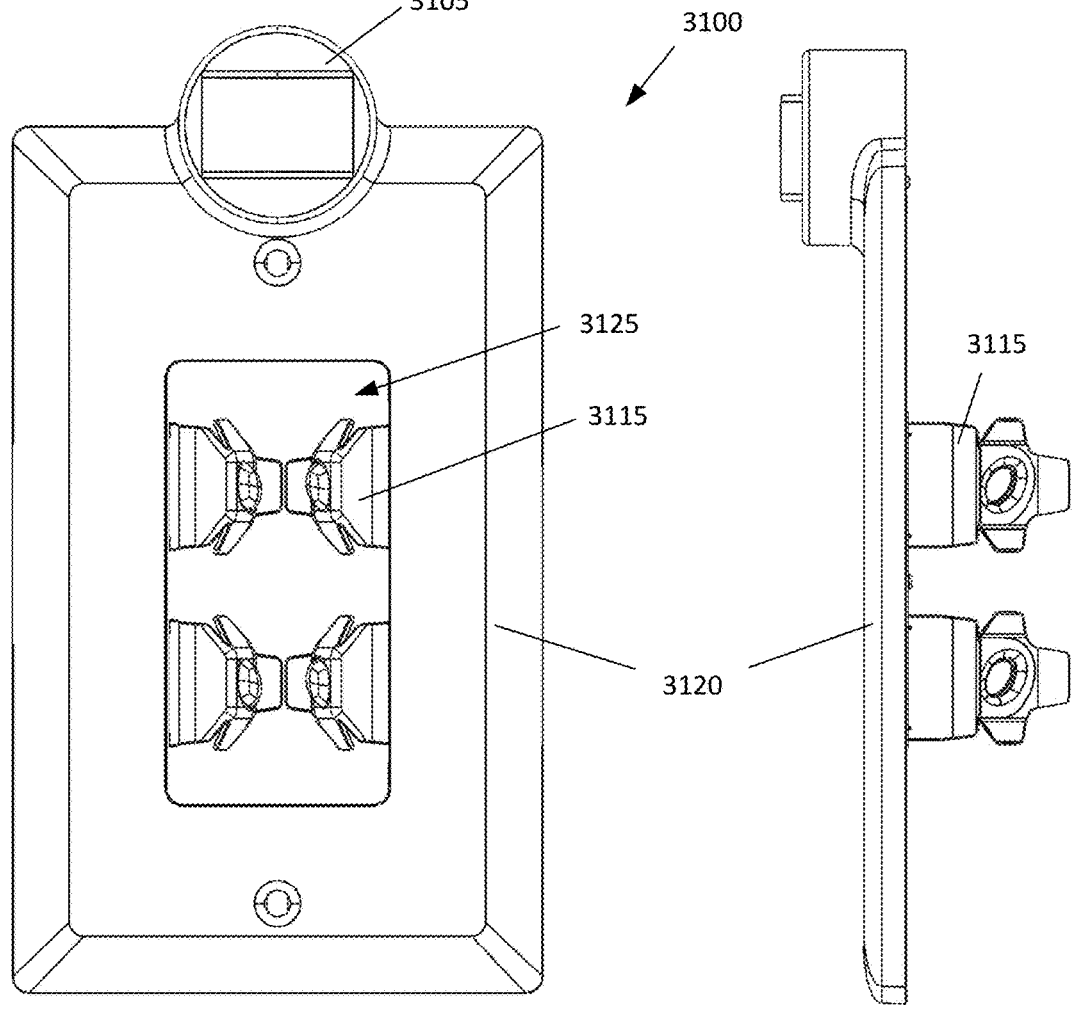
Figure 32E:
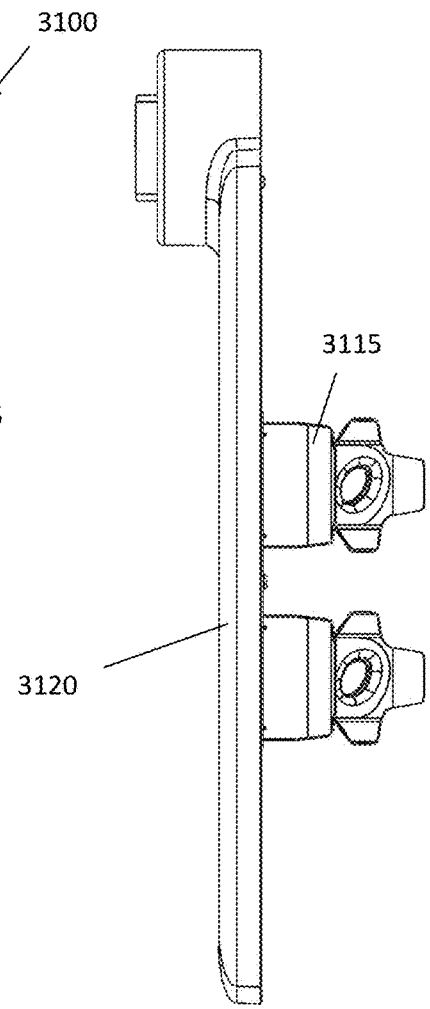
Figure 32F:
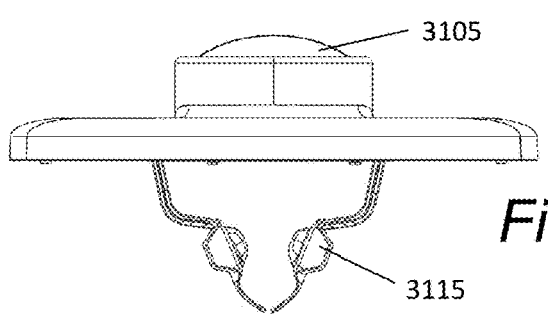

FIGS. 32A-32F show one illustrative example of an active cover plate (3100) with a protrusion (3105) that provides additional volume for circuitry and/or sensors. FIG. 32A is a perspective view showing an embodiment of the active cover plate (3100) that includes an aperture (3125) for a rocker light switch and prongs (3115) that are adapted to contact a rocker light switch. There may be any number of prongs, for example, there may be two prongs, three prongs or four prongs. The protrusion (3105) extends from the face plate (3120). FIG. 32B shows a rear perspective view of the faceplate (3120) without other associated components such as back plates, circuitry, and prongs.

FIG. 32C is a top view of the active cover plate (3100). FIGS. 31D, 31E and 31F are, respectively, a front view, a side view, and a bottom view of the active cover plate. In this embodiment, the active cover plate (3100) includes a protrusion (3105) that extends outward from a faceplate (3120) with prongs (3115) extending from the rear of the faceplate (3120). The protrusion (3105) may have a wide range of shapes and be adapted to a variety of sensors and circuity. In this example, the protrusion (3105) includes a window for motion sensor and space for the motion sensor circuit. The active cover plate (3100) may include a variety of other elements, such as wireless transmission, illumination, etc. A light bar or other illumination element is not explicitly shown in this example but may be present in any of a variety of forms. For example, the illumination or light bar may be present in the protrusion itself, on any edge/face of the faceplate, or in other appropriate locations and configurations.

There is an aperture (3125) in the faceplate (3120) to accept the electrical receptacle over which the active cover plate (3100) is configured to be fastened. In this embodiment, the aperture (3125) configured to fit over a decor outlet are shown. However, as discussed herein, there may be a wide variety of apertures that could be formed in the faceplate. For example, apertures for toggle light switches, rocker light switches, multi-gang light switch installations, GFCI outlets, décor outlets, double outlet installations, and other electrical receptacles could be incorporated into the active cover plate.

The décor aperture (3125) in the faceplate (3120) in this example will fit over rocker light switches, décor outlets, and GFCI outlets. By interchanging prongs, the active cover plate (3100) can be assembled to be compatible with any of these electrical receptacles. The prongs (3115) shown are specifically adapted for a rocker light switch. In this embodiment, there are four prongs shown, which allow the prongs to extract power from 3-way and 4-way switches in a variety of configurations. However, there may be a variety of other prongs used. Some alternative prongs may be used without any additional modification to the faceplate. As discussed above, GFCI outlets and décor electrical outlets are both compatible with the aperture (3125) and the faceplate (3120) may have posts to position and secure the various prongs (see e.g. 32B).

Figure 33A:
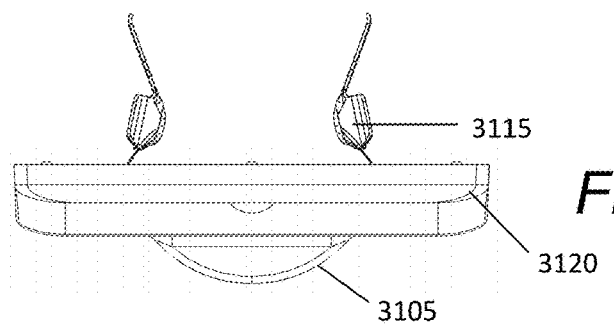
Figures 33B, 33C:
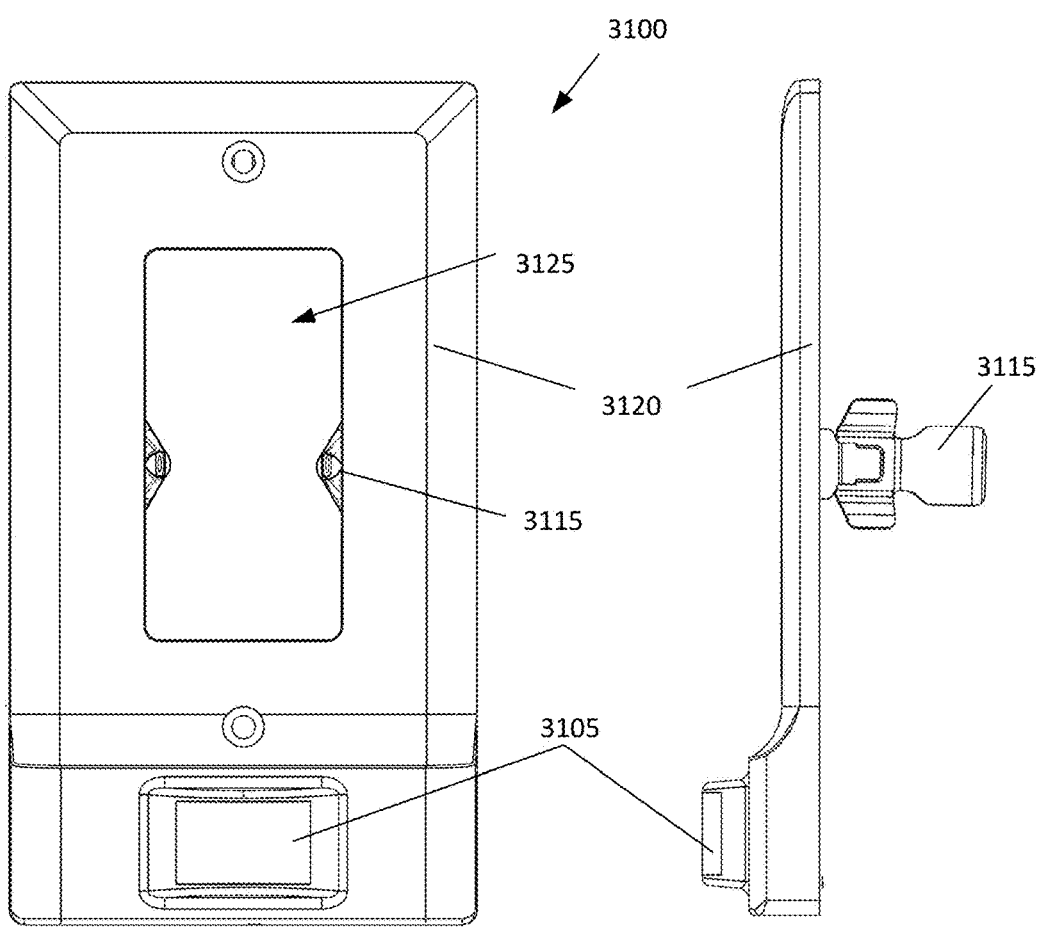
Figure 33D:
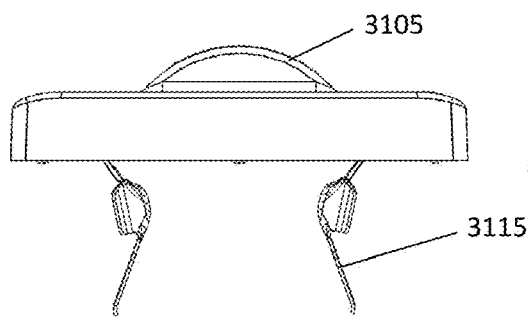

FIGS. 33A-33G show one illustrative example of an active cover plate (3100) with a protrusion (3105) that provides additional volume for circuitry and/or sensors. FIG. 33A is a top view of the active cover plate (3100). FIGS. 33B, 33C, 33D are, respectively, a front view, a side view, and a bottom view of the active cover plate. FIG. 33E is a front perspective view of the active coverplate. In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuity. In this example, the protrusion (3105) includes a window for motion sensor and space for the motion sensor circuit. The active cover plate (3100) may include a variety of other elements, such as wireless transmission, illumination, light bar, etc. As discussed herein, the light bar/illumination (if present) may have a variety of shapes, size, and locations.

There is an aperture (3125) in the faceplate (3120) to accept the electrical receptacle over which the active cover plate (3100) is configured to be fastened. In this embodiment, one aperture (3125) is configured (due its shape, size, and to the prongs attached to the faceplate) to fit over a decor outlet.

In the example shown in FIGS. 33A-33E, the active cover plate (3100) includes faceplate (3120) and prongs (3115) are configured for connection to outlet receptacles. However, as discussed above, there a variety of other prongs could used. FIG. 33F shows prongs that are configured for connection to light switches. When used in combination with the rectangular aperture (3125) in the faceplate (3120), the prongs (3115) are configured for connection to a single pole, 3-way, or 4-way rocker light switch. FIG. 33G shows a rear view of a faceplate (3120) without other components. As discussed above, this view of the faceplate shows a cover over the protrusion which may or may not be present. In some examples, the function of the cover is performed by the back plate.

FIGS. 34A-34G show an illustrative example of an active cover plate (3100) with a protrusion (3105) that provides additional volume for circuitry and/or sensors. FIG. 34A is a top view of the active cover plate (3100). FIGS. 34B, 34C, 34D are, respectively, a front view, a side view, and a bottom view of the active cover plate (3100). FIGS. 34E and 34G are front and rear perspective views of the active cover plate (3100). In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuity. In this example, the protrusion is upwardly angled for a better field of view for the motion sensor. There is an aperture (3125) in the faceplate (3120) to accept the electrical receptacle over which the active cover plate (3100) is configured to be fastened. In this embodiment, the one aperture (3125) is configured to fit over a decor outlet. However, as discussed herein, there may be a wide variety of apertures that could be formed in the faceplate.

In the example shown in FIGS. 34A-34E and 34G, the active cover plate (3100) includes faceplate (3120) and prongs (3115) are configured for connection to outlet receptacles. However, as discussed above, there a variety of other prongs could be used. FIG. 34F shows an illustrative embodiment of an active cover plate (3100) with prongs (3115) extending from the face plate (3120) that are configured for connection to light switches. When used in combination with the rectangular aperture (3125) in the faceplate (3120), the prongs (3115) are configured for connection to a single pole, 3-way, or 4-way rocker light switch.

FIGS. 35A-35G show one illustrative example of an active cover plate (3100) with a protrusion (3105) that provides additional volume for circuitry and/or sensors. FIG. 35A is a top view of the active cover plate (3100). FIGS. 35B, 35C, 35D, 35E, and 35G are, respectively, a front view, a side view, a bottom view, front perspective view, and rear perspective view of the active cover plate (3100). In this embodiment, the active cover plate (3100) includes a protrusion (3105) that extends outward from a faceplate (3120) with prongs (3115) extending from the rear of the faceplate. The protrusion (3105) may have a wide range of shapes and be adapted to a variety of sensors and circuity. A light pipe or other illumination may be present. For example, there may be a light pipe on the bottom edge/surface of the active cover plate. There is an aperture (3125) in the faceplate (3120) to accept the electrical receptacle over which the active cover plate (3100) is configured to be fastened. In this embodiment, the one aperture (3125) is configured to fit over a decor outlet. However, as discussed herein, there may be a wide variety of apertures that could be formed in the faceplate.

In the example shown in FIGS. 35A-35E and 35G, the active cover plate (3100) includes faceplate (3120) and prongs (3115) are configured for connection to outlet receptacles. However, as discussed above, there a variety of other prongs could be used. FIG. 35F shows prongs (3115) that are configured for connection to light switches. When used in combination with the rectangular aperture (3125) in the faceplate (3120), the prongs (3115) are configured for connection to a single pole, 3-way, or 4-way rocker light switch.

Figure 36E:
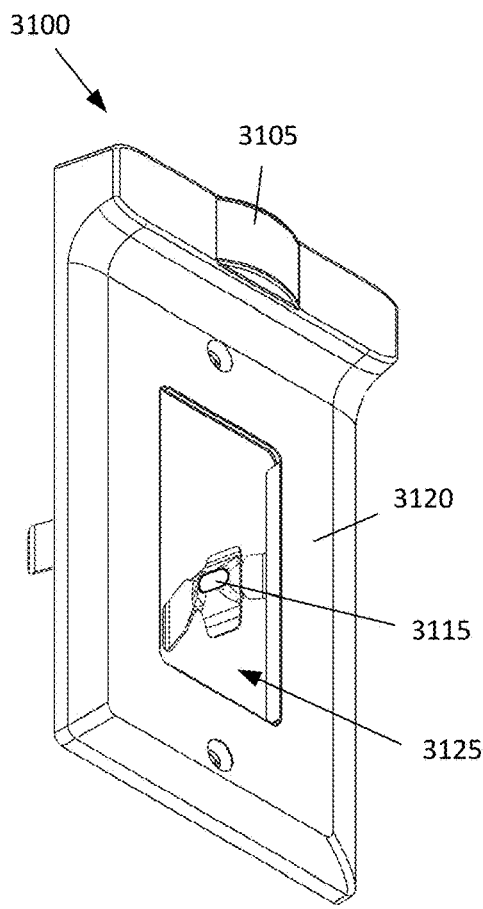

FIGS. 36A-36E show one illustrative example of an active cover plate (3100) with a protrusion (3105) that provides additional volume for circuitry and/or sensors. FIG. 36A is a top view of the active cover plate (3100). FIGS. 36B, 36C, 36D, and 36E are, respectively, a front view, a side view, bottom view and a front perspective of this illustrative active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. In this example the protrusion may extend from the top of the faceplate (3120).

There is an aperture (3125) in the faceplate (3120) to accept the electrical receptacle over which the active cover plate (3100) is configured to be fastened. In this embodiment, the one aperture (3125) is configured to fit over a décor outlet (because of the prongs selected). However, as discussed herein, there may be a wide variety of apertures (3125) that could be formed in the faceplate.

Figure 36F:
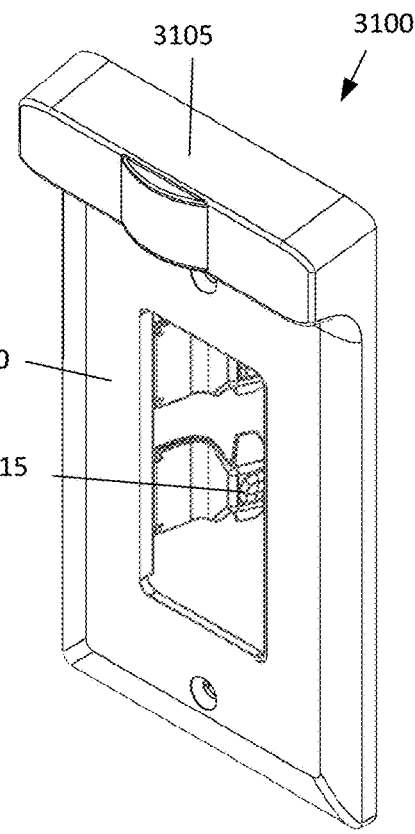
Figure 36G:
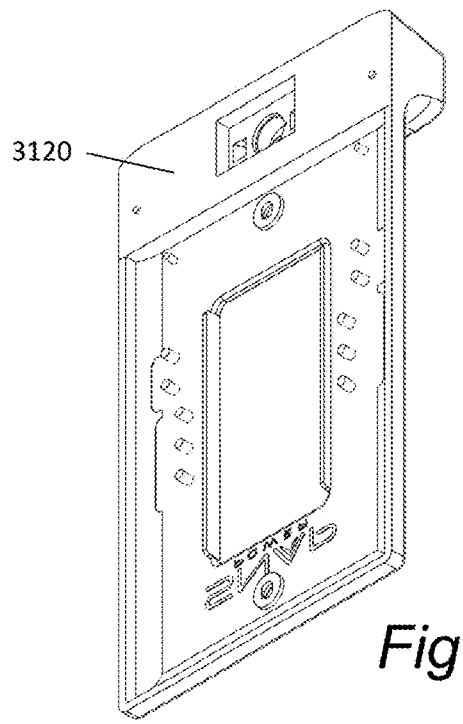

In the example shown in FIGS. 36A-36E, the active cover plate (3100) includes faceplate (3120) and prongs (3115) are configured for connection to outlet receptacles. However, as discussed above, there a variety of other prongs could be used. FIG. 36F shows prongs (3115) that are configured for connection to light switches. When used in combination with the rectangular aperture (3125) in the faceplate (3120), the prongs (3115) are configured for connection to a single pole, 3-way, or 4-way rocker light switch. FIG. 36G shows a rear view of a faceplate (3120) without other components. This faceplate and other décor/rocker style faceplate can be configured to work over any of a number of different electrical receptacles by picking the appropriate prongs and connecting/fastening the prongs to the faceplate and electrically connecting the prongs to the internal circuitry.

Figure 37A:
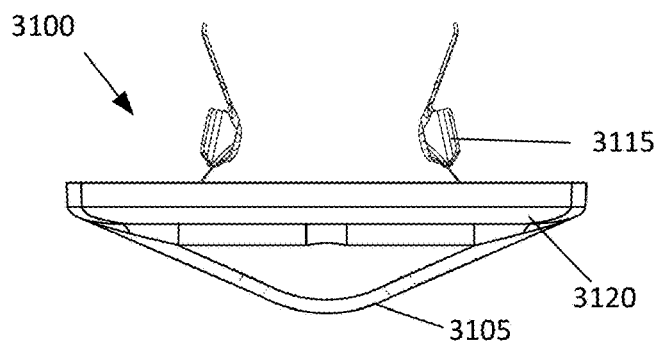
Figure 37B:
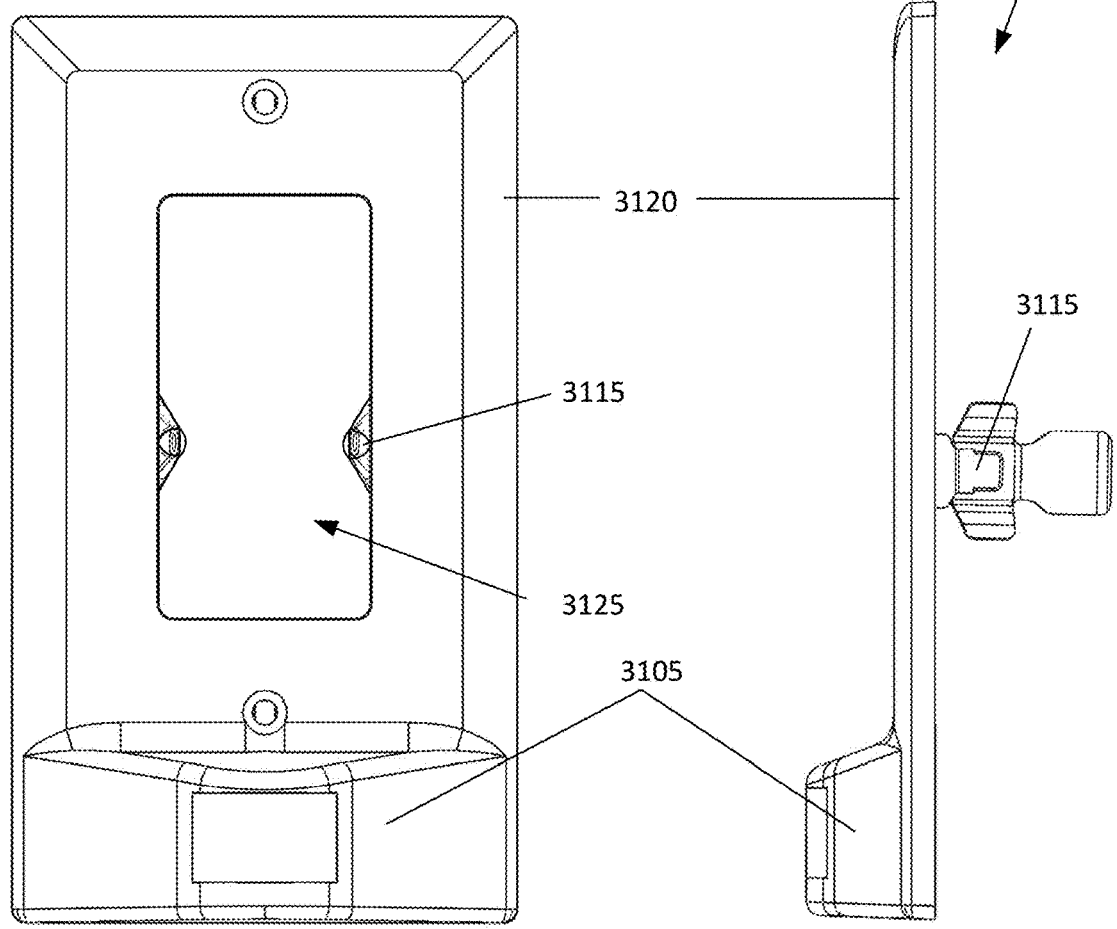
Figure 37C:
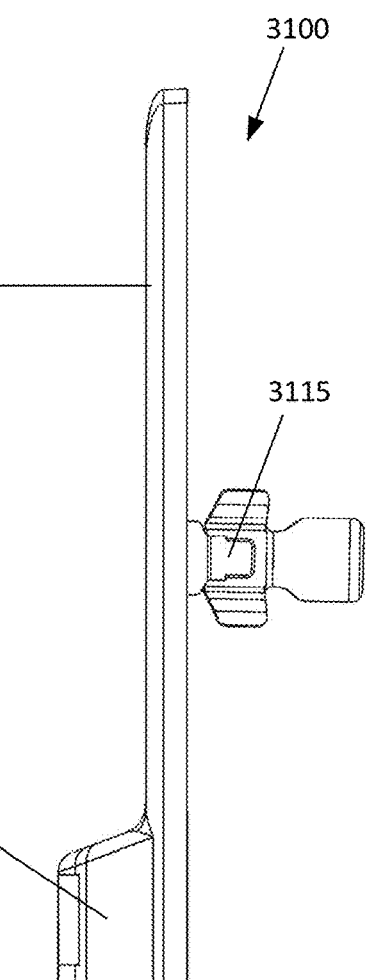
Figure 37D:
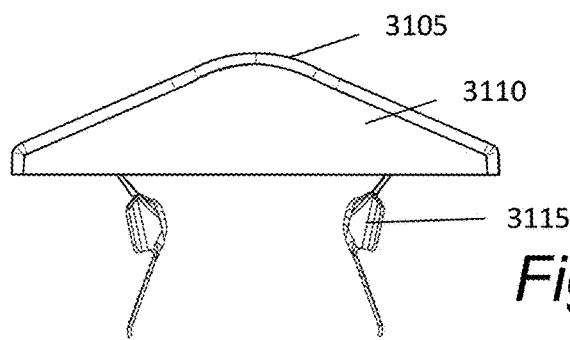

FIGS. 37A-37G show an illustrative example of an active cover plate (3100) with a protrusion (3105) on the bottom of the faceplate (3120) that provides additional volume for circuitry and/or sensors. FIG. 37A is a top view of the active cover plate (3100). FIGS. 37B, 37C, 37D, 37E and 37G are, respectively, a front view, a side view, bottom view, front perspective view, and rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. An aperture (3125) in the faceplate (3120) to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

In the example shown in FIGS. 37A-37E and 37G, the active cover plate (3100) includes faceplate (3120) and prongs (3115) are configured for connection to outlet receptacles. However, as discussed above, there a variety of other prongs could be used. FIG. 37F shows prongs (3115) that are configured for connection to light switches. When used in combination with the rectangular aperture (3125) in the faceplate (3120), the prongs (3115) are configured for connection to a single pole, 3-way, or 4-way rocker light switch.

Figure 38E:
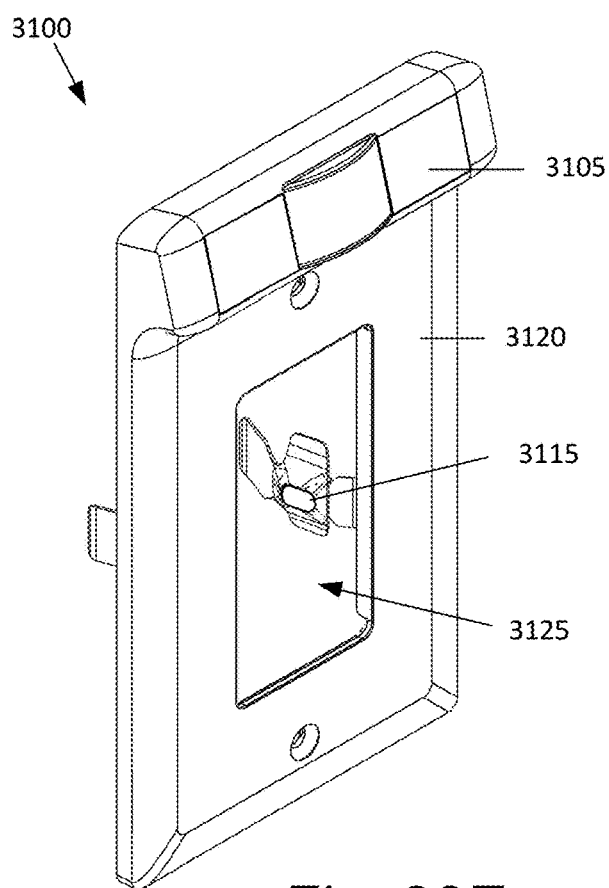

FIGS. 38A-38G show an illustrative example of an active cover plate (3100) with a protrusion (3105) that provides additional volume for circuitry and/or sensors. FIG. 38A is a top view of the active cover plate (3100). FIGS. 38B, 38C, 38D, and 38E are, respectively, a front view, a side view, bottom view, and front perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. An aperture (3125) in the faceplate (3120) to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

Figure 38F:
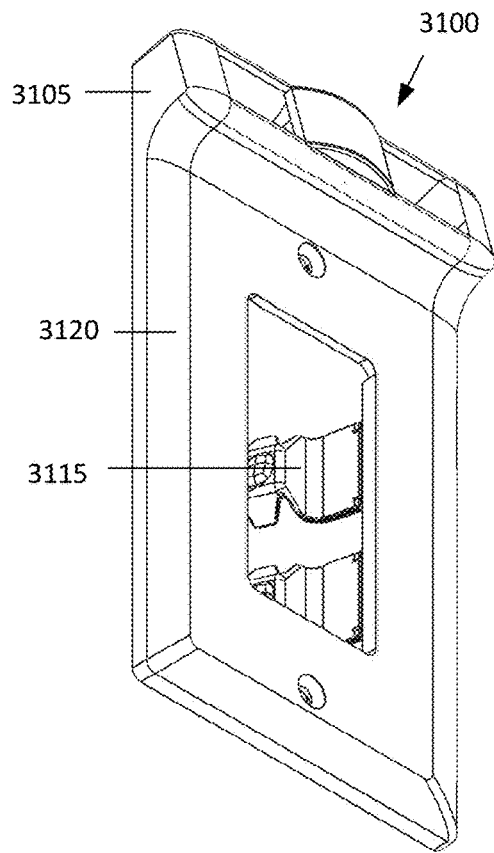
Figure 38G:
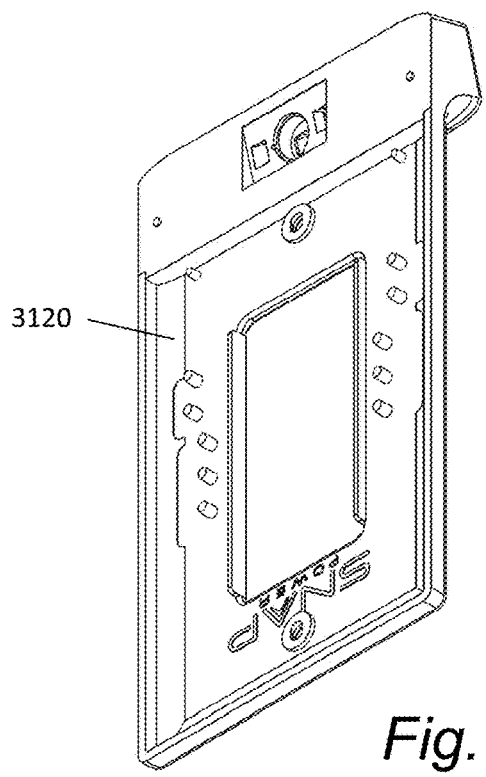

In the example shown in FIGS. 38A-38E, the active cover plate (3100) includes faceplate (3120) and prongs (3115) are configured for connection to outlet receptacles. However, as discussed above, there a variety of other prongs could be used. FIG. 38F shows prongs (3115) that are configured for connection to light switches. When used in combination with the rectangular aperture (3125) in the faceplate (3120) and prongs (3115), the active cover plate (3100) can be configured for connection to a single pole, 3-way, or 4-way rocker light switch. FIG. 38G shows a rear view of a faceplate (3120) without other components.

Figure 39E:
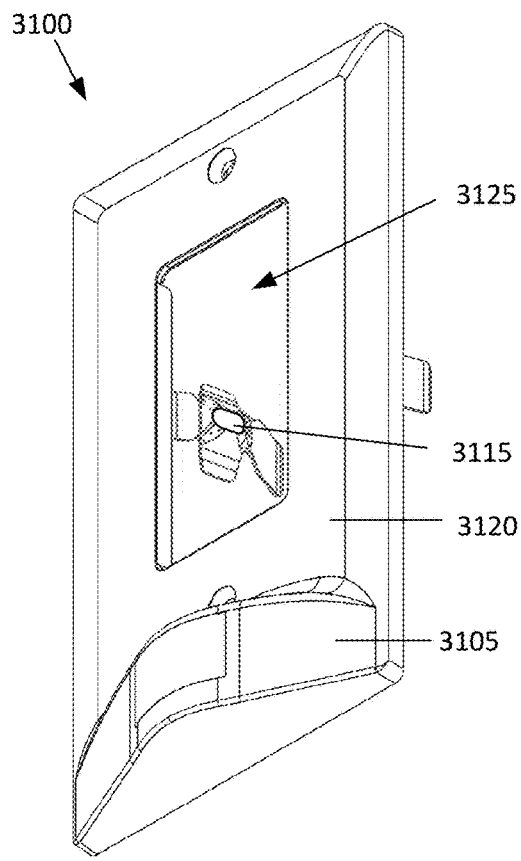

FIGS. 39A-39G show an illustrative example of an active cover plate (3100) with a protrusion that provides additional volume for circuitry and/or sensors. FIG. 39A is a top view of the active cover plate (3100). FIGS. 39B, 39C, 39D, 39E, and 39G are, respectively, a front view, a side view, bottom view, front perspective view and rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. An aperture (3125) in the faceplate (3120) to accept the electrical receptacle over which the active cover plate (3100) is configured to be fastened. In this embodiment, the one aperture (3125) is configured to fit over a décor outlet. However, as discussed herein, there may be a wide variety of apertures that could be formed in the faceplate.

Figure 39F:
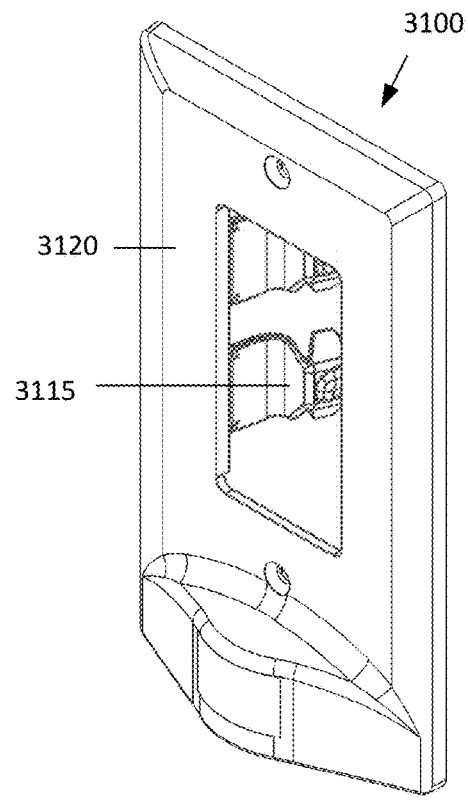
Figure 39G:
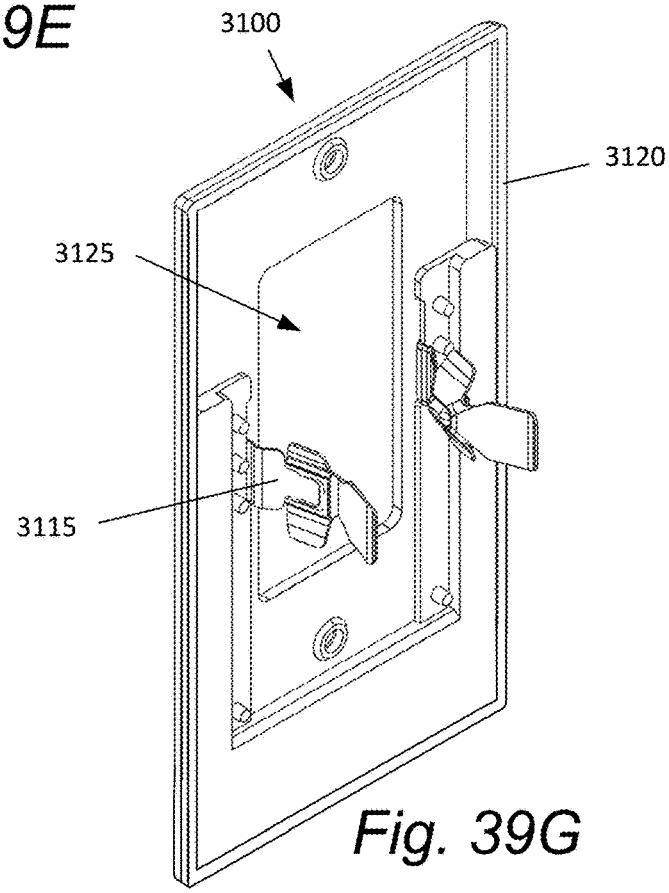

In the example shown in FIGS. 39A-39E and 39G, the active cover plate (3100) includes faceplate (3120) and prongs (3115) are configured for connection to outlet receptacles. However, as discussed above, there a variety of other prongs could be used. FIG. 39F shows prongs (3115) that are configured for connection to light switches. When used in combination with the rectangular aperture (3125) in the faceplate (3120), the prongs (3115) are configured for connection to a single pole, 3-way, or 4-way rocker light switch.

Figure 40A:
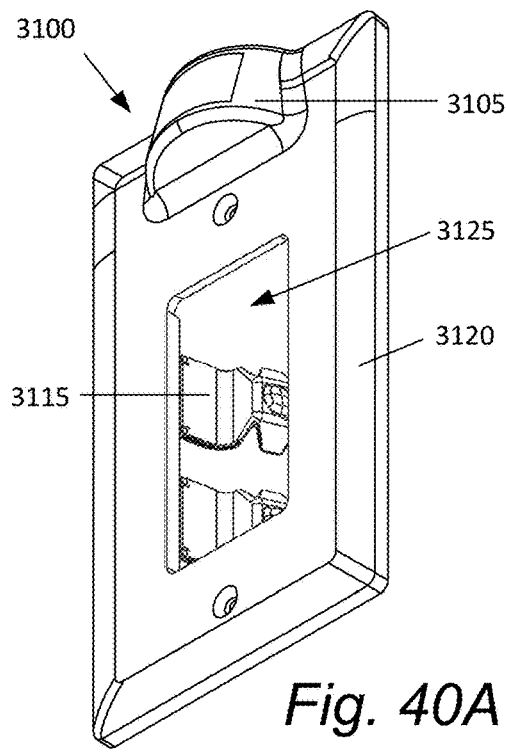
FIGS. 40A-40E show one illustrative example of an active cover plate with a protrusion that provides additional volume for circuitry and/or sensors, according to one example of principles described herein.
Figure 40B:
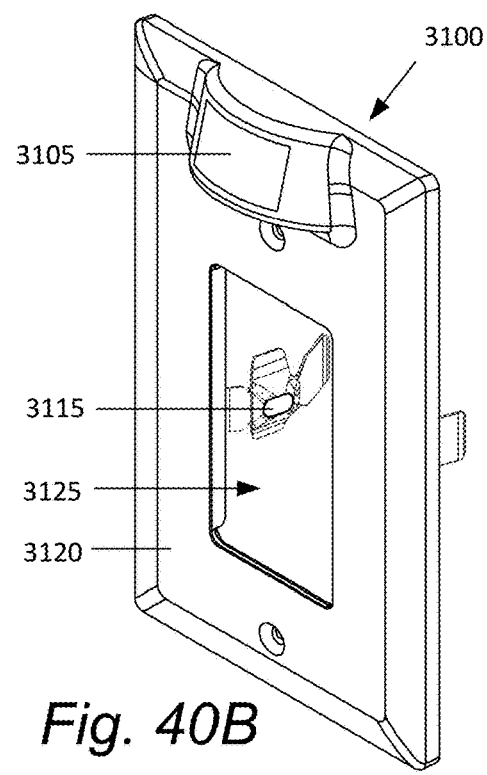

FIGS. 40A-40E show illustrative examples of an active cover plate (3100) with a protrusion that provides additional volume for circuitry and/or sensors. FIG. 40A and 40B are perspective views of active cover plates (3100). FIG. 40A is an active cover plate (3100) that is configured to connect to a light switch. FIGS. 40B, 40C, 40D, and 40E are a front perspective view, bottom, top, and side views, respectively, of an active cover plate (3100) that is configured for connection to an outlet.

FIG. 40A shows an active cover plate (3100) with a faceplate (3120) with an aperture (3125) and prongs (3115) for a rocker light switch. In this example, the protrusion (3105) is located at the top of the plate and is angle upward. The protrusion (3105) may include any of a number of sensors and circuitry, including motion sensor(s), air sensors, temperature sensors, or other sensors. As with other designs described herein, the circuitry may be entirely contained within the protrusion or may be distributed throughout the active cover plate.

FIG. 40B shows an active cover plate (3100) with a faceplate (3120), a protrusion (3105) on the upper portion of the faceplate and aperture (3125) through the faceplate. The prongs (3115) in this illustrative example are configured for outlets. While the protrusion (3105) is on the top of the faceplate in this example, the whole plate may be rotated and installed upside down, placing the protrusion (3105) at the bottom the reoriented faceplate (3120). This applies to many or all of the designs presented herein. In some examples, the prongs may need to be relocated to allow them to contact the screw terminals when the faceplate is installed in a different position. In other situations, the prongs may be suitability configured for either orientation. For example, the prongs (3115) shown in FIG. 40A are configured to contact screw terminals of a rocker switch in either orientation. The sensors, actuators, or other circuitry in the protrusion may be advantageously positioned by selecting a desired orientation of the active cover plate over the electrical receptacle. For example, if the protrusion includes a motion sensor and the electrical receptacle is located in a lower position on the wall (such as over an outlet), it may be advantageous for the sensor to be located on the upper side of the faceplate and in the case shown in FIG. 40B, have the motion detector angled upward to better sense the motion of people moving about the room. However, if an active cover plate was located over a light switch (see e.g. 3100, FIG. 40A) then it may be desirable for the protrusion be on the lower side of the faceplate and the active cover plate may be reoriented to achieve this.

Figure 40C:
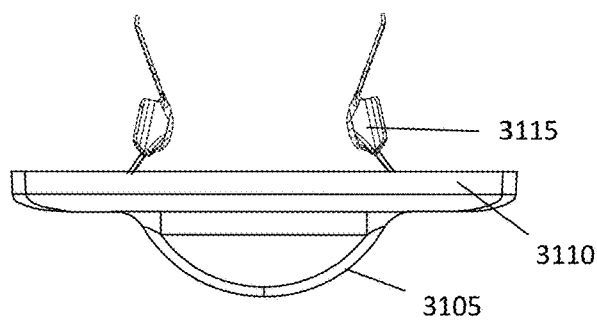
Figure 40D:
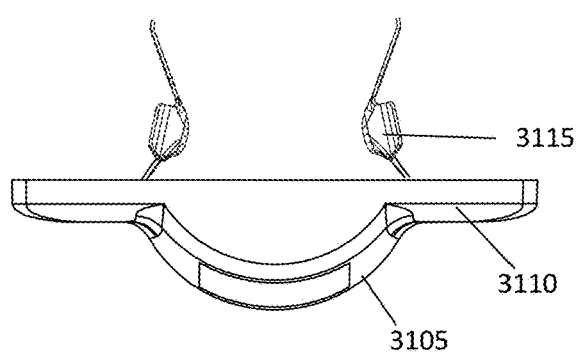
Figure 40E:
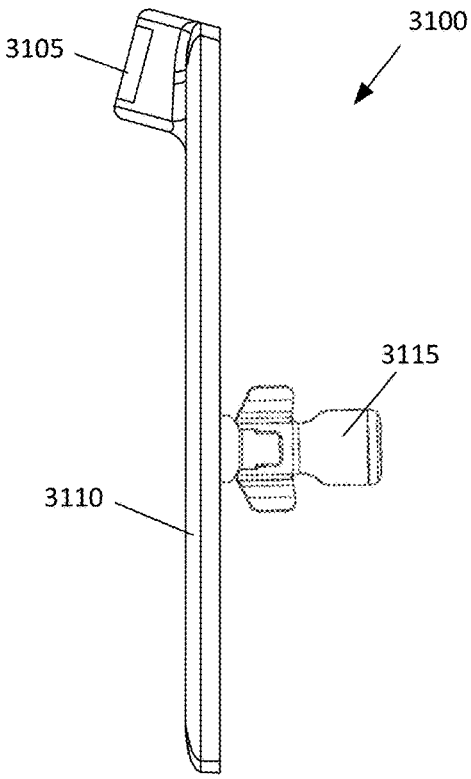

FIG. 40C shows a bottom view of the illustrative active cover plate (3100) shown in FIG. 40B. FIG. 40C shows the protrusion (3105), the faceplate (3120), and the prongs (3115). FIG. 40D shows a top view of the active cover plate of FIG. 40D, with the outlet style prongs (3115) and the face plate (3120) with the protrusion (3105) extending from the faceplate. FIG. 40E shows a side view of the same active cover plate (3100) and elements (3120, 3155, 3105).

FIGS. 41A-41G show an illustrative example of an active cover plate (3100) with a protrusion that provides additional volume for circuitry and/or sensors. FIG. 41A is a top view of the active cover plate (3100). FIGS. 41B, 41C, 41D, 41E, and 41G are, respectively, a front view, a side view, a bottom view, a front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. An aperture (3125) in the faceplate (3120) to accept the electrical receptacle over which the active cover plate (3100) is configured to be fastened. In this embodiment, the one aperture (3125) is configured to fit over a decor outlet. However, as discussed herein, there may be a wide variety of apertures that could be formed in the faceplate.

In the example shown in FIGS. 41A-41E, the active cover plate (3100) includes faceplate (3120) and prongs (3115) are configured for connection to outlet receptacles. However, as discussed above, there a variety of other prongs could be used. FIG. 39F shows prongs (3115) that are configured for connection to light switches. When used in combination with the rectangular aperture (3125) in the faceplate (3120), the prongs (3115) are configured for connection to a single pole, 3-way, or 4-way rocker light switch.

FIGS. 42A-42G one illustrative example of an active cover plate (3100) with a protrusion (3105) that provides additional volume for circuitry and/or sensors, according to one example of principles described herein. FIGS. 42A-42G show an illustrative example of an active cover plate (3100) with a protrusion (3105) that provides additional volume for circuitry and/or sensors. FIG. 42A is a top view of the active cover plate (3100). FIGS. 42B, 42C, 42D, and 42E, are, respectively, a front view, a side view, bottom view, and front perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. An aperture (3125) in the faceplate (3120) to accept the electrical receptacle over which the active cover plate (3100) is configured to be fastened. In FIG. 42F, the prongs are configured to fit over a decor outlet. However, as discussed herein, there may be a wide variety of apertures that could be formed in the faceplate.

In the example shown in FIGS. 42A-42E, the active cover plate (3100) includes faceplate (3120) and prongs (3115) are configured for connection to outlet receptacles. However, as discussed above, there a variety of other prongs could be used. FIG. 39F shows prongs (3115) that are configured for connection to light switches. When used in combination with the rectangular aperture (3125) in the faceplate (3120), the prongs (3115) are configured for connection to a single pole, 3-way, or 4-way rocker light switch. FIG. 38G shows a rear view of a faceplate (3120) without other components.

FIGS. 43A-43G show an illustrative example of an active cover plate (3100) with a protrusion that provides additional volume for circuitry and/or sensors. FIG. 43A is a top view of the active cover plate (3100). FIGS. 43B, 43C, 43D, 43E, 43F and 43G are, respectively, a front view, a side view, bottom view, front perspective view, another front perspective view and rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. An aperture (3125) in the faceplate (3120) to accept the electrical receptacle over which the active cover plate (3100) is configured to be fastened. In this embodiment, the one aperture (3125) is configured to fit over a duplex outlet. However, as discussed herein, there may be a wide variety of apertures that could be formed in the faceplate.

In the example shown in FIGS. 43A-43G, the active cover plate (3100) includes faceplate (3120) and prongs (3115) are configured for connection to outlet receptacles. FIGS. 43E and 43F are front perspective views of the active cover plate (3100) and show the apertures (3125) in the faceplate (3120) and protrusion (3105). FIG. 38G shows a rear view of the active cover plate (3100) with the faceplate (3120) including the prongs (3115) and back plate (3130). The light pipe (3110) may be formed in any desired configuration, shape or location. In this and other examples, the light pipe may be bottom surface of the cover plate as shown in FIG. 43B. For example, all or part of the bottom surface of the active cover plate may a light pipe in FIGS. 44A-44II shown below.

Figure 44A:
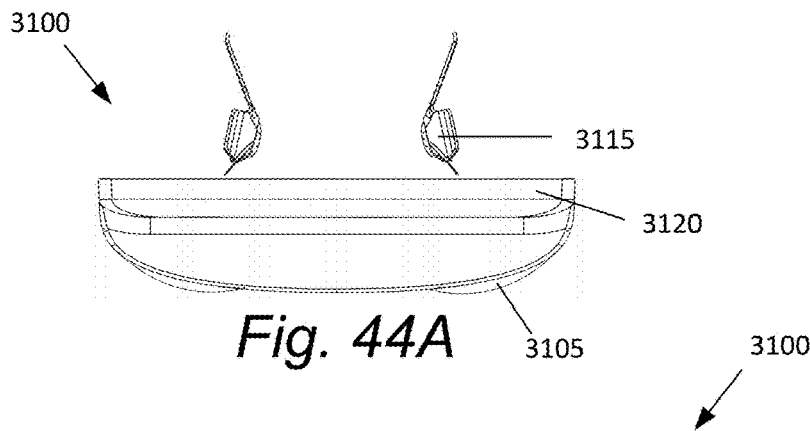
FIGS. 44A-44II show illustrative examples of active cover plates with a protrusion that provides additional volume for circuitry and/or sensors, according to one example of principles described herein.

FIGS. 44A-44II show various illustrative examples of an active cover plate (3100) with a protrusion that provides additional volume for circuitry and/or sensors. FIG. 44A is a top view of the active cover plate (3100). FIGS. 44B, 44C, 44D, 44E, 44F, and 44G are, respectively, a front view, a side view, a bottom view, front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. In this example, the protrusion (3105) includes two windows for motion sensors that arch outward from the primary curve of the protrusion. These windows are placed on either side of the protrusion and may provide additional sensitivity and wider viewing angles for the motion sensor.

Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate.

In the example shown in FIGS. 44A-44G, the active cover plate (3100) includes faceplate (3120) and prongs (3115) are configured for connection to outlet receptacles. FIGS. 43E and 43F are front perspective views of the active cover plate (3100) and show the apertures (3125) in the faceplate (3120) and protrusion (3105). FIG. 38G shows a rear view of the active cover plate (3100) with the faceplate (3120) including the prongs (3115) and back plate (3130).

FIGS. 44H-44N show a different embodiment of the active cover plate (3100). In this embodiment, the windows for the motion sensors are flush with the exterior curve of the protrusion. FIGS. 44H, 44I, 44J, 44K, 44L, 44M, 44N are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate. Although the figures show this and other embodiments in specific orientations, the active cover plates may be installed in any suitable orientation, including right side up, upside down, and horizontally. The available orientations may be subject to several limitations. For example, the orientation may be limited by obstructions around the electrical receptacle such as moldings or counters. The orientation may be limited by the ability of the prongs to contact the side screws or other electrified portion of the electrical receptacle.

FIGS. 44O-44U show a different embodiment of the active cover plate (3100). FIGS. 44O, 44P, 44Q, 44R, 44S, 44T, and 44U are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate. Although the figures show this and other embodiments in specific orientations, the active cover plates may be installed in any suitable orientation, including right side up, upside down, and horizontally. This embodiment includes a switch/lens cover (2208) located on the protrusion. The switch/lens cover (2208) may serve one or more functions in this and other embodiments. It may be a light transmissive cover over a light sensor. This cover may have light focusing and/or light dispersive characteristics. It may be a manually manipulatable connection to a switch. It may be used as both of these functions at the same time. It may also have a variety of other functions such as covering or providing access to other sensors or actuators. Light pipe (3310) is also shown in FIGS. 44R and 44T. All or part of the lower surface of the active cover plate could be used as the light pipe. Additionally or alternatively, the light pipe(s) could be formed on other faces or edges of the active cover plate.

Figures 44B, 44C:
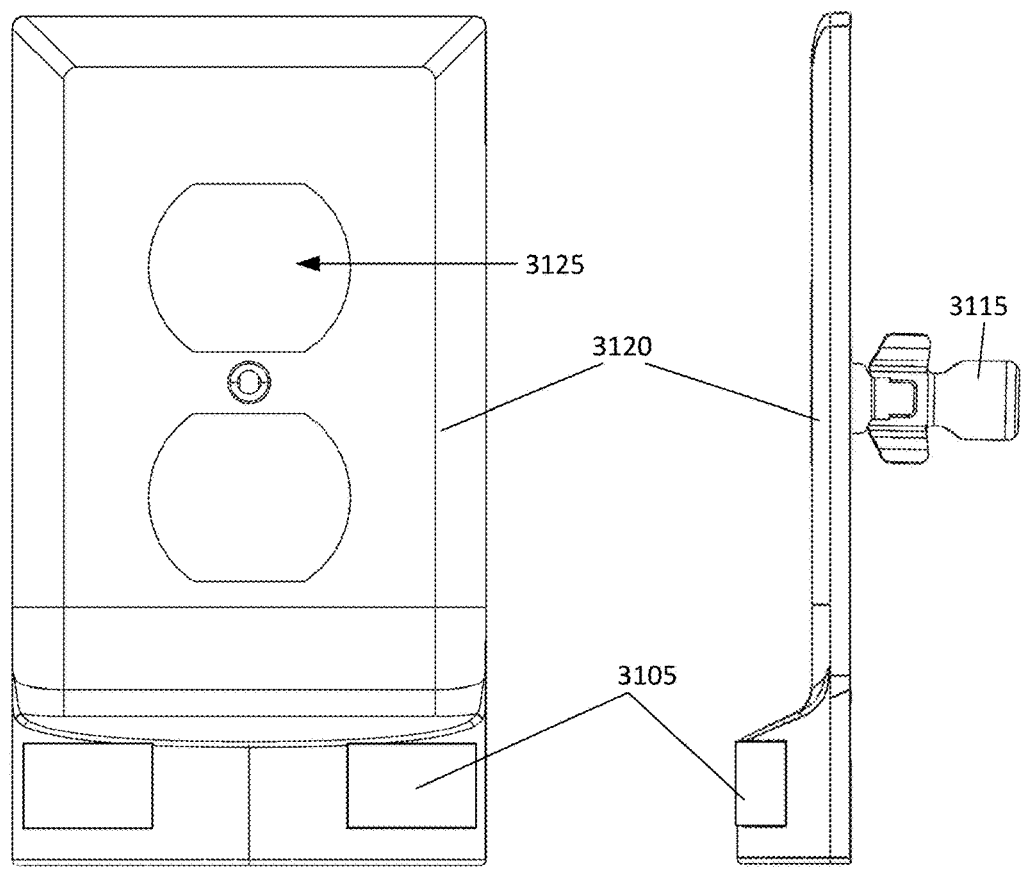
Figure 44D:
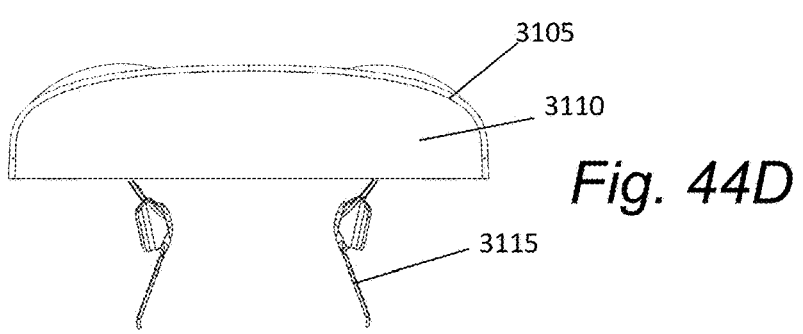
Figure 44E:
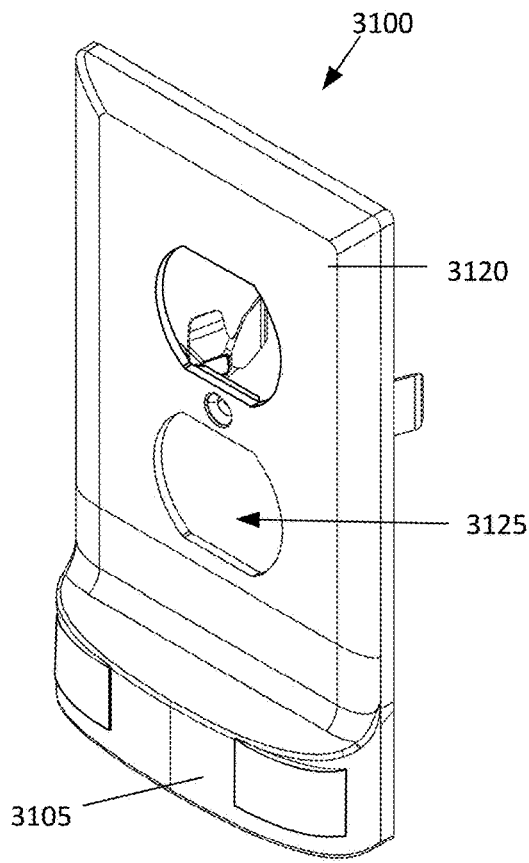
Figure 44F:
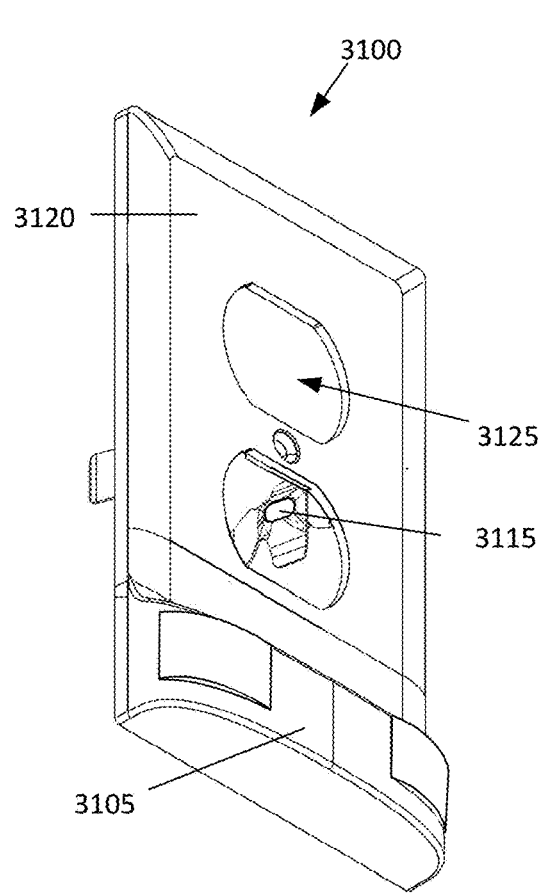
Figure 44G:
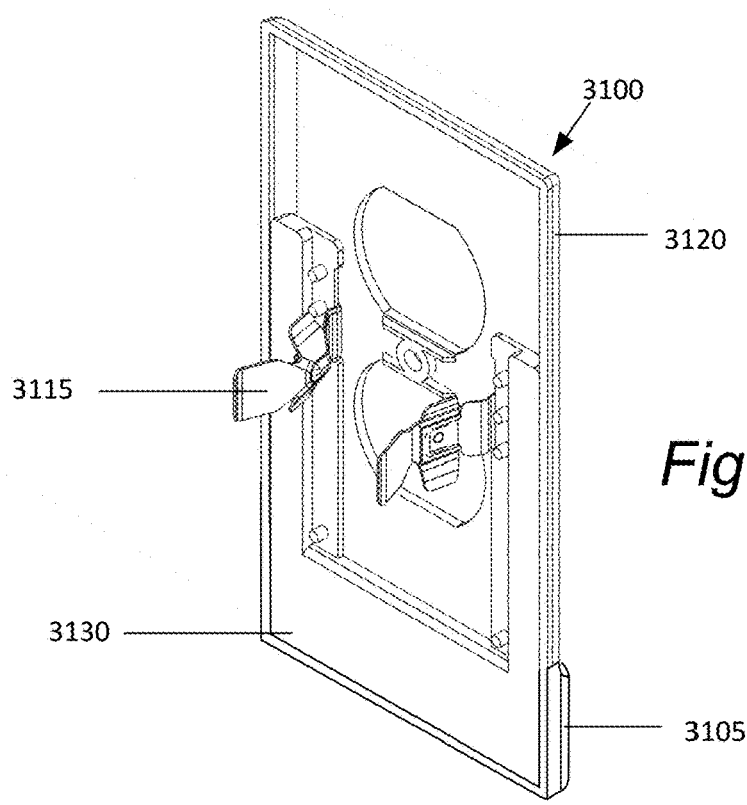
Figure 44H:
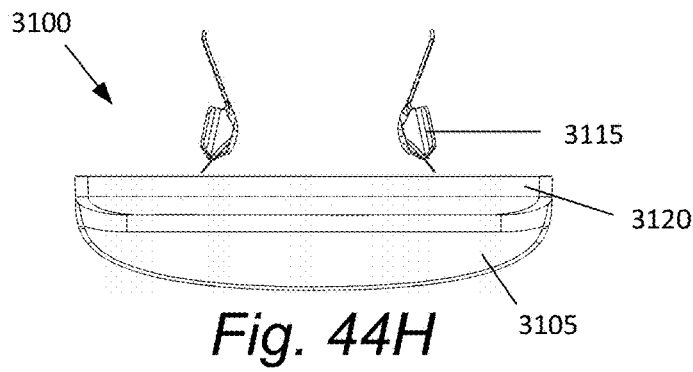
Figures 44I, 44J:
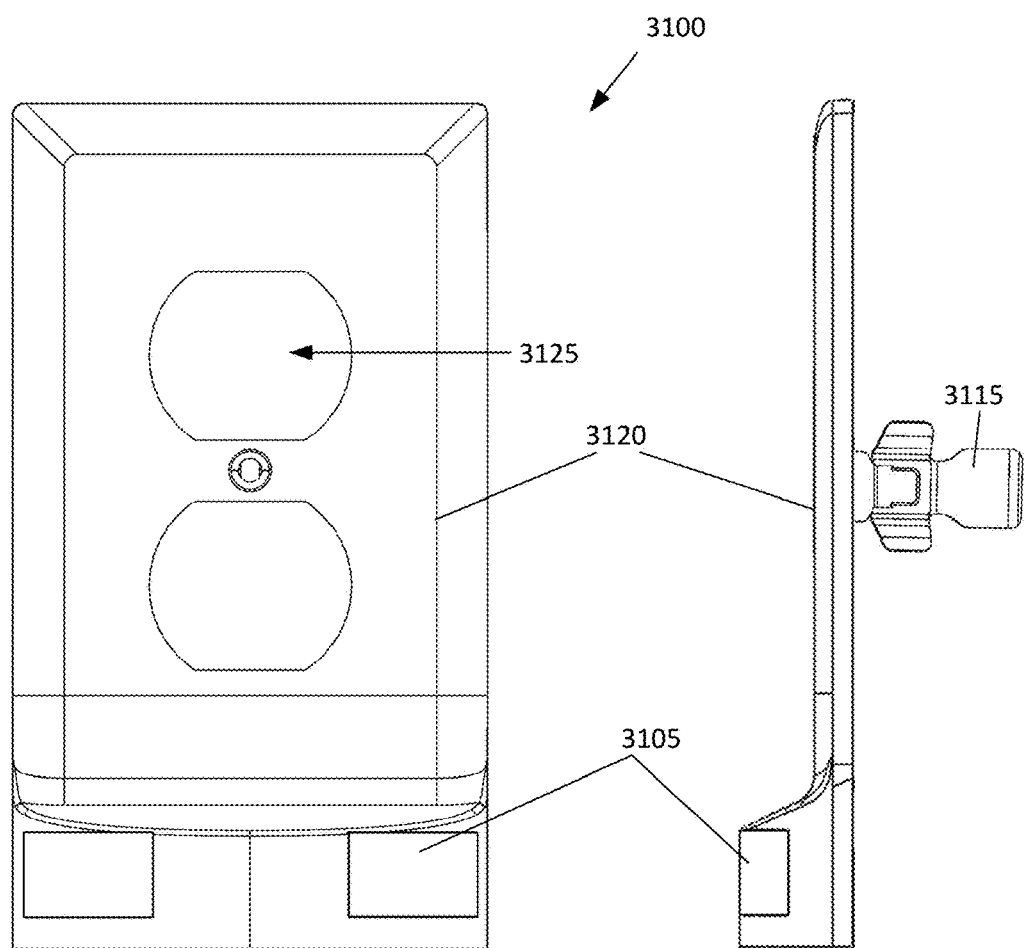
Figure 44K:
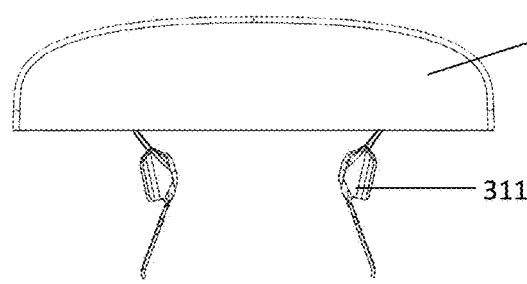
Figure 44L:
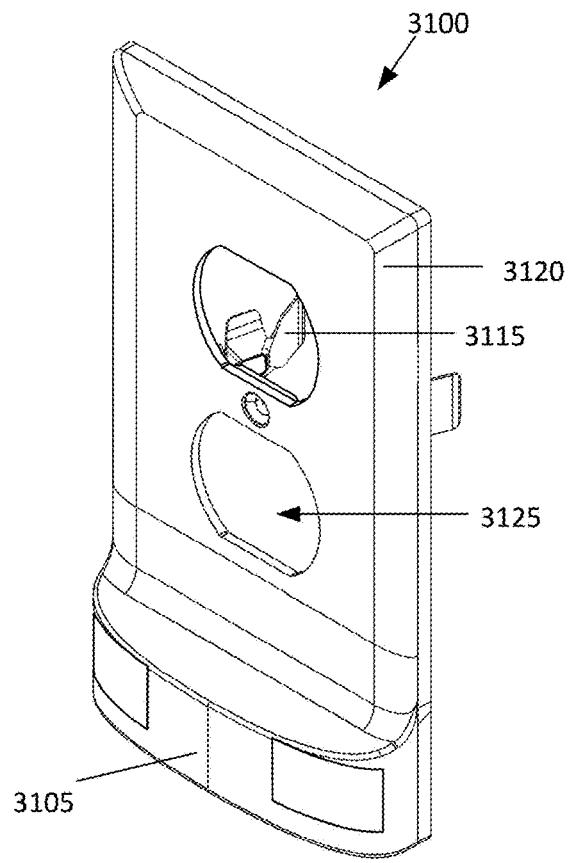
Figure 44M:
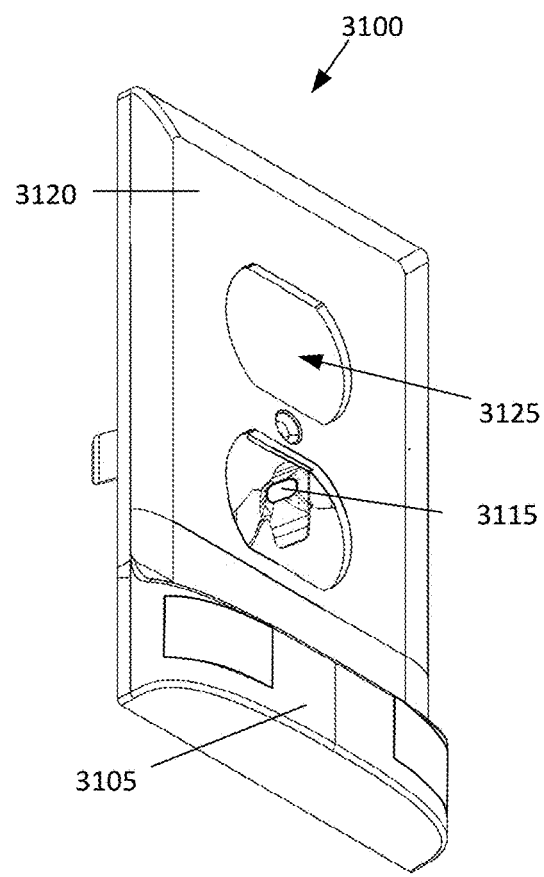
Figure 44N:
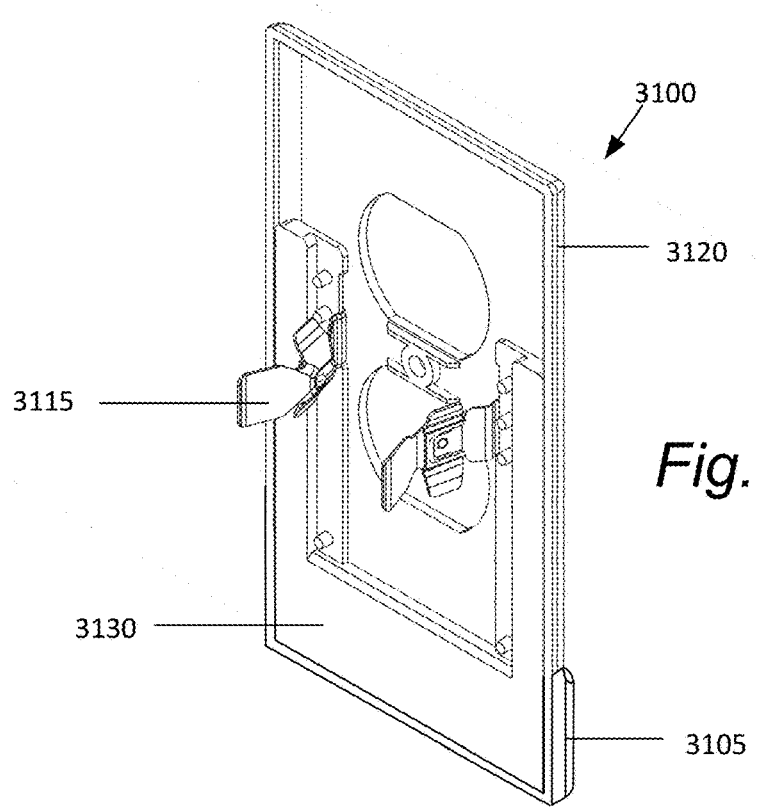

FIGS. 44V-44BB show a different embodiment of the active cover plate (3100). FIGS. 44V, 44W, 44X, 44Y, 44Z, 44AA, and 44BB are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. As discussed and shown herein, the protrusion (3105) may have a wide range of shapes and be adapted to a variety of sensors and circuity. In this example, a motion sensor lens is shown in the protrusion and a switch/lens cover (2208) is located below the motion sensor lens.

Apertures (3125) in the faceplate (3120) are configured to accept the electrical receptacle over which the active cover plate (3100) is configured to be fastened. In this embodiment, the apertures (3125) are configured to fit over a duplex outlet. However, as discussed herein, there may be a wide variety of apertures that could be formed in the faceplate. Although the figures show this and other embodiments in specific orientations, the active cover plates may be installed in any suitable orientation, including right side up, upside down, and horizontally. This embodiment includes a switch/lens cover (2208) located on the protrusion. The switch/lens cover (2208) may serve one or more functions in this and other embodiments. Light pipe (3310) is shown in FIGS. 44Y and 44AA.

FIGS. 44CC-44II show a different embodiment of the active cover plate (3100). FIGS. 44CC, 44DD, 44EE, 44FF, 44GG, 44HH, and 44II are, respectively, a top view, a front view, a side view, bottom view, a front perspective view, another front perspective view, and a rear perspective view of the active cover plate (3100). In this embodiment, the active cover plate (3100) includes a protrusion (3105) that extends outward from a faceplate (3120) with prongs (3115) extending from the rear of the faceplate. Apertures (3125) in the faceplate (3120) are configured to accept the electrical receptacle over which the active cover plate (3100) is configured to be fastened. In this embodiment, the apertures (3125) are configured to fit over a duplex outlet. As discussed and shown herein, the protrusion (3105) may have a wide range of shapes and be adapted to a variety of sensors and circuity. In this example, a motion sensor lens is shown in the protrusion and a switch/lens cover (2208) is located below the motion sensor lens. The protrusion (3105) in this example is located closer to the bottom aperture and as a result, the overall vertical dimension of the plate is smaller. Light pipe (3310) is shown in FIGS. 44Y and 44AA.

Figure 45F:
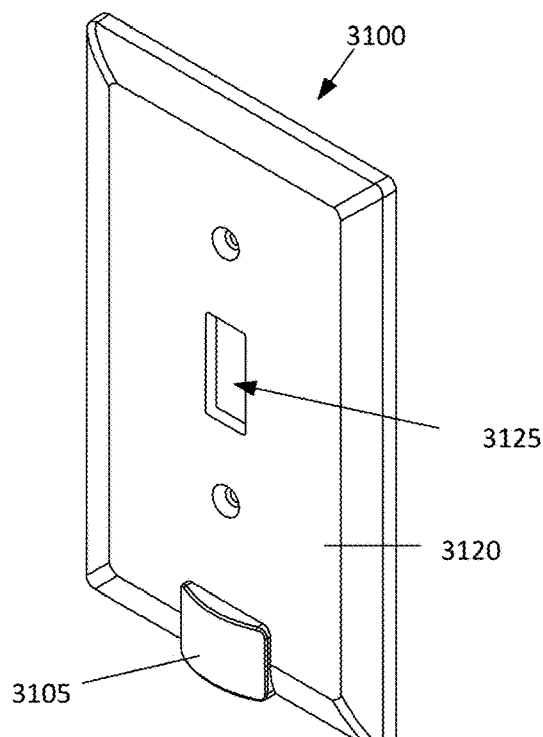
Figure 45G:
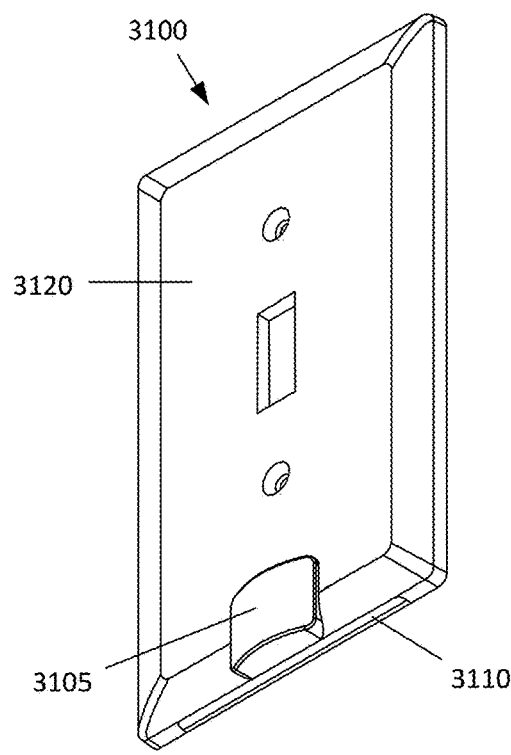
Figure 45H:
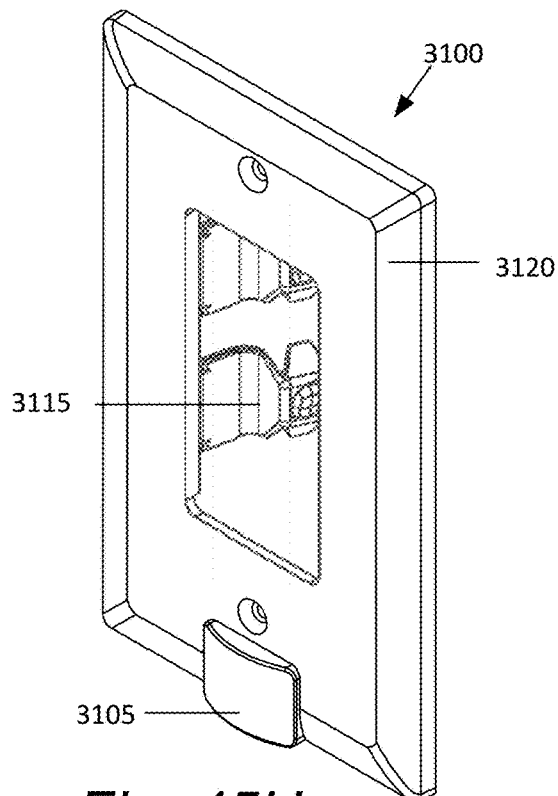
Figure 45I:
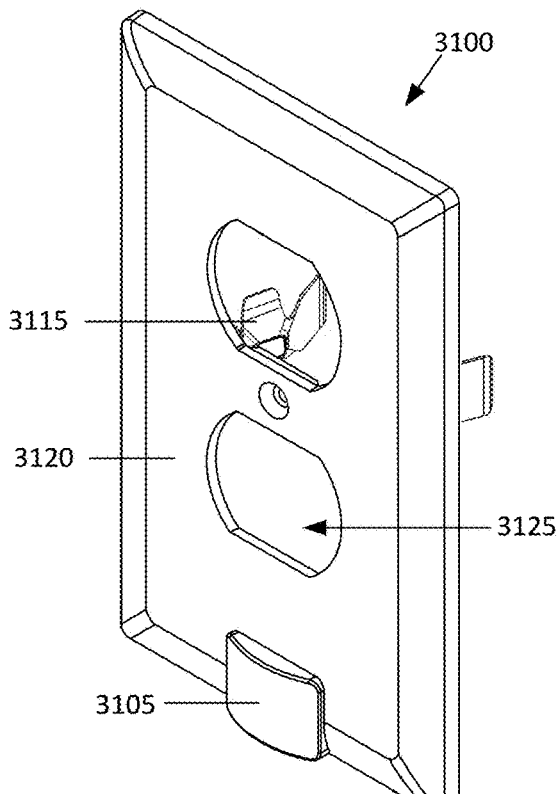

FIGS. 45A-45I show illustrative examples of an active cover plate (3100) with a protrusion that provides additional volume for circuitry and/or sensors. FIG. 45A is a top view of the active cover plate (3100). FIGS. 45B, 45C, 45D, 45E, 45F, and 45G are, respectively, a left-side view, a front view, a right-side view, a bottom view, a front perspective view, and another front perspective view of the active cover plate (3100). The active cover plate includes an aperture (3125), in the faceplate (3120) with the protrusion (3105) extending from the face plate. Although prongs can be used in conjunction with this design, the prongs are not shown in these figures, but are shown in numerous other figures herein. In this embodiment, the faceplate (3120) is configured to be compatible with a toggle light switch (3125). However, as with any of the previous designs, the faceplate may be configured to be compatible with any of a variety of electrical receptacles. For example, FIG. 45H is shows a faceplate with an aperture that is compatible with a décor outlet or a rocker light switch. The prongs in FIG. 45H are configured for a rocker light switch but a variety of prongs compatible with a décor outlet could be attached to the faceplate. FIG. 45I shows an active cover plate (3100) with apertures (3125) and prongs (3115) for a duplex outlet. FIGS. 45A-45I also show a protrusion (3105) that extends from the front the faceplate (3125) with prongs (3115) extending from the rear of the faceplate. In this case the protrusion is an arched rectangular shape. However, as discussed and shown herein, the protrusion (3105) may have a wide range of shapes and be adapted to a variety of sensors and circuity.

Figure 46A:
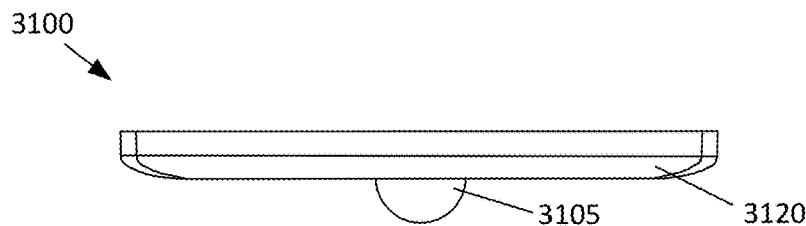
FIGS. 46A-46L show one illustrative example of an active cover plate with a protrusion that provides additional volume for circuitry and/or sensors, according to one example of principles described herein.
Figures 46B, 46C, 46D:
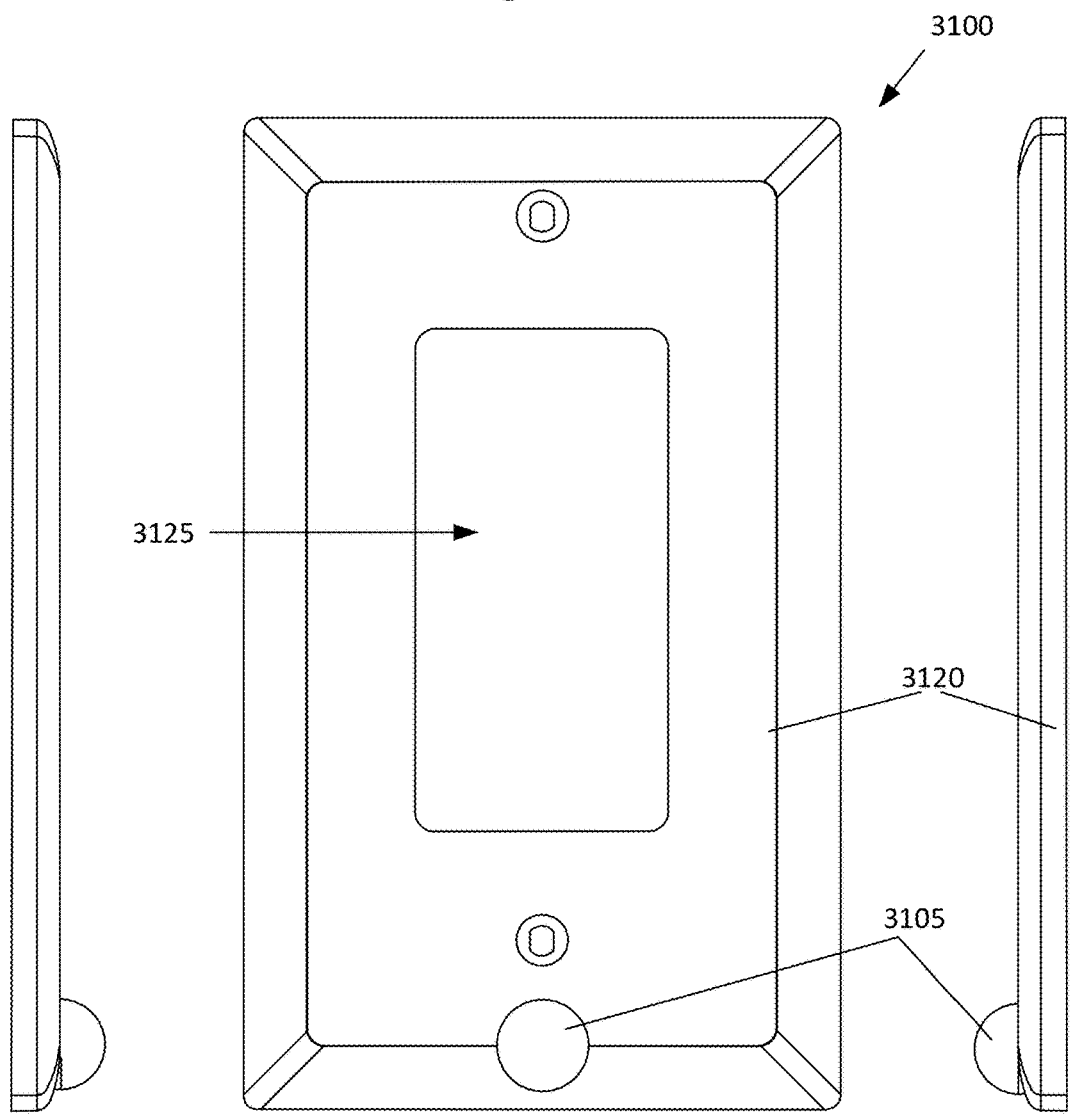
Figure 46E:
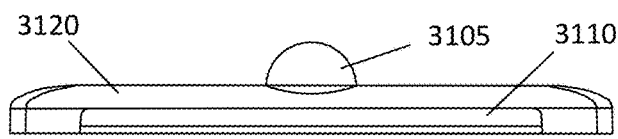
Figure 46F:
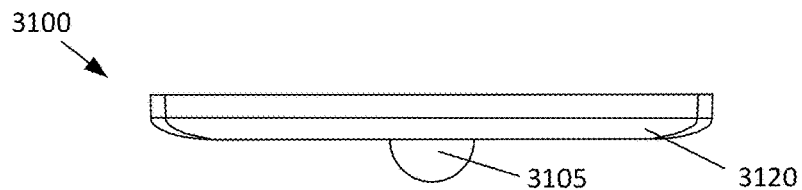
Figures 46G, 46H, 46I:
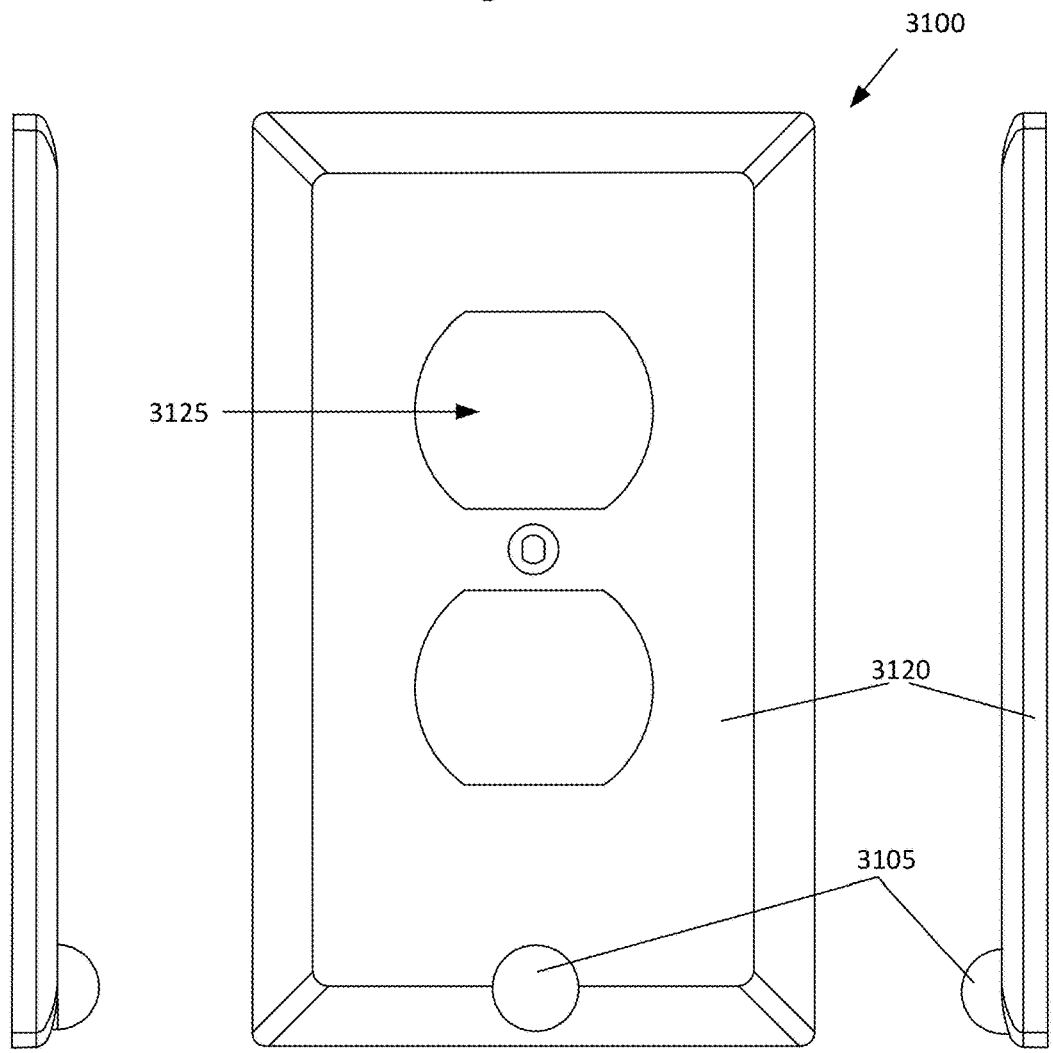
Figure 46J:
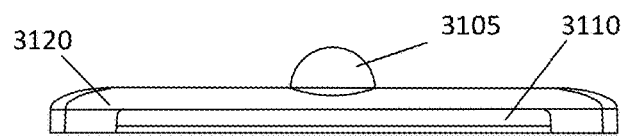
Figure 46K:
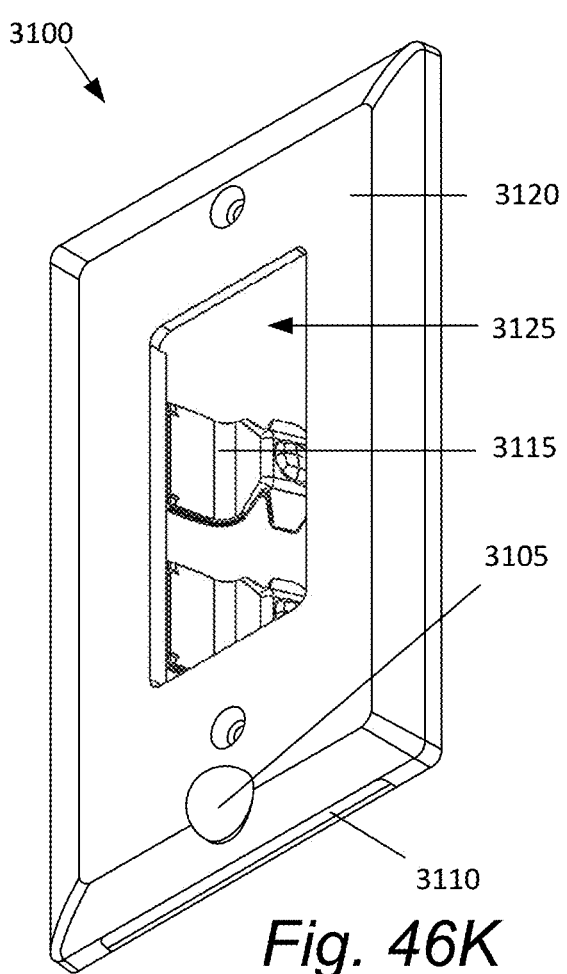

FIGS. 46A-46L show illustrative examples of an active cover plate (3100) with a protrusion that provides additional volume for circuitry and/or sensors. FIG. 46A is a top view of the active cover plate (3100). FIGS. 46B, 46C, 46D and 46E are, respectively, a left-side view, front view, a right-side view, and a bottom view of the active cover plate (3100) configured with a faceplate (3120) for use over a décor outlet, a GFCI outlet, or a rocker light switch. In this embodiment, the faceplate (3120) contains an aperture (3125) is configured to be compatible with a rocker light switch, a décor outlet, or a GFCI outlet because all of these electrical receptacles have the same perimeter shape that extends through the cover plate. Although prongs can be used in conjunction with this design, the prongs are not shown in these figures, but are shown in numerous other figures herein. One specific example is shown in FIG. 46K, which is a perspective view of the active cover plate (3100) with prongs (3115) for connection to a rocker light switch visible through the aperture (3125) in the face plate (3120).

However, as with other designs taught herein, the faceplate may be configured to be compatible with any of a variety of electrical receptacles. For example, FIGS. 46F-46J and 46F show a faceplate with an aperture that is compatible with a duplex outlet. Specifically, FIG. 46F is a top view of the active cover plates (3100). FIGS. 46G, 46H, 46I, 46J and 46L are, respectively, a left-side view, front view, a right-side view, a bottom view and an front perspective view of the active cover plate (3100) configured with a faceplate (3120) with an aperture (3125) for use over a duplex outlet.

Figure 46L:
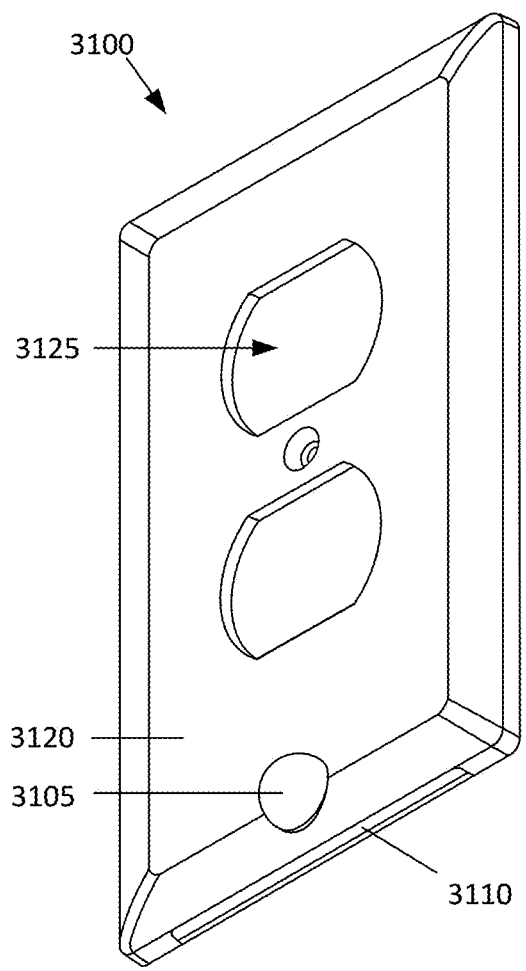

FIGS. 46A-46I also show a protrusion (3105) that extends from the front the faceplate (3125) with prongs (3115) extending from the rear of the faceplate. In this case the protrusion has a domed circular shape. However, as discussed and shown herein, the protrusion (3105) may have a wide range of shapes and be adapted to a variety of sensors and circuity. FIGS. 46J, 46K, and 46L show one example of a light pipe (3110) or other aperture that could be used for various purposes. The light pipe (3110) or aperture could have any of a variety of shapes and sizes, including those that are shown herein (see e.g. 24A-24L).

Figure 47F:
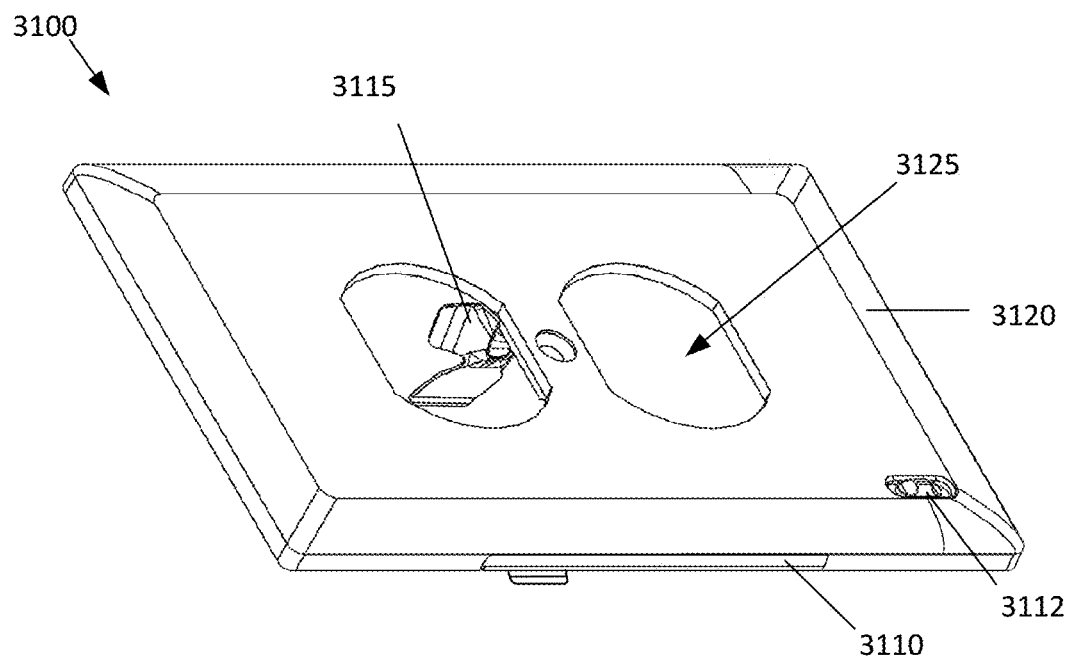
Figure 47G:
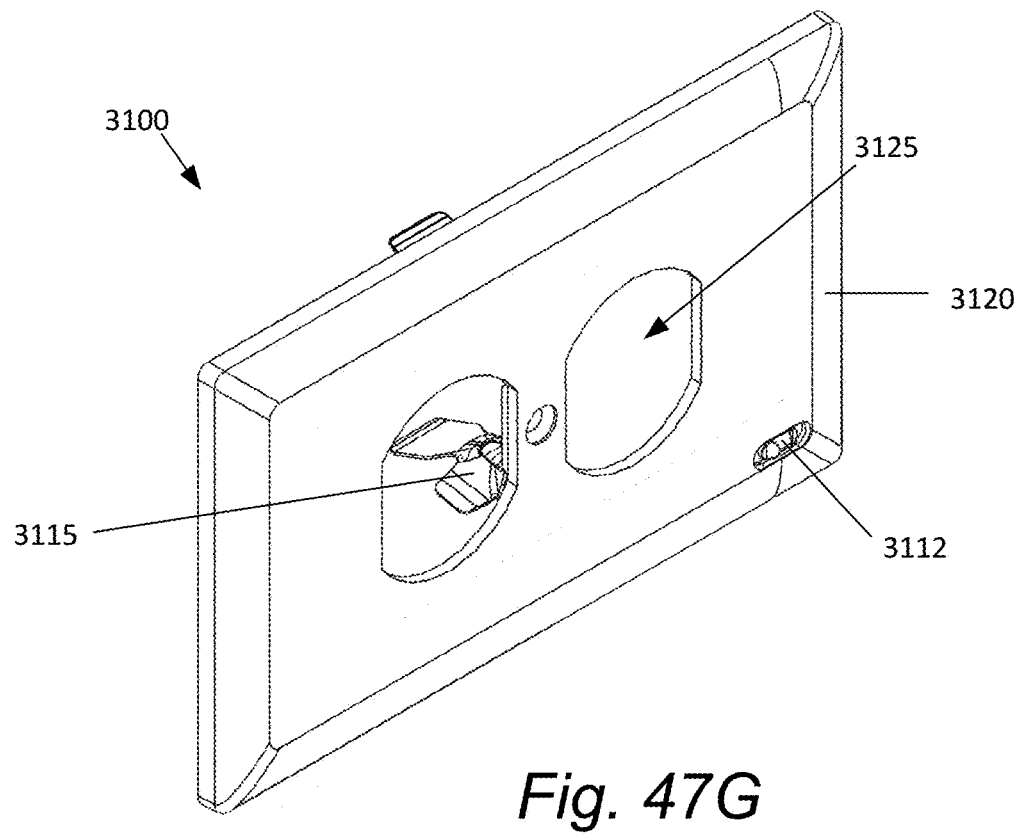
Figure 49F:
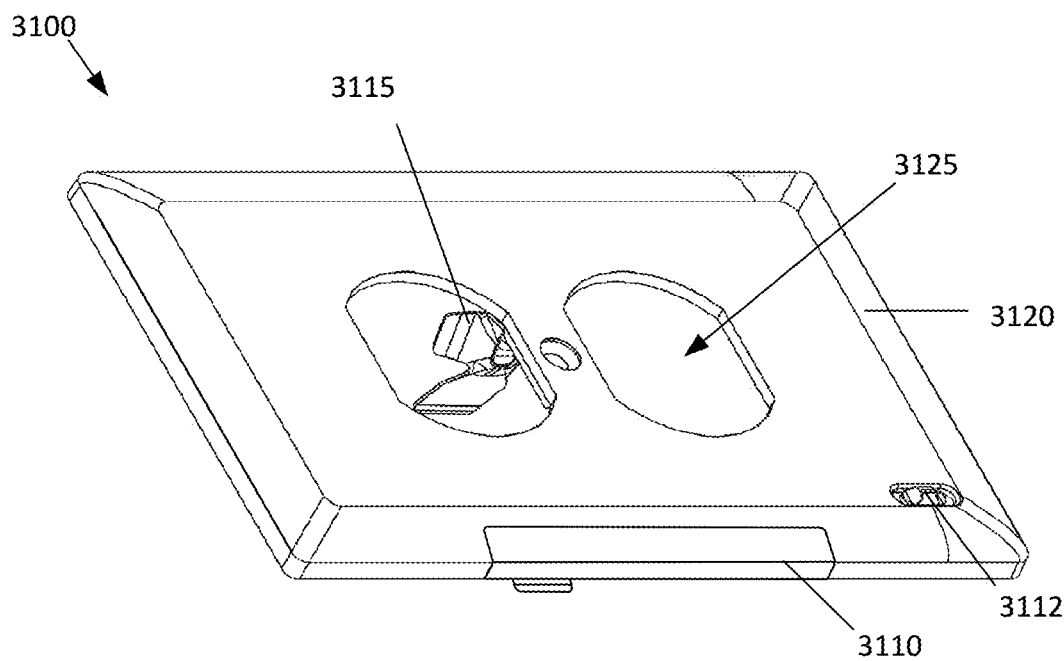
Figure 49G:
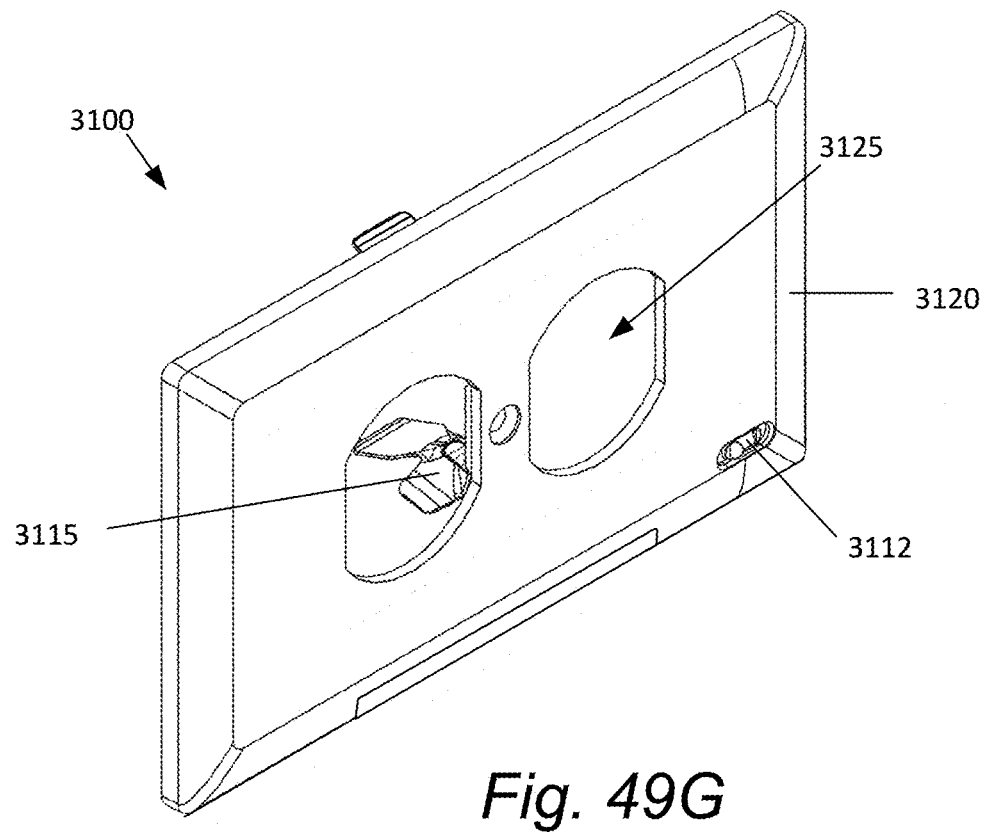

FIGS. 47A-47G, 48A-48E, and 49A-49G show examples of active cover plates (3100) that include a light pipe or other aperture (3110) along one of the long edges of the faceplate. As discussed previously, the light pipe (3110) may be formed from plastic and may serve multiple purposes, including protecting the circuitry and guiding light produced from internal elements to an exterior of the active cover plate. In the example shown in FIGS. 47A-47G the active cover plate (3100) includes a face plate (3120) with apertures (3125) configured to receive a duplex outlet. FIG. 47A is a top view of the active cover plate (3100). FIGS. 47B, 47C, 47D, and 47E are front, bottom, left, and right views, respectively of the active cover plate. Prongs (3115) extend from the rear of the face plate (3120). As discussed above, the prong (3115), apertures (3125) and light pipe (3110) may take a variety of shapes, sizes, locations and combinations. For example, the light pipe (3110) may have any of the configurations (or variations thereof) shown in FIGS. 24A-24Q or other configurations. In this example, the active cover plate also includes a light sensor cover/switch (3112). As discussed above, this light sensor cover/switch (3112) may have a variety of shapes, sizes, and locations, including those described herein (see e.g. 24R-24EE).

FIGS. 48A-48E show one illustrative example of an active cover plate (3100) that includes a faceplate (3120) with a rectangular aperture (3125) that is configured to fit over décor outlets, GFCI outlets and rocker switches. FIGS. 48A, 48B, 48C, 48D and 48E are, respectively, a top view, a front view, a bottom view, a left side view and a right side view. In this case the prongs (3115) are configured for connection to a GFCI outlet. The light pipe (3110) is located on a longer edge of the faceplate (3120). The light sensor cover/switch (3112) is located in one of the corners of the faceplate. Although the light pipe (3110) is shown on a specific side/edge, it may be located on other sides/edges or in combination with of two or more edges or faces. Further, the light pipe (3110) may have a variety of shapes and sizes.

FIGS. 49A-49G show one illustrative example of an active cover plate (3100) with a light pipe (3110) along one of the long edges of the faceplate (3120). FIGS. 49A, 49B, 49C, 49D, 49E, 49F and 49G are, respectively, a top view, a front view, a bottom view, a left side view, a right side view, a front perspective view, and another front perspective view. In this example, an active cover plate (3100) includes a faceplate (3120) with two apertures (3125) and prongs (3115) that are configured to fit over duplex outlets. The light sensor cover/switch (3112) is located in one of the corners of the faceplate. The light pipe (3110) is located on a longer side of the faceplate (3120) and wraps around the edge of the faceplate. Although the light pipe (3110) is shown on a specific side/edge, it may be located on other sides/edges or in combination with of two or more edges or faces. Further, the light pipe (3110) may have a variety of shapes and sizes as shown and described herein.

The preceding description has been presented only to illustrate and describe examples of the principles described. This description is not intended to be exhaustive or to limit these principles to any precise form disclosed. Many modifications and variations are possible in light of the above teaching.

What is claimed is:

1. An active cover plate comprising:
    a multi-gang face plate configured to be installed over a multi-gang light switch installation, the multi-gang faceplate comprising at least two apertures, wherein each aperture of the at two apertures is sized to accept a manually manipulatable element of a respective switch of the multi-gang light switch installation; and
    the multi-gang faceplate wherein the at least two apertures comprises a first aperture and a second aperture;
    the multi-gang face plate further comprising an attachment area located between the first aperture and the second aperture; and
    prongs extending rearward from the multi-gang faceplate around one of the apertures, wherein at least one of the prongs is secured to the attachment area.

2. The active cover plate of claim 1, wherein at least two of the prongs are configured to contact screw terminals of a light switch when the active cover plate is installed over the multi-gang light switch installation.

3. The active cover plate of claim 1, further comprising a first light bar along a first edge of the face plate.

4. The active cover plate of claim 1, wherein the at least one of the prongs is reversible to face either the first aperture or the second aperture.

5. The active cover plate of claim 1, wherein the active cover plate comprises a first configuration wherein the at least one of the prongs is configured to be oriented facing the first aperture and a second configuration wherein the at least one of the prongs is configured to be oriented to face the second aperture.

6. The active cover plate of claim 5, wherein the cover is configured be secured to the faceplate and secure a base of the at least one prong relative to the faceplate, wherein the cover is secured in a first orientation over the base when the at least one of the prongs is in the first configuration and in a second orientation over the base when the at least one of the prongs is in the second configuration.

7. The active cover plate of claim 5, wherein the cover is configured be secured to the faceplate and secure the base of the at least one prong relative to the faceplate.

8. The active cover plate of claim 1, further comprising a cover, wherein the at least one of the prongs comprises a base, wherein the cover is configured to cover the base.

9. The active cover plate of claim 8, wherein the cover is configured to be reversible such that it can cover the base when the at least one prong is facing the first aperture and when the at least one prong is facing the second aperture.

10. The active cover plate of claim 1, further comprising a cover, wherein the at least one of the prongs comprises a base, wherein the cover is configured to cover the base.

11. The active cover plate of claim 10, wherein the faceplate comprises channels adapted to receive edges of the cover, and wherein the edges of the cover are secured into the channels.

12. The active cover plate of claim 1, further comprising a load and conductors connecting the prongs to the load.

13. The active cover plate of claim 12, wherein a first prong and a second prong are secured on the same side of an aperture in the multi-gang face plate, wherein the multi-gang face plate comprises a spacing feature to space a first conductor connected to the first prong at distance from a conductive element of the second prong.

14. The active cover plate of claim 13, wherein the conductive element of the second prong comprises a base of the second prong.

15. The active cover plate of claim 14, wherein the spacing feature comprises a post configured to lift the first conductor over the base of the second prong.

16. The active cover plate of claim 15, further comprising a cover over the base of the second prong, wherein the cover locates the wire over the post.

17. The active cover plate of claim 14, where the spacing feature comprises a wall spacing the first conductor away from the base of the second prong.

* * * * *